US010831101B2

(12) United States Patent
Yorisue et al.

(10) Patent No.: US 10,831,101 B2
(45) Date of Patent: Nov. 10, 2020

(54) PHOTOSENSITIVE RESIN COMPOSITION, METHOD FOR MANUFACTURING CURED RELIEF PATTERN, AND SEMICONDUCTOR APPARATUS

(71) Applicant: ASAHI KASEI KABUSHIKI KAISHA, Tokyo (JP)

(72) Inventors: Tomohiro Yorisue, Tokyo (JP); Taihei Inoue, Tokyo (JP); Yoshito Ido, Tokyo (JP); Mitsutaka Nakamura, Tokyo (JP); Tomoshige Yunokuchi, Tokyo (JP); Daisuke Sasano, Tokyo (JP); Takahiro Sasaki, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/742,975

(22) PCT Filed: Mar. 28, 2017

(86) PCT No.: PCT/JP2017/012743

§ 371 (c)(1),
(2) Date: Jan. 9, 2018

(87) PCT Pub. No.: WO2017/170600

PCT Pub. Date: Oct. 5, 2017

(65) Prior Publication Data

US 2019/0113845 A1 Apr. 18, 2019

(30) Foreign Application Priority Data

| | | |
|---|---|---|
| Mar. 31, 2016 | (JP) | 2016-073576 |
| Apr. 20, 2016 | (JP) | 2016-084497 |
| Apr. 21, 2016 | (JP) | 2016-085535 |
| Apr. 22, 2016 | (JP) | 2016-086482 |
| May 9, 2016 | (JP) | 2016-094177 |

(51) Int. Cl.

| | |
|---|---|
| ***G03F 7/022*** | (2006.01) |
| ***G03F 7/031*** | (2006.01) |
| ***G03F 7/023*** | (2006.01) |
| ***G03F 7/038*** | (2006.01) |
| ***G03F 7/004*** | (2006.01) |
| ***G03F 7/037*** | (2006.01) |
| ***G03F 7/16*** | (2006.01) |
| ***C08L 77/00*** | (2006.01) |
| *H05K 3/28* | (2006.01) |
| *C08K 5/33* | (2006.01) |
| *C08K 5/375* | (2006.01) |
| *H05K 3/02* | (2006.01) |

(52) U.S. Cl.

CPC ............ *G03F 7/0226* (2013.01); *C08L 77/00* (2013.01); *G03F 7/0048* (2013.01); *G03F 7/0233* (2013.01); *G03F 7/031* (2013.01); *G03F 7/037* (2013.01); *G03F 7/0387* (2013.01); *G03F 7/0388* (2013.01); *G03F 7/162* (2013.01); *C08K 5/33* (2013.01); *C08K 5/375* (2013.01); *C08L 2203/20* (2013.01); *H05K 3/022* (2013.01); *H05K 3/287* (2013.01); *H05K 2201/0154* (2013.01)

(58) Field of Classification Search

CPC .... G03F 7/0387; G03F 7/0388; G03F 7/0226; G03F 7/233

See application file for complete search history.

(56) References Cited

U.S. PATENT DOCUMENTS

| | | | |
|---|---|---|---|
| 2,772,972 | A | 12/1954 | Herrick et al. |
| 2,797,213 | A | 6/1957 | Moore et al. |
| 3,669,658 | A | 6/1972 | Yonezawa et al. |
| 6,610,815 | B1 | 8/2003 | Hata et al. |
| 2001/0048166 | A1 | 12/2001 | Miyazaki |
| 2004/0053156 | A1 | 3/2004 | Fujita et al. |
| 2005/0244739 | A1 | 11/2005 | Kanatani et al. |
| 2008/0103275 | A1 | 5/2008 | Wu |
| 2011/0236826 | A1 | 9/2011 | Hatakeyama et al. |
| 2011/0318688 | A1 | 12/2011 | Hiraoka et al. |
| 2015/0115196 | A1 | 4/2015 | Kurii et al. |
| 2015/0353685 | A1 | 12/2015 | Enomoto et al. |
| 2017/0101521 | A1 | 4/2017 | Koyama |

FOREIGN PATENT DOCUMENTS

| | | | | |
|---|---|---|---|---|
| JP | 2001-338947 | A | | 12/2001 |
| JP | 2002-040658 | A | | 2/2002 |
| JP | 2002040658 | A | * | 2/2002 |
| JP | 2003-287889 | A | | 10/2003 |
| JP | 2004091572 | A | | 3/2004 |
| JP | 2004-126547 | A | | 4/2004 |
| JP | 2004285129 | A | | 10/2004 |
| JP | 2005-148633 | A | | 6/2005 |

(Continued)

OTHER PUBLICATIONS

English translation of JPWO 2015141618 (A1) which is an equivalent to WO2015141618 a1, obtained Jun. 12, 2019 from Espacenet website, 67 pages. (Year: 2019).*
International Search Report from PCT/JP2017/012743, dated Jun. 27, 2017.
Taiwanese Office Action from TW Patent Application No. 20170110461, dated Oct. 11, 2017.
Kagaku-Dai-Jiten,(Chemistry Dictionary) vol. 3, reduced edition, p. 674, Sep. 10, 1976.

(Continued)

*Primary Examiner* — Cynthia Hamilton
(74) *Attorney, Agent, or Firm* — Greenblum & Bernstein, P.L.C.

(57) ABSTRACT

A photosensitive resin composition containing a resin and a compound each having a structure specified by the present specification provides a cured film having excellent adhesiveness to copper wiring.

19 Claims, 3 Drawing Sheets

(56) References Cited

FOREIGN PATENT DOCUMENTS

| | | | | |
|---|---|---|---|---|
| JP | 2005-336125 | A | | 12/2005 |
| JP | 2007-206423 | A | | 8/2007 |
| JP | 2008-3164 | A | | 1/2008 |
| JP | 2008083467 | A | | 4/2008 |
| JP | 2008083468 | A | | 4/2008 |
| JP | 2010009052 | A | | 1/2010 |
| JP | 2011-191749 | A | | 9/2011 |
| JP | 2011191749 | A | * | 9/2011 |
| JP | 4919501 | B2 | | 4/2012 |
| JP | 2012-194520 | A | | 10/2012 |
| JP | 2013-076845 | A | | 4/2013 |
| JP | 5219008 | B1 | | 6/2013 |
| JP | 2014-122267 | A | | 7/2014 |
| JP | 2014-201695 | A | | 10/2014 |
| JP | 2015-010113 | A | | 1/2015 |
| JP | 2015-60091 | A | | 3/2015 |
| JP | 2015-113429 | A | | 6/2015 |
| JP | 2016-008992 | A | | 1/2016 |
| JP | 2016-024319 | A | | 2/2016 |
| TW | 201204697 | A1 | | 2/2012 |
| TW | 201206881 | A1 | | 2/2012 |
| TW | 201211686 | A | | 3/2012 |
| WO | WO 00/043439 | A1 | | 7/2000 |
| WO | 2014/024951 | A1 | | 2/2014 |
| WO | 2014/097595 | A1 | | 6/2014 |
| WO | 2015052885 | A1 | | 4/2015 |
| WO | 2015125469 | A1 | | 8/2015 |
| WO | 2015/141618 | A1 | | 9/2015 |
| WO | WO-2015141618 | A1 | * | 9/2015 ............. G03F 7/037 |
| WO | 2015199219 | A1 | | 12/2015 |
| WO | 2016/194769 | A1 | | 12/2016 |
| WO | 2017/002858 | A1 | | 1/2017 |
| WO | 2017002859 | A1 | | 1/2017 |
| WO | 2017/033833 | A1 | | 3/2017 |

OTHER PUBLICATIONS

Sigma-Aldrich, N,N-Dimethylacetoacetamide solution, URL:http://www.sigmaaldrich.com/catalog/product/aldrich/537373?lang=ja®ion=JP (searched Oct. 27, 2017).

* cited by examiner

PHOTOSENSITIVE RESIN COMPOSITION, METHOD FOR MANUFACTURING CURED RELIEF PATTERN, AND SEMICONDUCTOR APPARATUS

TECHNICAL FIELD

The present invention relates to a photosensitive resin composition used to form a relief pattern of, for example, an insulating material of an electronic component or a passivation film, buffer coat film or interlayer insulating film of a semiconductor device, a method for producing a cured relief pattern using the same, and a semiconductor device.

BACKGROUND ART

Polyimide films having superior heat resistance, electrical properties and mechanical properties have conventionally been used for the insulating materials of electronic components and the passivation films, buffer coat films and interlayer insulating films of semiconductor devices. Among these polyimide resins, those supplied in the form of photosensitive polyimide precursors are capable of easily forming a heat-resistant relief pattern by subjecting the polyimide precursor to thermal imidization treatment by coating, exposing to light, developing and curing. These photosensitive polyimide precursors have the characteristic of enabling a considerable reduction in processing time in comparison with conventional non-photosensitive polyimides.

On the other hand, the methods used to mount semiconductor devices on printed wiring boards have changed in recent years from the viewpoints of improving the degree of integration and function and reducing chip size. Structures are being employed in which a polyimide coating makes direct contact with the solder bump in the manner of the transition from conventional mounting methods using metal pins or lead-tin eutectic solder to higher density mounting methods such as ball grid arrays (BGA) or chip size packaging (CSP). The coating is required to have high heat resistance and chemical resistance during formation of such bump structures. A method has been disclosed for improving the heat resistance of polyimide coatings or polybenzoxazole coatings by adding a thermal crosslinking agent to a composition containing a polyimide precursor or polybenzoxazole precursor (see Patent Document 1).

Moreover, the wiring resistance of semiconductor devices can no longer be ignored due to the increasing miniaturization of semiconductor devices. Thus, the change is being made from previously used gold or aluminum wiring to copper or copper alloy wiring having lower resistance, and there are many cases in which surface protective films or interlay insulating films are formed on the copper and copper alloy. Consequently, adhesion with copper or copper alloy wiring has come to have a considerable effect on the reliability of semiconductor elements, thus resulting in a need for enhanced adhesion with copper and copper alloy wiring (see Patent Document 2).

PRIOR ART DOCUMENTS

Patent Documents

[Patent Document 1] Japanese Unexamined Patent Publication No. 2003-287889

[Patent Document 2] Japanese Unexamined Patent Publication No. 2005-336125

DISCLOSURE OF THE INVENTION

Problems to be Solved by the Invention

Although there is a method consisting of adding an additive component to a resin composition for the purpose of improving the adhesion with copper and copper alloy in order to respond to the needs as explained above (see, for example, Patent Document 2), this method was unable to obtain sufficient adhesion.

With the foregoing in view, an object of the present invention is to provide a negative-type photosensitive resin composition that yields a cured film demonstrating superior adhesion to copper wire, a pattern formation and production method for forming a polyimide pattern using the photosensitive resin composition, and a semiconductor device.

Means for Solving the Problem

The inventors of the present invention found that a photosensitive resin composition can be obtained that yields a cured film demonstrating superior adhesion to copper wire by using a resin having a specific structure and a compound, thereby leading to completion of the present invention. Namely, the present invention is as indicated below.

[1] A negative-type photosensitive resin composition including:

(A) a polyimide precursor in the form of a polyamic acid, polyamic acid ester or polyamic acid salt represented by the following general formula (1):

[Chemical Formula 1]

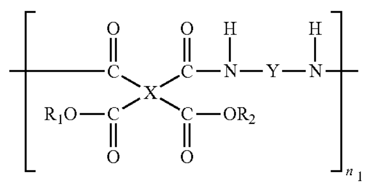

(1)

{wherein, X represents a tetravalent organic group, Y represents a divalent organic group, $n_1$ represents an integer of 2 to 150, and $R_1$ and $R_2$ respectively and independently represent a hydrogen atom, saturated aliphatic group having 1 to 30 carbon atoms, aromatic group, monovalent organic group represented by the following general formula (2):

[Chemical Formula 2]

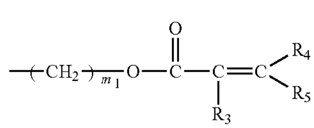

(2)

(wherein, $R_3$, $R_4$ and $R_5$ respectively and independently represent a hydrogen atom or organic group having 1 to 3 carbon atoms, and $m_1$ represents an integer of 2 to 10), or monovalent ammonium ion represented by the following general formula (3):

[Chemical Formula 3]

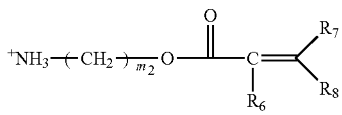

(3)

(wherein, $R_6$, $R_7$ and $R_8$ respectively and independently represent a hydrogen atom or organic group having 1 to 3 carbon atoms, and $m_2$ represents an integer of 2 to 10)}, and, (B) a photosensitizer; wherein, the component (A) is a blend of at least one of the following resins (A1) to (A3) with the following resin (A4):

(A1) a resin in which X in general formula (1) is a group represented by the following general formula (4):

[Chemical Formula 4]

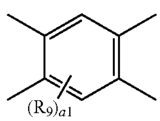

(4)

{wherein, a1 represents an integer of 0 to 2, $R_9$ represents a hydrogen atom, fluorine atom or monovalent organic group having 1 to 10 carbon atoms, and in the case a plurality of $R_9$ are present, may be mutually the same or different}, a group represented by the following general formula (5):

[Chemical Formula 5]

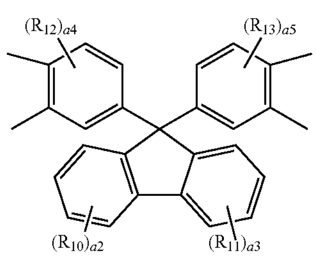

(5)

{wherein, a2 and a3 respectively and independently represent an integer of 0 to 4, a4 and a5 respectively and independently represent an integer of 0 to 3, $R_{10}$ to $R_{13}$ respectively and independently represent a hydrogen atom, fluorine atom or monovalent organic group having 1 to 10 carbon atoms, and in the case a plurality of $R_{10}$ to $R_{13}$ are present, may mutually be the same or different}, a group represented by the following general formula (6):

[Chemical Formula 6]

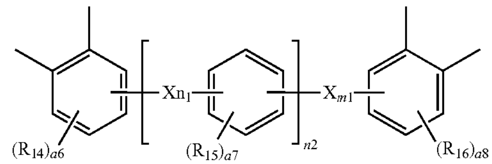

(6)

{wherein, n2 represents an integer of 0 to 5, $X_{n1}$ represents a single bond or divalent organic group, in the case a plurality of $X_{n1}$ are present, may mutually be the same or different, $X_{m1}$ represents a single bond or divalent organic group, at least one of $X_{m1}$ and $X_{n1}$ represents a single bond or an organic group selected from the group consisting of an oxycarbonyl group, oxycarbonylmethylene group, carbonylamino group, carbonyl group and sulfonyl group, a6 and a8 respectively and independently represent an integer of 0 to 3, a7 represents an integer of 0 to 4, $R_{14}$, $R_{15}$ and $R_{16}$ respectively and independently represent a hydrogen atom, fluorine atom or monovalent organic group having 1 to 10 carbon atoms, and in the case a plurality of $R_{14}$, $R_{15}$ and $R_{16}$ are present, may mutually be the same or different}; and, Y in general formula (1) represents a group represented by the following general formula (7):

[Chemical Formula 7]

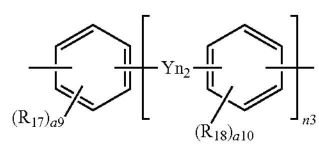

(7)

{wherein, n3 represents an integer of 1 to 5, $Y_{n2}$ represents an organic group having 1 to 10 carbon atoms that may contain a fluorine atom but does not contain a heteroatom other than fluorine, an oxygen atom or a sulfur atom, in the case a plurality of $Y_{n2}$ are present, may mutually be the same or different, a9 and a10 respectively and independently represent an integer of 0 to 4, $R_{17}$ and $R_{18}$ respectively and independently represent a hydrogen atom, fluorine atom or monovalent organic group having 1 to 10 carbon atoms, and in the case a plurality of $R_{17}$ and $R_{18}$ are present, may mutually be the same or different};

(A2) a resin in which X in general formula (1) is a group represented by the following general formula (8):

[Chemical Formula 8]

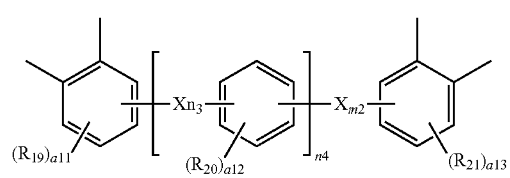

(8)

{wherein, n4 represents an integer of 0 to 5, $X_{m2}$ and $X_{n3}$ respectively and independently represent an organic group having 1 to 10 carbon atoms that may contain a fluorine atom but does not contain a heteroatom other than fluorine, an oxygen atom or a sulfur atom, in the case of a plurality of $X_{n3}$ are present, may be mutually the same or different, a11 and a13 respectively and independently represent an integer of 0 to 3, a12 represents an integer of 0 to 4, $R_{19}$, $R_{20}$ and $R_{21}$ respectively and independently represent a hydrogen atom, fluorine atom or monovalent organic group having 1 to 10 carbon atoms, and in the case of a plurality of $R_{19}$, $R_{20}$ and $R_{21}$ are present, may mutually be the same or different}, and Y in general formula (1) is a group represented by the following general formula (9):

[Chemical Formula 9]

(9)

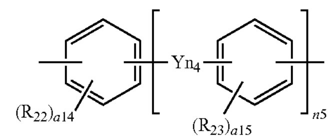

{wherein, n5 represents an integer of 0 to 5, $Y_{n4}$ represents a single bond or a divalent organic group, in the case of a plurality of $Y_{n4}$ are present, may be mutually the same or different, in the case n4 is 2 or more, at least one of $Y_{n4}$ represents a single bond or an organic group selected from the group consisting of an oxycarbonyl group, oxycathenylmethylene group, carbonylamino group, carbonyl group and sulfonyl group, a14 and a15 respectively and independently represent an integer of 0 to 4, $R_{22}$ and $R_{23}$ respectively and independently represent a hydrogen atom, fluorine atom or monovalent organic group having 1 to 10 carbon atoms, and in the case a plurality of $R_{22}$ and $R_{23}$ are present, may be mutually the same or different}, or a group represented by the following general formula (10):

[Chemical Formula 10]

(10)

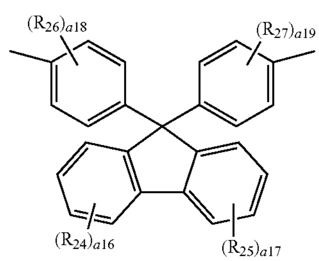

{wherein, a16 to a19 respectively and independently represent an integer of 0 to 4, $R_{24}$ to $R_{27}$ respectively and independently represent a hydrogen atom, fluorine atom or monovalent organic group having 1 to 10 carbon atoms, and in the case a plurality of $R_{24}$ to $R_{27}$ are present, may mutually be the same or different};

(A3) a resin in which X in general formula (1) is a group represented by general formula (4), (5) or (6), and Y in general formula (1) is a group represented by general formula (9) or (10); and, (A4) a resin in which X in general formula (1) is a group represented by general formula (8), and Y in general formula (1) is a group represented by general formula (7).

[2] The negative-type photosensitive resin composition described in [1], wherein the group represented by general formula (6) is at least one group selected from the group consisting of groups represented by the following general formula (X1):

[Chemical Formula 11]

(X1)

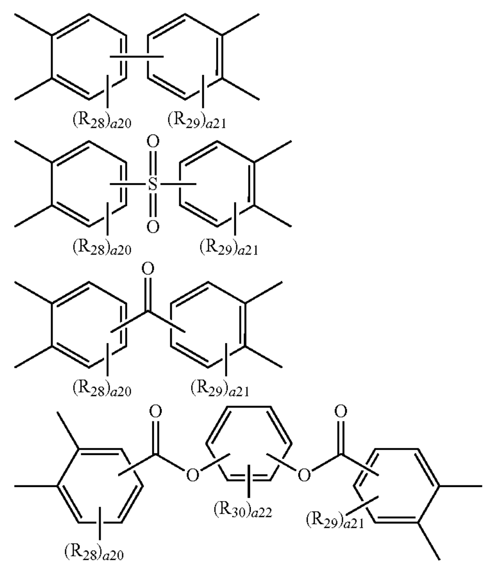

{wherein, a20 and a21 respectively and independently represent an integer of 0 to 3, a22 represents an integer of 0 to 4, $R_{28}$ to $R_{30}$ respectively and independently represent a hydrogen atom, fluorine atom or organic group having 1 to 10 carbon atoms, and in the case a plurality of $R_{28}$ to $R_{30}$ are present, may be mutually the same or different}, the group represented by general formula (7) is at least one group selected from the group consisting of groups represented by the following general formula (Y1):

[Chemical Formula 12]

(Y1)

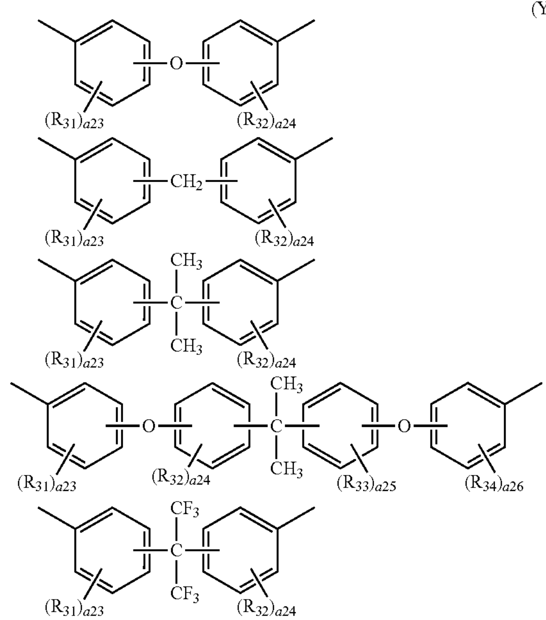

-continued

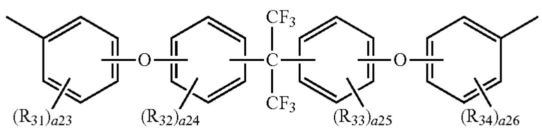

{wherein, a23 to a26 respectively and independently represent an integer of 0 to 4, $R_{31}$ to $R_{34}$ respectively and independently represent a hydrogen atom, fluorine atom or monovalent organic group having 1 to 10 carbon atoms, and in the case a plurality of $R_{31}$ to $R_{34}$ are present, may mutually be the same or different}, the group represented by general formula (8) is at least group selected from the group consisting of groups represented by the following general formula (X2):

[Chemical Formula 13]

(X2)

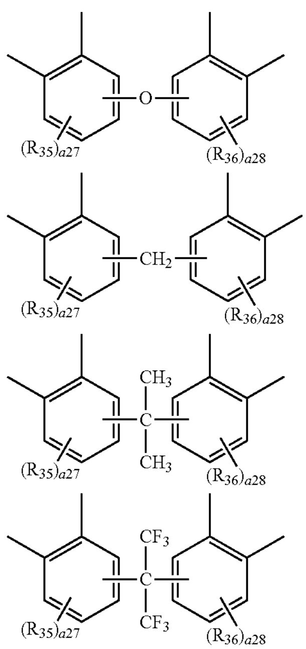

{wherein, a27 and a28 respectively and independently represent an integer of 0 to 3, $R_{35}$ and $R_{36}$ respectively and independently represent a hydrogen atom, fluorine atom or monovalent organic group having 1 to 10 carbon atoms, and in the case a plurality of $R_{35}$ and $R_{36}$ are present, may mutually be the same or different}, and the group represented by general formula (9) is at least one group selected from the group consisting of groups represented by the following general formula (Y2):

[Chemical Formula 14]

(Y2)

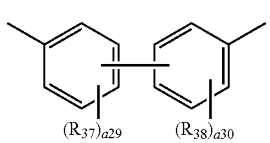

-continued

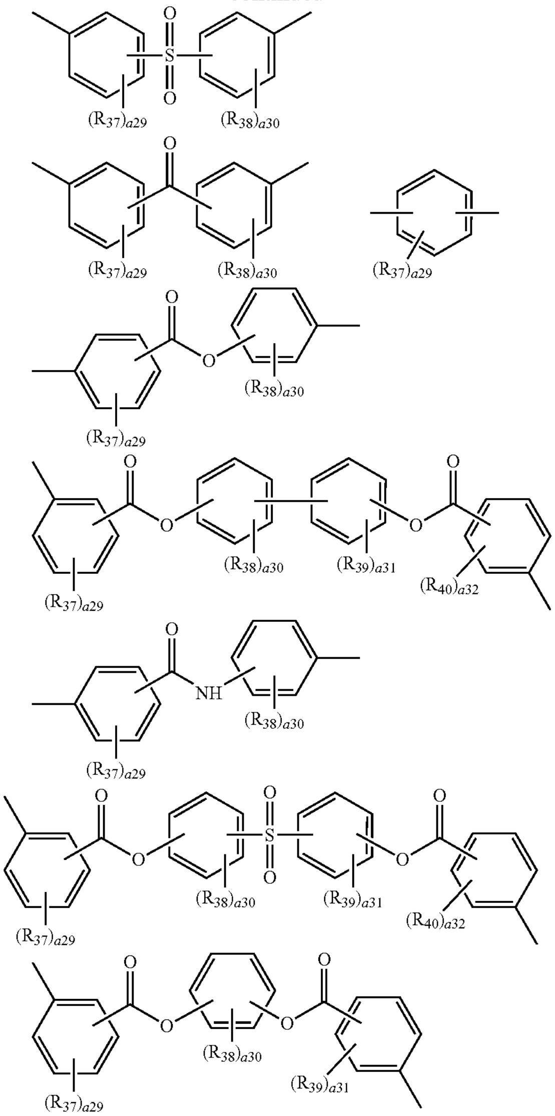

{wherein, a29 to a32 respectively and independently represent an integer of 0 to 4, $R_{37}$ to $R_{40}$ respectively and independently represent a hydrogen atom, fluorine atom or monovalent organic group having 1 to 10 carbon atoms, and in the case a plurality of $R_{37}$ to $R_{40}$ are present, may mutually be the same or different}.

[3] The negative-type photosensitive resin composition described in [1] or [2], wherein, in general formula (1) of (A1), 50 mol % or more of X is a group represented by general formula (4), (5) or (6), and 50 mol % or more of Y is a group represented by general formula (7).

[4] The negative-type photosensitive resin composition described in any of [1] to [3], wherein, in general formula (1) of (A2), 50 mol % or more of X is a group represented by general formula (8), and 50 mol % or more of Y is a group represented by general formula (9) or (10).

[5] The negative-type photosensitive resin composition described in any of [1] to [4], wherein, in general formula (1) of (A3), 50 mol % or more of X is a group represented by general formula (4), (5) or (6), and 50 mol % or more of Y is a group represented by general formula (9) or (10).

[6] The negative-type photosensitive resin composition described in any of [1] to [5], wherein, in general formula (1)

of (A4), 50 mol % or more of X is a group represented by general formula (8), and 50 mol % or more of Y in general formula (1) is a group represented by formula (7).

[7] The negative-type photosensitive resin composition described in any of [1] to [6], wherein the content of (A4) is 10% by weight to 90% by weight of the sum of the weights of (A1) to (A4).

[8] The negative-type photosensitive resin composition described in any of [1] to [7], wherein the sum of the weights of (A1) to (A4) is 50% or more of the total weight of component (A).

[9] The negative-type photosensitive resin composition described in any of [1] to [8], wherein 50 mol % or more of X in general formula (1) of (A1) is a group represented by general formula (4), (5) or (6), and 50 mol % or more of Y in general formula (1) of (A1) is a group represented by the following formula (11).

[Chemical Formula 15]

(11)

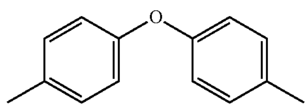

[10] The negative-type photosensitive resin composition described in any of [1] to [9], wherein 50 mol % or more of X in general formula (1) of (A2) is a group represented by the following formula (12):

[Chemical Formula 16]

(12)

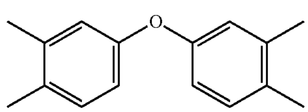

and 50 mol % or more of Y in general formula (1) of (A2) is a group represented by formula (9) or (10).

[11] The negative-type photosensitive resin composition described in any of [1] to [10], wherein 50 mol % or more of X in general formula (1) of (A4) is a group represented by formula (12), and 50 mol % or more of Y in general formula (1) of (A4) is a group represented by formula (11).

[12] The negative-type photosensitive resin composition described in [11], wherein 80 mol % or more of X in general formula (1) of (A4) is a group represented by formula (12), and 80 mol % or more of Y in general formula (1) is a group represented by formula (11).

[13] The negative-type photosensitive resin composition described in [11] or [12], containing a solvent (C1) having a boiling point of 200° C. to 250° C. and a solvent (C2) having a boiling point of 160° C. to 190° C.

[14] The negative-type photosensitive resin composition described in [11] or [12], wherein the solvent (C) includes at least two types selected from the group consisting of γ-butyrolactone, dimethylsulfoxide, tetrahydrofurfuryl alcohol, ethyl acetoacetate, dimethyl succinate, dimethyl malonate, N,N-dimethylacetoacetamide, ε-caprolactone and 1,3-dimethyl-2-imidazolidinone.

[15] The negative-type photosensitive resin composition described in [14], wherein the solvent (C1) is γ-butyrolactone and the solvent (C2) is dimethylsulfoxide.

[16] The negative-type photosensitive resin composition described in any of [13] to [15], wherein the weight of the solvent (C2) is 5% to 50% of the sum of the weights of the solvent (C1) and the solvent (C2).

[17] The negative-type photosensitive resin composition described in any of [1] to [16], containing a solvent (C1) having a boiling point of 200° C. to 250° C. and a solvent (C2) having a boiling point of 160° C. to 190° C.

[18] The negative-type photosensitive resin composition described in [17], wherein the solvent (C) includes at least two types selected from the group consisting of γ-butyrolactone, dimethylsulfoxide, tetrahydrofurfuryl alcohol, ethyl acetoacetate, dimethyl succinate, dimethyl malonate, N,N-dimethylacetoacetamide, ε-caprolactone and 1,3-dimethyl-2-imidazolidinone.

[19] The negative-type photosensitive resin composition described in [18], wherein the solvent (C1) is γ-butyrolactone and the solvent (C2) is dimethylsulfoxide.

[20] The negative-type photosensitive resin composition described in any of [17] to [19], wherein the weight of the solvent (C2) is 5% to 50% of the sum of the weights of the solvent (C1) and the solvent (C2).

[21] A negative-type photosensitive resin composition including:

(A) a polyimide precursor in the form of a polyamic acid, polyamic acid ester or polyamic acid salt represented by the following general formula (18):

[Chemical Formula 17]

(18)

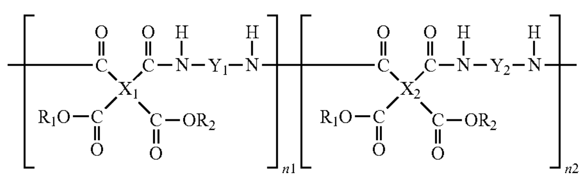

{wherein, $X_1$ and $X_2$ respectively and independently represent a tetravalent organic group, $Y_1$ and $Y_2$ respectively and independently represent a divalent organic group, n1 and n2 respectively and independently represent an integer of 2 to 150, and $R_1$ and $R_2$ respectively and independently represent a hydrogen atom, saturated aliphatic group having 1 to 30 carbon atoms, aromatic group, monovalent organic group represented by the general formula (2) or monovalent ammonium ion represented by general formula (3), provided that $X_1$ and $X_2$ are not the same and $Y_1$ and $Y_2$ are not the same};

(B) a photosensitizer; and, (C) a solvent.

[22] The negative-type photosensitive resin composition described in [21], wherein $X_1$ and $X_2$ in general formula (18) are at least one type selected from the group consisting of a group represented by the following general formula (4):

[Chemical Formula 18]

(4)

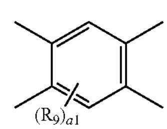

{wherein, a1 represents an integer of 0 to 2, $R_9$ represents a hydrogen atom, fluorine atom or monovalent organic group having 1 to 10 carbon atoms, and in the case a plurality of $R_9$ are present, may be mutually the same or different}, a group represented by the following general formula (5):

[Chemical Formula 19]

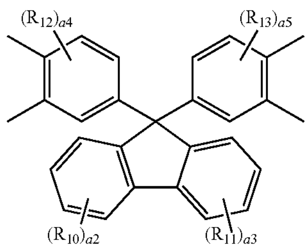

(5)

{wherein, a2 and a3 respectively and independently represent an integer of 0 to 4, a4 and a5 respectively and independently represent an integer of 0 to 3, $R_{10}$ to $R_{13}$ respectively and independently represent a hydrogen atom, fluorine atom or monovalent organic group having 1 to 10 carbon atoms, and in the case a plurality of $R_{10}$ to $R_{13}$ are present, may mutually be the same or different}, a group represented by the following general formula (6):

[Chemical Formula 20]

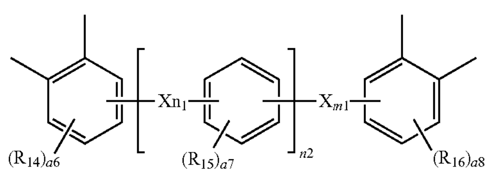

(6)

{wherein, n2 represents an integer of 0 to 5, $X_{n1}$ represents a single bond or divalent organic group, in the case a plurality of $X_{n1}$ are present, may mutually be the same or different, $X_{m1}$ represents a single bond or divalent organic group, at least one of $X_{m1}$ and $X_{n1}$ represents a single bond or an organic group selected from the group consisting of an oxycarbonyl group, oxycathenylmethylene group, carbonylamino group, carbonyl group and sulfonyl group, a6 and a8 respectively and independently represent an integer of 0 to 3, a7 represents an integer of 0 to 4, $R_{14}$, $R_{15}$ and $R_{16}$ respectively and independently represent a hydrogen atom, fluorine atom or monovalent organic group having 1 to 10 carbon atoms, and in the case a plurality of $R_{14}$, $R_{15}$ and $R_{16}$ are present, may be mutually the same or different}, and a group represented by the following general formula (8):

[Chemical Formula 21]

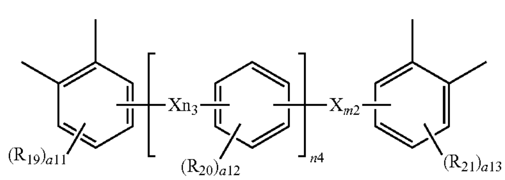

(8)

{wherein, n4 represents an integer of 0 to 5, $X_{m2}$ and $X_{n3}$ respectively and independently represent an organic group having 1 to 10 carbon atoms that may contain a fluorine atom but does not contain a heteroatom other than fluorine, an oxygen atom or a sulfur atom, in the case of a plurality of $X_{n3}$ are present, may be mutually the same or different, a11 and a13 respectively and independently represent an integer of 0 to 3, a12 represents an integer of 0 to 4, $R_{19}$, $R_{20}$ and $R_{21}$ respectively and independently represent a hydrogen atom, fluorine atom or monovalent organic group having 1 to 10 carbon atoms, and in the case of a plurality of $R_{19}$, $R_{20}$ and $R_{21}$ are present, may mutually be the same or different}.

[23] The negative-type photosensitive resin composition described in [21] or [22], wherein $Y_1$ and $Y_2$ in general formula (18) represent at least one type selected from the group consisting of a group represented by the following general formula (7):

[Chemical Formula 22]

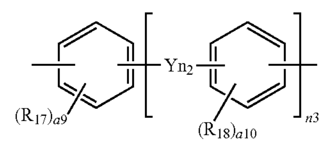

(7)

{wherein, n3 represents an integer of 1 to 5, $Y_{n2}$ represents an organic group having 1 to 10 carbon atoms that may contain a fluorine atom but does not contain a heteroatom other than fluorine, an oxygen atom or a sulfur atom, in the case a plurality of $Y_{n2}$ are present, may mutually be the same or different, a9 and a10 respectively and independently represent an integer of 0 to 4, $R_{17}$ and $R_{18}$ respectively and independently represent a hydrogen atom, fluorine atom or monovalent organic group having 1 to 10 carbon atoms, and in the case a plurality of $R_{17}$ and $R_{18}$ are present, may mutually be the same or different}, a group represented by the following general formula (9):

[Chemical Formula 23]

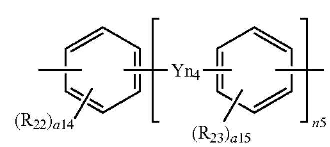

(9)

{wherein, n5 represents an integer of 0 to 5, $Y_{n4}$ represents a single bond or a divalent organic group, in the case of a plurality of $Y_{n4}$ are present, may be mutually the same or different, in the case n4 is 2 or more, at least one of $Y_{n4}$ represents a single bond or an organic group selected from the group consisting of an oxycarbonyl group, oxycathenylmethylene group, carbonylamino group, carbonyl group and sulfonyl group, a14 and a15 respectively and independently represent an integer of 0 to 4, $R_{22}$ and $R_{23}$ respectively and independently represent a hydrogen atom, fluorine atom or monovalent organic group having 1 to 10 carbon atoms, and in the case a plurality of $R_{22}$ and $R_{23}$ are present, may be mutually the same or different}, and a group represented by the following general formula (10):

[Chemical Formula 24]

(10)

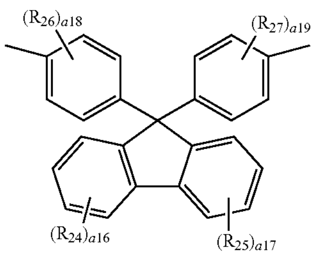

{wherein, a16 to a19 respectively and independently represent an integer of 0 to 4, $R_{24}$ to $R_{27}$ respectively and independently represent a hydrogen atom, fluorine atom or monovalent organic group having 1 to 10 carbon atoms, and in the case a plurality of $R_{24}$ to $R_{27}$ are present, may mutually be the same or different}.

[24] The negative-type photosensitive resin composition described in [22] or [23], wherein at least one of $X_1$ and $X_2$ in general formula (18) is selected from the group consisting of those represented by general formulas (4), (5), (6) and (8), and at least one of $Y_1$ and $Y_2$ in general formula (18) is selected from the group consisting of those represented by general formulas (7), (9) and (10).

[25] The negative-type photosensitive resin composition described in any of [22] to [24], wherein, in general formula (18), at least one of $X_1$ and $X_2$ is represented by general formula (8) and at least one of $Y_1$ and Y2 is represented by general formula (7).

[26] The negative-type photosensitive resin composition described in any of [22] to [25], wherein, in general formula (18), $X_1$ is represented by general formula (8) and $Y_1$ is represented by general formula (7).

[27] The negative-type photosensitive resin composition described in any of [21] to [26], wherein the solvent (C) includes at least one type selected from the group consisting of N-methyl-2-pyrrolidone, γ-butyrolactone, dimethylsulfoxide, tetrahydrofurfuryl alcohol, ethyl acetoacetate, dimethyl succinate, dimethyl malonate, N, N-dimethylacetoacetamide, ε-caprolactone and 1,3-dimethyl-2-imidazolidinone.

[28] The negative-type photosensitive resin composition described in [27], wherein the solvent (C) includes at least two types selected from the group consisting of N-methyl-2-pyrrolidene, γ-butyrolactone, dimethylsulfoxide, tetrahydrofurfuryl alcohol, ethyl acetoacetate, dimethyl succinate, dimethyl malonate, N,N-dimethylacetoacetamide, ε-caprolactone and 1,3-dimethyl-2-imidazolidinone.

[29] The negative-type photosensitive resin composition described in [28], wherein the solvent (C) includes γ-butyrolactone and dimethylsulfoxide.

[30] The negative-type photosensitive resin composition described in any of [1] to [29], wherein the photosensitizer (B) is a photo-radical initiator.

[31] The negative-type photosensitive resin composition described in any of [1] to [30], wherein the photosensitizer (B) contains a component represented by the following general formula (13):

[Chemical Formula 25]

(13)

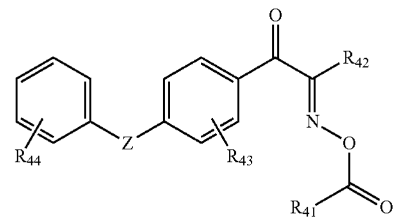

{wherein, Z represents a sulfur atom or oxygen atom, $R_4$; represents a methyl group, phenyl group or divalent organic group, and $R_{42}$ to $R_{44}$ respectively and independently represent a hydrogen atom or monovalent organic group}.

[32] The negative-type photosensitive resin composition described in [31], wherein the component represented by general formula (13) is at least one member selected from the group consisting of compounds represented by the following general formulas (14) to (17).

[Chemical Formula 26]

(14)

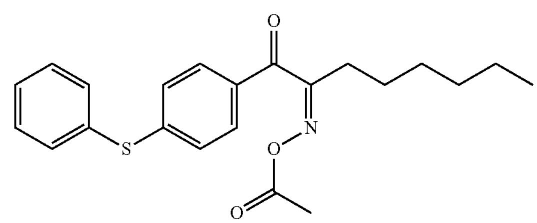

[Chemical Formula 27]

(15)

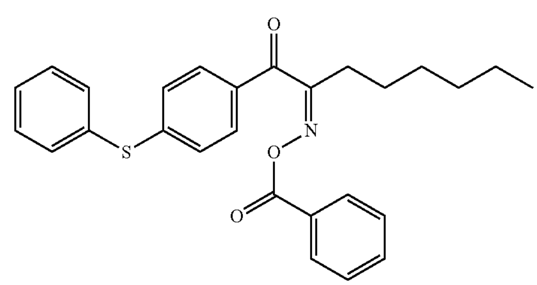

[Chemical Formula 28]

(16)

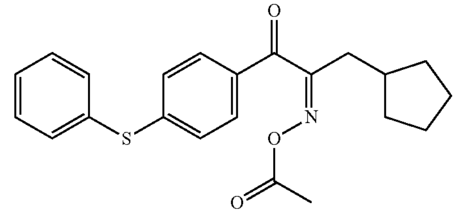

-continued

[Chemical Formula 29]

(17)

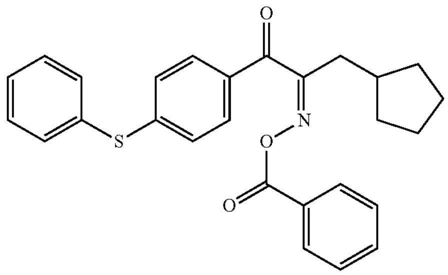

[33] A method for producing a cured relief pattern, including the steps of:

(1) forming a negative-type photosensitive resin layer on a substrate by coating the negative-type photosensitive resin composition described in any of [1] to [32] on the substrate;

(2) exposing the negative-type photosensitive resin layer to light;

(3) forming a relief pattern by developing the photosensitive resin layer after exposing to light; and, (4) forming a cured relief pattern by heat-treating the relief pattern.

[34] A photosensitive resin composition containing a photosensitive polyimide precursor, wherein the focus margin of a rounded-out concave relief pattern is 8 μm or more, the rounded-out concave relief pattern being obtained by going through the following steps (1) to (5) in that order:

(1) spin-coating the resin composition onto a sputtered Cu wafer substrate;

(2) obtaining a spin-coated film having a film thickness of 13 μm by heating a spin-coated wafer substrate on a hot plate for 270 seconds at 110° C.;

(3) exposing a rounded-out concave pattern with a mask size of 8 μm by changing the focus from the surface of the film to the bottom of the film 2 μm at a time using the surface of the spin-coated film as a reference;

(4) forming a relief pattern by developing the exposed wafer; and, (5) heat-treating the developed wafer in a nitrogen atmosphere for 2 hours at 230° C.

[35] The photosensitive resin composition described in [34], wherein the focus margin is 12 μm or more.

[36] The photosensitive resin composition described in [34] or [35], wherein the cross-sectional angle of a cured product of the photosensitive polyimide precursor in the form of a cured relief pattern is 60° to 90°.

[37] The photosensitive resin composition described in any of [34] to [36], wherein the photosensitive polyimide precursor is a polyamic acid derivative having a radical-polymerizable substituent in a side chain thereof.

[38] The photosensitive resin composition described in any of [34] to [37], wherein the photosensitive polyimide precursor contains a structure represented by the following general formula (21):

[Chemical Formula 30]

(21)

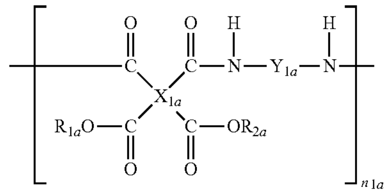

{wherein, $X_{1a}$ represents a tetravalent organic group, $Y_{1a}$ represents a divalent organic group, $n_{1a}$ represents an integer of 2 to 150, and $R_{1a}$ and $R_{2a}$ respectively and independently represent a hydrogen atom, monovalent organic group represented by the following general formula (22):

[Chemical Formula 31]

(22)

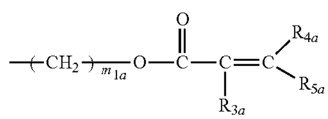

(wherein, $R_{3a}$, $R_{4a}$ and $R_{5a}$ respectively and independently represent a hydrogen atom or organic group having 1 to 3 carbon atoms, and $m_{1a}$ represents an integer of 2 to 10), or a saturated aliphatic group having 1 to 4 carbon atoms, provided that $R_{1a}$ and $R_{2a}$ are not both simultaneously hydrogen atoms}.

[39] The photosensitive resin composition described in [38], wherein, in general formula (21), $X_{1a}$ represents at least one tetravalent organic group selected from the group consisting of the following formulas (23) to (25):

[Chemical Formula 32]

(23)

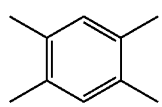

[Chemical Formula 33]

(24)

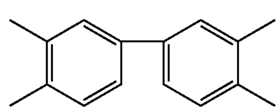

[Chemical Formula 34]

(25)

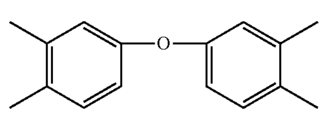

and $Y_{1a}$ represents at least one divalent organic group selected from the group consisting of a group represented by the following general formula (26):

[Chemical Formula 35]

(26)

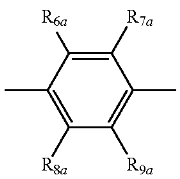

{wherein, $R_{6a}$ to $R_{9a}$ represent hydrogen atoms or monovalent aliphatic groups having 1 to 4 carbon atoms and may mutually be the same or different}, a group represented by the following formula (27):

[Chemical Formula 36]

(27)

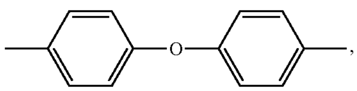

and a group represented by the following formula (28):

[Chemical Formula 37]

(28)

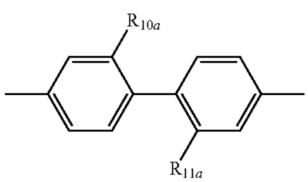

{wherein, $R_{10a}$ and $R_{11a}$ respectively and independently represent a fluorine atom, trifluoromethyl group or methyl group}.

[40] The photosensitive resin composition described in any of [34] to [39], further containing a photopolymerization initiator.

[41] The photosensitive resin composition described in [40], wherein the photopolymerization initiator contains a component represented by the following general formula (29):

[Chemical Formula 38]

(29)

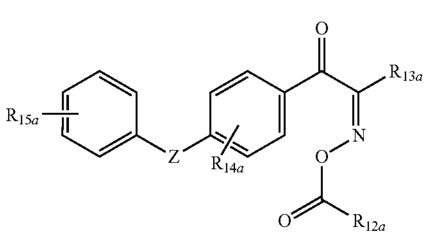

{wherein, Z represents a sulfur atom or oxygen atom, $R_{12a}$ represents a methyl group, phenyl group or divalent organic group, and $R_{13a}$ to $R_{15a}$ respectively and independently represent a hydrogen atom or monovalent organic group}.

[42] The photosensitive resin composition described in any of [34] to [41], further containing an inhibitor.

[43] The photosensitive resin composition described in [42], wherein the inhibitor is at least one type selected from the group consisting of a hindered phenol-type inhibitor and nitroso-type inhibitor.

[44] A method for producing a cured relief pattern including the following steps (6) to (9):

(6) forming a photosensitive resin layer on a substrate by coating the photosensitive resin composition described in any of [34] to [43] on the substrate;

(7) exposing the photosensitive resin layer to light;

(8) forming a relief pattern by developing the photosensitive resin layer after exposing to light; and, (9) forming a cured relief pattern by heat-treating the relief pattern.

[45] The method described in [44], wherein the substrate comprises copper or copper alloy.

Effects of the Invention

According to the present invention, a photosensitive resin composition can be obtained that yields a cured film demonstrating superior adhesion to copper wiring by incorporating a polyimide precursor having a specific structure in a photosensitive resin composition, and a method for producing a cured relief pattern that forms a pattern using the photosensitive resin composition, along with a semiconductor device, can be provided.

MODE FOR CARRYING OUT THE INVENTION

Figure 1A:
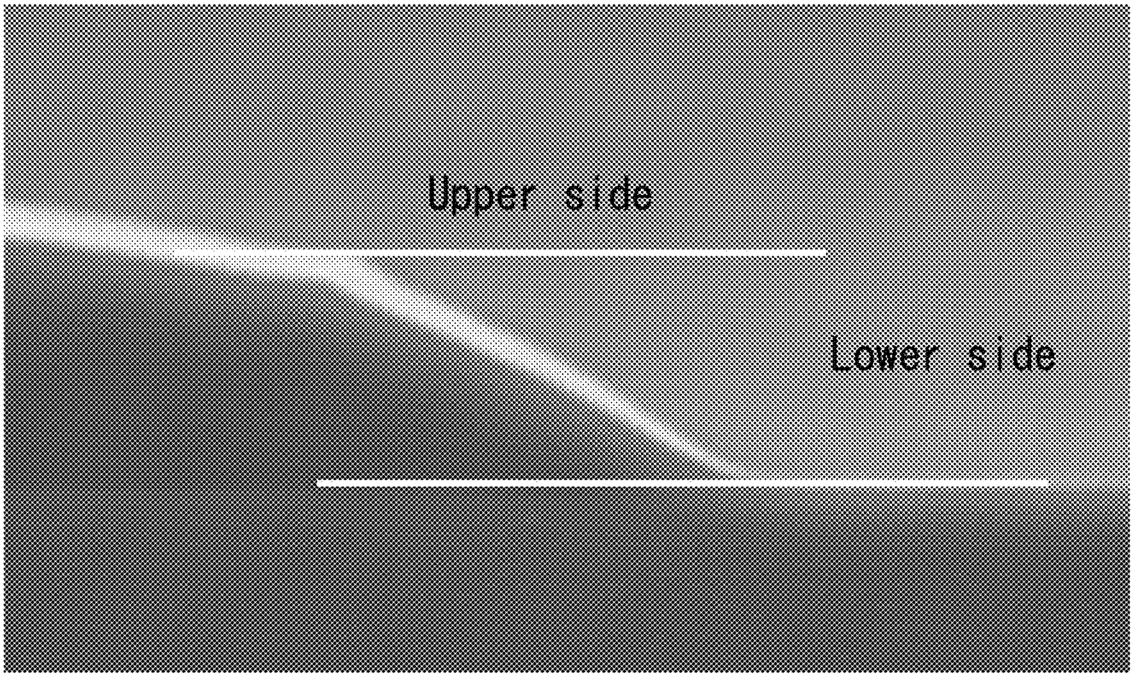
FIG. 1A is a drawing for explaining a cross-sectional angle of a relief pattern of the present invention along with a method for evaluating the same.

The following provides a detailed explanation of the present invention. Furthermore, throughout the present description, structures represented by the same reference symbols in general formulas may be mutually the same or different in the case a plurality thereof is present in a molecule.

[First Aspect]

A first aspect of the present invention is a photosensitive resin composition as indicated below.

<Photosensitive Resin Composition>

In an embodiment of the present invention, a photosensitive resin composition has for essential components thereof a polyimide precursor (A) having a specific structure and a photosensitive component (B). Thus, the following provides an explanation of the polyimide precursor (A) having a specific structure, the photosensitive component (B) and other components.

(A) Polyimide Precursor Resin

The following provides an explanation of the resin (A) used in the present invention. The resin (A) of the present invention is a polyimide precursor in the form of a polyamic acid, polyamic acid ester or polyamic acid salt represented by the following general formula (1):

[Chemical Formula 39]

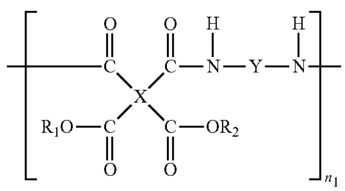

(1)

{wherein, X represents a tetravalent organic group, Y represents a divalent organic group, $n_1$ represents an integer of 2 to 150, and $R_1$ and $R_2$ respectively and independently represent a hydrogen atom, saturated aliphatic group having 1 to 30 carbon atoms, aromatic group, monovalent organic group represented by the following general formula (2):

[Chemical Formula 40]

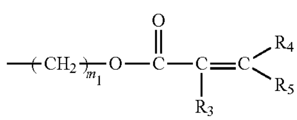

(2)

(wherein, $R_3$, $R_4$ and $R_5$ respectively and independently represent a hydrogen atom or organic group having 1 to 3 carbon atoms, and $m_1$ represents an integer of 2 to 10), or monovalent ammonium ion represented by the following general formula (3):

[Chemical Formula 41]

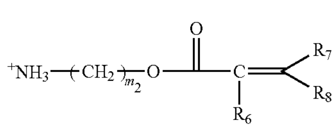

(3)

(wherein, $R_6$, $R_7$ and $R_8$ respectively and independently represent a hydrogen atom or organic group having 1 to 3 carbon atoms, and $m_2$ represents an integer of 2 to 10)}.

The present invention is characterized by the combined use of at least one of the following resins (A1) to (A3) and the following resin (A4) as resins preferably used in the present invention in this polyimide precursor.

As a specific example thereof, (A1) is a resin in which X in general formula (1) contains a structure represented by the following general formula (4), (5) or (6), and Y in general formula (1) contains a structure represented by the following general formula (7).

Here, X in general formula (1) contains a structure represented by general formula (4):

[Chemical Formula 42]

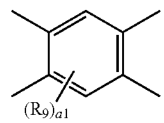

(4)

{wherein, a1 represents an integer of 0 to 2, $R_9$ represents a hydrogen atom, fluorine atom or monovalent organic group having 1 to 10 carbon atoms, and in the case a plurality of $R_9$ are present, may be mutually the same or different}, a structure represented by the following general formula (5):

[Chemical Formula 43]

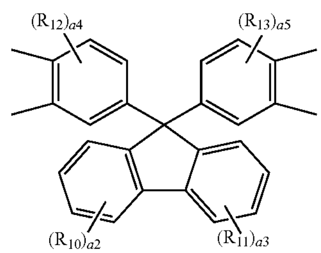

(5)

{wherein, a2 and a3 respectively and independently represent an integer of 0 to 4, a4 and a5 respectively and independently represent an integer of 0 to 3, $R_{10}$ to $R_{13}$ respectively and independently represent a hydrogen atom, fluorine atom or monovalent organic group having 1 to 10 carbon atoms, and in the case a plurality of $R_{10}$ to $R_{13}$ are present, may mutually be the same or different}, or a structure represented by the following general formula (6):

[Chemical Formula 44]

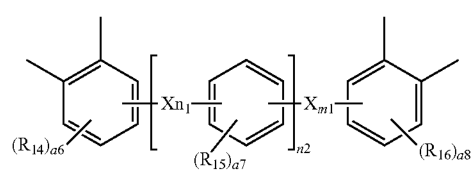

(6)

{wherein, n2 represents an integer of 0 to 5, $X_{n3}$ represents a single bond or divalent organic group, in the case a plurality of $X_{n1}$ are present, may mutually be the same or different, $X_{m1}$ represents a single bond or divalent organic group, at least one of $X_{m1}$ or $X_{n1}$ represents a single bond or an organic group selected from the group consisting of an oxycarbonyl group, oxycathenylmethylene group, carbonylamino group, carbonyl group and sulfonyl group, a6 and a8 respectively and independently represent an integer of 0 to 3, a7 represents an integer of 0 to 4, $R_{14}$, $R_{15}$ and $R_{16}$ respectively and independently represent a hydrogen atom, fluorine atom or monovalent organic group having 1 to 10 carbon atoms, and in the case a plurality of $R_{14}$, $R_{15}$ and $R_{16}$ are present, may mutually be the same or different}; and, Y in general formula (1) contains a structure represented by the following general formula (7):

[Chemical Formula 45]

(7)

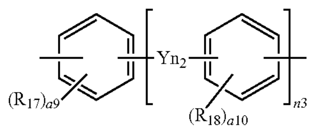

{wherein, n3 represents an integer of 1 to 5, $Y_{n2}$ represents an organic group having 1 to 10 carbon atoms that may contain a fluorine atom but does not contain a heteroatom other than fluorine, an oxygen atom or a sulfur atom, in the case a plurality of $Y_{n2}$ are present, may mutually be the same or different, a9 and a10 respectively and independently represent an integer of 0 to 4, $R_{17}$ and $R_{18}$ respectively and independently represent a hydrogen atom, fluorine atom or monovalent organic group having 1 to 10 carbon atoms, and in the case a plurality of $R_{17}$ and $R_{18}$ are present, may mutually be the same or different}.

In addition, resin (A2) is a resin in which X in general formula (1) contains a structure represented by the following general formula (8) and Y in general formula (1) contains a structure represented by the following general formula (9) or (10). Here, X contains a structure represented by general formula (8):

[Chemical Formula 46]

(8)

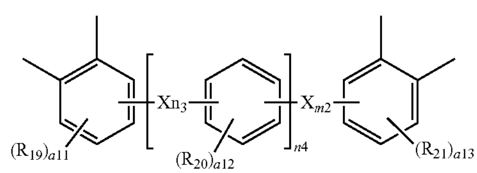

{wherein, n4 represents an integer of 0 to 5, $X_{m2}$ and $X_{n3}$ respectively and independently represent an organic group having 1 to 10 carbon atoms that may contain a fluorine atom but does not contain a heteroatom other than fluorine, an oxygen atom or a sulfur atom, in the case of a plurality of $X_{n3}$ are present, may be mutually the same or different, a11 and a13 respectively and independently represent an integer of 0 to 3, a12 represents an integer of 0 to 4, $R_{19}$, $R_{20}$ and $R_{21}$ respectively and independently represent a hydrogen atom, fluorine atom or monovalent organic group having 1 to 10 carbon atoms, and in the case of a plurality of $R_{19}$, $R_{20}$ and $R_{21}$ are present, may mutually be the same or different}, and Y in general formula (1) contains a structure represented by the following general formula (9):

[Chemical Formula 47]

(9)

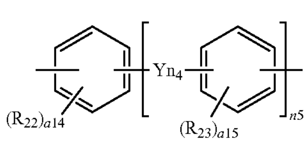

{wherein, n5 represents an integer of 0 to 5, $Y_{n4}$ represents a single bond or a divalent organic group, in the case of a plurality of $Y_{n4}$ are present, may be mutually the same or different, in the case n4 is 1 or more, at least one of $Y_{n4}$ represents a single bond or an organic group selected from the group consisting of an oxycarbonyl group, oxycarbonylmethylene group, carbonylamino group, carbonyl group and sulfonyl group, a14 and a15 respectively and independently represent an integer of 0 to 4, $R_{22}$ and $R_{23}$ respectively and independently represent a hydrogen atom, fluorine atom or monovalent organic group having 1 to 10 carbon atoms, and in the case a plurality of $R_{22}$ and $R_{23}$ are present, may be mutually the same or different}, or a structure represented by the following general formula (10):

[Chemical Formula 48]

(10)

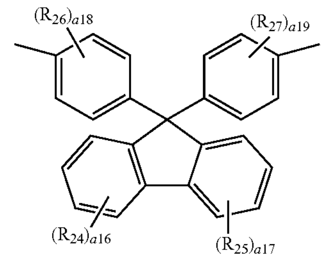

{wherein, a16 to a19 respectively and independently represent an integer of 0 to 4, $R_{24}$ to $R_{27}$ respectively and independently represent a hydrogen atom, fluorine atom or monovalent organic group having 1 to 10 carbon atoms, and in the case a plurality of $R_{24}$ to $R_{27}$ are present, may mutually be the same or different}.

In addition, resin (A3) is a resin in which X in general formula (1) contains a structure represented by formula (4), (5) or (6) and Y in general formula (1) contains a structure represented by formula (9) or (10).

Moreover, resin (A4) is a resin in which X in general formula (1) contains a structure represented by general formula (8) and Y in general formula (1) contains a structure represented by general formula (7).

As has been described above, in the present invention, the combination of resins is a combination comprising at least one of resin (A1), (A2) or (A3) and resin (A4).

The structure represented by general formula (6) is preferably a structure selected from the following group (XI) from the viewpoint of adhesion:

[Chemical Formula 49]

(X1)

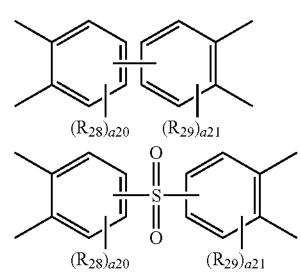

-continued

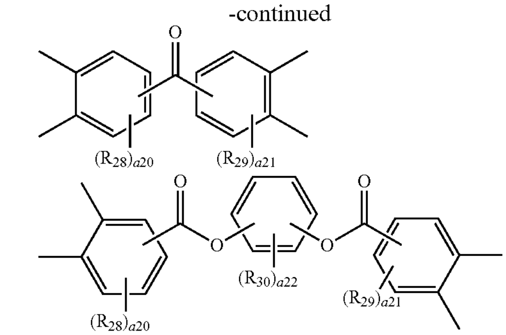

{wherein, a20 and a21 respectively and independently represent an integer of 0 to 3, a22 represents an integer of 0 to 4, $R_{28}$ to $R_{30}$ respectively and independently represent a hydrogen atom, fluorine atom or monovalent organic group having 1 to 10 carbon atoms, and in the case a plurality of $R_{28}$ to $R_{30}$ are present, may be mutually the same or different}.

The structure represented by general formula (7) is preferably a structure selected form the following group (Y1) from the viewpoint of adhesion:

[Chemical Formula 50]

(Y1)

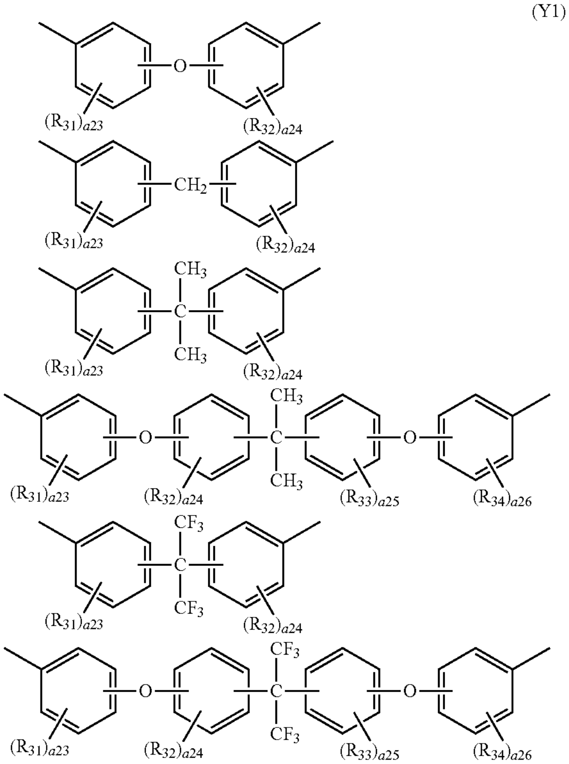

{wherein, a23 to a26 respectively and independently represent an integer of 0 to 4, $R_{31}$ to $R_{34}$ respectively and independently represent a hydrogen atom, fluorine atom or monovalent organic group having 1 to 10 carbon atoms, and in the case a plurality of $R_{31}$ to $R_{34}$ are present, may be mutually the same or different}.

In addition, the structure represented by general formula (8) is preferably a structure selected from the following group (X2) from the viewpoint of adhesion:

[Chemical Formula 51]

(X2)

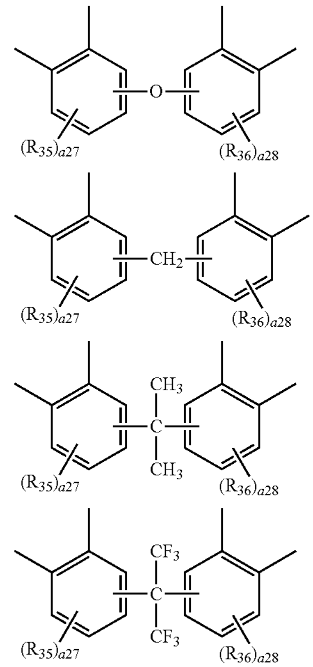

{wherein, a27 and a28 respectively and independently represent an integer of 0 to 3, $R_{35}$ and $R_{36}$ respectively and independently represent a hydrogen atom, fluorine atom or monovalent organic group having 1 to 10 carbon atoms, and in the case a plurality of $R_{35}$ and $R_{36}$ are present, may be mutually the same or different}.

Moreover, the structure represented by general formula (9) is preferably a structure represented by the following group (Y2) from the viewpoint of adhesion:

[Chemical Formula 52]

(Y2)

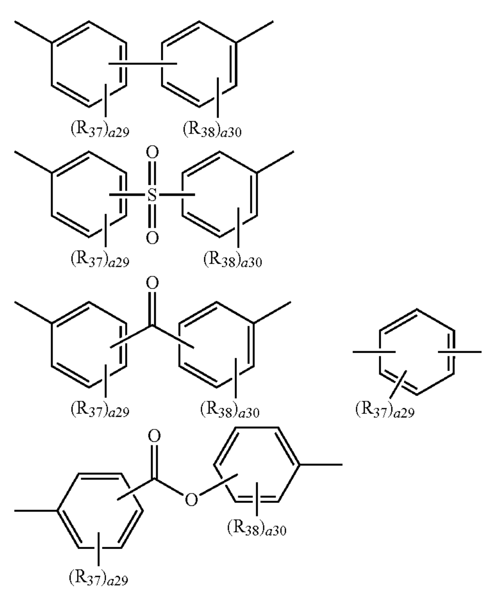

-continued

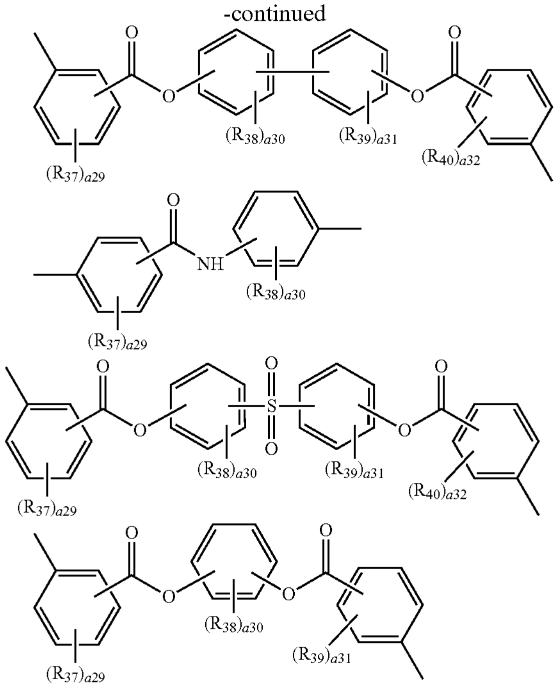

{wherein, a29 to a32 respectively and independently represent an integer of 0 to 4, $R_{37}$ to $R_{40}$ respectively and independently represent a hydrogen atom, fluorine atom or monovalent organic group having 1 to 10 carbon atoms, and in the case a plurality of $R_{37}$ to $R_{40}$ are present, may be mutually the same or different}.

Although there are no particular limitations on X in general formula (1) of resin (A1) provided it contains a structure represented by general formula (4), (5) or (6), from the viewpoint of adhesion, a structure represented by general formula (4), (5) or (6) preferably accounts for 50 mol % or more of X and more preferably accounts for 80 mol % or more.

Although there are no particular limitations on Y in general formula (1) of resin (A1) provided it contains a structure represented by general formula (7), from the viewpoint of adhesion, a structure represented by general formula (7) preferably accounts for 50 mol % or more of Y and more preferably accounts for 80 mol % or more.

Although there are no particular limitations on X in general formula (1) of resin (A2) provided it contains a structure represented by general formula (8), from the viewpoint of adhesion, a structure represented by general formula (8) preferably accounts for 50 mol % or more of X and more preferably accounts for 80 mol % or more.

Although there are no particular limitations on Y in general formula (1) of resin (A2) provided it contains a structure represented by general formula (9) or (10), from the viewpoint of adhesion, a structure represented by general formula (9) or (10) preferably accounts for 50 mol % or more of Y and more preferably accounts for 80 mol % or more.

Although there are no particular limitations on X in general formula (1) of resin (A3) provided it contains a structure represented by general formula (4), (5) or (6), from the viewpoint of adhesion, a structure represented by general formula (4), (5) or (6) preferably accounts for 50 mol % or more of X and more preferably accounts for 80 mol %; or more.

Although there are no particular limitations on Y in general formula (1) of resin (A3) provided it contains a structure represented by general formula (9) or (10), from the viewpoint of adhesion, a structure represented by general formula (9) or (10) preferably accounts for 50 mol % or more of Y and more preferably accounts for 80 mol % or more.

Although there are no particular limitations on X in general formula (1) of resin (A4) provided it contains a structure represented by general formula (7), from the viewpoint of adhesion, a structure represented by general formula (7) preferably accounts for 50 mol % or more of X and more preferably accounts for 80 mol % or more.

Although there are no particular limitations on Y in general formula (1) of resin (A4) provided it contains a structure represented by general formula (8), from the viewpoint of adhesion, a structure represented by general formula (8) preferably accounts for 50 mol % or more of Y and more preferably accounts for 80 mol % or more.

Although there are no particular limitations on the proportions of resins (A1) to (A4) in component (A), from the viewpoint of adhesion, the total weight thereof preferably accounts for 50 mol % or more, and more preferably accounts for 80 mol % or more, of the total weight of component (A).

The parts by weight of resin (A4) are preferably 10% to 90% of the sum of the weights of resins (A1) to (A4) from the viewpoint of adhesion.

Although the reason for the improvement of adhesion resulting from mixing resin (A4) with at least one the resins (A1) to (A3) is not certain, the inventors of the present invention have surmised this to be attributable to that indicated below.

Although resins (A1) to (A3) have numerous structures such as biphenyl groups or polar groups within their polymers that promote interaction between molecules, resin (A4) has few groups capable of interacting between molecules. Thus, resins (A1) to (A3) mutually aggregate due to interaction within their resin films, enabling them to form portions having a somewhat high glass transition temperature and portions having a low glass transition temperature within their resin films. These portions are in a relationship in the manner of a tackifier and elastomer of a hot melt adhesive as used in the field of adhesives during heat curing, and this is thought to result in improved adhesion.

Examples of methods used to impart photosensitivity to a resin composition using a polyimide precursor include ester bonding and ionic bonding. The former is a method consisting of introducing a photopolymerizable group, or in other words, a compound having an olefinic double bond, into a side chain of a polyimide precursor by ester bonding, while the latter is a method consisting of imparting a photopolymerizable group by bonding an amino group of (meth)acrylic compound having an amino group with a carboxyl group of a polyimide precursor through an ionic bond.

The aforementioned ester-bonded polyimide precursor is obtained by first preparing a partially esterified tetracarboxylic acid (to also be referred to as an acid/ester form) by reacting a tetracarboxylic dianhydride containing the tetravalent organic group X in general formula (1) with an alcohol having photopolymerizable unsaturated double bond, and optionally, a saturated aliphatic alcohol having 1 to 4 carbon atoms, followed by subjecting this to amide polycondensation with a diamine containing the divalent organic group Y in general formula (1).

(Preparation of Acid/Ester Form)

In the present invention, examples of the tetracarboxylic dianhydride containing the tetravalent organic group X preferably used to prepare the ester-bonded polyimide precursor that forms a structure represented by general formula (4) include pyromellitic anhydride. Examples of those that form a structure represented by general formula (5) include 9,9-bis(3,4-dicarboxyphenyl)fluorene dianhydride. Examples of those that form a structure represented by general formula (6) include benzophenone-3,3',4,4'-tetracarboxylic dianhydride, biphenyl-3,3'4,4'-tetracarboxylic dianhydride, diphenylphosphone-3,3',4,4'-tetracarboxylic dianhydride and p-phenylenebis(trimellitate anhydride). Examples of those that form a structure represented by general formula (8) include, but are not limited to diphenylether-3,3',4,4'-tetracarboxylic dianhydride, diphenylether-2,2',3,3'-tetracarboxlic dianhydride, diphenylmethane-3,3'4, 4'-tetracarboxylic dianhydride, 2,2-bis(3,4-phthalic anhydride)propane and 2,2-bis(3,4-phthalic anhydride)-1,1, 1,3,3,3-hexafluoropropane. In addition, these can naturally be used alone or two or more types may be used as a mixture. From the viewpoint of adhesion, phenylethyl-3,3',4,4'-tetracarboxylic dianhydride is particularly preferable as an acid anhydride that forms a structure represented by general formula (8).

It is more preferable that 50 mol % or more of the acid anhydride represented as structure X in general formula (1) of the aforementioned resin (A4) is 4,4'-oxydiphthalic dianhydride, and 80 mol % or more of the diamine represented as structure Y in general formula (1) of resin (A4) is 4,4'-diaminodiphenyl ether.

In addition, It is more preferable that 80 mol % or more of the acid anhydride represented as structure X in general formula (1) of the aforementioned resin (A4) is 4,4'-oxydiphthalic dianhydride, and 80 mol % or more of the diamine represented as structure Y in general formula (1) of resin (A4) is 4,4'-diaminodiphenyl ether.

In the present invention, examples of alcohols having a photopolymerizable unsaturated double bond preferably used to prepare the ester-bonded polyimide precursor include 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butyoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, methylol vinyl ketone, 2-hydroxyethyl vinyl ketone, 2-hydroxy-3-methoxyopropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

Alcohols such as methanol, ethanol, n-propanol, isopropanol, n-butanol or tert-butanol can also be used by mixing a portion thereof with the aforementioned alcohols.

In the present embodiment, a copolymer represented by the following general formula (18) can also be used for the polyimide precursor (A):

[Chemical Formula 53]

(18)

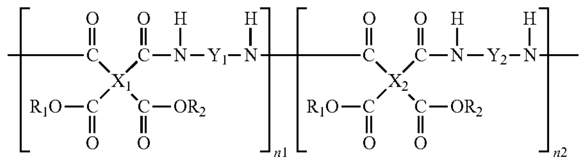

{wherein, $X_1$ and $X_2$ respectively and independently represent a tetravalent organic group, $Y_1$ and $Y_2$ respectively and independently represent a divalent organic group, n1 and n2 respectively and independently represent an integer of 2 to 150, and $R_1$ and $R_2$ respectively and independently represent a hydrogen atom, saturated aliphatic group having 1 to 30 carbon atoms, aromatic group, monovalent organic group represented by the general formula (2) or monovalent ammonium ion represented by general formula (3), provided that $X_1$ and $X_2$ are not the same and $Y_1$ and $Y_2$ are not the same}.

Although there are no particular limitations on $X_2$ and $X_2$ according to the present embodiment provided they are tetravalent organic groups, they are respectively and independently preferably one type selected from the group consisting of groups represented by the aforementioned general formulas (4), (5), (6) and (8) from the viewpoints of copper adhesion and chemical resistance.

Although there are no particular limitations on $Y_1$ and $Y_2$ according to the present embodiment provided they are tetravalent organic groups, they are respectively and independently preferably one type selected from the group consisting of groups represented by the aforementioned general formulas (7), (9) and (10) from the viewpoints of copper adhesion and chemical resistance.

Among these, preferably group $X_1$ is represented by general formula (8) and group $Y_1$ is represented by general formula (7) form the viewpoints of copper adhesion and chemical resistance, and more preferably group $X_1$ is represented by general formula (8), group $X_2$ is represented by one type selected from the group consisting of groups represented by general formulas (4), (5) and (6), group, group $Y_1$ is represented by general formula (7), and group $Y_2$ is represented by one type selected from the group consisting of groups represented by general formulas (9) and (10) from the viewpoints of copper adhesion and chemical resistance.

A desired acid/ester form can be obtained by carrying out an acid anhydride esterification reaction by dissolving and mixing the aforementioned preferable tetracarboxylic dianhydride of the present invention with an aforementioned alcohol in the presence of a basic catalyst such as pyridine and in a suitable reaction solvent followed by stirring for 4 to 10 hours at a temperature of 20° C. to 50° C.

A reaction solvent that completely dissolves the acid/ester form and the polyimide precursor, which is the amide polycondensation product of the acid/ester form and a diamine component, is preferable for the aforementioned reaction solvent, and examples thereof include N-methyl-2-pyrrolidone, N,N-dimethylacetoamide, N,N-dimethylformamide, dimethylsulfoxide, tetramethyl urea and γ-butyrolactone.

Examples of other reaction solvents include ketones, esters, lactones, ethers and halogenated hydrocarbons, and examples of hydrocarbons include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene. These may be used alone or two or more types may be used as a mixture as necessary.

(Preparation of Polyimide Precursor)

After converting the acid/ester form to a polyacid anhydride by adding a suitable dehydration condensation agent such as dicyclocarbodiimide, 1-ethoxycarbonyl-2-ethoxy-1,2-dihydroquinoline, 1,1-carbonyldioxy-di-1,2,3-benzotriazole or N,N'-disuccinimidyl carbonate to the aforementioned acid/ester form (typically in the form of a solution of the aforementioned reaction solvent) while cooling with ice and mixing therewith, a solution or dispersion of a diamine containing the divalent organic group Y preferably used in the present invention dissolved or dispersed in a different solvent is dropped therein followed by amide polycondensation to obtain the target polyimide precursor.

Examples of diamines containing the divalent organic group Y preferably used in the present invention that form a structure represented by general formula (7) include 4,4-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 1,4-bis(4-aminophenoxy)benzene, 1,3-bis(4-aminophenoxy)benzene, 1,3-bis(3-aminophenoxy)benzene, bis[4-(4-aminophenoxy)phenyl]ether, bis[4-(3-aminophenoxy)phenyl] ether, 2,2-bis(aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane and those in which a portion of the hydrogen atoms on the benzene ring thereof is substituted with a substituent such as a methyl group, ethyl group, trifluoromethyl group, hydroxymethyl group, hydroxyethyl group or halogen atom, such as 3,3'-dimethyl-4,4'-diaminodiphenylmethane or 2,2'-dimethyl-4,4'-diaminodiphenylmethane. Examples those that form a structure represented by general formula (9) include p-phenylenediamine, m-phenylenediamine, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, bis[4-(4-aminophenoxy)phenyl] sulfone, bis[4-(3-aminophenoxy)phenyl]sulfone, 4,4-bis(4-aminophenoxy)biphenyl, 4,4-bis(3-aminophenoxy) biphenyl, 1,4-bis(4-aminophenyl)benzene, 1,3-bis(4-aminophenyl)benzene, o-toluidine sulfone, 4-aminophenyl-4'-aminobenzoate, 4,4'-diaminobenzanilide and those in which a portion of the hydrogen atoms on the benzene ring thereof is substituted with a substituent such as a methyl group, ethyl group, trifluoromethyl group, hydroxymethyl group, hydroxyethyl group or halogen atom, such as 2,2'-dimethyl-4,4'-diaminobiphenyl, 2,2'-bis(trifluoromethyl) benzidine, 3,3'-dimethoxy-4,4'-diaminobiphenyl or 3,3'-dichloro-4,4'-diaminobiphenyl. Examples of those that form a structure represented by general formula (10) include, but are not limited to, 9,9-bis(4-aminophenyl)fluorene.

As was previously described, in the present invention, in those compounds represented by structure X in general formula (1) of resin (A1), 50 mol % or more is more preferably a structure represented by general formula (4), (5) or (6), and in diamines represented by structure Y in general formula (1), 50 mol % or more is more preferably 4,4'-diaminodiphenyl ether.

In addition, in acid dianhydrides represented by structure X in general formula (1) of resin (A2), 50 mol $ or more is more preferably 4,4'-oxydiphthalic dianhydride, and in diamines represented by structure Y in general formula (1), 50 mol % or more is more preferably a structure represented by general formula (9) or (10).

In addition, a diaminosiloxane such as 1,3-bis(3-aminopropyl)tetramethyldisiloxane or 1,3-bis(3-aminopropyl)tetraphenyldisiloxane can be copolymerized when preparing the polyimide precursor for the purpose of improving adhesion between various types of substrates and the resin layer formed on a substrate by coating the photosensitive resin composition of the present invention on a substrate.

Following completion of the amide polycondensation reaction, the polymer can be purified by filtering out absorption byproducts of the dehydration condensation agent also present in the reaction solution as necessary, followed by adding a poor solvent such as water, an aliphatic lower alcohol or a mixture thereof to the resulting polymer component, precipitating the polymer component, and further repeating re-dissolution and re-precipitation procedures and vacuum drying to isolate the target polyimide precursor. In order to improve the degree of purification, a solution of this polymer may be passed through a column packed with an anion and/or cation exchange resin swollen with a suitable organic solvent to remove any ionic impurities.

On the other hand, the aforementioned ionic-bonded polyimide precursor is typically obtained by reacting a diamine with a tetracarboxylic dianhydride. In this case, at least one of $R_1$ and $R_2$ in the aforementioned general formula (1) is a hydrogen atom.

A tetracarboxylic dianhydride containing a structure of the aforementioned group (XI) is preferable for the tetracarboxylic dianhydride for resins (A1) and (A3), while an anhydride of a tetracarboxylic acid containing a structure of the aforementioned group (X2) is preferable for resins (A2) and (A4). A tetracarboxylic anhydride containing a structure of the aforementioned group (Y1) is preferable as diamine for resins (A1) and (A4), while a diamine containing a structure of the aforementioned group (Y2) is preferable for resins (A2) and (A3). The addition of a (meth)acrylic compound having an amino group to be subsequently described to the resulting polyamic acid results in the formation of a salt due to ionic bonding between a carboxyl group of the polyamic acid and an amino group of the (meth)acrylic compound having an amino group, resulting in a polyamic acid salt imparted with a photopolymerizable group.

A dialkylaminoacrylate or dialkylaminomethacrylate such as dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, diethylaminopropyl acrylate, diethylaminopropyl methacrylate, dimethylaminobutyl acrylate, dimethylaminobutyl methacrylate, diethylaminobutyl acrylate or diethylaminobutyl methacrylate is preferable for the (meth)acrylic compound having an amino group, and among these, a dialkylaminoacrylate or dialkylaminomethacrylate, in which the alkyl group on the amino group has 1 to 10 carbon atoms and the alkyl chain has 1 to 10 carbon atoms, is preferable from the viewpoint of photosensitivity.

The incorporated amount of these (meth)acrylic compounds having an amino group based on 100 parts by weight of the resin (A) is 1 part by weight to 20 parts by weight and preferably 2 parts by weight to 15 parts by weight form the viewpoint of photosensitivity. The incorporation of 1 part by weight or more of the photosensitizer (B) in the form of the (meth)acrylic compound having an amino group based on 100 parts by weight of the resin (A) results in superior photosensitivity, while the incorporation of 20 parts by weight or less resulting in superior thick film curability.

The molecular weight of the aforementioned ester-bonded and ionic-bonded polyimide precursors in the case of measuring by gel permeation chromatography based on standard polystyrene conversion is preferably 8,000 to 150,000 and more preferably 9,000 to 50,000. Mechanical properties are favorable in the case of a weight average molecular weight of 8,000 or more, while dispersibility in developer and resolution of the relief pattern are favorable in the case of a weight average molecular weight of 150,000 or less. The use of tetrahydrofuran or N-methyl-2-pyrrolidone is recommended for the developing solvent during gel permeation chromatography. In addition, weight average molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

[Photosensitive Component (B)]

Next, an explanation is provided of the photosensitive component (B) used in the present invention.

A photopolymerization initiator and/or photoacid generator that generates radicals by absorbing and decomposing at a specific wavelength is preferably used for the photosensitive component (B). The incorporated amount of the photosensitive component (B) in the photosensitive resin composition is 1 part by weight to 50 parts by weight based on 100 parts by weight of the resin (A). Photosensitivity and patterning properties are demonstrated when incorporated at 1 part by weight or more, while the properties of the photosensitive resin layer improve after curing when incorporated at 50 parts by weight or less.

In the case of a photopolymerization initiator, the resin (A) is cured by radicals generated by a chain transfer reaction with the main chain backbone of the resin (A) or by a radical polymerization reaction with a (meth)acrylate group introduced into the resin (A).

The photopolymerization initiator used for the photosensitizer (B) is preferably a photo-radical polymerization initiator, and preferable examples thereof include, but are not limited to, photoacid generators in the manner of benzophenone derivatives such as benzophenone and benzophenone derivatives such as methyl o-benzoyl benzoate, 4-benzoyl-4'-methyl diphenyl ketone, dibenzyl ketone or fluorenone, acetophenone derivatives such as 2,2'-diethoxyacetophenone, 2-hydroxy-2-methylpropiophenone or 1-hydroxycyclohexyl phenyl ketone, thioxanthone and thioxanthone derivatives such as 2-methylthioxanthone, 2-isopropylthioxanthone or diethylthioxanthone, benzyl and benzyl derivatives such as benzyldimethylketal or benzyl-β-methoxyethylacetal, benzoin and benzoin derivatives such as benzoin methyl ether, oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime or 1-phenyl-3-ethoxypropanetrione-2-(o-benzoyl)oxime, N-arylglycines such as N-phenylglycine, peroxides such as benzoyl peroxide, aromatic biimidazoles, titanocenes or α-(n-octanesulfonyloxyimino)-4-methoxybenzyl cyanide. Among the aforementioned photopolymerization initiators, oximes are more preferable particularly from the viewpoint of photosensitivity.

Among the aforementioned oxime photopolymerization initiators, those having a structure represented by the following general formula (13) are more preferable, and those having a structure represented by any of the following formulas (14) to (17) are most preferable from the viewpoint of adhesion:

[Chemical Formula 54]

(13)

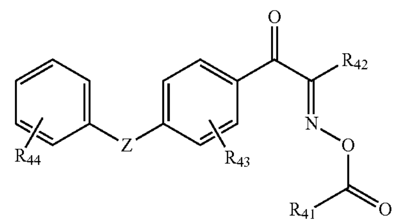

{wherein, Z represents a sulfur atom or oxygen atom, $R_{41}$ represents a methyl group, phenyl group or divalent organic group, and $R_{42}$ to $R_{44}$ respectively and independently represent a hydrogen atom or monovalent organic group.}

[Chemical Formula 55]

(14)

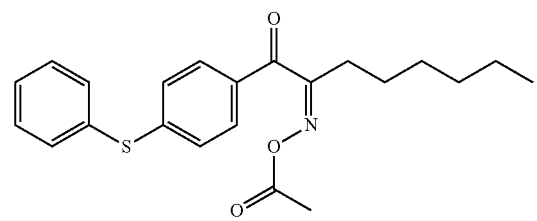

[Chemical Formula 56]

(15)

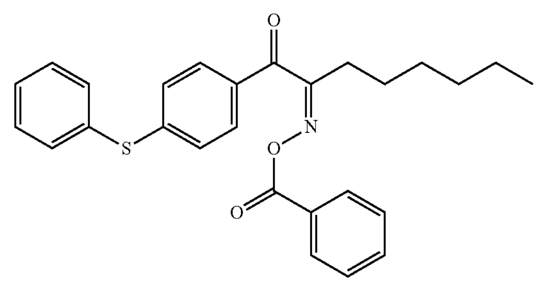

[Chemical Formula 57]

(16)

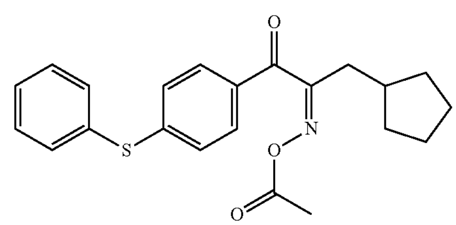

-continued

[Chemical Formula 58]

(17)

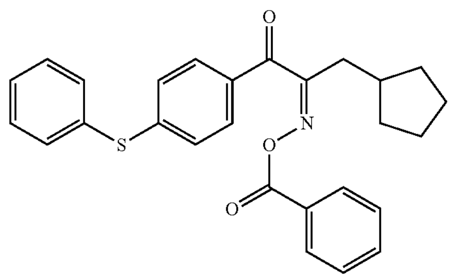

In the case of using a photoacid generator for the photosensitive component (B) in a negative-type photosensitive resin composition, in addition to the photoacid generator demonstrating acidity by irradiating with an active light beam in the manner of ultraviolet light, due to that action, it has the effect of causing a component (D) to be subsequently described in the form of a crosslinking agent to crosslink with a resin in the form of component (A) or causing polymerization of crosslinking agents. Examples of photoacid generators used include diaryl sulfonium salts, triazole sulfonium salts, dialkyl phenacyl sulfonium salts, diaryl iodonium salts, aryl diazonium salts, aromatic tetracarboxylic acid esters, aromatic sulfonic acid esters, nitrobenzyl esters, oxime sulfonic acid esters, aromatic N-oxyimidosulfonates, aromatic sulfamides, haloalkyl group-containing hydrocarbon-based compounds, haloalkyl group-containing heterocyclic compounds and naphthoquinone diazido-4-sulfonic acid esters. Two or more types of these compounds can be used in combination or in combination with other sensitizers as necessary. Among the aforementioned photoacid generators, aromatic oxime sulfonic acid esters and aromatic N-oxyimidosulfonates are more preferable from the viewpoint of photosensitivity in particular.

(C) Solvent

The photosensitive resin composition of the present invention may also contain a solvent (C) in order to use as a solution of the photosensitive resin composition by dissolving each component of the photosensitive resin composition to form a varnish. From the viewpoint of solubility in the resin (A), a polar organic solvent is preferably used as solvent. More specifically, the solvent is a solvent that contains the previously described solvents (reaction solvents), examples thereof include N,N-dimethylformamide, N-methyl-2-pyrrolidone, N-ethyl-2-pyrrolidone, N,N-dimethylacetoamide, dimethylsulfoxide, diethylene glycol dimethyl ether, cyclopentanone, γ-butyrolactone, α-acetyl-γ-butyrolactone, tetramethyl urea, 1,3-dimethyl-2-imidazolinone, N-cyclohexyl-2-pyrrolidone, tetrahydrofurfuryl alcohol, ethyl acetoacetate, dimethyl succinate, dimethyl malonate, N,N-dimethylacetoacetamide, ε-caprolactone and 1,3-dimethyl-2-imidazolidinone, and these can be used alone or two or more types can be used in combination.

In particular, the use of at least two types selected from the group consisting of γ-butyrolactone, dimethylsulfoxide, tetrahydrofurfuryl alcohol, ethyl acetoacetate, dimethyl succinate, dimethyl malonate, N,N-dimethylacetoacetamide, ε-caprolactone, and 1,3-dimethyl-2-imidazolidinone is preferable from the viewpoint of copper adhesion.

The aforementioned solvent can be used within the range of, for example, 30 parts by weight to 1500 parts by weight, and preferably within the range of 100 parts by weight to 1000 parts by weight, based on 100 parts by weight of the resin (A) corresponding to the desired coated film thickness and viscosity of the photosensitive resin composition.

Moreover, the solvent may contain a solvent containing an alcohol from the viewpoint of improving storage stability of the photosensitive resin composition. Alcohols able to be used are typically alcohols that have an alcoholic hydroxyl group but do not have an olefinic double bond within a molecule thereof, and specific examples thereof include alkyl alcohols such as methyl alcohol, ethyl alcohol, n-propyl alcohol, isopropyl alcohol, n-butyl alcohol, isobutyl alcohol or tert-butyl alcohol, lactic acid esters such as ethyl lactate, propylene glycol monoalkyl ethers such as propylene glycol 1-methyl ether, propylene glycol 2-methyl ether, propylene glycol 1-ethyl ether, propylene glycol 2-ethyl ether, propylene glycol 1-(n-propyl) ether or propylene glycol 2-(n-propyl) ether, monoalcohols such as ethylene glycol methyl ether, ethylene glycol ethyl ether or ethylene glycol n-propyl ether, 2-hydroxyisobutyric acid esters, and dialcohols such as ethylene glycol and propylene glycol. Among these, lactic acid esters, propylene glycol monoalkyl ethers, 2-hydroxyisobutyric acid esters and ethyl alcohol are preferable, and in particular, ethyl lactate, propylene glycol 1-methyl ether, propylene glycol 1-ethyl ether and propylene glycol 1-(n-propyl) ether are more preferable.

In the case the solvent contains an alcohol that does not have an olefinic double bond, the content of alcohol not having an olefinic double bond present in the entire solvent is preferably 5% by weight to 50% by weight and more preferably 10% by weight to 30% by weight. In the case the aforementioned content of the alcohol not having an olefinic double bond is 5% by weight or more, storage stability of the photosensitive resin composition is favorable, while in the case the content thereof is 50% by weight or less, solubility of the resin (A) is favorable.

In the case of using two or more types of the aforementioned solvent (C) in combination, from the viewpoint of adhesion, a solvent (C1) having a boiling point of 200° C. to 250° C. and a solvent (C2) having a boiling point of 160° C. to 190° C. are more preferably used after mixing.

Specific examples of the solvent (C1) having a boiling point of 200° C. to 250° C. include N-methyl-2-pyrrolidone, N-ethyl-2-pyrrolidone, γ-butyrolactone and 1,3-dimethyl-2-imidazolinone. Among these, N-methylpyrrolidone and γ-butyrolactone are more preferable and γ-butyrolactone is most preferable, from the viewpoint of adhesion.

Specific examples of the solvent (C2) having a boiling point of 160° C. to 190° C. include N,N-dimethylacetoamide, dimethylsulfoxide, diethylene glycol dimethyl ether, tetramethyl urea and propylene glycol. Among these, dimethylsulfoxide is most preferable from the viewpoint of adhesion.

Moreover, the combination of γ-butyrolactone and dimethylsulfoxide is most preferable for the combination of solvents (C1) and (C2) from the viewpoint of adhesion. In the case of using a mixture of (C1) and (C2), although there are no particular limitations on the ratios thereof, the weight of (C2) based on the total weight of (C1) and (C2) is preferably 50% or less from the viewpoint of solubility of component (A), and is more preferably 5% to 30%, and most preferably 5% to 20%, from the viewpoint of adhesion.

Although the reason for the improvement in adhesion resulting from the combined use of (C1) and (C2) as solvent is unclear, the inventors of the present invention have surmised this to be attributable to that indicated below.

When the photosensitive resin composition is coated onto a substrate and the solvent is dried, the solvent (C2) having a comparatively low boiling point first volatilizes gradually as a result of using solvents having different boiling points. As a result, although orientation of resins (A1) to (A3) having groups capable of demonstrating interaction between molecules as previously described and their subsequent aggregation are promoted as a result thereof, since there is little volatilization of the solvent (C1) having a high boiling point, resin (A4) having few groups capable of interacting is maintained in a dissolved state. As a result, partial separation between resins (A1) to (A3) and resin (A4) occurs efficiently, and adhesion is thought to improve for the previously described reason.

A crosslinking agent (D) may also be contained in the photosensitive resin composition of the present invention. The crosslinking agent can be a crosslinking agent capable of crosslinking the resin (A) or forming a crosslinked network by itself when heat-curing a relief pattern formed using the photosensitive resin composition of the present invention. The crosslinking is further able to enhance heat resistance and chemical resistance of a cured film formed from the photosensitive resin composition.

Examples of crosslinking agents having a single thermal crosslinking group include ML-26X, ML-4X, ML-236TMP, 4-Methylol 3M6C, ML-MC, ML-TBC (trade names, all manufactured by Honshu Chemical Industry Co., Ltd.) and Type P-a Benzoxazine (trade name, Shikoku Chemicals Corp.), examples of those having two thermal crosslinking groups include DM-BI25X-F, 46DMOC, 46DMOIPP, 46DMOEP (trade names, all manufactured by Asahi Yukizai Corp.), DML-MBPC, DML-MBOC, DML-OCHP, DML-PC, DML-PCHP, DML-PTBP, DML-34X, DML-EP, DML-POP, DML-OC, Dimethylol Bis-C, Dimethylol BisOC-P, DML-BisOC-Z, DML-BisOCHP-Z, DML-PFP, DML-PSBP, DML-MB25, DML-MtrisPC, DML-Bis25X-34XL and DML-Bis25X-PCHP (trade names, all manufactured by Honshu Chemical Industry Co., Ltd.), Nikalac MX-290 (trade name, manufactured by Sanwa Chemical Co., Ltd.), Type B-a Benzoxazine, Type B-m Benzoxazine (trade names, manufactured by Shikoku Chemicals Corp.), 2,6-dimethoxymethyl-4-t-butylphenol and 2,6-dimethoxymethyl-p-cresol, 2,6-diacetoxymethyl-p-cresol, examples of those having three thermal crosslinking groups include TriML-P, TriML-35XL, TriML-TrisCR-HAP (trade names, all manufactured by Honshu Chemical Industry Co., Ltd.), examples of those having four thermal crosslinking groups include TM-BIP-A (trade name, Asahi Yukizai Corp.), TML-BP, TML-HQ, TML-pp-BPF, TML-BPA, TMOM-BP (trade names, all manufactured by Honshu Chemical Industry Co., Ltd.), Nikalac MX-280 and Nikalac MX-270 (trade names, manufactured by Sanwa Chemical Co., Ltd.), examples of those having six thermal crosslinking groups include HML-TPPHBA, HML-TPHAP (trade names, manufactured by Honshu Chemical Industry Co., Ltd.), Nikalac MW-390 and Nikalac MW-100LM (trade names, manufactured by Sanwa Chemical Co., Ltd.).

Among these, crosslinking agents containing two thermal crosslinking groups are used preferably in the present invention, and particularly preferable examples thereof include 46DMOC, 46DMOEP (trade names, manufactured by Asahi Yukizai Corp.), DML-MBPC, DML-MBOC, DML-OCHP, DML-PC, DML-PCDML, DML-PTBP, DML-34X, DML-EP, DML-POP, Dimethylol BisOC-P, DML-PFP, DML-PSBP, DML-MTrisPC (trade names, all manufactured by Honshu Chemical Industry Co., Ltd.), Nikalac MX-290 (trade name, manufactured by Sanwa Chemical Co., Ltd.), Type B-a Benzoxazine, Type B-m Benzoxazine (trade names, manufactured by Shikoku Chemicals Corp.), 2,6-dimethoxymethyl-4-t-butylphenol and 2,6-dimethoxymethyl-p-cresol, 2,6-diacetoxymethyl-p-cresol, TriML-P, TriML-35XL (trade names, manufactured by Honshu Chemical Industry Co., Ltd.), TM-BIP-A (trade name, manufactured by Asahi Yukizai Corp.), TML-BP, TML-HQ, TML-pp-BPF, TML-BPA, TMOM-BP (trade names, all manufactured by Honshu Chemical Industry Co., Ltd.), Nikalac MX-280, Nikalac MX-270 (trade names, manufactured by Sanwa Chemical Co., Ltd.), HML-TPPHBA and HML-TPHAP (trade names, manufactured by Honshu Chemical Industry Co., Ltd.). In addition, more preferable examples thereof include Nikalac MX-290, Nikalac MX-280, Nikalac MX-270 (trade names, all manufactured by Sanwa Chemical Co., Ltd.), Type B-a Benzoxazine, Type B-m Benzoxazine (trade names, manufactured by Shikoku Chemicals Corp.), Nikalac MW-390 and Nikalac MW-100LM (trade names, manufactured by Sanwa Chemical Co., Ltd.).

The incorporated amount of crosslinking agent contained by the photosensitive resin composition with respect to the balance with various properties other than heat resistance and chemical resistance is preferably 0.5 parts by weight to 20 parts by weight and more preferably 2 parts by weight to 10 parts by weight based on 100 parts by weight of the resin (A). In the case the incorporated amount is 0.5 parts by weight or more, favorable heat resistance and chemical resistance are demonstrated, while in the case the incorporated amount is 20 parts by weight or less, storage stability is superior.

(E) Organic Titanium Compound

The photosensitive resin composition of the present invention may also contain an organic titanium compound (E). The containing of the organic titanium compound (E) allows the formation of a photosensitive resin layer having superior chemical resistance even in the case of having cured at a low temperature of about 250° C.

Examples of organic titanium compounds able to be used for the organic titanium compound (E) include those in which an organic chemical substance is bound to a titanium atom through a covalent bond or ionic bond.

Specific examples of the organic titanium compound (E) include following I) to VII):

I) titanium chelate compounds: titanium chelate compounds having two or more alkoxy groups are more preferable since they allow the obtaining of storage stability of the negative-type photosensitive resin composition as well as a favorable pattern, and specific examples thereof include titanium bis(triethanolamine)diisopropoxide, titanium di(n-butoxide)bis(2,4-pentanedionate), titanium diisopropoxide bis(2,4-pentanedionate), titanium diisopropoxide bis(tetramethylheptanedionate) and titanium diisopropoxide bis(ethylacetoacetate).

II) Tetraalkoxytitanium compounds: examples thereof include titanium tetra(n-butoxide), titanium tetraethoxide, titanium tetra(2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearyloxide and titanium tetrakis[bis{2,2-(allyloxymethyl)butoxide}].

III) Titanocene compounds: examples thereof include titanium pentamethylcyclopent adienyl trimethoxide, bis($\eta^5$-2,4-cyclopentadien-1-yl) bis(2,6-difluorophenyl) titanium and bis($\eta^5$-2,4-cyclopentadien-1-yl) bis(2,6-difluoro-3-(1H-pyrrol-1-yl)phenyl) titanium.

IV) Monoalkoxy titanium compounds: examples thereof include titanium tris(dicetylphosphate)isopropoxide and titanium tris(dodecylbenzenesulfonate)isopropoxide.

V) Titanium oxide compounds: examples thereof include titanium oxide bis(pentanedionate), titanium oxide bis(tetramethylheptanedionate) and phthalocyanine titanium oxide.

VI) Titanium tetraacetylacetonate compounds: examples thereof include titanium tetraacetylacetonate.

VII) Titanate coupling agents: examples thereof include isopropyltridecylbenzenesulfonyl titanate.

Among these, the organic titanium compound (E) is preferably at least one type of compound selected from the group consisting of the aforementioned titanium chelate compounds (I), tetraalkoxytitanium compounds (II) and titanocene compounds (III) from the viewpoint of demonstrating more favorable chemical resistance.

Titanium diisopropoxide bis(ethylacetoacetate), titanium tetra(n-butoxide) and bis($\eta^5$-2,4-cyclopentadien-1-yl) bis(2,6-difluoro-3-(1H-pyrrol-1-yl)phenyl) titanium are particularly preferable.

The incorporated amount in the case of incorporating the organic titanium compound (E) is preferably 0.05 parts by weight to 10 parts by weight and more preferably 0.1 parts by weight to 2 parts by weight based on 100 parts by weight of the resin (A). In the case the incorporated amount is 0.05 parts by weight or more, favorable heat resistance and chemical resistance are demonstrated, while in the case the incorporated amount is 10 parts by weight or less, storage stability is superior.

(F) Other Components

The photosensitive resin composition of the present invention may further contain other components in addition to the aforementioned components (A) to (E). For example, in the case of forming a cured film on a substrate composed of copper or copper alloy using the photosensitive resin composition of the present invention, an azole compound can be optionally incorporated to inhibit discoloration on the copper.

Examples of azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl) triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis($\alpha$,$\alpha$-dimethylbenzyl)phenyl]benzotriazole, 2-(3,5-di-t-butyl-2-hydroxyphenyl)benzotriazole, 2-(3-t-butyl-5-methyl-2-hydroxyphenyl)benzotriazole, 2-(3,5-ti-t-amyl-2-hydroxyphenyl)benzotriazole, 2-(2'-hydroxy-5'-t-octylphenyl)benzotriazole, hydroxyphenylbenzotriazole, tolytriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole.

Particularly preferable examples include tolytriazole, 5-methyl-1H-benzotriazole and 4-methyl-1H-benzotriazole. In addition, one type of these azole compounds of a mixture of two or more types may be used.

The incorporated amount in the case the photosensitive resin composition contains the aforementioned azole compound is preferably 0.1 parts by weight to 20 parts by weight and more preferably 0.5 parts by weight to 5 parts by weight based on 100 parts by weight of the resin (A). In the case the incorporated amount of the azole compound based on 100 parts by weight of the resin (A) is 0.1 parts by weight or more, discoloration of the copper or copper alloy surface is inhibited in the case of having formed the photosensitive resin composition of the present invention on copper or copper alloy, while in the case the incorporated amount is 20 parts by weight or less, photosensitivity is superior.

In addition, a hindered phenol compound can be optionally incorporated in order to inhibit discoloration on the copper surface. Examples of hindered phenol compounds include, but are not limited to, 2,6-di-t-butyl-4-methylphenol, 2,5-di-t-butyl-hydroquinone, octadecyl-3-(3,5-di-t-butyl-4-hydroxyphenyl)propionate, isooctyl-3-(3,5-di-t-butyl-4-hydroxyphenyl)propionate, 4,4'-methylene-bis(2,6-di-t-butylphenol), 4,4'-thiobis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thio-diethylenebis[3-(3,5-di-t-butyl-4-hydroxphenyl)propionate], N,N'-hexamethylenebis(3,5-di-t-butyl-4-hydroxyhydrocinnamide), 2,2'-methylene-bis(4-methyl-6-t-butylphenol), 2,2'-methylene-bis(4-ethyl-6-t-butylphenol), pentaerythryl-tetrakis[3-(3,5-di-t-butyl-4-hydroxyphenyl)propionate], tris-(3,5-di-t-butyl-4-hydroxybenzyl)isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H, 3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Among these, 1,3,5-tris(4-t-butyl-3-hydroxy-2,6-dimethylbenzyl)-1,3,5-triazine-2,4,6-(1H,3H,5H)-trione is particularly preferable.

The incorporated amount of the hindered phenol compound is preferably 0.1 parts by weight to 20 parts by weight, and more preferably 0.5 parts by weight to 10 parts by weight from the viewpoint of photosensitivity, based on 100 parts by weight of the resin (A). In the case the incorporated amount of the hindered phenol compound based on 100 parts by weight of the resin (A) is 0.1 parts by weight or more, discoloration and corrosion of the copper or copper alloy is prevented in the case of having formed the photosensitive resin composition of the present invention on copper or copper alloy, while in the case the incorporated amount is 20 parts by weight or less, photosensitivity is superior.

A sensitizer can be optionally incorporated to improve photosensitivity. Examples of this sensitizer include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino) chalcone, 4,4'-bis(diethylamino)chalcone, p-diethylaminocinnamylidene indanone, p-dimethylaminobenzylidene indanone, 2-(p-dimethylaminophenylbiphenylene)benzothiazole, 2-(p-dimethylaminophenylvinylene) benzothiazole, 2-(p-dimethylaminophenylvinylene) isonaphthothiazole, 1,3-bis(4'-dimethylaminobenzal) acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-d)thiazole and 2-(p-dimethylaminobenzoyl)styrene. These can be used alone or, for example, 2 to 5 types can be used in combination.

The incorporated amount of the sensitizer in the case the photosensitive resin composition contains a sensitizer for improving photosensitivity is preferably 0.1 parts by weight to 25 parts by weight based on 100 parts by weight of the resin (A).

In addition, a monomer having a photopolymerizable unsaturated bond can be optionally incorporated to improve resolution of a relief pattern. The monomer is preferably a (meth)acrylic compound that undergoes a radical polymerization reaction by a photopolymerization initiator, and although not limited to that indicated below, examples thereof include compounds such as mono- or diacrylates and methacrylates of ethylene glycol or polyethylene glycol such as diethylene glycol dimethacrylate or tetraethylene glycol dimethacrylate, mono- or diacrylates and methacrylates of propylene glycol or polypropylene glycol, mono-, di- or triacrylates, methacrylates, cyclohexane diacrylates, and dimethacrylates of glycerol, diacrylates and dimethacrylates of 1,4-butanediol, diacrylates and dimethacrylates of 1,6-hexanediol, diacrylates and dimethacrylates of neopentyl glycol, mono- or diacrylates, methacrylates, benzene trimethacrylates, isobornyl acrylates and methacrylates, acrylamides and derivatives thereof, methacrylamides and derivatives thereof and trimethylolpropane triacrylates and methacrylates of bisphenol A, triacrylates and methacrylates of glycerol, di- tri- or tetraacrylates and methacrylates of pentaerythritol, and ethylene oxide or propylene oxide adducts of these compounds.

In the case the photosensitive resin composition contains the aforementioned monomer having a photopolymerizable unsaturated bond in order to improve the resolution of a relief pattern, the incorporated amount of the photopolymerizable monomer having an unsaturated bond is preferably 1 part by weight to 50 parts by weight based on 100 parts by weight of the resin (A).

In addition, an adhesive assistant can be optionally incorporated to improve adhesion between a substrate and a film formed using the photosensitive resin composition of the present invention. Examples of adhesive assistants include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis(N-[3-triethoxysilyl]propylamido)-4,4'-dicarboxylic acid, benzene-1,4-bis(N-[3-triethoxysilyl]propylamido)-2,5-dicarboxylic acid, 3-(triethoxysilyl)propylsuccinic anhydride, N-phenylaminopropyltrimethoxysilane, 3-ureidopropyltrimethoxysilane, 3-ureidopropyltriethoxysilane, 3-(trialkoxysilyl)propyl succinic anhydride or 3-(triethoxysilylpropyl)-tert-butyl carbamate, and aluminum-based adhesive assistants such as aluminum tris(ethylacetoacetate), aluminum tris(acetylacetonate) or aluminum ethylacetylacetate diisopropylate.

Among these adhesive assistants, silane coupling agents are more preferable from the viewpoint of adhesive strength. In the case the photosensitive resin composition contains an adhesive assistant, the incorporated amount of the adhesive assistant is preferably 0.5 parts by weight to 25 parts by weight based on 100 parts by weight of the resin (A).

In addition, a thermal polymerization inhibitor can be optionally incorporated to improve viscosity and photosensitivity stability of the photosensitive resin composition when storing in a state of a solution containing a solvent in particular. Examples of thermal polymerization inhibitors include hydroquinone, N-nitrosodiphenylamine, p-tert-butylcatechol, phenothiazine, N-phenylnaphthylamine, ethyldiamine tetraacetic acid, 1,2-cyclohexanediamine tetraacetic acid, glycol ether diamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt and N-nitroso-N-(1-naphthyl) hydroxylamine ammonium salt.

The incorporated amount of the thermal polymerization inhibitor in the case of incorporating in the photosensitive resin composition is preferably within the range of 0.005 parts by weight to 12 parts by weight based on 100 parts by weight of the resin (A).

<Method for Producing Cured Relief Pattern and Semiconductor Device>

In addition, the present invention provides a method for producing a cured relief pattern, comprising (1) a step for forming a resin layer on a substrate by coating the aforementioned photosensitive resin composition of the present invention on the substrate, (2) a step for exposing the resin layer to light, (3) a step for forming a relief pattern by developing the resin layer after exposing to light, and (4) a step for forming a cured relief pattern by heat-treating the relief pattern. The following provides an explanation of a typical aspect of each step.

(1) Step for Forming a Resin Layer on s Substrate by Coating Photosensitive Resin Composition on the Substrate In the present step, the photosensitive resin composition of the present invention is coated onto a substrate followed by drying as necessary to form a resin layer. A method conventionally used to coat photosensitive resin compositions can be used, examples of which include coating methods using a spin coater, bar coater, blade coater, curtain coater or screen printer, and spraying methods using a spray coater.

A coating film composed of the photosensitive resin composition can be dried as necessary. A method such as air drying, or heat drying or vacuum drying using an oven or hot plate, is used for the drying method. More specifically, in the case of carrying out air drying or heat drying, drying can be carried out under conditions consisting of 1 minute to 1 hour at 20° C. to 140° C. The resin layer can be formed on the substrate in this manner.

(2) Step for Exposing Resin Layer to Light

In the present step, the resin layer formed in the manner described above is exposed to an ultraviolet light source and the like either directly or through a photomask having a pattern or reticle using an exposure device such as a contact aligner, mirror projector or stepper.

Subsequently, post-exposure baking (PEB) and/or pre-development baking may be carried out using an arbitrary combination of temperature and time as necessary for the purpose of improving photosensitivity and the like. Although the range of baking conditions preferably consists of a temperature of 40° C. to 120° C. and time of 10 seconds to 240 seconds, the range is not limited thereto provided various properties of the photosensitive resin composition of the present invention are not impaired.

(3) Step for Forming Relief Pattern by Developing Resin Layer after Exposure

In the present step, unexposed portions of the photosensitive resin layer are developed and removed following exposure. An arbitrary method can be selected and used for the development method from among conventionally known photoresist development methods, examples of which include the rotary spraying method, paddle method and immersion method accompanying ultrasonic treatment. In addition, post-development baking using an arbitrary combination of temperature and time may be carried out as necessary after development for the purpose of adjusting the form of the relief pattern.

A good solvent with respect to the photosensitive resin composition or a combination of this good solvent and a poor solvent is preferable for the developer used for development. For example, in the case of a photosensitive resin composition that does not dissolve in an aqueous alkaline solution, preferable examples of good solvents include N-methylpyrrolidone, N-cyclohexyl-2-pyrrolidone, N,N-dimethylacetoamide, cyclopentanone, cyclohexanone, γ-butyrolactone and α-acetyl-γ-butyrolactone, while preferable examples of poor solvents include toluene, xylene, methanol, ethanol, isopropyl alcohol, ethyl lactate, propylene glycol methyl ether acetate and water. In the case of using a mixture of good solvent and poor solvent, the proportion of poor solvent to good solvent is preferably adjusted according to the solubility of polymer in the photosensitive resin composition. In addition, two or more types of each solvent, such as a combination of several types of each solvent, can also be used.

(4) Step for Forming Cured Relief Pattern by Heat-Treating Relief Pattern

In the present step, the relief pattern obtained by developing in the manner previously described is converted to a cured relief pattern by heating. Various methods can be selected for the heat curing method, examples of which include heating with a hot plate, heating using an oven, and heating using a programmable oven that allows the setting of a temperature program. Heating can be carried out under conditions consisting of, for example, 30 minutes to 5 hours at 180° C. to 400° C. Air may be used for the atmospheric gas during heat curing, or an inert gas such as nitrogen or argon can be used.

<Semiconductor Device>

The present invention also provides a semiconductor device that contains a cured relief pattern obtained according to the method for producing a cured relief pattern of the present invention described above. The present invention also provides a semiconductor device containing a semiconductor element in the form of a base material and a cured relief pattern of a resin formed according to the aforementioned method for producing a cured relief pattern on the aforementioned base material. In addition, the present invention can be applied to a method for producing a semiconductor device that uses a semiconductor element for the base material and contains the aforementioned method for producing a cured relief pattern as a portion of the process thereof. The semiconductor device of the present invention can be produced by combining with known methods for producing semiconductor devices by forming the cured relief pattern formed according to the aforementioned method for producing a cured relief pattern as a surface protective film, interlayer insulating film, rewiring insulating film, flip-chip device protective film or protective film of a semiconductor device having a bump structure.

The photosensitive resin composition according to the first aspect of the present invention is also useful in applications such as the interlayer insulation of a multilayer circuit, cover coating of a flexible copper-clad board, solder-resistive film or liquid crystal alignment film.

[Second Aspect]

Semiconductors (to also be referred to as "elements") are mounted on printed boards using various methods corresponding to the objective. Conventional elements were typically fabricated by a wire bonding method in which a connection is made from an external terminal of the element (pad) to a lead frame with a fine wire. However, with today's current higher element speeds in which the operating frequency has reached the GHz range, differences in the wiring lengths of each terminal during mounting are having an effect on element operation. Consequently, in the case of mounting elements for high-end applications, it has become necessary to accurately control the lengths of mounting wires, and it has become difficult to satisfy this requirement with wire bonding.

Thus, flip-chip mounting has been proposed in which, after having formed a rewiring layer on the surface of a semiconductor chip and formed a bump (electrode) thereon, the chip is turned over (flipped) followed by directly mounting on the printed board. As a result of being able to accurately control wiring distance, this flip-chip mounting is being employed in elements for high-end applications handling high-speed signals, and because of its small mounting size, is also being employed in cell phone applications, thereby resulting in a rapid increase in demand. More recently, a semiconductor chip mounting technology known as fan-out wafer level (FOWL) packaging has been proposed that consists of dicing preprocessed wafers to produce individual chips followed by reconstructing the individual chips on a support and sealing with a molding resin, and finally separating from the support followed by forming a rewiring layer (see, for example, Japanese Unexamined Patent Publication No. 2005-167191). Fan-out wafer level packaging offers the advantage of being able to reduce package height in addition to realizing high-speed transmission and reduced costs.

However, in addition to increasing diversity in the types of supports due to the growing diversification of package mounting technologies in recent years, since the types of rewiring layers have also become increasingly diverse, there is the problem of a considerable decrease in resolution due to the occurrence of shifts in focus depth during exposure of a photosensitive resin composition. For this reason, problems have occurred such as the occurrence of signal delays or decreases in yield caused by disconnections in the rewiring layer.

With the foregoing in view, an object of the second aspect of the present invention is to provide a photosensitive resin composition that allows the production of a semiconductor device that exhibits little signal delay and demonstrates favorable electrical properties, and is capable of preventing decreases in yield caused by the occurrence of disconnections during formation of the semiconductor device.

The inventors of the present invention found that, by selecting and using a specific photosensitive resin composition having a focus margin of a specific value or higher, a semiconductor device can be produced that has little signal delay and demonstrates favorable electrical properties, and is capable of preventing decreases in yield caused by the occurrence of disconnections during the formation of the semiconductor device, thereby leading to completion of the second aspect of the present invention. Namely, the second aspect of the present invention is as indicated below.

[1] A photosensitive resin composition containing a photosensitive polyimide precursor in which the focus margin of a rounded out concave relief pattern is 8 μm or more, the rounded out concave relief pattern being obtained by going through the following steps (1) to (5) in that order:

(1) spin-coating the resin composition onto a sputtered Cu wafer substrate;

(2) obtaining a spin-coated film having a film thickness of 13 μm by heating a spin-coated wafer substrate on a hot plate for 270 seconds at 110° C.;

(3) exposing a rounded out convex pattern having a mask size of 8 μm by changing the focus from the surface of the film to the bottom of the film 2 μm at a time using the surface of the spin-coated film as a reference;

(4) forming a relief pattern by developing the exposed wafer; and, (5) heat-treating the developed wafer in a nitrogen atmosphere for 2 hours at 230° C.

[2] The photosensitive resin composition described in [1], wherein the focus margin is 12 μm or more.

[3] The photosensitive resin composition described in [1] or [2], wherein the cross-sectional angle of a cured product of the photosensitive polyimide precursor in the form of a cured relief pattern is 60° to 90°.

[4] The photosensitive resin composition described in any of [1] to [3], wherein the photosensitive polyimide precursor is a polyamic acid derivative having a radical-polymerizable substituent in a side chain thereof.

[5] The photosensitive resin composition described in any of [1] to [4], wherein the photosensitive polyimide precursor contains a structure represented by the following general formula (21):

[Chemical Formula 59]

(21)

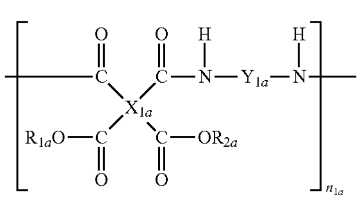

{wherein, $X_{1a}$ represents a tetravalent organic group, $Y_{1a}$ represents a divalent organic group, $n_{1a}$ represents an integer of 2 to 150, and $R_{1a}$ and $R_{2a}$ respectively and independently represent a hydrogen atom, monovalent organic group represented by the following general formula (22):

[Chemical Formula 60]

(22)

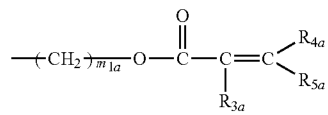

(wherein, $R_{3a}$, $R_{4a}$ and $R_{5a}$ respectively and independently represent a hydrogen atom or organic group having 1 to 3 carbon atoms, and $m_{1a}$ represents an integer selected from 2 to 10), or a saturated aliphatic group having 1 to 4 carbon atoms, provided that $R_{1a}$ and $R_{2a}$ are not both simultaneously hydrogen atoms}.

[6] The photosensitive resin composition described in [5], wherein $X_{1a}$ in general formula (21) represents one or more types of tetravalent organic groups selected from the following formulas (23) to (25):

[Chemical Formula 61]

(23)

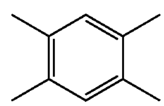

[Chemical Formula 62]

(24)

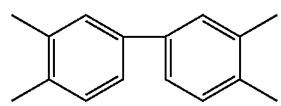

[Chemical Formula 63]

(25)

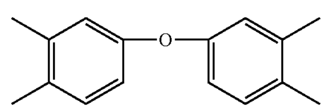

and $Y_{1a}$ represents one or more types of divalent organic groups selected from a group represented by the following general formula (26):

[Chemical Formula 64]

(26)

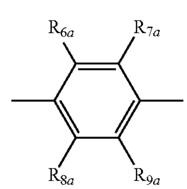

{wherein, $R_{6a}$ to $R_{9a}$ represent hydrogen atoms or monovalent aliphatic groups having 1 to 4 carbon atoms and may mutually be the same or different}, the following formula (27):

[Chemical Formula 65]

(27)

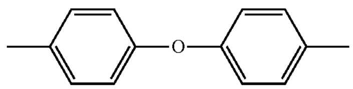

or the following formula (28):

[Chemical Formula 66]

(28)

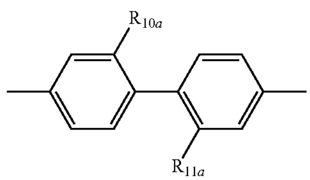

{wherein, $R_{10a}$ and $R_{11a}$ respectively and independently represent a fluorine atom, trifluoromethyl group or methyl group}.

[7] The photosensitive resin composition described in any of [1] to [6], further containing a photopolymerization initiator.

[8] The photosensitive resin composition described in [7], wherein the photopolymerization initiator contains a component represented by the following general formula (29):

[Chemical Formula 67]

(29)

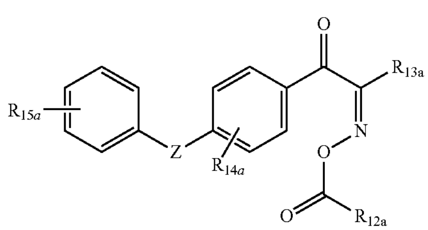

{wherein, Z represents a sulfur atom or oxygen atom, $R_{12a}$ represents a methyl group, phenyl group or divalent organic group, and $R_{13a}$ to $R_{15a}$ respectively and independently represent a hydrogen atom or monovalent organic group}.

[9] The photosensitive resin composition described in any of [1] to [8], further containing an inhibitor.

[10] The photosensitive resin composition described in [9], wherein the inhibitor is at least one type selected from a hindered phenol-type inhibitor and nitroso-type inhibitor.

[11] A method for producing a cured relief pattern including the following steps (6) to (9):

(6) forming a photosensitive resin layer on a substrate by coating the photosensitive resin composition described in any of [1] to [10] on the substrate;

(7) exposing the photosensitive resin layer to light;

(8) forming a relief pattern by developing the photosensitive resin layer after exposing to light; and, (9) forming a cured relief pattern by heat-treating the relief pattern.

[12] The method described in [11], wherein the substrate is formed from copper or copper alloy.

According to a second aspect of the present invention, a photosensitive resin composition, which is able to prevent the occurrence of disconnections and decreases in yield when forming a semiconductor device, and allows the production of a semiconductor device having little signal delay and favorable electrical properties, by using a photosensitive polyimide precursor having a focus margin of a fixed value or more, a method for producing a cured relief pattern using the photosensitive resin composition, and a semiconductor device having the cured relief pattern, can be provided.

The second aspect of the present invention is the photosensitive resin composition indicated below.

[Photosensitive Resin Composition]

The photosensitive resin composition of the present embodiment is characterized by the focus margin of a rounded out concave relief pattern being 8 μm or more, the rounded out concave relief pattern being obtained by going through the following steps (1) to (5) in that order:

(1) a step for spin-coating the resin composition onto a sputtered Cu wafer substrate;

(2) a step for obtaining a spin-coated film having a film thickness of 13 μm by heating a spin-coated wafer substrate on a hot plate for 270 seconds at 110° C.;

(3) a step for exposing a rounded out convex pattern having a mask size of 8 μm by changing the focus from the surface of the film to the bottom of the film 2 μm at a time using the surface of the spin-coated film as a reference;

(4) a step for forming a relief pattern by developing the exposed wafer; and, (5) a step for heat-treating the developed wafer in a nitrogen atmosphere for 2 hours at 230° C. The use of this photosensitive resin composition makes it possible to prevent the occurrence of disconnections and decreases in yield when forming a semiconductor device even in the case of the occurrence of warping and deformation of the substrate or in the case of poor surface flatness of the lower layer of the multilayer rewiring layer causing the focus depth during exposure to shift from a desired location. Moreover, a semiconductor device can be produced that has little signal delay and favorable electrical properties.

[Photosensitive Polyimide Precursor]

The following provides an explanation of the polyimide precursor used in the present invention. The resin component of the photosensitive resin composition of the present invention is a polyamide having a structural unit represented by the following general formula (21). The polyimide precursor is converted to a polyimide by subjecting to cyclization treatment while heating (at, for example, 200° C. or higher):

[Chemical Formula 68]

(21)

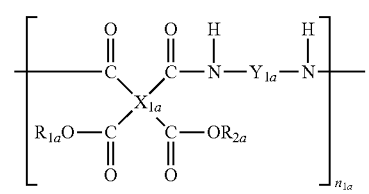

{wherein, $X_{1a}$ represents a tetravalent organic group, $Y_{1a}$ represents a divalent organic group, $n_{1a}$ represents an integer of 2 to 150, and $R_{1a}$ and $R_{2a}$ respectively and independently represent a hydrogen atom, monovalent organic group represented by the following general formula (22):

[Chemical Formula 69]

(22)

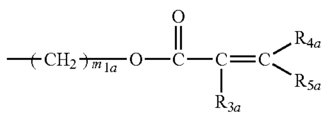

(wherein, $R_{3a}$, $R_{4a}$ and $R_{5a}$ respectively and independently represent a hydrogen atom or organic group having 1 to 3 carbon atoms, and m1a represents an integer selected from 2 to 10), or a saturated aliphatic group having 1 to 4 carbon atoms, provided that $R_{1a}$ and $R_{2a}$ are not both simultaneously hydrogen atoms}.

In the aforementioned general formula (21), examples of the tetravalent organic group represented by $X_{1a}$ preferably include, but are not limited to, organic groups having 6 to 40 carbon atoms, more preferably an aromatic group or alicyclic group having a —$COOR_1$ group and a —$COOR_2$ group at mutually ortho positions with a —CONH— group, and even more preferably structures represented by the following formula (60).

[Chemical Formula 70]

(60)

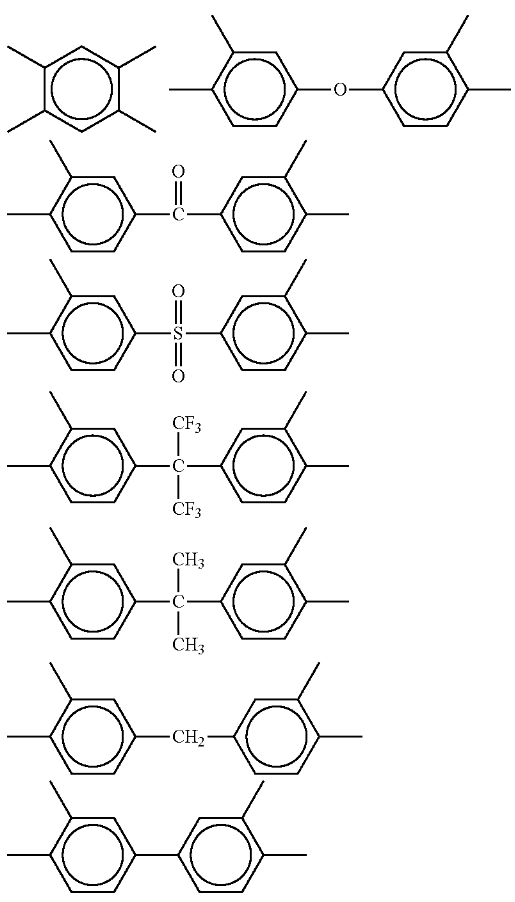

In addition, these may be used alone or two or more types may be combined. Among these, $X_{1a}$ preferably has a structure represented by the following structural formulas (23) to (25).

[Chemical Formula 71]

(23)

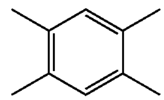

[Chemical Formula 72]

(24)

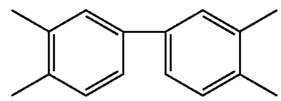

[Chemical Formula 73]

(25)

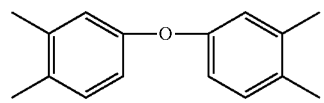

In the aforementioned general formula (21), the divalent organic group represented by $Y_{1a}$ is preferably an aromatic group having 6 to 40 carbon atoms, such as a group represented by the following formula (61):

[Chemical Formula 74]

(61)

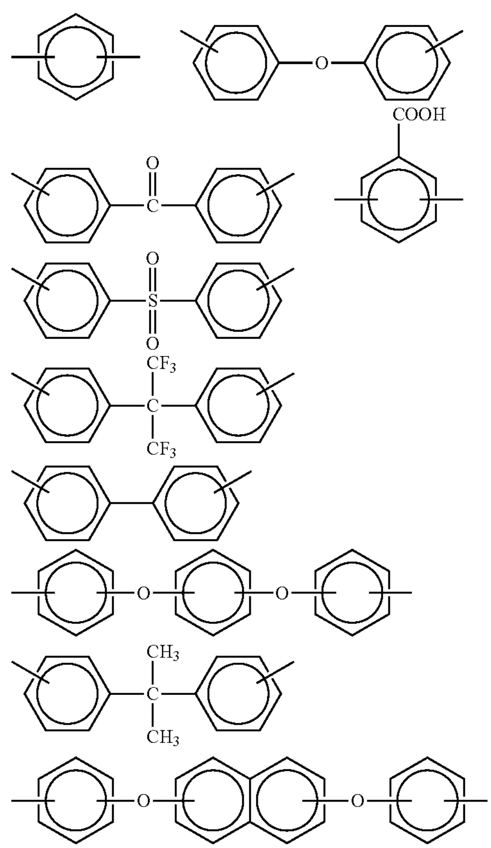

-continued

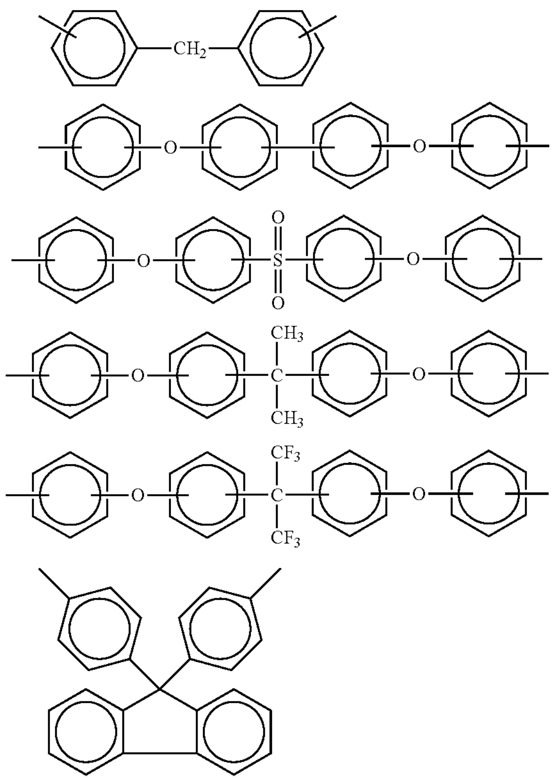

or a structure represented by the following formula (62).

[Chemical Formula 75]

(62)

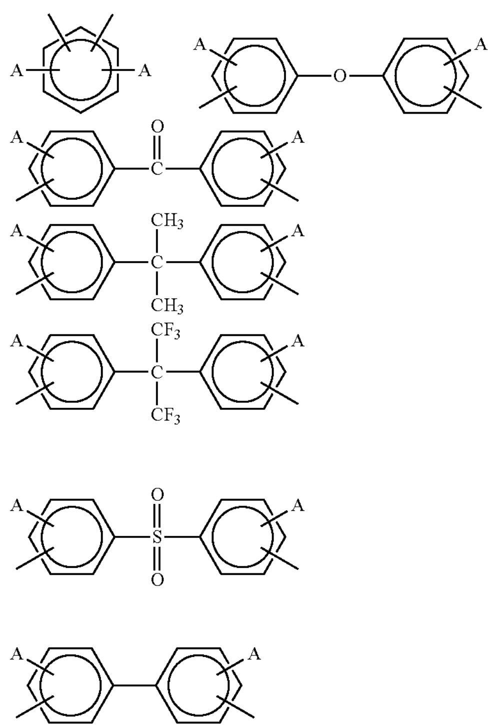

-continued

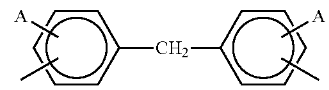

A = $CH_3$, $C_2H_5$, $C_3H_7$, $C_4H_9$

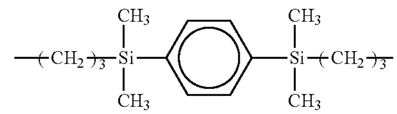

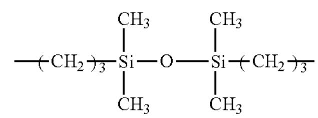

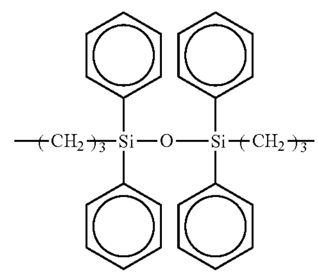

Among these, $Y_{1a}$ is particularly preferably at least one type of divalent organic group selected from the group consisting of groups represented by the following general formula (26):

[Chemical Formula 76]

(26)

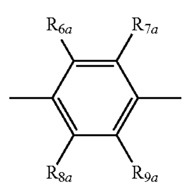

{wherein, $R_{6a}$ to $R_{9a}$ represent hydrogen atoms or monovalent aliphatic groups having 1 to 4 carbon atoms and may be the same or different}, groups represented by the following formula (27),

[Chemical Formula 77]

(27)

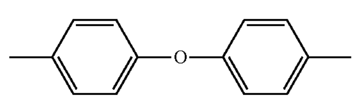

and groups represented by the following formula (28):

[Chemical Formula 78]

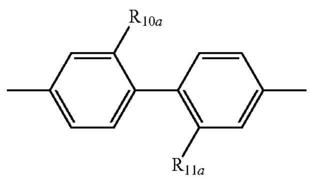

(28)

{wherein, $R_{10a}$ and $R_{11a}$ respectively and independently represent a fluorine atom, trifluoromethyl group or methyl group}. These may be used alone or two or more types may be combined.

The polyimide precursor of the present invention represented by the aforementioned formula (21) is obtained by first preparing a partially esterified tetracarboxylic acid (to also be referred to as an acid/ester form) by reacting a tetracarboxylic dianhydride containing the tetravalent organic group $X_{1a}$ with an alcohol having photopolymerizable unsaturated double bond and a saturated aliphatic alcohol having 1 to 4 carbon atoms, followed by subjecting this to amide polycondensation with a diamine containing the divalent organic group $Y_{1a}$.

(Preparation of Acid/Ester Form)

Examples of the tetracarboxylic dianhydride containing the tetravalent organic group $X_{1a}$ preferably used in the present invention include, but are not limited to, pyromellitic anhydride, diphenylether-3,3',4,4'-tetracarboxylic dianhydride, benzophenone-3,3',4,4'-tetracarboxylic dianhydride, biphenyl-3,3'4,4'-tetracarboxylic dianhydride, diphenylphosphone-3,3',4,4'-tetracarboxylic dianhydride, diphenylmethane-3,3'4,4'-tetracarboxylic dianhyride, 2,2-bis(3,4-phthalic anhydride)propane and 2,2-bis(3,4-phthalic anhydride)-1,1,1,3,3,3-hexafluoropropane. In addition, these can naturally be used alone or two or more types may be used as a mixture.

Examples of alcohols having a photopolymerizable unsaturated double bond preferably used in the present invention include 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butyoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, 2-hydroxy-3-methoxyopropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

Saturated aliphatic alcohols having 1 to 4 carbon atoms, such as methanol, ethanol, n-propanol, isopropanol, n-butanol or tert-butanol, can also be used by mixing a portion thereof with the aforementioned alcohols.

A desired acid/ester form can be obtained by carrying out an acid anhydride esterification reaction by dissolving and mixing the aforementioned preferable tetracarboxylic dianhydride and alcohol of the present invention in the presence of a basic catalyst such as pyridine and in a suitable reaction solvent followed by stirring for 4 to 10 hours at a temperature of 20° C. to 50° C.

A reaction solvent that completely dissolves the acid/ester form and the polyimide precursor, which is the amide polycondensation product of the acid/ester form and a diamine component, is preferable for the reaction solvent, and examples thereof include N-methyl-2-pyrrolidone, N,N-dimethylacetoamide, N,N-dimethylformamide, dimethylsulfoxide, tetramethyl urea and γ-butyrolactone.

Examples of other reaction solvents include ketones, esters, lactones, ethers and halogenated hydrocarbons, and examples of hydrocarbons include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene. These may be used alone or two or more types may be used as a mixture as necessary.

(Preparation of Polyimide Precursor)

A suitable dehydration condensation agent, such as dicyclocarbodiimide, 1-ethoxycarbonyl-2-ethoxy-1,2-dihydroquinoline, 1,1-carbonyldioxy-di-1,2,3-benzotriazole or N,N'-disuccinimidyl carbonate is added to and mixed with the aforementioned acid/ester form while cooling with ice to convert the acid/ester form to a polyacid anhydride. Subsequently, a solution or dispersion of a diamine containing the divalent organic group Y preferably used in the present invention in a different solvent is dropped therein followed by amide polycondensation to obtain the target polyimide precursor.

Examples of diamines containing the divalent organic group $Y_{1a}$ preferably used in the present invention include, but are not limited to, p-phenylene diamine, m-phenylene diamine, 4,4-diaminodiphenyl ether, 3,4'-diaminodiphenyl ether, 3,3'-diaminodiphenyl ether, 2,2'-dimethylbiphenyl-4,4'-diamine, 2,2-bis(trifluoromethyl)bendizine, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl] ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, o-toluidine sulfone, 9,9-bis(4-aminophenyl)fluorene, and those in which a portion of the hydrogen atoms on the benzene ring thereof is substituted with a substituent such as a methyl group, ethyl group, hydroxymethyl group, hydroxyethyl group or halogen atom, e.g., 3,3'-dimethyl-4,4'-diaminodiphenylmethane, 2,2'-dimethyl-4,4'-diaminodiphenylmethane, 3,3'-dimethoxy-4,4'-diaminobiphenyl or 3,3'-dichloro-4,4'-diaminobiphenyl, as well as mixtures thereof.

In addition, a diaminosiloxane such as 1,3-bis(3-aminopropyl)tetramethyldisiloxane or 1,3-bis(3-aminopropyl)tetraphenyldisiloxane can be copolymerized for the purpose of improving adhesion between various types of substrates.

Following completion of the reaction, after filtering out absorption byproducts of the dehydration condensation agent also present in the reaction solution as necessary, a poor solvent such as water, an aliphatic lower alcohol or a mixture thereof is added to the resulting polymer component to precipitate the polymer component. Moreover, the polymer can be purified by repeating re-dissolution and re-precipitation procedures followed by vacuum drying to isolate the target polyimide precursor. In order to improve the degree of purification, a solution of this polymer may be passed through a column packed with an anion exchange resin swollen with a suitable organic solvent to remove any ionic impurities.

The molecular weight of the polyimide precursors in the case of measuring by gel permeation chromatography based on standard polystyrene conversion is preferably 8,000 to 150,000 and more preferably 9,000 to 50,000. Mechanical properties are improved in the case of a weight average molecular weight of 8,000 or more, while dispersibility in developer and resolution of the relief pattern are improved in the case of a weight average molecular weight of 150,000 or less. The use of tetrahydrofuran or N-methyl-2-pyrrolidone is recommended for the developing solvent during gel permeation chromatography. In addition, molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

[Photopolymerization Initiator]

The photosensitive resin composition according to the present invention may further contain a photopolymerization initiator.

Examples of photopolymerization initiators preferably include, but are not limited to, benzophenone and benzophenone derivatives such as methyl o-benzoyl benzoate, 4-benzoyl-4'-methyl diphenyl ketone, dibenzyl ketone or fluorenone, acetophenone derivatives such as 2,2'-diethoxyacetophenone, 2-hydroxy-2-methylpropiophenone or 1-hydroxycyclohexyl phenyl ketone, thioxanthone and thioxanthone derivatives such as 2-methylthioxanthone, 2-isopropylthioxanthone or diethylthioxanthone, benzyl and benzyl derivatives such as benzyldimethylketal or benzyl-β-methoxyethylacetal, benzoin and benzoin derivatives such as benzoin methyl ether, oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime or 1-phenyl-3-ethoxypropanetrione-2-(o-benzoyl)oxime, N-arylglycines such as N-phenylglycine, peroxides such as benzoyl perchloride and aromatic biimidazoles. In addition, when using these photopolymerization initiators, they may be used alone or two or more types may be used as a mixture. Among the aforementioned photopolymerization initiators, oxime-based compounds represented by the following general formula (29):

[Chemical Formula 79]

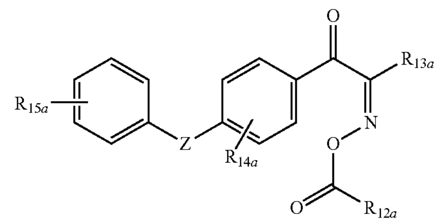

(29)

{wherein, Z represents a sulfur atom or oxygen atom, $R_{12a}$ represents a methyl group, phenyl group or divalent organic group, and $R_{11a}$ to $R_{15a}$ respectively and independently represent a hydrogen atom or monovalent organic group.} are used preferably. Among these, compounds represented by the following formula (63)

[Chemical Formula 80]

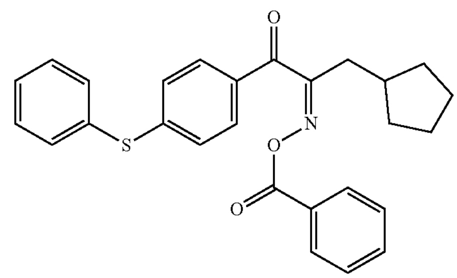

(63)

formula (64):

[Chemical Formula 81]

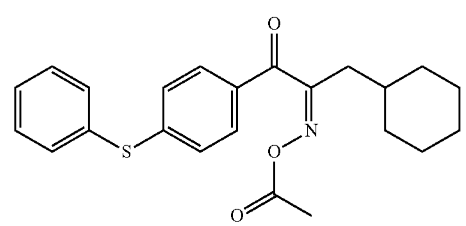

(64)

formula (65):

[Chemical Formula 82]

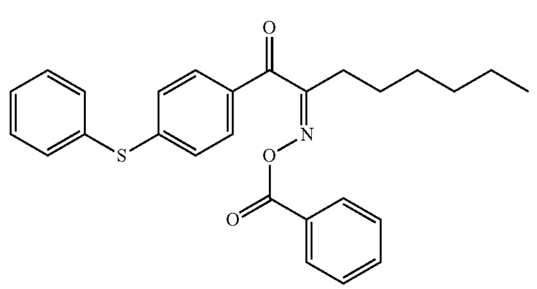

(65)

or formula (66):

[Chemical Formula 83]

(66)

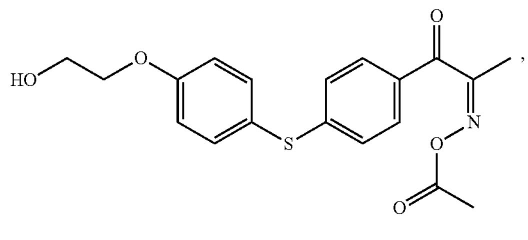

or mixtures thereof are particularly preferable. A compound represented by formula (63) is commercially available as TR-PBG-305 manufactured by Changzhou Tronly New Electronic Materials Co., Ltd., a compound represented by formula (64) is commercially available as TR-PBG-3057 manufactured by Changzhou Tronly New Electronic Materials Co., Ltd., and a compound represented by formula (65) is commercially available as Irgacure OXE-01 manufactured by BASF Corp.

The added amount of the photopolymerization initiator is 0.1 parts by weight to 20 parts by weight, and preferably 1 part by weight to 15 parts by weight from the viewpoint of photosensitivity, based on 100 parts by weight of the polyimide precursor. The addition of 0.1 parts by weight or more of the photopolymerization initiator based on 100 parts by weight of the polyimide precursor results in superior photosensitivity, and electrical properties are superior due improvement of focus margin. In addition, addition of 20 parts by weight or less of the photopolymerization initiator based on 100 parts by weight of the polyimide precursor results in superior thick film curability, and electrical properties are superior due to improvement of focus margin.

[Thermal Polymerization Inhibitor]

A thermal polymerization inhibitor can be optionally added to the photosensitive resin composition according to the present invention. Examples of thermal polymerization inhibitors used include hydroquinone, N-nitrosodiphenylamine, p-tert-butylcatechol, phenothiazine, N-phenylnaphthylamine, ethyldiamine tetraacetic acid, 1,2-cyclohexanediamine tetraacetic acid, glycol ether diamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt and N-nitroso-N-(1-naphthyl) hydroxylamine ammonium salt.

The amount of thermal polymerization inhibitor added to the photosensitive resin composition is preferably within the range of 0.005 parts by weight to 1.5 parts by weight based on 100 parts by weight of the polyimide precursor. If the amount of thermal polymerization inhibitor is within this range, a photocrosslinking reaction proceeds easily during exposure, swelling is suppressed during exposure causing the focus margin to expand and resulting in favorable electrical properties, and storage stability of the composition is favorable resulting in an increase in photosensitivity stability, thereby making this preferable.

Although there are no particular limitations on the aforementioned initiator and inhibitor according to the present embodiment provided the focus margin is 8 μm or more, a combination of an oxime-based initiator and a hindered phenol-based inhibitor or an oxime-based initiator and a nitroso-based inhibitor tend to yield a focus margin of 8 μm or more, thereby making this preferable.

In addition, a combination of an oxime-based initiator and hindered phenol-based inhibitor or an oxime-based initiator and a nitroso-based inhibitor is preferable from the viewpoints of copper adhesion, cross-sectional angle after curing, and film properties.

[Sensitizer]

A sensitizer can be optionally added to the photosensitive resin composition according to the present invention in order to improve focus margin. Examples of this sensitizer include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino) chalcone, 4,4'-bis(diethylamino)chalcone, p-diethylaminocinnamylidene indanone, p-dimethylaminobenzylidene indanone, 2-(p-dimethylaminophenylbiphenylene)benzotriazole, 2-(p-dimethylaminophenylvinylene) benzotriazole, 2-(p-dimethylaminophenylvinylene) isonaphthothiazole, 1,3-bis(4'-dimethylaminobenzal) acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-d)thiazole and 2-(p-dimethylaminobenzoyl)styrene. These can be used alone or, for example, 2 to 5 types can be used in combination. The sensitizer for improving photosensitivity is preferably used at 0.1 parts by weight to 15 parts by weight and more preferably used at 1 part by weight to 12 parts by weight, based on 100 parts by weight of the polyimide precursor. If the amount sensitizer is within the range of 0.1 parts by weight to 15 parts by weight, the sensitizer no longer swells during exposure, focus margin expands and electrical properties are favorable, thereby making this preferable, or the resulting photosensitization effect is favorable enabling the photocrosslinking reaction to proceed adequately, thereby making this preferable.

[Monomer]

A monomer having a photopolymerizable unsaturated bond can be optionally added to the photopolymerizable resin composition according to the present invention to improve resolution of a relief pattern. The monomer is preferably a (meth)acrylic compound that undergoes a radical polymerization reaction by a photopolymerization initiator, and although there are no particular limitations thereon, examples thereof include compounds such as mono- or diacrylates and methacrylates of ethylene glycol or polyethylene glycol such as diethylene glycol dimethacrylate or tetraethylene glycol dimethacrylate, mono- or diacrylates and methacrylates of propylene glycol or polypropylene glycol, mono-, di- or triacrylates, methacrylates, cyclohexane diacrylates, and dimethacrylates of glycerol, diacrylates and dimethacrylates of 1,4-butanediol, diacrylates and dimethacrylates of 1,6-hexanediol, diacrylates and dimethacrylates of neopentyl glycol, mono- or diacrylates, methacrylates, benzene trimethacrylates, isobornyl acrylates and methacrylates, acrylamides and derivatives thereof, methacrylamides and derivatives thereof and trimethylolpropane triacrylates and methacrylates of bisphenol A, di- or triacrylates and methacrylates of glycerol, di- tri- or tetraacrylates and methacrylates of pentaerythritol, and ethylene oxide or propylene oxide adducts of these compounds.

The aforementioned monomer having a photopolymerizable unsaturated bond for improving resolution of a relief pattern is preferably used at 1 part by weight to 50 parts by weight based on 100 parts by weight of the polyimide precursor.

[Solvent]

A solvent can be used in the photosensitive resin composition according to the present invention in order to use as a solution of the photosensitive resin composition by dissolving each component of the photosensitive resin composition to form a varnish. From the viewpoint of solubility in the polyimide precursor, a polar organic solvent is preferably used as solvent. More specifically, examples thereof include N,N-dimethylformamide, N-methyl-2-pyrrolidone, N-ethyl-2-pyrrolidone, N,N-dimethylacetoamide, dimethylsulfoxide, diethylene glycol dimethyl ether, cyclopentanone, γ-butyrolactone, α-acetyl-γ-butyrolactone, tetramethyl urea, 1,3-dimethyl-2-imidazolinone and N-cyclohexyl-2-pyrrolidone, and these can be used alone or two or more types can be used in combination. Among these, a combination of N-methyl-2-pyrrolidone or dimethylsulfoxide and γ-butyrolactone is preferable from the viewpoint of polyimide solubility, and the mixing ratio of the dimethylsulfoxide and γ-butyrolactone is such that the weight ratio of dimethylsulfoxide is preferably 50% by weight or less and most preferably 5% by weight to 20% by weight.

The aforementioned solvent can be used within the range of, for example, 30 parts by weight to 1500 parts by weight based on 100 parts by weight of the polyimide precursor corresponding to the desired coated film thickness and viscosity of the photosensitive resin composition.

Moreover, a solvent containing an alcohol is preferable for improving storage stability of the photosensitive resin composition.

Alcohols able to be used are typically alcohols that have an alcoholic hydroxyl group but do not have an olefinic double bond within a molecule thereof, and specific examples thereof include alkyl alcohols such as methyl alcohol, ethyl alcohol, n-propyl alcohol, isopropyl alcohol, n-butyl alcohol, isobutyl alcohol or tert-butyl alcohol, lactic acid esters such as ethyl lactate, propylene glycol monoalkyl ethers such as propylene glycol 1-methyl ether, propylene glycol 2-methyl ether, propylene glycol 1-ethyl ether, propylene glycol 2-ethyl ether, propylene glycol 1-(n-propyl) ether or propylene glycol 2-(n-propyl) ether, monoalcohols such as ethylene glycol methyl ether, ethylene glycol ethyl ether or ethylene glycol n-propyl ether, 2-hydroxyisobutyric acid esters, and dialcohols such as ethylene glycol or propylene glycol. Among these, lactic acid esters, propylene glycol monoalkyl ethers, 2-hydroxyisobutyric acid esters and ethyl alcohol are preferable, and in particular, ethyl lactate, propylene glycol 1-methyl ether, propylene glycol 1-ethyl ether and propylene glycol 1-(n-propyl) ether are more preferable.

The content of alcohol not having an olefinic double bond present in the entire solvent is preferably 5% by weight to 50% by weight and more preferably 10% by weight to 30% by weight. In the case the aforementioned content of the alcohol not having an olefinic double bond is 5% by weight or more, storage stability of the photosensitive resin composition is favorable, while in the case the content thereof is 50% by weight or less, solubility of the polyimide precursor is favorable.

[Other Components]

The photosensitive resin composition of the present invention may contain the following components (A) to (D) as components other than the components previously described.

(A) Azole Compound

The photosensitive resin composition of the present invention may contain an azole compound represented by the following general formula (67), the following general formula (68) or the following general formula (69). In the case of forming the photosensitive resin composition of the present invention on copper or copper alloy, for example, the azole compound has the action of preventing discoloration of the copper or copper alloy:

[Chemical Formula 84]

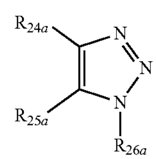

(67)

{wherein, $R_{24a}$ and $R_{25a}$ respectively and independently represent a hydrogen atom, linear or branched alkyl group having 1 to 40 carbon atoms, or alkyl group or aromatic group having 1 to 40 carbon atoms substituted with a carboxyl group, hydroxyl group, amino group or nitro group, and $R_{26a}$ represents a hydrogen atom, phenyl group, or alkyl group or aromatic group substituted with an amino group or silyl group},

[Chemical Formula 85]

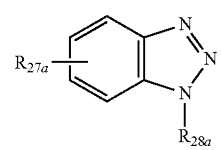

(68)

{wherein, $R_{27a}$ represents a hydrogen atom, carboxyl group, hydroxyl group, amino group, nitro group, linear or branched alkyl group having 1 to 40 carbon atoms, or alkyl group or aromatic group having 1 to 40 carbon atoms substituted with a carboxyl group, hydroxyl group, amino group or nitro group, and $R_{28a}$ represents a hydrogen atom, phenyl group, or alkyl group or aromatic group having 1 to 40 carbon atoms substituted with an amino group or silyl group}, and

[Chemical Formula 86]

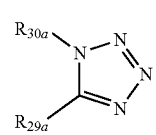

(69)

{wherein, $R_{29a}$ represents a hydrogen atom, linear or branched alkyl group having 1 to 40 carbon atoms, or alkyl group or aromatic group having 1 to 40 carbon atoms substituted with a carboxyl group, hydroxyl group, amino group or nitro group, and $R_{30a}$ represents a hydrogen atom, phenyl group, or alkyl group or aromatic group having 1 to 40 carbon atoms substituted with an amino group or silyl group}.

Examples of azole compounds represented by the aforementioned general formula (67) include, but are not limited to, 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole and 1,5-dimethyltriazole, 4,5-diethyl-1H-triazole, examples represented by the aforementioned general formula (68) include, but are not limited to, 1H-benzotriazole, 2-(5-methyl-2-hydroxyphenyl)benzotriazole, 2-[2-hydroxy-3,5-bis(α,α-dimethylbenzyl)phenyl]benzotriazole, 2-(3,5-di-t-butyl-2-hydroxyphenyl)benzotriazole, 2-(3-t-butyl-5-methyl-2-hydroxyphenyl)benzotriazole, 2-(3,5-ti-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole and 5-carboxy-1H-benzotriazole, and examples represented by the aforementioned general formula (69) include, but are not limited to, 1H-tetrazole, 5-methyl-1H-tetrazole, 5-phenyl-1H-tetrazole, 5-amino-1H-tetrazole and 1-methyl-1H-tetrazole. Among these, tolytriazole, 5-methyl-1H-benzotriazole and 4-methyl-1H-benzotriazole are particularly preferable from the viewpoint of inhibiting discoloration of copper or copper alloy. In addition, these azole compounds may be used alone or two or more types may be used as a mixture.

The amount of azole compound added is 0.1 parts by weight to 20 parts by weight, and preferably 0.5 parts by weight to 5 parts by weight from the viewpoint of photosensitivity, based on 100 parts by weight of the polyimide precursor. If the added amount of azole compound to 100 parts by weight of the polyimide precursor is 0.1 parts by weight or more, discoloration of the surface of copper or copper alloy is inhibited in the case of having formed the photosensitive resin composition of the present invention on copper or copper alloy, while in the case the amount added is 20 parts by weight or less, a favorable relief pattern is obtained in the case of having formed the photosensitive resin composition of the present invention on copper or copper alloy.

(B) Hindered Phenol Compound

The photosensitive resin composition of the present invention may further contain a hindered phenol compound (B) as a compound that has the action of preventing discoloration of copper or copper alloy in the case of forming on copper or copper alloy, for example. Here, the hindered phenol compound refers to a compound having a structure represented by the following general formula (70), general formula (71), general formula (75), general formula (76) or general formula (77) in a molecule thereof:

[Chemical Formula 87]

(70)

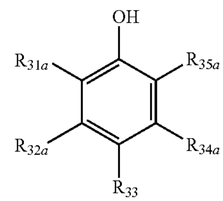

{wherein, $R_{31a}$ represents a t-butyl group, $R_{32a}$ and $R_{34a}$ respectively and independently represent a hydrogen atom or alkyl group, $R_{33a}$ represents a hydrogen atom, alkyl group, alkoxy group, hydroxyalkyl group, dialkylaminoalkyl group, hydroxyl group or alkyl group substituted with a carboxyl group, and $R_{35a}$ represents a hydrogen atom or alkyl group},

[Chemical Formula 88]

(71)

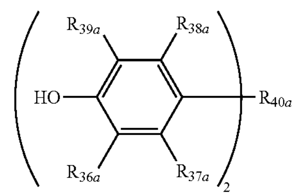

{wherein, $R_{36a}$ represents a t-butyl group, $R_{37a}$, $R_{38a}$ and $R_{39a}$ respectively and independently represent a hydrogen atom or alkyl group, and $R_{40a}$ represents an alkylene group, divalent sulfur atom, dimethylene thiol ether group, or group represented by the following general formula (72):

[Chemical Formula 89]

$$—CH_2CH_2COO—R_{41a}—OOCCH_2CH_2— \quad (72)$$

(wherein, $R_{41a}$ represents an alkyl group having 1 to 6 carbon atoms, diethylene thiol ether group or group represented by the following formula (72-1):

[Chemical Formula 90]

$$—CH_2CH_2OCH_2CH_2OCH_2CH_2— \quad (72\text{-}1)$$

or group represented by the following formula (72-2),

[Chemical Formula 91]

(72-2)

$$—CH_2CH_2CONH—(CH_2)_6—NHCOCH_2CH_2—,$$

)}

[Chemical Formula 92]

(75)

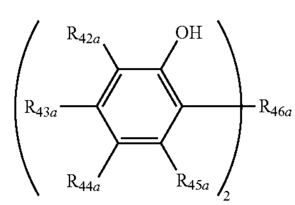

{wherein, $R_{42a}$ represents a t-butyl group, cyclohexyl group or methylcyclohexyl group, $R_{43a}$, $R_{44a}$ and $R_{45a}$ respectively and independently represent a hydrogen atom or alkyl group, and $R_{46a}$ represents an alkylene group, sulfur atom or terephthalic acid ester},

[Chemical Formula 93]

(76)

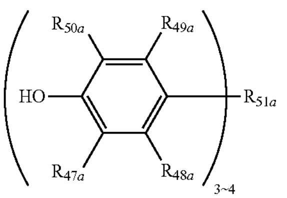

{wherein, $R_{47a}$ represents a t-butyl group, $R_{49a}$ and $R_{50a}$ respectively and independently represent a hydrogen atom or alkyl group, and $R_{51a}$ represents an alkyl group, phenyl group, isocyanurate group or propionate group}, and

[Chemical Formula 94]

(77)

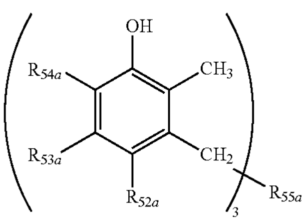

{wherein, $R_{52a}$ and $R_{53a}$ respectively and independently represent a hydrogen atom or monovalent organic group having 1 to 6 carbon atoms, $R_{55a}$ represents an alkyl group, phenyl group, isocyanurate group or propionate group, and $R_{54a}$ represents a group represented by the following general formula (78):

[Chemical Formula 95]

(78)

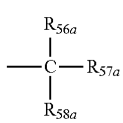

(wherein, $R_{56d}$, $R_{57d}$ and $R_{58a}$ respectively and independently represent a hydrogen atom or monovalent organic group having 1 to 6 carbon atoms, provided at least two of $R_{56a}$, $R_{57a}$ and $R_{58a}$ represent monovalent organic groups having 1 to 6 carbon atoms), or a phenyl group}.

The hindered phenol compound has the action of preventing discoloration of copper or copper alloy in the case of forming the photosensitive resin composition of the present invention on copper or copper alloy, for example. In the present invention, as a result of using a specific phenol compound, namely a phenol compound represented by the aforementioned general formula (70), general formula (71), general formula (75), general formula (76) or general formula (77), the advantage is obtained of being able to obtain a polyimide of high resolution without causing discoloration or corrosion of the copper or copper alloy.

Examples of hindered phenol compounds represented by the aforementioned general formula (70) include, but are not limited to, 2,6-di-t-butyl-4-methylphenol, 2,5-di-t-butyl-hydroquinone, octadecyl-3-(3,5-di-t-butyl-4-hydroxyphenyl) propionate, and isooctyl-3-(3,5-di-t-butyl-4-hydroxyphenyl) propionate, examples of hindered phenol compounds represented by the aforementioned general formula (71) include, but are not limited to, 4,4'-methylene-bis(2,6-di-t-butylphenol), 4,4'-thiobis(3-methyl-6-t-butylphenol), 4,4'-butylidene-bis(3-methyl-6-t-butylphenol), triethylene glycol-bis[3-(3-t-butyl-5-methyl-4-hydroxyphenyl) propionate], 1,6-hexanediol-bis[3-(3,5-di-t-butyl-4-hydroxyphenyl)propionate], 2,2-thio-diethylenebis[3-(3,5-di-t-butyl-4-hydroxphenyl)propionate] and N,N'-hexamethylenebis(3,5-di-t-butyl-4-hydroxyhydrocinnamide), examples represented by the aforementioned general formula (75) include, but are not limited to, 2,2'-methylene-bis(4-methyl-6-t-butylphenol) and 2,2'-methylene-bis(4-ethyl-6-t-butylphenol), examples represented by the aforementioned general formula (76) include, but are not limited to, pentaerythrol-tetrakis[3-(3,5-di-t-butyl-4-hydroxyphenyl)propionate], tris-(3,5-di-t-butyl-4-hydroxybenzyl)isocyanurate and 1,3,5-trimethyl-2,4,6-tris(3,5-di-t-butyl-4-hydroxybenzyl)benzene, examples represented by the aforementioned general formula (77) include, but are not limited to, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Among these, 1,3,5-tris(4-t-butyl-3-hydroxy-2,6-dimethylbenzyl)-1,3,5-triazine-2,4,6-(1H,3H,5H)-trione is particularly preferable.

The added amount of the hindered phenol (B) is 0.1 parts by weight to 20 parts by weight, and preferably 0.5 parts by weight to 10 parts by weight from the viewpoint of photosensitivity, based on 100 parts by weight of the polyimide precursor. If the added amount of hindered phenol compound (B) based on 100 parts by weight of the polyimide precursor is 0.1 parts by weight or more, discoloration and corrosion of copper or copper alloy is prevented in the case of having formed the photosensitive resin composition of the present invention on copper or copper alloy, for example, while if the added amount is 20 parts by weight or less, photosensitivity is superior.

(C) Organic Titanium Compound

The photosensitive resin composition of the present invention may also contain an organic titanium compound (C) as a compound that improves chemical resistance. There are no particular limitations on organic titanium compounds able to be used for the component (C) provided an organic chemical substance is bound to a titanium atom through a covalent bond or ionic bond.

Specific examples of the organic titanium compound (C) include compounds indicated in I) to VII below.

I) Titanium chelate compounds: titanium chelate compounds having two or more alkoxy groups are more preferable since they allow the obtaining of stability of the compound and a favorable pattern, and specific examples thereof include titanium bis(triethanolamine)diisopropoxide, titanium di(n-butoxide)bis(2,4-pentanedionate), titanium diisopropoxide bis(2,4-pentanedionate), titanium diisopropoxide bis(tetramethylheptanedionate) and titanium diisopropoxide bis(ethylacetoacetate).

II) Tetraalkoxytitanium compounds: examples thereof include titanium tetra(n-butoxide), titanium tetraethoxide, titanium tetra(2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearyloxide and titanium tetrakis[bis(2,2-(allyloxymethyl)butoxide)].

III) Titanocene compounds: examples thereof include titanium pentamethylcyclopentadienyl trimethoxide, bis($\eta^5$2,4-cyclopentadien-1-yl) bis(2,6-difluorophenyl) titanium and bis($\eta^5$-2,4-cyclopentadien-1-yl) bis(2,6-difluoro-3-(1H-pyrrol-1-yl)phenyl) titanium.

IV) Monoalkoxy titanium compounds: examples thereof include titanium tris(dicetylphosphate)isopropoxide and titanium tris(dodecylbenzenesulfonate)isopropoxide.

V) Titanium oxide compounds: examples thereof include titanium oxide bis(pentanedionate), titanium oxide bis(tetramethylheptanedionate) and phthalocyanine titanium oxide.

VI) Titanium tetraacetylacetonate compounds: examples thereof include titanium tetraacetylacetonate.

VII) Titanate coupling agents: examples thereof include isopropyltridecylbenzenesulfonyl titanate.

Among these, the organic titanium compound (C) is preferably at least one type of compound selected from the group consisting of the aforementioned titanium chelate compounds (I), tetraalkoxytitanium compounds (II) and titanocene compounds (III) from the viewpoint of demonstrating more favorable chemical resistance.

The added amount of these organic titanium compounds is preferably 0.05 parts by weight to 10 parts by weight and more preferably 0.1 parts by weight to 2 parts by weight based on 100 parts by weight of the polyimide precursor. If the added amount is 0.05 parts by weight or more, favorable heat resistance or chemical resistance are demonstrated, while in the case the added amount is 10 parts by weight or less, storage stability is superior.

(D) Adhesive Assistant

In addition, an adhesive assistant (D) can be optionally added to improve adhesion between a substrate and a film formed using the photosensitive resin composition of the present invention. Examples of adhesive assistants include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-triethoxysilyl]propylamide acid, benzophenone-3,3'-bis(N-[3-triethoxysilyl]propylamido)-4,4'-dicarboxylic acid, benzene-1,4-bis(N-[3-triethoxysilyl]propylamido)-2,5-dicarboxylic acid, 3-(triethoxysilyl)propylsuccinic anhydride or N-phenylaminopropyltrimethoxysilane, and aluminum-based adhesive assistants such as aluminum tris(ethylacetoacetate), aluminum tris(acetylacetonate) or aluminum ethylacetylacetate diisopropylate.

Among these adhesive assistants, silane coupling agents are more preferable from the viewpoint of adhesive strength. The added amount of the adhesive assistant is preferably within the range of 0.5 parts by weight to 25 parts by weight based on 100 parts by weight of the polyimide precursor.

Heat resistance and chemical resistance can be further enhanced by adding a crosslinking agent that is capable of crosslinking the polyimide precursor or forming a crosslinked network by itself. An amino resin or derivative thereof is preferably used for the crosslinking agent, and among these, a glycol urea resin, hydroxyethylene urea resin, melamine resin, benzoguanamine resin or derivatives thereof are used preferably. The crosslinking agent is particularly preferably an alkoxymethylated melamine compound, and an example thereof is hexamethoxymethylmelamine.

The added amount of crosslinking agent with respect to the balance with various properties other than heat resistance and chemical resistance is preferably 2 parts by weight to 40 parts by weight and more preferably 5 parts by weight to 30 parts by weight based on 100 parts by weight of the polyimide precursor. In the case the added amount is 2 parts by weight or more, favorable heat resistance and chemical resistance are demonstrated, while in the case the added amount is 40 parts by weight or less, storage stability is superior.

The following provides an explanation of the cross-sectional angle of a relief pattern in the present embodiment. In the present embodiment, a photosensitive resin composition allowing the production of a semiconductor device having a wide focus margin and favorable electrical properties preferably has a cross-sectional angle between a concave relief pattern and the substrate of 60 degrees to 90 degrees. If the cross-sectional angle is within this range, a normal relief pattern can be formed without the occurrence of bridging, the focus margin is large, and there is no occurrence of disconnections, thereby making this preferable.

In addition, if the cross-sectional angle is below this range, it becomes difficult to form the rewiring layer, thereby making this undesirable. The cross-sectional angle is more preferably 60 degrees to 85 degrees.

<Method for Producing Cured Relief Pattern and Semiconductor Device>

In addition, the present invention provides a method for producing a cured relief pattern, comprising the following steps (6) to (9):

(6) a step for forming a resin layer on a substrate by coating the photosensitive resin composition of the present invention on the substrate;

(7) a step for exposing the resin layer to light;

(8) a step for forming a relief pattern by developing the resin layer after exposing to light; and, (9) a step for forming a cured relief pattern by heat-treating the relief pattern. The following provides of a typical aspect of each step.

(6) Step for Forming a Resin Layer on a Substrate by Coating the Photosensitive Resin on the Substrate In the present step, the photosensitive resin composition of the present invention is coated onto a substrate followed by drying as necessary to form a resin layer. A method conventionally used to coat photosensitive resin compositions can be used, examples of which include coating methods using a spin coater, bar coater, blade coater, curtain coater or screen printer, and spraying methods using a spray coater.

The method for forming a relief pattern using the photosensitive resin composition of the resin may consist of forming the resin layer not only by forming the resin layer on the substrate by coating the photosensitive resin composition on the substrate, but also by forming the photosensitive resin composition into the form of a film followed by laminating a layer of the photosensitive resin composition on the substrate. In addition, a film of the photosensitive resin composition according to the present invention may be formed on a support base material, and the support base material may be removed before or after laminating when using the film.

A coating film composed of the photosensitive resin composition can be dried as necessary. A method such as air drying, or heat drying or vacuum drying using an oven or hot plate, is used for the drying method. More specifically, in the case of carrying out air drying or heat drying, drying can be carried out under conditions consisting of 1 minute to 1 hour at 20° C. to 140° C. The resin layer can be formed on the substrate in this manner.

(7) Step for Exposing Resin Layer to Light

In the present step, the resin layer formed in the manner described above is exposed to an ultraviolet light source and the like either directly or through a photomask having a pattern or reticle using an exposure device such as a contact aligner, mirror projector or stepper.

Subsequently, post-exposure baking (PEB) and/or pre-development baking may be carried out using an arbitrary combination of temperature and time as necessary for the purpose of improving photosensitivity and the like. Although the range of baking conditions preferably consists of a temperature of 40° C. to 120° C. and time of 10 seconds to 240 seconds, the range is not limited thereto provided various properties of the photosensitive resin composition of the present invention are not impaired.

(8) Step for Forming Relief Pattern by Developing Resin Layer after Exposing to Light In the present step, unexposed portions of the photosensitive resin layer are developed and removed following exposure. An arbitrary method can be selected and used for the development method from among conventionally known photoresist development methods, examples of which include the rotary spraying method, paddle method and immersion method accompanying ultrasonic treatment. In addition, post-development baking using an arbitrary combination of temperature and time may be carried out as necessary after development for the purpose of adjusting the form of the relief pattern.

A good solvent with respect to the photosensitive resin composition or a combination of this good solvent and a poor solvent is preferable for the developer used for development. Examples of good solvents include N-methylpyrrolidone, N-cyclohexyl-2-pyrrolidone, N,N-dimethylacetoamide, cyclopentanone, cyclohexanone, γ-butyrolactone and α-acetyl-γ-butyrolactone, while preferable examples of poor solvents include toluene, xylene, methanol, ethanol, isopropyl alcohol, ethyl lactate, propylene glycol methyl ether acetate and water. In the case of using a mixture of good solvent and poor solvent, the proportion of poor solvent to good solvent is preferably adjusted according to the solubility of polymer in the photosensitive resin composition. In addition, two or more types of each solvent, such as a combination of several types of each solvent, can also be used.

(9) Step for Forming Cured Relief Pattern by Heat-Treating Relief Pattern

In the present step, the relief pattern obtained by developing in the manner previously described is converted to a cured relief pattern by heating. Various methods can be selected for the heat curing method, examples of which include heating with a hot plate, heating using an oven, and heating using a programmable oven that allows the setting of a temperature program. Heating can be carried out under conditions consisting of, for example, 30 minutes to 5 hours at 180° C. to 400° C. Air may be used for the atmospheric gas during heat curing, or an inert gas such as nitrogen or argon can be used.

<Semiconductor Device>

The present invention also provides a semiconductor device that contains a cured relief pattern obtained according to the method for producing a cured relief pattern of the present invention described above. The present invention also provides a semiconductor device containing a semiconductor element in the form of a base material and a cured relief pattern of a resin formed according to the aforementioned method for producing a cured relief pattern on the aforementioned base material. In addition, the present invention can be applied to a method for producing a semiconductor device that uses a semiconductor element for the base material and contains the aforementioned method for producing a cured relief pattern as a portion of the process thereof. The semiconductor device of the present invention can be produced by combining with known methods for producing semiconductor devices by forming the cured relief pattern formed according to the aforementioned method for producing a cured relief pattern as a surface protective film, interlayer insulating film, rewiring insulating film, flip-chip device protective film, fan out device protective film or protective film of a semiconductor device having a bump structure.

The photosensitive resin composition according to the second aspect of the present invention is also useful in applications such as the interlayer insulation of a multilayer circuit, cover coating of a flexible copper-clad board, solder-resistive film or liquid crystal alignment film.

[Third Aspect]

Elements are mounted on printed boards using various methods corresponding to the purpose. Conventional elements were typically fabricated by a wire bonding method in which a connection is made from an external terminal of the element (pad) to a lead frame with a fine wire. However, with today's current higher element speeds in which the operating frequency has reached the GHz range, differences in the wiring lengths of each terminal during mounting are having an effect on element operation. Consequently, in the case of mounting elements for high-end applications, it has become necessary to accurately control the lengths of mounting wires, and it has become difficult to satisfy this requirement with wire bonding.

Thus, flip-chip mounting has been proposed in which, after having formed a rewiring layer on the surface of a semiconductor chip and formed a bump (electrode) thereon, the chip is turned over (flipped) followed by directly mounting on the printed board (see, for example, Japanese Unexamined Patent Publication No. 2001-338947). As a result of being able to accurately control wiring distance, this flip-chip mounting is being employed in elements for high-end applications handling high-speed signals, and because of its small mounting size, is also being employed in cell phone applications, thereby resulting in a rapid increase in demand. In the case of using a polyimide material for flip-chip mounting, the process goes through a step for forming a metal wiring layer after a pattern has been formed in the polyimide layer. The metal wiring layer is normally formed by roughening the surface of the polyimide layer by subjecting to plasma etching, followed by forming a metal layer serving as the plating seed layer by sputtering at a thickness of 1 μm or less, and then forming the metal wiring layer by electrolytic plating using this metal layer as an electrode. Although Ti is typically used for the metal of the seed layer at this time, Cu is used as the metal of the rewiring layer formed by electrolytic plating.

With respect to this metal rewiring layer, the rewired metal layer and resin layer are required to demonstrate high adhesion. However, there have conventionally been cases in which adhesion between the rewiring Cu layer and resin layer decreases due to the effects of the resin and additives that form the photosensitive resin composition and the effects of the production method used when forming the rewiring layer. A decrease in adhesion between the rewired Cu layer and resin layer results in a decrease in insulation reliability of the rewiring layer.

With the foregoing in view, an object of the third aspect of the present invention is to provide a method for forming a rewiring layer demonstrating a high level of adhesion with a Cu layer, and a semiconductor device having this rewiring layer.

The inventors of the present invention found that the aforementioned object can be achieved by combining a photosensitive polyimide precursor and a specific compound, thereby leading to completion of the third aspect of the present invention. Namely, the third aspect of the present invention is as indicated below.

[1] A photosensitive resin composition comprising:

a photosensitive polyimide precursor in the form of a component (A); and a component (B) represented by the following general formula (B1):

[Chemical Formula 96]

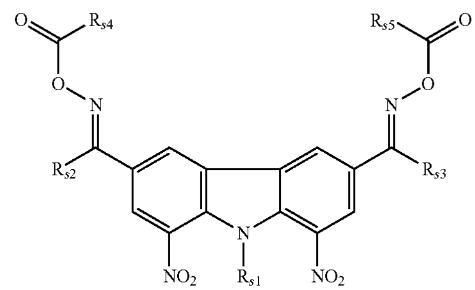

(B1)

{wherein, $R_{s1}$ to $R_{s5}$ respectively and independently represent a hydrogen atom or monovalent organic group}.

[2] The photosensitive resin composition described in [1], wherein component (A) is a polyamic acid derivative having a radical-polymerisable substituent in a side chain thereof.

[3] The photosensitive resin composition described in [1] or [2], wherein component (A) is a photosensitive polyimide precursor containing a structure represented by the following general formula (A1):

[Chemical Formula 97]

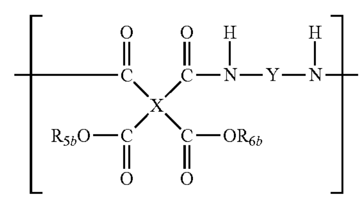

(A1)

{wherein, X represents a tetravalent organic group, Y represents a divalent organic group, and $R_{5b}$ and $R_{6b}$ respectively and independently represent a hydrogen atom, a monovalent organic group represented by the following general formula (R1):

[Chemical Formula 98]

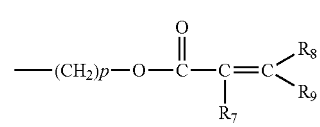

(R1)

(wherein, $R_{7b}$, $R_{8b}$ and $R_{9b}$ respectively and independently represent a hydrogen atom or organic group having 1 to 3 carbon atoms, and p represents an integer of 2 to 10), or a saturated aliphatic group having 1 to 4 carbon atoms, provided that $R_{5b}$ and $R_{6b}$ are not both simultaneously hydrogen atoms}.

[4] The photosensitive resin composition described in any of [1] to [3], wherein component (B) contains a structure represented by the following formula (B2).

[Chemical Formula 99]

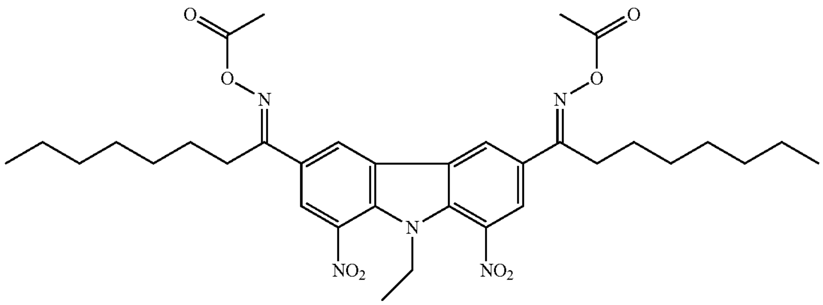

(B2)

[5] The photosensitive resin composition describe in any of [1] to [4], wherein X in general formula (A1) contains at least one type of tetravalent organic group selected from the following (C1) to (C3):

[Chemical Formula 100]

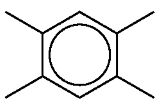

(C1)

[Chemical Formula 101]

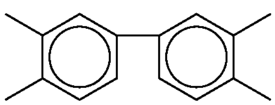

(C2)

[Chemical Formula 102]

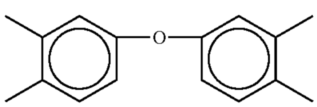

(C3)

and Y contains at least one type of divalent organic group selected from the following group (D1):

[Chemical Formula 103]

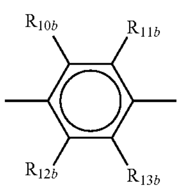

(D1)

{wherein, $R_{10b}$ to $R_{13b}$ represent hydrogen atoms or aliphatic groups having 1 to 4 carbon atoms, and may mutually be the same or different}, and following group (D2).

[Chemical Formula 104]

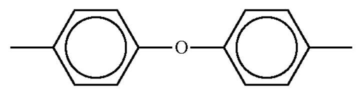

(D2)

[6] The photosensitive resin composition described in any of [1] to [5], wherein the content of component (B) based on 100 parts by weight of component (A) is 0.1 parts by weight to 10 parts by weight.

[7] The photosensitive resin composition described in any of [1] to [6], wherein the content of component (B) based on 100 parts by weight of component (A) is 0.5 parts by weight to 5 parts by weight.

[8] A method for producing a cured relief pattern including the following steps:

(1) a coating step for forming a photosensitive resin layer on a substrate by coating the photosensitive resin composition described in any of [1] to [7] on the substrate, (2) an exposure step for exposing the photosensitive resin layer to light, (3) a development step for forming a relief pattern by developing the photosensitive resin layer after exposing to light; and, (4) a heating step for forming a cured relief pattern by heat-treating the relief pattern.

[9] A semiconductor device having a substrate and a cured relief pattern obtained according to the method described in [8] formed on the substrate, wherein the cured relief pattern contains a polyimide resin and a compound represented by the following general formula (B1):

[Chemical Formula 105]

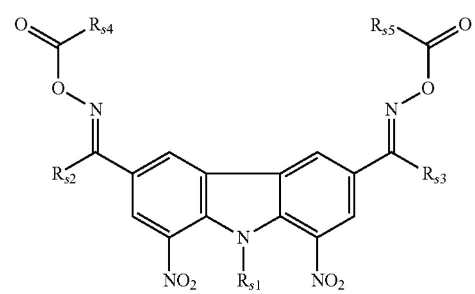

(B1)

{wherein, $R_{s1}$ to $R_{s5}$ respectively and independently represent a hydrogen atom or monovalent organic group}.

According to this third aspect of the present invention, a photosensitive resin composition, in which a photosensitive resin demonstrating a high level of adhesion between a Cu layer and a polyimide layer, is obtained by combining a photosensitive polyimide precursor and a specific compound, a method for forming a cured relief pattern using the photosensitive resin composition, and a semiconductor device having the cured relief pattern, can be provided.

The following provides a detailed explanation of the present third aspect. Furthermore, throughout the present description, in the case a plurality of structures represented by the same reference symbol in the general formulas are present within a molecule, those structures may be the same or different.

<Photosensitive Resin Composition>

The photosensitive resin composition of the present invention contains a photosensitive polyimide precursor in the form of a component (A) and a component (B) represented by the following general formula (B1);

[Chemical Formula 106]

(B1)

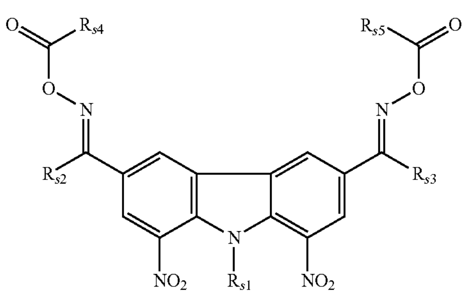

{wherein, $R_{s1}$ to $R_{s5}$ respectively and independently represent a hydrogen atom or monovalent organic group}.

[Photosensitive Polyimide Precursor (A)]

The following provides an explanation of the photosensitive polyimide precursor of component (A) used in the present invention.

A photosensitive polyimide precursor having an i-line absorbance of 0.8 to 2.0, as measured for a 10 μm thick film obtained after coating in the form of single solution and prebaking, is preferably used for the photosensitive polyimide precursor in the present invention.

The photosensitive resin composition of the present invention preferably contains a photosensitive polyimide precursor (A) that satisfies the aforementioned requirements in order to give the sides of an opening in the cured relief pattern obtained from the photosensitive resin composition a forward tapered shape (shape in which the opening diameter in the top of a film is larger than the opening diameter in the bottom of the film).

After having prebaked the photosensitive polyimide precursor alone, the i-line absorbance of a 10 μm thick film can be measured for a coating film formed on quartz with an ordinary spectrophotometer. In the case the thickness of the film formed is not 10 μm, i-line absorbance can be determined for a thickness of 10 μm by converting absorbance obtained for the film to a thickness of 10 μm in accordance with Lambert-Beer's Law.

If the i-line absorbance is 0.8 to 2.0, mechanical properties and physical properties of the coating film are superior, and since i-line absorbance of the coating film is such that light suitably reaches to the bottom, curing is able to proceed to the bottom of the coating film in the case of a negative-type film, thereby making this preferable.

The photosensitive polyimide precursor (A) of the present invention preferably has a polyamic acid ester for the main component thereof. Here, the main component refers to containing this resin at 60% by weight or more, and preferably at 80% by weight or more, based on the total amount of resin. In addition, other resins may be contained as necessary.

The weight average molecular weight (Mw) of the photosensitive polyimide precursor (A) as determined by gel permeation chromatography (GPC) based on standard polystyrene conversion is preferably 1,000 or more and more preferably 5,000 or more from the viewpoints of heat resistance and mechanical properties of the film obtained following heat treatment. The upper limit of weight average molecular weight (Mw) is preferably 100,000 or less. The upper limit is more preferably 50,000 or less from the viewpoint of solubility with respect to the developer.

In the photosensitive resin composition of the present invention, the most preferable photosensitive polyimide precursor (A) from the viewpoints of heat resistance and photosensitivity is an ester-type photosensitive polyimide precursor containing a structure represented by the following general formula (A1):

[Chemical Formula 107]

(A1)

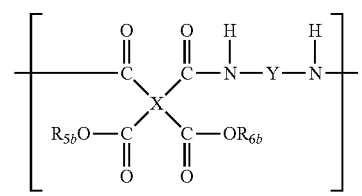

{wherein, X represents a tetravalent organic group, Y represents a divalent organic group, and $R_{5b}$ and $R_{6b}$ respectively and independently represent a hydrogen atom, a monovalent organic group represented by the following general formula ($R_1$):

[Chemical Formula 108]

(R1)

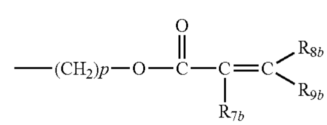

(wherein, $R_{7b}$, $R_{8b}$ and $R_{9b}$ respectively and independently represent a hydrogen atom or organic group having 1 to 3 carbon atoms, and p represents an integer of 2 to 10), or a saturated aliphatic group having 1 to 4 carbon atoms, provided that $R_{5b}$ and $R_{6b}$ are not both simultaneously hydrogen atoms}.

From the viewpoint of realizing both heat resistance and photosensitivity, examples of the tetravalent organic group represented by X in the aforementioned general formula (A1) preferably include, but are not limited to, organic groups having 6 to 40 carbon atoms, more preferably an aromatic group or alicyclic group having a —$COOR_1$ group and a —$COOR_2$ group at mutually ortho positions with a —CONH— group, and even more preferably structures represented by the following formula (90):

[Chemical Formula 109]

(90)

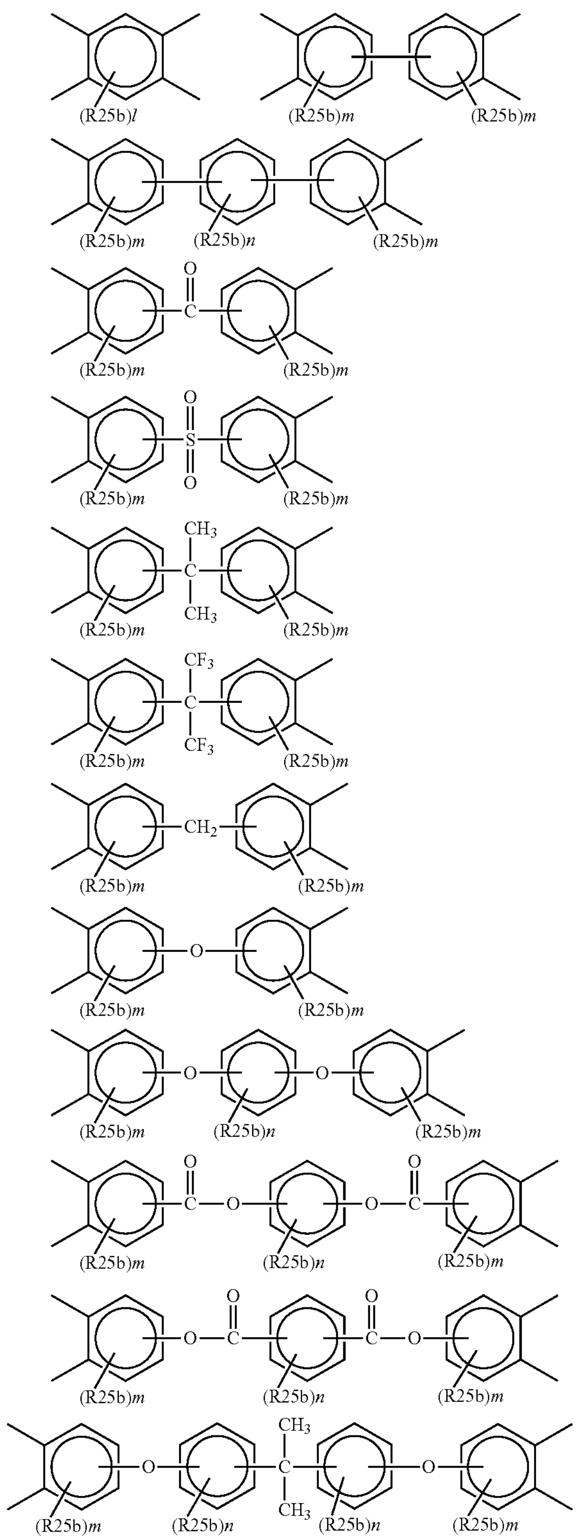

-continued

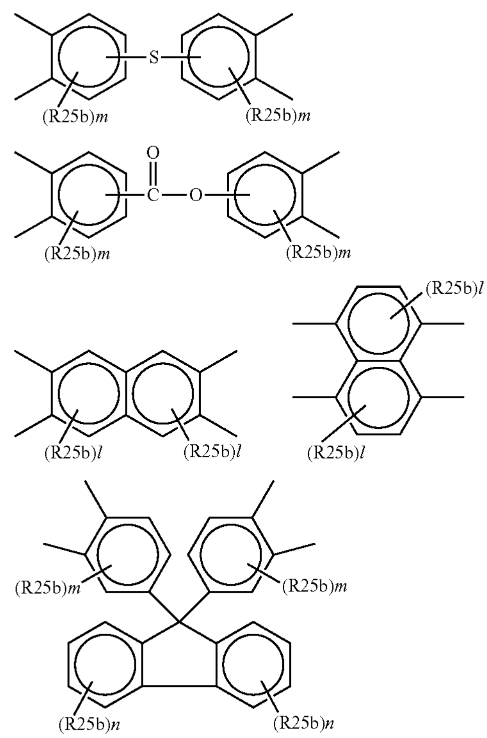

{wherein, $R_{25b}$ represents a hydrogen atom, fluorine atom or monovalent group selected from hydrocarbon groups having 1 to 10 carbon atoms and fluorine-containing hydrocarbon groups having 1 to 10 carbon atoms, 1 represents an integer of 0 to 2, m represents an integer of 0 to 3 and n represents an integer of 0 to 4}. In addition, the structure of X may be one type or a combination of two or more types. Group X having a structure represented by the aforementioned formulas is particularly preferable from the viewpoint of realizing both heat resistance and photosensitivity.

From the viewpoint of realizing both heat resistance and photosensitivity, examples of the divalent organic group represented by Y in the aforementioned general formula (A1) preferably include aromatic groups having 6 to 40 carbon atoms such as the structures represented by the following formula (91):

[Chemical Formula 110]

(91)

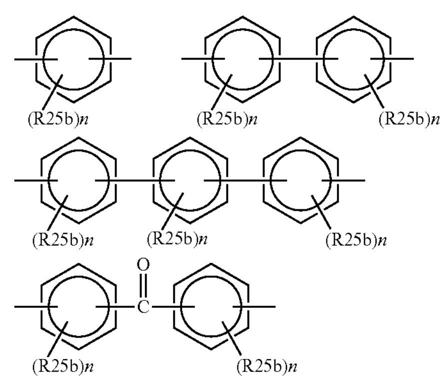

-continued

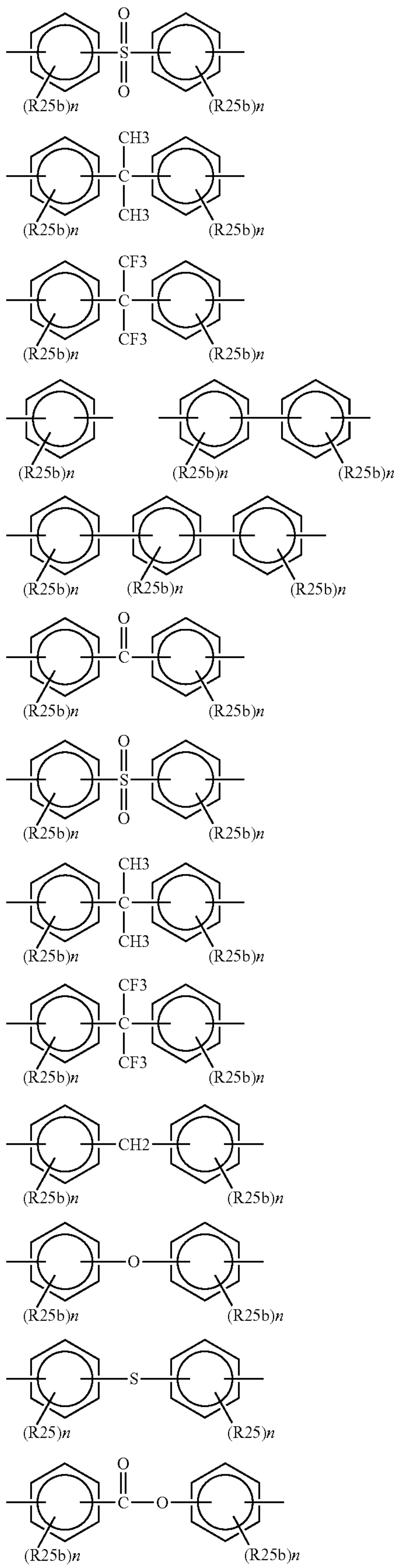

-continued

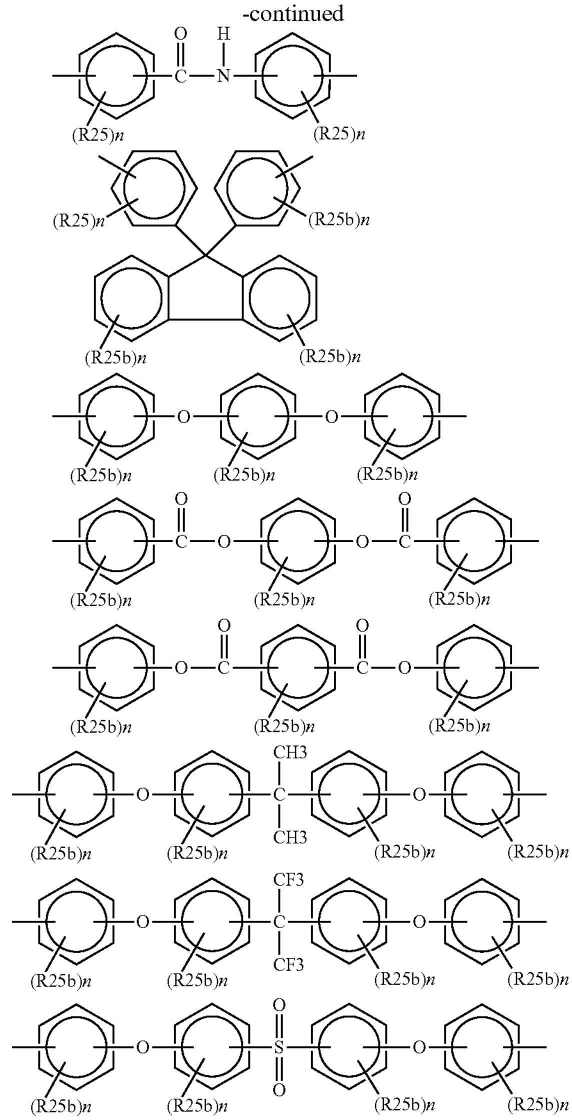

{wherein, $R_{25b}$ represents a hydrogen atom, fluorine atom or monovalent group selected from the group consisting of hydrocarbon groups having 1 to 10 carbon atoms and fluorine-containing hydrocarbon groups having 1 to 10 carbon atoms, and n represents an integer of 0 to 4}. In addition, the structure of Y may be one type or a combination of two or more types. Group Y having a structure represented by the aforementioned formula (91) is particularly preferable from the viewpoint of realizing both heat resistance and photosensitivity.

Group $R_{7b}$ in the aforementioned general formula (R1) is preferably a hydrogen atom or methyl group, and $R_{8b}$ and $R_{9b}$ are preferably hydrogen atoms from the viewpoint of photosensitivity. In addition, p is an integer of 2 to 10, and preferably an integer of 2 to 4, from the viewpoint of photosensitivity.

In the case of using a polyimide precursor for the resin (A), examples of methods used to impart photosensitivity to the photosensitive resin composition include ester bonding and ionic bonding. The former is a method consisting of introducing a photopolymerizable group, or in other words, a compound having an olefinic double bond, into a side chain of a polyimide precursor by ester bonding, while the latter is a method consisting of imparting a photopolymerizable group by bonding an amino group of (meth)acrylic compound having an amino group with a carboxyl group of a polyimide precursor through an ionic bond.

The aforementioned ester-bonded polyimide precursor is obtained by first preparing a partially esterified tetracarboxylic acid (to also be referred to as an acid/ester form) by reacting a tetracarboxylic dianhydride containing the tetravalent organic group X with an alcohol having photopolymerizable unsaturated double bond, and optionally, a saturated aliphatic alcohol having 1 to 4 carbon atoms, followed by subjecting this to amide polycondensation with a diamine containing the divalent organic group Y.

(Preparation of Acid/Ester Form)

In the present invention, examples of the tetracarboxylic dianhydride containing the tetravalent organic group X preferably used to prepare the ester-bonded polyimide precursor include, but are not limited to, acid dianhydrides having a structure represented by the aforementioned general formula (90) such as pyromellitic anhydride, diphenylether-3,3',4,4'-tetracarboxylic dianhydride, benzophenone-3,3',4,4'-tetracarboxylic dianhydride, biphenyl-3,3'4,4'-tetracarboxylic dianhydride, diphenylphosphone-3,3',4,4'-tetracarboxylic dianhydride, diphenylmethane-3,3'4,4'-tetracarboxylic dianhydride, 2,2-bis(3,4-phthalic anhydride) propane or 2,2-bis(3,4-phthalic anhydride)-1,1,1,3,3,3-hexafluoropropane. Preferable examples include, but are not limited to, pyromellitic anhydride, diphenylether-3,3',4,4'-tetracarboxylic dianhydride, biphenyl-3,3'4,4'-tetracarboxylic dianhydride, preferably pyromellitic anhydride, diphenylether-3,3',4,4'-tetracarboxylic dianhydride, benzophenone-3,3',4,4'-tetracarboxylic dianhydride and biphenyl-3,3'4,4'-tetracarboxylic dianhydride, and more preferably pyromellitic anhydride, diphenylether-3,3',4,4'-tetracarboxylic dianhydride and biphenyl-3,3'4,4'-tetracarboxylic dianhydride. In addition, these may be used alone or two or more types may be used as a mixture.

In the present invention, examples of alcohols having a photopolymerizable group preferably used to prepare the ester-bonded polyimide precursor include 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butyoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, 2-hydroxy-3-methoxyopropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

Saturated aliphatic alcohols able to be optionally used together with the aforementioned alcohols having a photopolymerizable group are preferably saturated aliphatic alcohols having 1 to 4 carbon atoms. Specific examples thereof include methanol, ethanol, n-propanol, isopropanol, n-butanol and tert-butanol.

A desired acid/ester form can be obtained by carrying out an acid anhydride esterification reaction by mixing the aforementioned preferable tetracarboxylic dianhydride of the present invention with an aforementioned alcohol preferably in the presence of a basic catalyst such as pyridine and preferably and in a suitable reaction solvent to be subsequently described followed by stirring for 4 to 10 hours at a temperature of 20° C. to 50° C.

[Preparation of Photosensitive Polyimide Precursor]

The acid/ester form is converted to a polyacid anhydride by adding a suitable dehydration condensation agent to the aforementioned acid/ester form (typically in the form of a solution dissolved in the aforementioned reaction solvent) while cooling with ice and mixing therewith. Next, a solution or dispersion of a diamine containing the divalent organic group Y preferably used in the present invention dissolved or dispersed in a different solvent is dropped therein followed by amide polycondensation to obtain the target photosensitive polyimide precursor. A diaminosiloxane may be used in combination with the aforementioned diamine having the divalent organic group Y.

Examples of the aforementioned dehydration condensation agent include dicyclocarbodiimide, 1-ethoxycarbonyl-2-ethoxy-1,2-dihydroquinoline, 1,1-carbonyldioxy-di-1,2,3-benzotriazole and N, N'-disuccinimidyl carbonate.

An intermediate in the form of a polyacid anhydride is obtained in the manner described above.

In the present invention, examples of diamines having the divalent organic group Y preferably used in the reaction with the polyacid anhydride obtained in the manner described above include diamines having a structure represented by the aforementioned general formula (91), such as p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl] ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, o-toluidine sulfone or 9,9-bis(4-aminophenyl)fluorene, those in which a portion of the hydrogen atoms on the benzene ring thereof is substituted with a substituent such as a methyl group, ethyl group, hydroxymethyl group, hydroxyethyl group or halogen atom, and mixtures thereof.

Specific examples of the aforementioned substituents include 3,3'-dimethyl-4,4'-diaminobiphenyl, 2,2'-dimethyl- 4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, 2,2'-bis(trifluoromethyl)-4,4'-diaminobiphenyl, 2,2'-bis(fluoro)-4,4'-diaminobiphenyl, 4,4'-diaminooctafluorobiphenyl and mixtures thereof. Among these, examples of substituents that are used preferably include p-phenylenediamine, 4,4'-diaminodiphenyl ether, 2,2'-dimethyl-4,4'-diaminobiphenyl, 2,2'-bis(trifluoromethyl)-4,4'-diaminobiphenyl, 2,2'-bis(fluoro)-4,4'-diaminobiphenyl and 4,4'-diaminooctafluorobiphenyl, while more preferable examples include p-phenylenediamine, 4,4'-diaminodiphenyl ether and mixtures thereof. These diamines are not limited to the aforementioned examples thereof.

Diaminosiloxanes are used in combination with the aforementioned diamine containing the divalent organic group Y when preparing the photosensitive polyimide precursor (A) for the purpose of improving adhesion between various types of substrates and a coating film formed from the photosensitive resin composition of the present invention. Specific examples of such diaminosiloxanes include 1,3-bis(3-aminopropyl)tetramethyldisiloxane and 1,3-bis(3-aminopropyl)tetraphenyldisiloxane.

Following completion of the amide polycondensation reaction, after filtering out absorption byproducts of the dehydration condensation agent also present in the reaction solution as necessary, a suitable poor solvent such as water, an aliphatic lower alcohol or a mixture thereof is added to a solution containing the polymer component to precipitate the polymer component. Moreover, after purifying the polymer by repeating re-dissolution and re-precipitation procedures as necessary, vacuum drying is carried out to isolate the target photosensitive polyimide precursor. In order to improve the degree of purification, a solution of this polymer may be passed through a column packed with an anion exchange resin and/or cation exchange resin swollen with a suitable organic solvent to remove any ionic impurities.

From the viewpoints of heat resistance and mechanical properties of the film obtained following heat treatment, the weight average molecular weight (Mw) of the ester-bonded polyimide precursor in the case of measuring by gel permeation chromatography (GPC) based on standard polystyrene conversion is preferably 1,000 or more and more preferably 5,000 or more. The upper limit of weight average molecular weight (Mw) is preferably 100,000 or less. The upper limit of weight average molecular weight (Mw) is more preferably 50,000 or less from the viewpoint of solubility with respect to the developer. The use of tetrahydrofuran or N-methyl-2-pyrrolidone is recommended for the developing solvent during gel permeation chromatography. Molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

Various values can be adopted for the i-line absorbance of a prebaked film formed alone for the photosensitive polyimide precursor (A) synthesized according to a method like that described above corresponding to the molecular structure thereof. However, since the i-line absorbance of a mixture is the arithmetic mean of the i-line absorbance of each component, the i-line absorbance of a 10 μm thick film following prebaking of the photosensitive polyimide precursor (A) can be made to be 0.8 to 2.0 while maintaining balance among mechanical properties, heat resistance and the like by combining two or more types of the photosensitive polyimide precursor (A) at a suitable ratio.

[Component (B)]

Next, an explanation is provided of component (B) used in the present invention.

Component (B) used in the present invention is an oxime ester having an i-line absorbance of a 0.001% by weight solution of 0.1 to 0.2, an h-line absorbance of 0.02 to 0.1, and a g-line absorbance of 0.02 or less. These oxime esters have photosensitivity and are essential for patterning a photosensitive resin by photolithography.

From the viewpoint of adhesion with Cu, the i-line absorbance of a 0.001% by weight solution is preferably 0.1 to 0.2, h-line absorbance is preferably 0.02 to 0.1, and g-line absorbance is preferably 0.02 or less. Adhesion with Cu decreases in the case i-line absorbance exceeds 0.2, h-line absorbance exceeds 0.1 and g-line absorbance exceeds 0.02, while sensitivity decreases in the case i-line absorbance is less than 0.1 and h-line absorbance is less than 0.02.

Component (B) able to be used in the present invention contains a structure represented by the following general formula (B1):

[Chemical Formula 111]

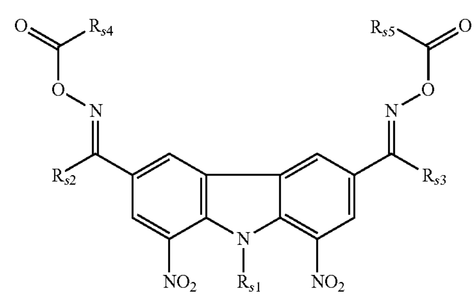

(B1)

{wherein, $R_{s1}$ to $R_{s5}$ respectively and independently represent a hydrogen atom or monovalent organic group}.

Here, a hydrogen atom or a group selected from a linear, branched or cyclic alkyl group, alkylaryl group and arylalkyl group is respectively and independently preferably used for $R_{s1}$ to $R_{s6}$. Specific examples thereof include a methyl group, ethyl group, n-propyl group, isopropyl group, n-butyl group, isobutyl group, sec-butyl group, tert-butyl group, n-pentyl group, isopentyl group, neopentyl group, tert-pentyl group, n-hexyl group, isohexyl group, n-octyl group, isooctyl group, n-decyl group, isodecyl group, cyclopropyl group, cyclobutyl group, cyclopentyl group, cyclohexyl group, methylcyclopentyl group, cyclopentylmethyl group, methylcyclohexyl group, cyclohexylmethyl group, phenyl group, tolyl group, xylyl group and benzyl group.

Compounds represented by the following general formula (B2) are preferably used for component (B):

[Chemical Formula 112]

(B2)

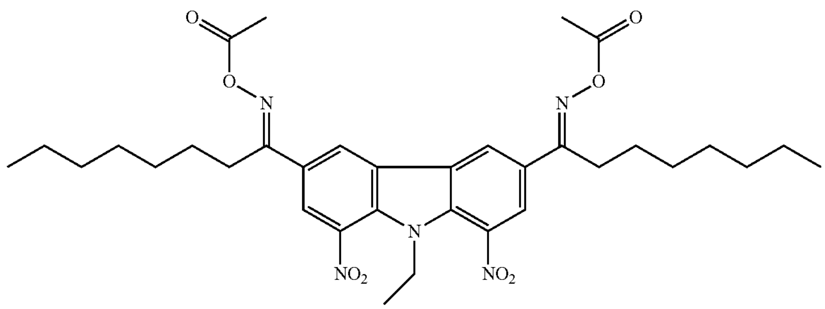

An example thereof is TR-PBG-346 manufactured by Changzhou Tronly New Electronic Materials Co., Ltd.

Component (B) is used at an added amount of 0.1 parts by weight to 10 parts by weight, and preferably 0.5 parts by weight to 5 parts by weight, based on 100 parts by weight of the photosensitive polyimide precursor (A). In the case the added amount of component (B) is 0.1 parts by weight or more based on 100 parts by weight of the photosensitive polyimide precursor (A), the effect of inhibiting the formation of voids at the interface between the Cu layer and polyimide layer is adequately demonstrated following a high-temperature storage test. In addition, if the added amount of component (B) is 10 parts by weight or less based on 100 parts by weight of the photosensitive polyimide precursor (A), filterability and coatability of the composition improve.

The oxime ester used in the present invention, when examining the g-line absorbance, h-line absorbance and i-line absorbance of a 0.001% by weight solution thereof, is characterized in that i-line absorbance is 0.1 to 0.2, h-line absorbance is 0.02 to 0.1, and g-line absorbance is 0.02 or less. Normally, when used as a polymerization inhibitor, only the i-line absorbance of the oxime ester is high, while g-line and h-line absorbance are not observed. On the other hand, since some oxime esters demonstrate hardly any g-line, h-line or i-line absorbance, it is necessary to use the oxime ester in combination with a sensitizer.

On the basis of these characteristic g-line, h-line and i-line absorbance spectra, the oxime ester of the present invention is able to improve adhesion with Cu as a result of generating a specific amount of not only a polymerization-initialing radical when exposed, but also generating a specific amine, and that amine specifically interacting with Cu.

[Other Component (C)]

The photosensitive resin composition of the present invention may further contain a component other than the aforementioned photosensitive polyimide precursor (A) and the component (B).

The photosensitive resin composition of the present invention is used as a liquid photosensitive resin composition by dissolving each of the aforementioned components and optional components used as necessary in a solvent to form a varnish. Consequently, in addition to a solvent, examples of other component (C) include a resin other than the photosensitive polyimide precursor of component (A), sensitizer, monomer having a photopolymerizable unsaturated bond, adhesive assistant, thermal polymerization inhibitor, azole compound and hindered phenol compound.

Examples of the aforementioned solvent include polar organic solvents and alcohols.

A polar organic solvent is preferably used for the solvent from the viewpoints of solubility with respect to the photosensitive polyimide precursor (A). Specific examples thereof include N,N-dimethylformamide, N-methyl-2-pyrrolidone, N-ethyl-2-pyrrolidone, N,N-dimethylacetoamide, dimethylsulfoxide, diethylene glycol dimethyl ether, cyclopentanone, γ-butyrolactone, α-acetyl-γ-butyrolactone, tetramethyl urea, 1,3-dimethyl-2-imidazolinone and N-cyclohexyl-2-pyrrolidene, and these can be used alone or two or more types can be used in combination.

A solvent containing an alcohol is preferable for the solvent used in the present invention from the viewpoint of improving storage stability of the photosensitive resin composition. Alcohols able to be used preferably are typically alcohols that have an alcoholic hydroxyl group but do not have an olefinic double bond within a molecule thereof.

Specific examples thereof include alkyl alcohols such as methyl alcohol, ethyl alcohol, n-propyl alcohol, isopropyl alcohol, n-butyl alcohol, isobutyl alcohol or tert-butyl alcohol, lactic acid esters such as ethyl lactate, propylene glycol monoalkyl ethers such as propylene glycol 1-methyl ether, propylene glycol 2-methyl ether, propylene glycol 1-ethyl ether, propylene glycol 2-ethyl ether, propylene glycol 1-(n-propyl) ether or propylene glycol 2-(n-propyl) ether, monoalcohols such as ethylene glycol methyl ether, ethylene glycol ethyl ether or ethylene glycol n-propyl ether, 2-hydroxyisobutyric acid esters, and dialcohols such as ethylene glycol and propylene glycol.

Among these, lactic acid esters, propylene glycol monoalkyl ethers, 2-hydroxyisobutyric acid esters and ethyl alcohol are preferable, and in particular, ethyl lactate, propylene glycol 1-methyl ether, propylene glycol 1-ethyl ether and propylene glycol 1-(n-propyl) ether are more preferable.

In addition, ketones, esters, lactones, ethers, halogenated hydrocarbons and hydrocarbons can also be used preferably.

Specific examples thereof include ketones such as acetone, methyl ethyl ketone, methyl isobutyl ketone or cyclohexanone, esters such as methyl acetate, ethyl acetate, butyl acetate or diethyl oxalate, lactones such as γ-butyrolactone, ethers such as ethylene glycol dimethyl ether, diethylene glycol dimethyl ether or tetrahydrofuran, halogenated hydrocarbons such as dichloromethane, 1,2-dichloroethane, 1,4-dichlorobutane, chlorobenzene or o-dichlorobenzene, and hydrocarbons such as hexane, heptane, benzene, toluene or xylene. These may be used alone or two or more types may be used as a mixture as necessary.

The aforementioned solvent can be used within the range of, for example, 30 parts by weight to 1500 parts by weight, and preferably within the range of 100 parts by weight to 1000 parts by weight, based on 100 parts by weight of the photosensitive polyimide precursor (A) corresponding to the desired coated film thickness and viscosity of the photosensitive resin composition. In the case the solvent contains an alcohol that does not have an olefinic double bond, the content of alcohol not having an olefinic double bond present in the entire solvent is preferably 5% by weight to 50% by weight and more preferably 10% by weight to 30% by weight. In the case the aforementioned content of the alcohol not having an olefinic double bond is 5% by weight or more, storage stability of the photosensitive resin composition is favorable, while in the case the content thereof is 50% by weight or less, solubility of the photosensitive polyimide precursor (A) is favorable.

The photosensitive resin composition of the present invention may further contain a resin component other than the photosensitive polyimide precursor (A) described above. Examples of resin components able to be contained include polyimides, polyoxazoles, polyoxazole derivatives, phenol resins, polyamides, epoxy resins, siloxane resins and acrylic resins. The incorporated amount of these resin components is preferably within the range of 0.01 parts by weight to 20 parts by weight based on 100 parts by weight of the photosensitive polyimide precursor (A).

The photosensitive resin composition of the present invention can optionally incorporate a sensitizer for improving photosensitivity. Examples of the sensitizer include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-diethylaminocinnamylidene indanone, p-dimethylaminobenzylidene indanone, 2-(p-dimethylaminophenylbiphenylene)benzothiazole, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-d)thiazole, 2-(p-dimethylaminobenzoyl)styrene, diphenylacetoamide, benzanilide, N-methylacetoanilide and 3',4'-dimethylacetoanilide. These can be used alone or, for example, 2 to 5 types can be used in combination.

The incorporated amount of the sensitizer in the case the photosensitive resin composition contains a sensitizer for improving photosensitivity is preferably 0.1 parts by weight to 25 parts by weight based on 100 parts by weight of the photosensitive polyimide precursor (A).

A monomer having a photopolymerizable unsaturated bond can be optionally incorporated in the photosensitive resin composition of the present invention to improve resolution of a relief pattern. The monomer is preferably a (meth)acrylic compound that undergoes a radical polymerization reaction by a photopolymerization initiator.

In particular, examples thereof include, but are not limited to compounds such as mono- or di(meth)acrylates of ethylene glycol or polyethylene glycol such as diethylene glycol dimethacrylate or tetraethylene glycol dimethacrylate, mono- or di(meth)acrylates of propylene glycol or polypropylene glycol, mono-, di- or tri(meth)acrylates of 1,4-butanediol and di(meth)acrylates of 1,6-hexanediol, di(meth)acrylates of neopentyl glycol, mono- or di(meth)acrylates of bisphenol A, benzene trimethacrylates, isobornyl (meth)acrylates, acrylamides and derivatives thereof, methacrylamides and derivatives thereof, trimethylolpropane tri(meth)acrylates, di- or tri(meth)acrylates of glycerol, di, tri- or tetra(meth)acrylates of pentaerythritol, and ethylene oxide or propylene oxide adducts of these compounds.

In the case the photosensitive resin composition contains the aforementioned monomer having a photopolymerizable unsaturated bond in order to improve the resolution of a relief pattern, the incorporated amount of the photopolymerizable monomer having an unsaturated bond is preferably 1 part by weight to 50 parts by weight based on 100 parts by weight of the photosensitive polyimide precursor (A).

An adhesive assistant can be optionally incorporated in the photosensitive resin composition of the present invention to improve adhesion between a substrate and a film formed from the photosensitive resin composition. Examples of adhesive assistants include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-triethoxysilyl]propylamide acid, benzophenone-3,3'-bis(N-[3-triethoxysilyl]propylamido)-4,4'-dicarboxylic acid, benzene-1,4-bis(N-[3-triethoxysilyl]propylamido)-2,5-dicarboxylic acid, 3-(triethoxysilyl)propylsuccinic anhydride or N-phenylaminopropyltrimethoxysilane, and aluminum-based adhesive assistants such as aluminum tris(ethylacetoacetate), aluminum tris(acetylacetonate) or aluminum ethylacetylacetate diisopropylate.

Among these adhesive assistants, silane coupling agents are used more preferably from the viewpoint of adhesive strength. In the case the photosensitive resin composition contains an adhesive assistant, the incorporated amount of the adhesive assistant is preferably 0.5 parts by weight to 25 parts by weight based on 100 parts by weight of the photosensitive polyimide precursor (A).

A thermal polymerization inhibitor can be optionally incorporated in the photosensitive resin composition of the present invention to improve viscosity and photosensitivity stability of the photosensitive resin composition during storage particularly in the case of storing in the form of a solution containing a solvent. Examples of thermal polymerization inhibitors used include hydroquinone, N-nitrosodiphenylamine, p-tert-butylcatechol, phenothiazine, N-phenylnaphthylamine, ethyldiamine tetraacetic acid, 1,2-cyclohexanediamine tetraacetic acid, glycol ether diamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt and N-nitroso-N-(1-naphthyl) hydroxylamine ammonium salt.

The incorporated amount of the thermal polymerization inhibitor in the case of incorporating in the photosensitive resin composition is preferably within the range of 0.005 parts by weight to 12 parts by weight based on 100 parts by weight of the photosensitive polyimide precursor (A).

For example, in the case of forming a cured film on a substrate composed of copper or copper alloy using the photosensitive resin composition of the present invention, a nitrogen-containing heterocyclic compound such as an azole compound or purine derivative can be optionally incorporated to inhibit discoloration of the copper. Examples of azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]benzotriazole, 2-(3,5-di-t-butyl-2-hydroxyphenyl)benzotriazole, 2-(3-t-butyl-5-methyl-2-hydroxyphenyl)benzotriazole, 2-(3,5-ti-t-amyl-2-hydroxyphenyl)benzotriazole, 2-(2'-hydroxy-5'-t-octylphenyl)benzotriazole, hydroxyphenylbenzotriazole, tolytriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole. Particularly preferable examples include one or more types selected from tolytriazole, 5-methyl-1H-benzotriazole and 4-methyl-1H-benzotriazole. One type of these azole compounds or a mixture of two or more types may be used.

Specific examples of purine derivatives include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanine oxime, trihydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, 8-azahypoxanthine and derivatives thereof.

The incorporated amount in the case the photosensitive resin composition contains the aforementioned azole compound or purine derivative is preferably 0.1 parts by weight to 20 parts by weight, and more preferably 0.5 parts by weight to 5 parts by weight from the viewpoint of photosensitivity, based on 100 parts by weight of the photosensitive polyimide precursor (A). In the case the incorporated amount of the azole compound based on 100 parts by weight of the photosensitive polyimide precursor (A) is 0.1 parts by weight or more, discoloration of the copper or copper alloy surface is inhibited in the case of having formed the photosensitive resin composition of the present invention on copper or copper alloy, while in the case the incorporated amount is 20 parts by weight or less, photosensitivity is superior.

A hindered phenol compound can be optionally incorporated instead of the aforementioned azole compound or together with aforementioned azole compound in order to inhibit discoloration of the copper surface. Examples of hindered phenol compounds include, but are not limited to, 2,6-di-t-butyl-4-methylphenol, 2,5-di-t-butyl-hydroquinone, octadecyl-3-(3,5-di-t-butyl-4-hydroxyphenyl)propionate, isooctyl-3-(3,5-di-t-butyl-4-hydroxyphenyl)propionate, 4,4'-methylene-bis(2,6-di-t-butylphenol), 4,4'-thiobis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4-hydroxyphenyl)propionate], 2,2-thio-diethylenebis[3-(3,5-di-t-butyl-4-hydroxphenyl) propionate], N,N'-hexamethylenebis(3,5-di-t-butyl-4-hydroxyhydrocinnamide), 2,2'-methylene-bis(4-methyl-6-t-butylphenol), 2,2'-methylene-bis(4-ethyl-6-t-butylphenol), pentaerythryl-tetrakis[3-(3,5-di-1-butyl-4-hydroxyphenyl) propionate], tris-(3,5-di-t-butyl-4-hydroxybenzyl)isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris (4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Among these, 1,3,5-tris(4-t-butyl-3-hydroxy-2,6-dimethylbenzyl)-1,3,5-triazine-2,4,6-(1H,3H,5H)-trione is particularly preferable.

The incorporated amount of the hindered phenol compound is preferably 0.1 parts by weight to 20 parts by weight, and more preferably 0.5 parts by weight to 10 parts by weight from the viewpoint of photosensitivity, based on 100 parts by weight of the photosensitive polyimide precursor (A). In the case the incorporated amount of the hindered phenol compound based on 100 parts by weight of the photosensitive polyimide precursor (A) is 0.1 parts by weight or more, discoloration and corrosion of the copper or copper alloy is prevented in the case of, for example, having formed the photosensitive resin composition of the present invention on copper or copper alloy, while in the case the incorporated amount is 20 parts by weight or less, superior photosensitivity of the photosensitive resin composition is maintained.

A crosslinking agent may also be contained in the photosensitive resin composition of the present invention. The crosslinking agent can be a crosslinking agent capable of crosslinking the photosensitive polyimide precursor (A) or forming a crosslinked network by itself when heat-curing a relief pattern formed using the photosensitive resin composition of the present invention. The crosslinking agent is further able to enhance heat resistance and chemical resistance of a cured film formed from the photosensitive resin composition.

Examples of crosslinking agents include compounds containing a methylol group and/or alkoxymethyl group in the form of Cymel (Registered Trade Mark) 300, 301, 303, 370, 325, 327, 701, 266, 267, 238, 1141, 272, 202, 1156, 1158, 1123, 1170 or 1174, UFR 65 or 300, and Mycoat 102 or 105 (all manufactured by Mitsui-Cytec), Nikalac (Registered Trade Mark) MX-270, -280 or -290, Nikalac MS-11 and Nikalac MW-30, -100, -300, -390 or -750 (all manufactured by Sanwa Chemical Co., Ltd.), DML-OCHP, DML-MBPC, DML-BPC, DML-PEP, DML-34X, DML-PSBP, DML-PTBP, DML-PCHP, DML-POP, DML-PFP, DML-MBOC, BisCMP-F, DML-BisOC-Z, DML-BisOCHP-Z, DML-BisOC-P, DMOM-PTBT, TMOM-BP, TMOM-BPA or TML-BPAF-MF (all manufactured by Honshu Chemical Industry Co., Ltd.), benzenedimethanol, bis(hydroxymethyl)cresol, bis(hydroxymethyl)dimethoxybenzene, bis(hydroxymethyl) diphenyl ether, bis(hydroxymethyl)benzophenone, hydroxymethylphenyl hydroxymethyl benzoate, bis(hydroxymethyl)biphenyl, dimethylbis(hydroxymethyl)biphenyl, bis(methoxymethyl)benzene, bis(methoxymethyl) cresol, bis(methoxymethyl)dimethoxybenzene, bis (methoxymethyl)diphenyl ether, bis(methoxymethyl) benzophenone, methoxymethylphenyl methoxymethyl benzoate, bis(methoxymethyl)biphenyl and dimethylbis (methoxymethyl)biphenyl.

In addition, other examples include oxirane compounds in the form of phenol novolac epoxy resin, cresol novolac epoxy resin, bisphenol epoxy resin, trisphenol epoxy resin, tetraphenol epoxy resin, phenol-xylylene epoxy resin, naphthol-xylylene epoxy resin, phenol-naphthol epoxy resin, phenol-dicyclopentadiene epoxy resin, alicyclic epoxy resin, aliphatic epoxy resin, diethylene glycol diglycidyl ether, sorbitol polyglycidyl ether, propylene glycol diglycidyl ether, trimethylolpropane polyglycidyl ether, 1,1,2,2-tetra(p-hydroxyphenyl)ethane tetraglycidyl ether, glycerol triglycidyl ether, ortho-secondary-butylphenyl glycidyl ether, 1,6-bis(2,3-epoxypropoxy)naphthalene, diglycerol polyglycidyl ether, polyethylene glycol glycidyl ether, YDB-340, YDB-412, YDF-2001, YDF-2004 (trade names, all manufactured by Nippon Steel Chemical Co., Ltd.), NC-3000-H, EPPN-501H, EOCN-1020, NC-7000L, EPPN-201L, XD-1000, EOCN-4600 (trade names, all manufactured by Nippon Kayaku Co, Ltd.), Epikote (Registered Trade Mark) 1001, Epikote 1007, Epikote 1009, Epikote 5050, Epikote 5051, Epikote 1031S, Epikote 180S65, Epikote 157H70, YX-315-75 (trade names, all manufactured by Japan Epoxy Resins Co., Ltd.), EHPE3150, Placcel G402, PUE101, PUE105 (trade names, all manufactured by Daicel Chemical Industries, Ltd.), Epiclon (Registered Trade Mark) 830, 850, 1050, N-680, N-690, N-695, N-770, HP-7200, HP-820, EXA-4850-1000 (trade names, all manufactured by DIC Corp.), Denacol (Registered Trade Mark) EX-201, EX-251, EX-203, EX-313, EX-314, EX-321, EX-411, EX-511, EX-512, EX-612, EX-614, EX-614B, EX-711, EX-731, EX-810, EX-911, EM-150 (trade names, all manufactured by Nagase Chemtex Corp.), Epolight (Registered Trade Mark) 70P and Epolight 100MF (trade names, both manufactured by Kyoeisha Chemical Co., Ltd.).

In addition, other examples include isocyanate compounds in the form of 4,4'-diphenylmethane diisocyanate, tolylene diisocyanate, 1,3-phenylene-bismethylene diisocyanate, cyclohexylmethane-4,4'-diisocyanate, isophorone diisocyanate, hexamethylene diisocyanate, Takenate (Registered Trade Mark) 500, 600, Cosmonate (Registered Trade Mark) NBDI, ND (trade names, all manufactured by Mitsui Chemicals, Inc.), Duranate (Registered Trade Mark) 17B-60PX, TPA-B80E, MF-B60X, MF-K60X and E402-B80T (trade names, all manufactured by Asahi Kasei Chemicals Corp.).

In addition, although other examples include bismaleimide compounds in the form of 4,4'-diphenylmethane bismaleimide, phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4'-diphenylsulfide bismaleimide, 1,3-bis(3-maleimidophenoxy)benzene, 1,3-bis(4-maleimidophenoxy)benzene, BMI-1000, BMI-1100, BMI-2000, BMI-2300, BMI-3000, BMI-4000, BMI-5100, BMI-7000, BMI-TMH, BMI-6000 and BMI-8000 (trade names, all manufactured by Daiwa Kasei Kogyo Co., Ltd.), they are not limited thereto provided they are compounds that demonstrate thermal crosslinking in the manner described above.

The incorporated amount in the case of using a crosslinking agent is preferably 0.5 parts by weight to 20 parts by weight and more preferably 2 parts by weight to 10 parts by weight based on 100 parts by weight of the photosensitive polyimide precursor (A). In the case the incorporated amount is 0.5 parts by weight or more, favorable heat resistance and chemical resistance are demonstrated, while in the case the incorporated amount is 20 parts by weight or less, storage stability is superior.

<Method for Forming Cured Relief Pattern>

The present invention also provides a method for forming a cured relief pattern.

The method for forming a cured relief pattern in the present invention is characterized by including the following steps in the order shown below:

(1) a coating step for forming a photosensitive resin layer on a substrate by coating the previously described photosensitive resin composition of the present invention on the substrate;

(2) an exposure step for exposing the photosensitive resin layer to light;

(3) a development step for forming a relief pattern by developing the photosensitive resin layer after exposing to light; and, (4) a heating step for forming a cured relief pattern by heat-treating the relief pattern.

The following provides an explanation of a typical aspect of each step.

(1) Coating Step

In the present step, a photosensitive resin layer is formed by coating the photosensitive resin composition of the present invention onto a substrate followed by drying as necessary.

Examples of substrates that can be used include metal substrates composed of silicon, aluminum, copper or copper alloy, resin substrates such as those composed of epoxy, polyimide or polybenzoxazole, substrates having a metal circuit formed in the aforementioned resin substrate, and substrates obtained by laminating a plurality of metal layers or metal and resin layers.

In the present invention, the effect of the present invention of inhibiting the formation of voids at the interface between a Cu layer and polyimide layer can be particularly preferably obtained by using a substrate of which at least the surface thereof is composed of Cu, the present invention can also be applied to other substrates.

A method conventionally used to coat photosensitive resin compositions can be used for the coating method, examples of which include coating methods using a spin coater, bar coater, blade coater, curtain coater or screen printer, and spraying methods using a spray coater.

A photosensitive resin composition film can be dried as necessary. A method such as air drying, or heat drying or vacuum drying using an oven or hot plate, is used for the drying method. Drying is preferably carried out under conditions such that imidization of the photosensitive polyimide precursor (polyamic acid ester) in the photosensitive resin composition does not occur. More specifically, in the case of carrying out air drying or heat drying, drying can be carried out under conditions consisting of 1 minute to 1 hour at 20° C. to 140° C. The photosensitive resin layer can be formed on the substrate in this manner.

(2) Exposure Step

In the present step, the photosensitive resin layer formed in the manner described above is exposed to light. Examples of exposure devices used include a contact aligner, mirror projector and stepper. Exposure can be carried out by exposing either directly or through a photomask having a pattern or reticle. The light source used for exposure is, for example, an ultraviolet light source.

Following exposure, post-exposure baking (PEB) and/or pre-development baking may be carried out using an arbitrary combination of temperature and time as necessary for the purpose of improving photosensitivity and the like. Although the range of baking conditions preferably consists of a temperature of 40° C. to 120° C. and time of 10 seconds to 240 seconds, the range is not limited thereto provided various properties of the photosensitive resin composition of the present invention are not impaired.

(3) Development Step

In the present step, unexposed portions of the photosensitive resin layer are developed and removed following exposure. A conventionally known photoresist development method can be selected and used for the development method used to develop the photosensitive resin layer after exposure (irradiation). Examples thereof include the rotary spraying method, paddle method and immersion method accompanying ultrasonic treatment. In addition, post-development baking using an arbitrary combination of temperature and time may be carried out as necessary after development for the purpose of adjusting the form of the relief pattern. The temperature of post-development baking can be, for example, 80° C. to 130° C. and the duration can be, for example 0.5 to 10 minutes.

A good solvent with respect to the photosensitive resin or a combination of a good solvent and a poor solvent is preferable for the developer used for development. Preferable examples of good solvents include N-methyl-2-pyrrolidene, N-cyclohexyl-2-pyrrolidone, N,N-dimethylacetoamide, cyclopentanone, cyclohexanone, γ-butyrolactone and α-acetyl-γ-butyrolactone, while preferable examples of poor solvents include toluene, xylene, methanol, ethanol, isopropyl alcohol, ethyl lactate, propylene glycol methyl ether acetate and water. In the case of using a mixture of good solvent and poor solvent, the proportion of poor solvent to good solvent is preferably adjusted according to the solubility of polymer in the photosensitive resin composition. In addition, two or more types of each solvent, such as a combination of several types of each solvent, can also be used.

(4) Heating Step

In the present step, the relief pattern obtained by developing in the manner previously described is converted from the polyimide to a cured relief pattern by heating to evaporate the photosensitive component together with imidizing the photosensitive polyimide precursor (A).

Various methods can be selected for the heat curing method, examples of which include heating with a hot plate, heating using an oven, and heating using a programmable oven that allows the setting of a temperature program. Heating can be carried out under conditions consisting of, for example, 30 minutes to 5 hours at 200° C. to 400° C. Air may be used for the atmospheric gas during heat curing, or an inert gas such as nitrogen or argon can be used.

A cured relief pattern can be produced in the manner described above.

<Semiconductor Device>

The present invention also provides a semiconductor device that has a cured relief pattern obtained according to the method for producing a cured relief pattern of the present invention described above.

The aforementioned semiconductor device can be a semiconductor device having a semiconductor element in the form of a base material and a cured relief pattern formed according to the aforementioned method for producing a cured relief pattern on the aforementioned base material.

Namely, the semiconductor device of the present invention is characterized by having a base material and a cured relief pattern formed on the base material, and the aforementioned cured relief pattern is characterized by containing a polyimide resin and a compound represented by the aforementioned general formula (B1). The aforementioned semiconductor device can be produced according to a method that uses a semiconductor element for the base material and contains the aforementioned method for producing a cured relief pattern as a portion of the process thereof. The semiconductor device of the present invention can be produced by combining with known methods for producing semiconductor devices by forming the cured relief pattern formed according to the aforementioned method for producing a cured relief pattern as, for example, a surface protective film, interlayer insulating film, rewiring insulating film, flip-chip device protective film or protective film of a semiconductor device having a bump structure.

In the case of applying the semiconductor device of the present invention to a relief pattern composed of metal rewiring layer composed of a Cu layer and a polyimide resin, the formation of voids at the interface thereof is inhibited resulting in a high level of adhesion and superior properties.

The photosensitive resin composition according to the third aspect of the present invention is also useful in applications such as the interlayer insulation of a multilayer circuit, cover coating of a flexible copper-clad board, solder-resistive film or liquid crystal alignment film in addition to applying to a semiconductor device as described above.

[Fourth Aspect]

Elements are mounted on printed boards using various methods corresponding to the objective. Conventional elements were typically fabricated by a wire bonding method in which a connection is made from an external terminal of the element (pad) to a lead frame with a fine wire. However, with today's current higher element speeds in which the operating frequency has reached the GHz range, differences in the wiring lengths of each terminal during mounting are having an effect on element operation. Consequently, in the case of mounting elements for high-end applications, it has become necessary to accurately control the lengths of mounting wires, and it has become difficult to satisfy this requirement with wire bonding.

Thus, flip-chip mounting has been proposed in which, after having formed a rewiring layer on the surface of a semiconductor chip and formed a bump (electrode) thereon, the chip is turned over (flipped) followed by directly mounting on the printed board (see, for example, Japanese Unexamined Patent Publication No. 2001-338947). As a result of being able to accurately control wiring distance, this flip-chip mounting is being employed in elements for high-end applications handling high-speed signals, and because of its small mounting size, is also being employed in cell phone applications, thereby resulting in a rapid increase in demand. More recently, fan-out mounting has been proposed as an advanced form of flip-chip mounting that consists of dicing preprocessed wafers to produce individual chips in order to increase the number of pins accessible from the semiconductor chip, followed by embedding the diced chips in resin to produce a molded resin substrate and then forming a rewiring layer on the substrate. In the case using a material such as polyimide, polybenzoxazole or phenol resin for this flip-chip mounting or fan-out mounting, the process goes through a metal wiring layer formation step after having formed a pattern in the resin layer. The metal wiring layer is normally formed by roughening the surface of the resin layer by subjecting to plasma etching, followed by forming a metal layer serving as the plating seed layer by sputtering at a thickness of 1 μm or less, and then forming the metal wiring layer by electrolytic plating using this metal layer as an electrode. Although Ti is typically used for the metal of the seed layer at this time, Cu is used as the metal of the rewiring layer formed by electrolytic plating.

Moreover, in the case of printed boards or build-up boards, although continuity in the vertical direction was conventionally achieved by laminating a substrate, laminated with metal foil or metal, with a non-photosensitive insulating resin and forming holes in the insulating resin layer with a drill or laser, more recently, due to the increasingly fine pitch of the wiring, it has become necessary to form smaller diameter holes, and a technique has been adopted that consists of using a photosensitive resin composition for the insulating resin on the substrate and forming the holes by photolithography. In this case, after having formed a seed layer on the resin by laminating or pressing Cu foil on the insulating resin, or by electrolytic plating or sputtering, the conductive layer is formed by electrolytic plating of Cu and the like (see, for example, Japanese Patent No. 5219008 and Japanese Patent No. 4919501).

A metal rewiring layer formed from a photosensitive resin composition and Cu in this manner is required to demonstrate a high level of adhesion between the rewired metal layer and resin layer following reliability testing. Examples of the reliability testing carried out here include a high-temperature storage test consisting of storing in air at a high temperature of 125° C. or higher for 100 hours or more, a high-temperature operation test consisting of confirming operation after having stored in air at a high temperature of about 125° C. for 100 hours or more while connecting the wires and applying a voltage, a heat cycle test consisting of repeatedly subjecting to a low-temperature state of about −65° C. to −40° C. in air and a high-temperature state of about 125° C. to 150° C. in cycles, a high-temperature, high-humidity storage test consisting of storing at a temperature of 85° C. or higher in a water vapor atmosphere having humidity of 85% or higher, a high-temperature, high-humidity bias test consisting of carrying out the above test while connecting the wires and applying a voltage, and a solder reflow test consisting of passing multiple times through a solder reflow oven in air or nitrogen at 260° C.

However, in the case of carrying out reliability testing in the form of a high-temperature storage test, there was the problem of voids forming at the interface contacted by the rewired Cu layer and resin layer. The formation of voids at the interface between the Cu layer and resin layer ends up causing a decrease in adhesion between the two layers.

With the foregoing in view, an object of the fourth aspect of the present invention is to provide a rewiring layer produced by combining a specific Cu surface treatment method and a specific photosensitive resin composition formed on silicon, glass, a dummy substrate, or substrate in which diced silicon chips are arranged and embedded in a molding resin, wherein there is no formation of voids at the interface between a Cu layer and a resin layer following a high-temperature storage test.

The inventors of the present invention found that, by treating the surface of a Cu layer, formed on silicon, glass, a dummy substrate, or a substrate in which diced silicon chips are arranged and embedded in a molding resin, with a specific method and combining with a specific photosensitive resin composition, a wiring layer having superior high-temperature storage test performance can be obtained, thereby leading to completion of the present invention. Namely, the fourth aspect of the present invention is as indicated below.

[1] A rewiring layer having a copper layer, formed on silicon, glass, compound semiconductor, printed board, build-up board, dummy substrate or substrate in which diced silicon chips are arranged and embedded in a molding resin, and in which surface irregularities having a maximum height of 0.1 μm to 5 μm are formed on the surface thereof, and a cured relief pattern layer, wherein the cured relief pattern is obtained by curing a photosensitive resin composition.

[2] A method for producing the rewiring layer described in [1], comprising:

(1) forming a photosensitive resin composition on a copper layer by coating a photosensitive resin composition onto a copper layer, formed on silicon, glass, compound semiconductor, printed board, build-up board, dummy substrate or substrate in which diced silicon chips are arranged and embedded in a molding resin, in which surface irregularities having a maximum height of 0.1 μm to 5 μm are formed on the surface thereof, (2) exposing the photosensitive resin layer to light, (3) forming a relief pattern by developing the photosensitive resin layer after exposing to light, and (4) forming a cured relief pattern by heat-treating the relief pattern.

[3] The rewiring layer described in [1] or the method described in [2], wherein the photosensitive resin composition contains:

(A) 100 parts by weight of at least one type of resin selected from the group consisting of polyamic acid, polyamic acid ester, polyamic acid salt, polyhydroxyamide, polyaminoamide, polyamide, polyamide-imide, polyimide, polybenzoxazole and novolac resin, polyhydroxystyrene and phenol resin, and (B) 1 part by weight to 50 parts by weight of a photosensitizer based on 100 parts by weight of the resin.

[4] The rewiring layer described in [1] or [3] or the method described in [2] or [3], wherein the resin (A) is at least one type of resin selected from the group consisting of a polyimide precursor containing the following general formula (40), a polyamide containing the following general formula (43), a polyoxazole precursor containing the following general formula (44), a polymide containing the following general formula (45) and novolac, polyhydroxystyrene resin and phenol resin containing the following general formula (46):

[Chemical Formula 113]

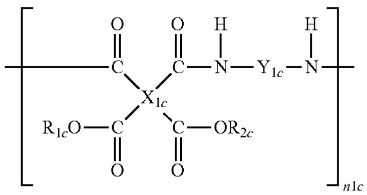
(40)

{wherein, $X_{1C}$ represents a tetravalent organic group, $Y_{1c}$ represents a divalent organic group, $n_{1c}$ represents an integer of 2 to 150 and $R_{1c}$ and $R_{2c}$ respectively and independently represent a hydrogen atom, saturated aliphatic group having 1 to 30 carbon atoms, aromatic group, monovalent organic group represented by the following general formula (41):

[Chemical Formula 114]

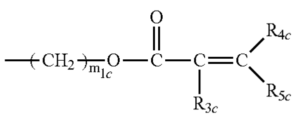
(41)

(wherein, $R_{3c}$, $R_{4c}$ and $R_{5c}$ respectively and independently represent a hydrogen atom or organic group having 1 to 3 carbon atoms, and $m_{1c}$ represents an integer of 2 to 10), saturated aliphatic group having 1 to 4 carbon atoms, or a monovalent ammonium ion represented by the following general formula (42):

[Chemical Formula 115]

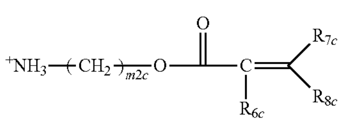
(42)

(wherein, $R_{6c}$, $R_{7c}$ and $R_{8c}$ respectively and independently represent a hydrogen atom or organic group having 1 to 3 carbon atoms, and $m_{2c}$ represents an integer of 2 to 10);

[Chemical Formula 116]

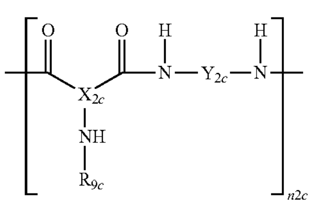
(43)

{wherein, $X_{2c}$ represents a trivalent organic group having 6 to 15 carbon atoms, $Y_{2c}$ represents a divalent organic group having 6 to 35 carbon atoms and may have the same structure or a plurality of structures, $R_{9c}$ represents an organic group having 3 to 20 carbon atoms and having at least one radical-polymerizable unsaturated bond, and $n_{2c}$ represents an integer of 1 to 1000};

[Chemical Formula 117]

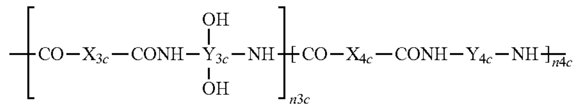
(44)

{wherein, $Y_{3c}$ represents a tetravalent organic group having a carbon atom, $Y_{4c}$, $X_{3c}$ and $X_{4c}$ respectively and independently represent a divalent organic group having two or more carbon atoms, $n_{3c}$ represents an integer of 1 to 1000, $n_{4c}$ represents an integer of 0 to 500, $n_{3c}/(n_{3c}+n_{4c})$ is greater than 0.5, and there are no restrictions on the arrangement order of the $n_{3c}$ number of dihydroxydiamide units containing $X_{3c}$ and $Y_{3c}$ or the $n_{4c}$ number of diamide units containing $X_{4c}$ and $Y_{4c}$};

[Chemical Formula 118]

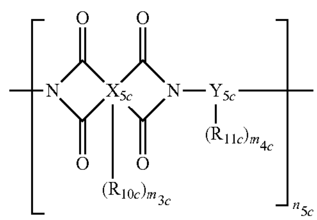
(45)

{wherein, $X_{5c}$ represents a tetra to tetradeca valent organic group, $Y_{5c}$ represents a divalent to dodecavalent organic group, $R_{10c}$ and $R_{11c}$ respectively and independently represent an organic group having at least one of a phenolic hydroxyl group, sulfonate group and thiol group, $n_{5c}$ represents an integer of 3 to 200, and $m_{3c}$ and $m_{4c}$ represent integers of 0 to 10};

[Chemical Formula 119]

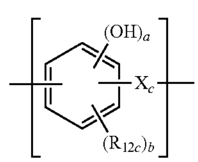
(46)

{wherein, a represents an integer of 1 to 3, b represents an integer of 0 to 3, $1 \leq (a+b) \leq 4$, $R_{12c}$ represents a monovalent substituent selected from the group consisting of a monovalent organic group having 1 to 20 carbon atoms, halogen atom, nitro group and cyano group, a plurality of $R_{12c}$ may be the same or different in the case b is 2 or 3, and $X_c$ represents a divalent organic group selected from the group consisting of a divalent aliphatic group having 2 to 10 carbon atoms that may or may not have an unsaturated bond, divalent alicyclic group having 3 to 20 carbon atoms, divalent alkylene oxide group represented by the following general formula (47):

[Chemical Formula 120]

$$—C_pH_{2p}O— \quad (47)$$

(wherein, p represents an integer of 1 to 10), and divalent organic group having an aromatic ring having 6 to 12 carbon atoms}.

[5] The rewiring layer or method described in [4] containing a phenol resin having a repeating unit represented by general formula (46), wherein $X_c$ in general formula (46) represents a divalent organic group selected from the group consisting of a divalent group represented by the following general formula (48):

[Chemical Formula 121]

(48)

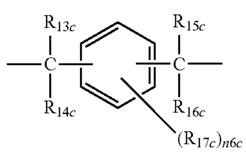

{wherein, $R_{13c}$, $R_{14c}$, $R_{15c}$ and $R_{16c}$ respectively and independently represent a hydrogen atom, monovalent aliphatic group having 1 to 10 carbon atoms, or monovalent aliphatic group having 1 to 10 carbon atoms in which all or a portion of the hydrogen atoms are substituted with fluorine atoms, $n_{6c}$ represents an integer of 0 to 4, $R_{17c}$ in the case $n_{6c}$ is an integer of 1 to 4 represents a halogen atom, hydroxyl group or monovalent organic group having 1 to 12 carbon atoms, at least one of $R_{6c}$ is a hydroxyl group, and a plurality of $R_{17c}$ may be mutually the same or different in the case $n_{6c}$ is an integer of 2 to 4}, and a divalent organic group selected from the group consisting of a divalent alkylene oxide group represented by the following general formula (49):

[Chemical Formula 122]

(49)

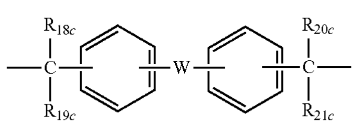

{wherein, $R_{18c}$, $R_{19c}$, $R_{20c}$ and $R_{21c}$ respectively and independently represent a hydrogen atom, monovalent aliphatic group having 1 to 10 carbon atoms, or monovalent aliphatic group having 1 to 10 carbon atoms in which all or a portion of the hydrogen atoms are substituted with fluorine atoms, and W represents a single bond, or a divalent organic group selected from the group consisting of an aliphatic group having 1 to 10 carbon atoms optionally substituted with fluorine atoms, alicyclic group having 3 to 20 carbon atoms optionally substituted with fluorine atoms, divalent alkylene oxide group represented by the following general formula (47):

[Chemical Formula 123]

$$—C_pH_{2p}O— \quad (47)$$

(wherein, p represents an integer of 1 to 10), and divalent group represented by the following general formula (50)}.

[Chemical Formula 124]

(50)

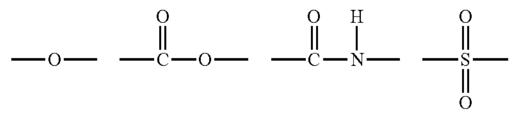

[6] A rewiring layer having a copper layer, formed on silicon, glass, compound semiconductor, printed board, build-up board, dummy substrate or substrate in which diced silicon chips are arranged and embedded in a molding resin, and having an alloy layer containing copper and tin on the surface thereof as well as a layer of silane coupling agent thereon, and a cured relief pattern layer, wherein, the cured relief pattern is obtained by curing a photosensitive resin composition.

[7] A method for producing the rewiring layer described in [6], comprising:

(1) forming a photosensitive resin composition on a copper layer by coating a photosensitive resin composition onto a copper layer, formed on silicon, glass, compound semiconductor, printed board, build-up board, dummy substrate or substrate in which diced silicon chips are arranged and embedded in a molding resin, and having an alloy layer containing copper and tin on the surface thereof as well as a layer of silane coupling agent thereon, (2) exposing the photosensitive resin layer to light, (3) forming a relief pattern by developing the photosensitive resin layer after exposing to light, and (4) forming a cured relief pattern by heat-treating the relief pattern.

[8] The rewiring layer described in [6] or the method described in [7], wherein the photosensitive resin composition contains:

(A) 100 parts by weight of at least one type of resin selected from the group consisting of polyamic acid, polyamic acid ester, polyamic acid salt, polyhydroxyamide, polyaminoamide, polyamide, polyamide-imide, polyimide, polybenzoxazole and novolac resin, polyhydroxystyrene and phenol resin, and (B) 1 part by weight to 50 parts by weight of a photosensitizer based on 100 parts by weight of the resin.

[9] The rewiring layer described in [6] or [8] or the method described in [7] or [8], wherein the resin (A) is at least one type of resin selected from the group consisting of a polyimide precursor containing the following general formula (40), a polyamide containing the following general formula (43), a polyoxazole precursor containing the following general formula (44), a polymide containing the following general formula (45) and novolac, polyhydroxystyrene resin and phenol resin containing the following general formula (46):

[Chemical Formula 125]

(40)

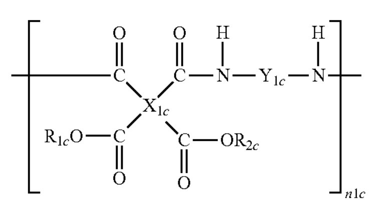

{wherein, $X_{1C}$ represents a tetravalent organic group, $Y_{1c}$ represents a divalent organic group, $n_{1c}$ represents an integer of 2 to 150, and $R_{1c}$ and $R_{2c}$ respectively and independently represent a hydrogen atom, saturated aliphatic group having 1 to 30 carbon atoms, aromatic group, monovalent organic group represented by the following general formula (41):

[Chemical Formula 126]

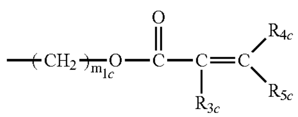

(41)

(wherein, $R_{3c}$, $R_{4c}$ and $R_{5c}$ respectively and independently represent a hydrogen atom or organic group having 1 to 3 carbon atoms, and $m_{1c}$ represents an integer of 2 to 10), saturated aliphatic group having 1 to 4 carbon atoms, or a monovalent ammonium ion represented by the following general formula (42):

[Chemical Formula 127]

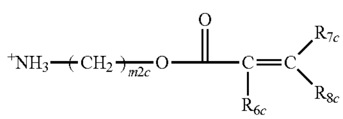

(42)

(wherein, $R_{6c}$, $R_{7c}$ and $R_{8c}$ respectively and independently represent a hydrogen atom or organic group having 1 to 3 carbon atoms, and $m_{2c}$ represents an integer of 2 to 10);

[Chemical Formula 128]

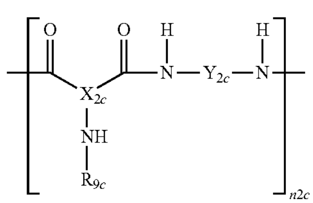

(43)

{wherein, $X_{2c}$ represents a trivalent organic group having 6 to 15 carbon atoms, $Y_{2c}$ represents a divalent organic group having 6 to 35 carbon atoms and may have the same structure or a plurality of structures, $R_{9c}$ represents an organic group having 3 to 20 carbon atoms and having at least one radical-polymerizable unsaturated bond, and $n_{2c}$ represents an integer of 1 to 1000};

[Chemical Formula 129]

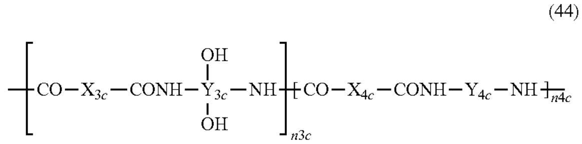

(44)

{wherein, $Y_{3c}$ represents a tetravalent organic group having a carbon atom, $Y_{4c}$, $X_{3c}$ and $X_{4c}$ respectively and independently represent a divalent organic group having two or more carbon atoms, $n_{3c}$ represents an integer of 1 to 1000, $n_{4c}$ represents an integer of 0 to 500, $n_{3c}/(n_{3c}+n_{4c})$ is greater than 0.5, and there are no restrictions on the arrangement order of the $n_{3c}$ number of dihydroxydiamide units containing $X_{3c}$ and $Y_{3c}$ or the $n_{4c}$ number of diamide units containing $X_{4c}$ and $Y_{4c}$};

[Chemical Formula 130]

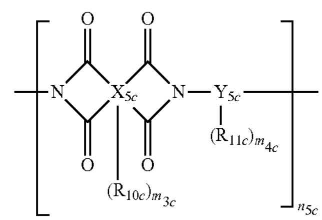

(45)

{wherein, $X_{5c}$ represents a tetra to tetradecavalent organic group, $Y_{5c}$ represents a divalent to dodecavalent organic group, $R_{10c}$ and $R_{11c}$ respectively and independently represent an organic group having at least one of a phenolic hydroxyl group, sulfonate group and thiol group, $n_{5c}$ represents an integer of 3 to 200, and $m_{3c}$ and $m_{4c}$ represent integers of 0 to 10};

[Chemical Formula 131]

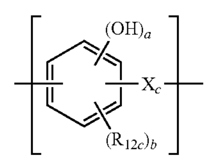

(46)

{wherein, a represents an integer of 1 to 3, b represents an integer of 0 to 3, $1 \leq (a+b) \leq 4$, $R_{12c}$ represents a monovalent substituent selected from the group consisting of a monovalent organic group having 1 to 20 carbon atoms, halogen atom, nitro group and cyano group, a plurality of $R_{12c}$ may be the same or different in the case b is 2 or 3, and $X_c$ represents a divalent organic group selected from the group consisting of a divalent aliphatic group having 2 to 10 carbon atoms that may or may not have an unsaturated bond, divalent alicyclic group having 3 to 20 carbon atoms, divalent alkylene oxide group represented by the following general formula (47):

[Chemical Formula 132]

$$—C_pH_{2p}O— \quad (47)$$

(wherein, p represents an integer of 1 to 10), and divalent organic group having an aromatic ring having 6 to 12 carbon atoms}.

[10] The rewiring layer or method described in [9] wherein the photosensitive resin composition contains a phenol resin having a repeating unit represented by general formula (46), and $X_c$ in general formula (46) represents a divalent organic group selected from the group consisting of a divalent group represented by the following general formula (48):

[Chemical Formula 133]

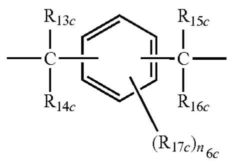

(48)

{wherein, $R_{13c}$, $R_{14c}$, $R_{15c}$ and $R_{16c}$ respectively and independently represent a hydrogen atom, monovalent aliphatic group having 1 to 10 carbon atoms, or monovalent aliphatic group having 1 to 10 carbon atoms in which all or a portion of the hydrogen atoms are substituted with fluorine atoms, $n_{6c}$ represents an integer of 0 to 4, $R_{17c}$ in the case $n_{6c}$ is an integer of 1 to 4 represents a halogen atom, hydroxyl group or monovalent organic group having 1 to 12 carbon atoms, at least one of $R_{6c}$ is a hydroxyl group, and $R_{17c}$ may be mutually the same or different in the case $n_{6c}$ is an integer of 2 to 4}, and a divalent organic group represented by the following general formula (49):

[Chemical Formula 134]

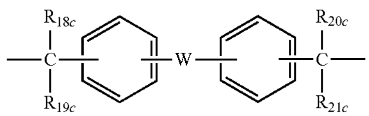

(49)

{wherein, $R_{18c}$, $R_{19c}$, $R_{20c}$ and $R_{21c}$ respectively and independently represent a hydrogen atom, monovalent aliphatic group having 1 to 10 carbon atoms, or monovalent aliphatic group having 1 to 10 carbon atoms in which all or a portion of the hydrogen atoms are substituted with fluorine atoms, and W represents a single bond, or a divalent organic group selected from the group consisting of an aliphatic group having 1 to 10 carbon atoms optionally substituted with fluorine atoms, alicyclic group having 3 to 20 carbon atoms optionally substituted with fluorine atoms, divalent alkylene oxide group represented by the following general formula (47):

[Chemical Formula 135]

$$—C_pH_{2p}O— \quad (47)$$

(wherein, p represents an integer of 1 to 10), and divalent group represented by the following general formula (50)

[Chemical Formula 136]

(50)

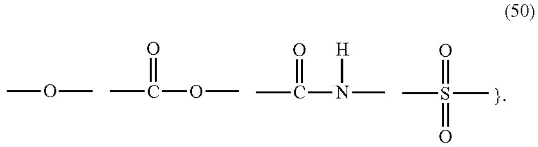

According to the fourth aspect of the present invention, a rewiring layer having superior high-temperature storage test performance can be provided by treating the surface of a Cu layer, formed on a silicon substrate, glass substrate, compound semiconductor substrate, printed board, build-up board, dummy substrate or substrate in which diced silicon chips are arranged and embedded in a molding resin, according to a specific method and combining with a specific photosensitive resin composition.

The following provides a detailed explanation of the fourth aspect of the present invention. Furthermore, throughout the present description, structures represented by the same reference symbols in general formulas may be mutually the same or different in the case a plurality thereof is present in a molecule.

<Substrate>

Examples of the substrate used to form the rewiring layer of the present invention include any of silicon substrates, glass substrates, compound semiconductor substrates, printed boards, build-up boards, dummy substrates or substrates in which diced silicon chips are arranged and embedded in a molding resin. The substrate may be round or rectangular.

A silicon substrate may be a substrate in which a semiconductor and fine wires are formed internally or a substrate in which there are no components formed internally. In addition, electrodes or surface irregularities formed from Al and the like may be formed on the surface thereof, or a passivation film composed of $SiO_2$ or SiN may be formed on the substrate or through holes passing through the substrate may be formed therein.

There are no limitations on the material of the glass substrate provided it is a material made of glass such as non-alkali glass or silica glass. In addition, surface irregularities may be formed on the top and a rewiring layer may be formed on the bottom, or through holes may be formed that pass through the substrate.

Examples of compound semiconductor substrates include substrates having a compound semiconductor such as SiC, GaAs or GaP. In this case as well, the substrate may be a substrate in which a semiconductor and fine wires are formed internally or a substrate in which there are no components formed internally. In addition, electrodes or surface irregularities formed from Al and the like may be formed on the surface thereof, or a passivation film composed of $SiO_2$ or SiN may be formed on the substrate or through holes passing through the substrate may be formed therein.

The printed board may be an ordinary wiring board obtained by laminating an insulating resin layer with a core material, such as a single-sided board, double-sided board or laminated board, and through holes may be formed that pass through the wiring board or blind via holes may be formed between wiring.

A build-up board is a type of printed board, and refers to that obtained not by a single lamination, but rather by sequentially laminating an insulating layer or Cu-adhered insulating layer onto a core material.

A dummy substrate is the generic term for substrates that do not remain on the finished product as a result of pulling apart the substrate and wiring layer after having formed a wiring layer thereon. The material may be any of resin, silicon or glass, and the method used to finally pull part the substrate and wiring layer may be any arbitrary method, such as a chemical treatment method in which adhered portions are dissolved with a solvent, a heat treatment method in which adhered portions are separated by heating, and an optical treatment method in which adhered portions are separated by irradiating with laser light.

Substrates in which diced silicon chips are arranged and embedded in a sealing resin refer to substrates obtained by initially incorporating a semiconductor or rewiring layer in a silicon wafer followed by dicing to put into the form of ordinary silicon chips, and then arranging the chips on a different substrate and molding from above with a sealing resin and the like.

<Formation of Copper Layer>

In the present invention, the copper layer is formed by forming a seed layer by ordinary sputtering followed by forming the copper layer by electrolytic plating. Ordinary Ti/Cu is used for the seed layer, and the thickness thereof is normally 1 μm or less. In the case of sputtering on resin, the resin surface is preferably roughened by plasma etching in advance from the viewpoint of adhesion with the resin. In addition, electroless plating can also be used to form the seed layer instead of sputtering.

In order to form copper wiring, after having formed a seed layer followed by forming a resist layer on the surface thereof and patterning the resist to a desired pattern by exposure and development, copper is deposited on only the patterned portion by electrolytic plating. Subsequently, the resist is stripped using a stripper followed by removing the seed layer by flash etching.

In addition, an example of method frequently used with printed boards consists of forming a Cu layer on resin by laminating a resin layer and Cu foil.

<Copper Surface Treatment>

Examples of methods used to treat the surface of copper in the present invention include a method consisting of microetching the surface of the copper to form surface irregularities having a maximum height of 0.1 μm to 5 μm, and a method consisting of forming an alloy layer containing tin on the copper surface by carrying out electroless tin plating on the copper surface followed by further reacting with a silane coupling agent.

An explanation is first provided of microetching. Copper can be etched by, for example, an aqueous cupric chloride solution under acidic conditions. At this time, due to the additional presence of a specific compound such as a compound having an amino group, instead of uniformly dissolving the copper surface, portions that are easily dissolved and portions that are difficult to dissolve are formed on the copper surface, thereby enabling the formation of surface irregularities having a maximum height of 0.1 μm to 5 μm (see, for example, Patent Document 2). Here, maximum height refers to the length from the apex to the trough of the surface irregularities in the case of viewing a profile of the surface irregularities on the surface by using as a reference the case in which the copper surface has been etched uniformly. From the viewpoint of adhesion between the copper and resin, the maximum height is preferably 0.1 μm or more and more preferably 0.2 μm or more, and from the viewpoint of insulating reliability, the maximum height is preferably 5 μm or less and more preferably 2 μm or less. In addition, the surface of the copper having surface irregularities formed therein may be further treated with a rust inhibitor after having carried out microetching.

Next, an explanation is provided of the method consisting of treating the copper surface with a silane coupling agent. Since silane coupling agents have difficulty in reacting with hydroxyl groups of the copper surface, it is effective to deposit tin having greater reactivity with the silane coupling agent than with copper on the surface of the copper by carrying out electroless tin plating on the surface thereof followed by treating with the silane coupling agent (see, for example, Patent Document 3). At this time, the alloy layer on the copper surface may contain tin as well as nickel or other arbitrary metals.

Suitable examples of silane coupling agents able to be used in the present invention include those having an epoxy group, amino group, acryloxy group, methacryloxy group or vinyl group. An example of a method used to treat with a silane coupling agent consists of contacting a 1% aqueous solution of the silane coupling agent with a metal surface for 30 minutes.

In this manner, migration of copper following a high-temperature storage test can be inhibited by changing the state of interaction between the copper and resin from the case of being untreated by forming minute surface irregularities in the copper surface or forming a layer of a silane coupling agent through an alloy layer with tin.

Next, an explanation is provided of the photosensitive resin composition contained in the insulating layer present in the rewiring layer.

<Photosensitive Resin Composition>

The present invention has as essential components thereof:

(A) 100 parts by weight of at least one type of resin selected from the group consisting of polyamic acid, polyamic acid ester, polyamic acid salt, polyhydroxyamide, polyaminoamide, polyamide, polyamide-imide, polyimide, polybenzoxazole and novolac resin, polyhydroxystyrene and phenol resin, and (B) 1 part by weight to 50 parts by weight of a photosensitizer based on 100 parts by weight of the resin (A).

Resin (A)

The following provides an explanation of the resin (A) used in the present invention. The resin (A) of the present invention has for the main component thereof at least one type of resin selected from the group consisting of polyamic acid, polyamic acid ester, polyamic acid salt, polyhydroxyamide, polyaminoamide, polyamide, polyamide-imide, polyimide, polybenzoxazole and novolac resin, polyhydroxystyrene and phenol resin. Here, the main component refers to containing these resins at 60% by weight or more, and preferably at 80% by weight or more, based on the total amount of resin. In addition, other resins may be contained as necessary.

The weight average molecular weight of these resins as determined by gel permeation chromatography based on standard polystyrene conversion is preferably 200 or more and more preferably 5,000 or more from the viewpoints of heat resistance and mechanical properties following heat treatment. The upper limit is preferably 500,000 or less, and the case of using in the form of a photosensitive resin composition, the upper limit is more preferably 20,000 or less from the viewpoint of solubility with respect to the developer.

In the present invention, the resin (A) is a photosensitive resin in order to form a relief pattern. The photosensitive resin is a photosensitive resin composition used together with the photosensitizer (B) to be subsequently described that causes development by dissolving or not dissolving in the subsequent development step.

Examples of photosensitive resins include polyamic acid, polyamic acid ester, polyamic acid salts, polyhydroxyamide, polyaminoamide, polyamide, polyamide-imide, polyimide, polybenzoxazole and novolac resin, polyhydroxystyrene and phenol resin, and among these, polyamic acid ester, polyamic acid salt, polyamide, polyhydroxyamide, polyimide and phenol resin are used preferably due to the superior heat resistance and mechanical properties of the resin following heat treatment. In addition, these photosensitive resins can be selected corresponding to the desired application, such as by preparing a negative-type or positive-type photosensitive resin composition with the photosensitizer (B) to be subsequently described.

[Polyamic Acid, Polyamic Acid Ester and Polyamic Acid Salt (A)]

One example of the most preferable resin (A) from the viewpoints of heat resistance and photosensitivity in the photosensitive resin composition of the present invention is a polyamic acid, polyamic acid ester or polyamic acid salt containing a structure represented by the general formula (40):

[Chemical Formula 137]

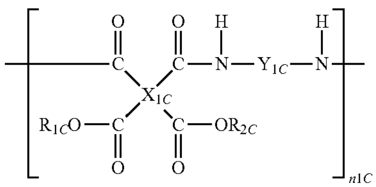

(40)

{wherein, $X_{1c}$ represents a tetravalent organic group, $Y_{1c}$ represents a divalent organic group, $n_{1c}$ represents an integer of 2 to 150, and $R_{1c}$ and $R_{2c}$ respectively and independently represent a hydrogen atom, saturated aliphatic group having 1 to 30 carbon atoms, monovalent organic group represented by the following general formula (41):

[Chemical Formula 138]

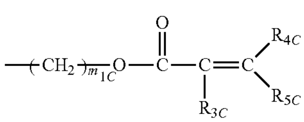

(41)

(wherein, $R_{3c}$, $R_{4c}$ and $R_{5c}$ respectively and independently represent a hydrogen atom or organic group having 1 to 3 carbon atoms, and $m_{1c}$ represents an integer of 2 to 10), saturated aliphatic group having 1 to 4 carbon atoms, or a monovalent ammonium ion represented by the following general formula (42):

[Chemical Formula 139]

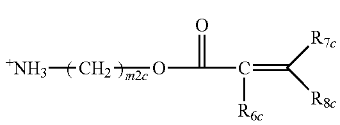

(42)

(wherein, $R_{6c}$, $R_{7c}$ and $R_{8c}$ respectively and independently represent a hydrogen atom or organic group having 1 to 3 carbon atoms, and $m_{2c}$ represents an integer of 2 to 10)}.

Since polyamic acids, polyamic acid esters and polyamic acid salts are converted to polyimide by subjecting to cyclization treatment by heating (at, for example, 200° C. or higher), they are treated as polyimide precursors. These polyimide precursors are suitable for use in negative-type photosensitive resin compositions.

In the aforementioned general formula (40), the tetravalent organic group represented by $X_{1c}$ is preferably an organic group having 6 to 40 carbon atoms, and more preferably an aromatic group or alicyclic group having a —$COOR_1$ group and a —$COOR_2$ group at mutually ortho positions with a —CONH— group from the viewpoint of realizing both heat resistance and photosensitivity. Examples of the tetravalent organic group represented by $X_{1c}$ preferably include, but are not limited to, organic groups having 6 to 40 carbon atoms containing an aromatic ring, and more preferably structures represented by the following formula (90):

[Chemical Formula 140]

(90)

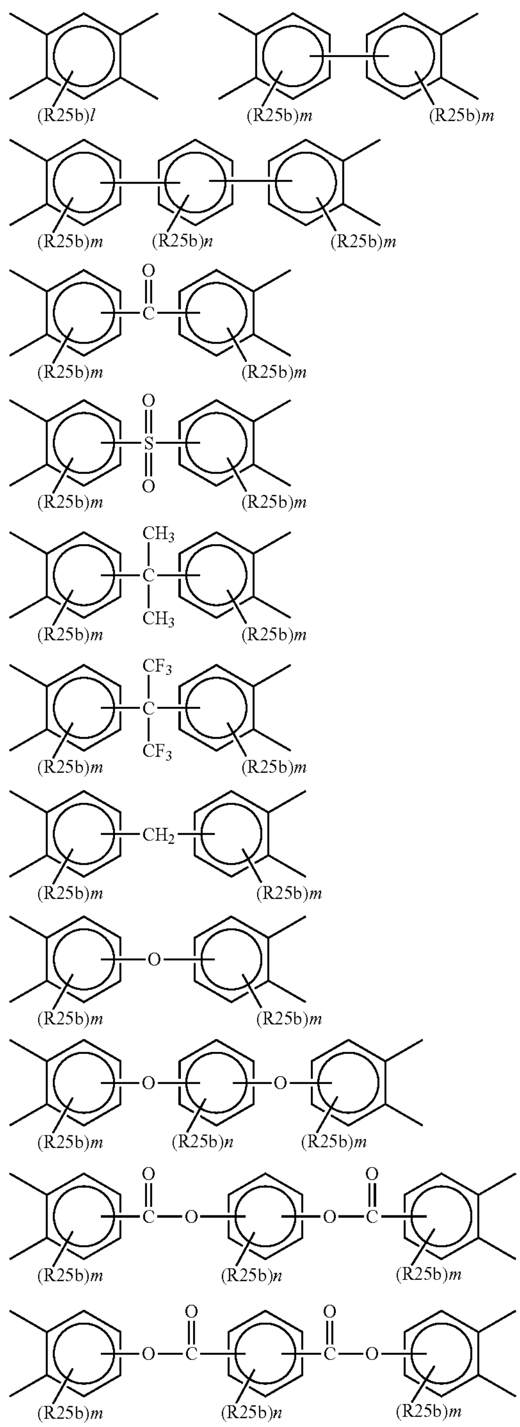

-continued

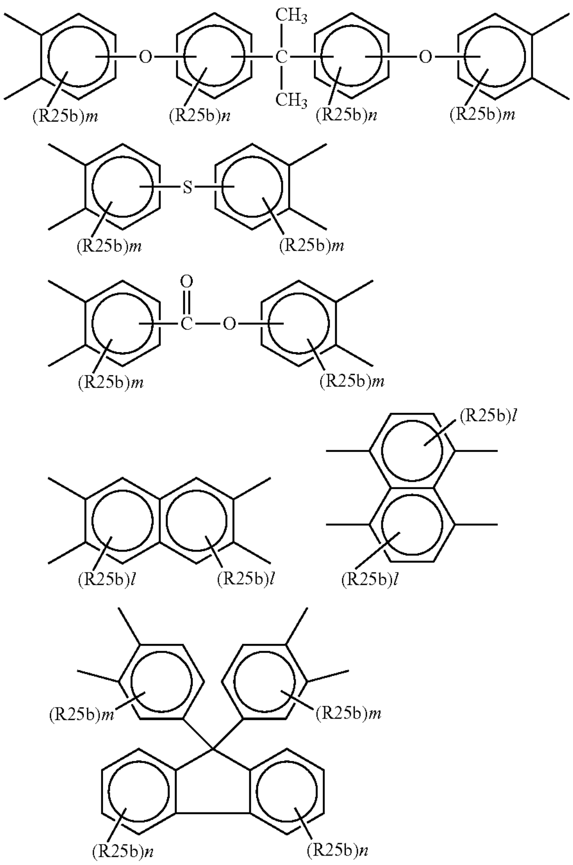

{wherein $R_{25b}$ represents a hydrogen atom, fluorine atom or monovalent group selected from hydrocarbon groups having 1 to 10 carbon atoms and fluorine-containing hydrocarbon groups having 1 to 10 carbon atoms, 1 represents an integer of 0 to 2, m represents an integer of 0 to 3 and n represents an integer of 0 to 4}. In addition, the structure of $X_{1c}$ may be one type or a combination of two or more types. Group $X_{1c}$ having a structure represented by the aforementioned formulas is particularly preferable from the viewpoint of realizing both heat resistance and photosensitivity.

From the viewpoint of realizing both heat resistance and photosensitivity, examples of the divalent organic group represented by $Y_{1c}$ in the aforementioned general formula (1) preferably include, but are not limited to, aromatic groups having 6 to 40 carbon atoms such as the structures represented by the following formula (91):

[Chemical Formula 141]

(91)

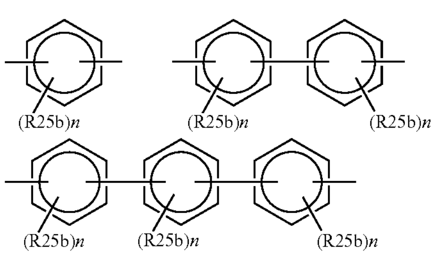

-continued

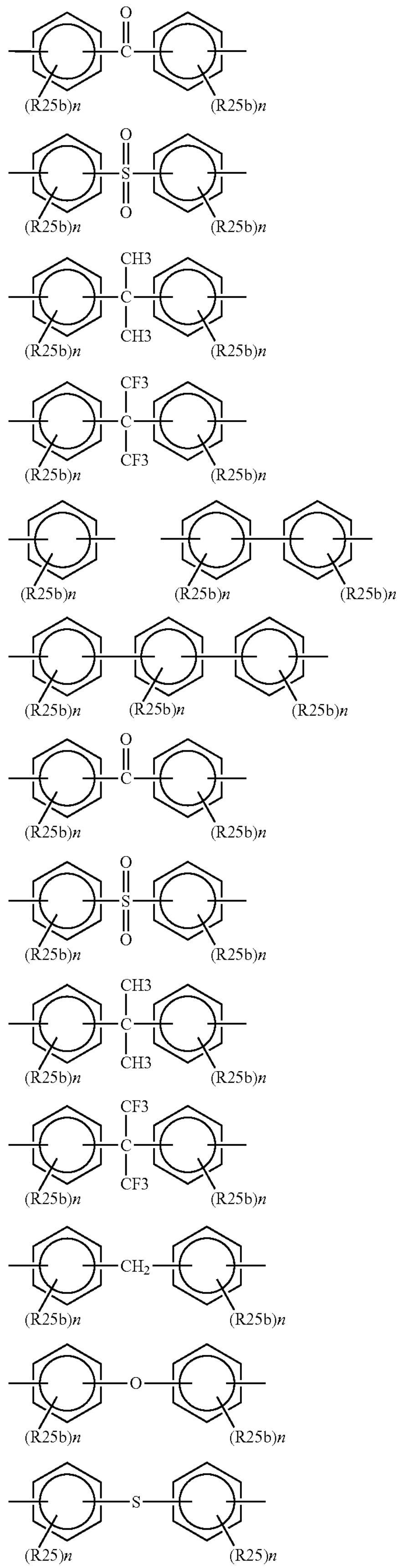

-continued

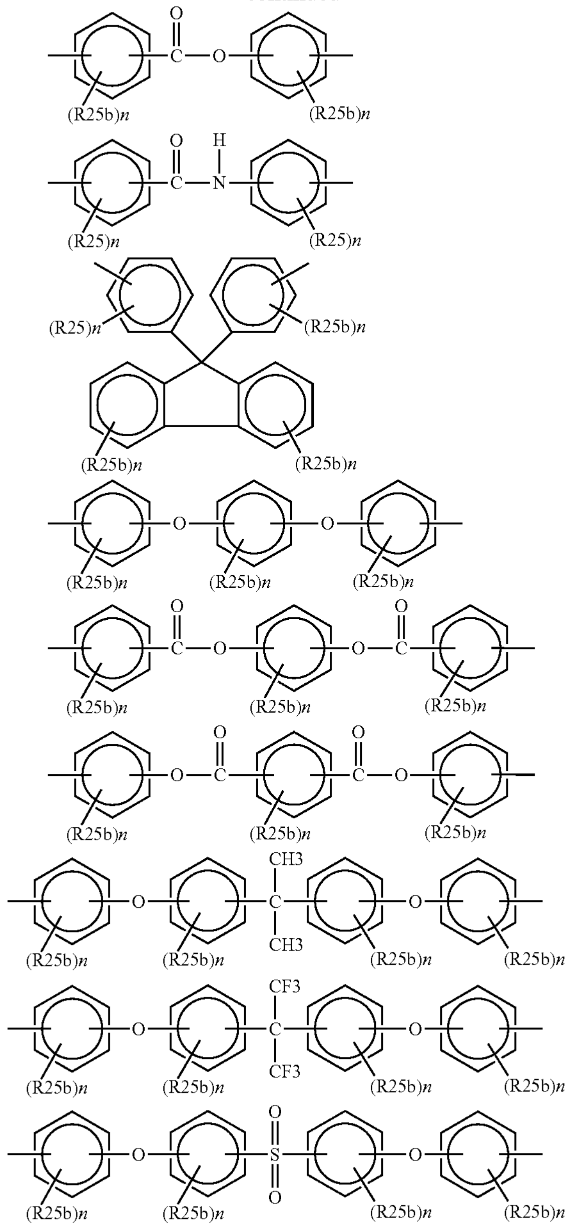

{wherein, $R_{25b}$ represents a hydrogen atom, fluorine atom or monovalent group selected from hydrocarbon groups having 1 to 10 carbon atoms and fluorine-containing hydrocarbon groups having 1 to 10 carbon atoms, and n represents an integer of 0 to 4}. In addition, the structure of $Y_{1c}$ may be one type or a combination of two or more types. Group $Y_{1c}$ having a structure represented by the aforementioned formula (91) is particularly preferable from the viewpoint of realizing both heat resistance and photosensitivity.

Group $R_{3c}$ in the aforementioned general formula (41) is preferably a hydrogen atom or methyl group, and $R_{4c}$ and $R_{5c}$ are preferably hydrogen atoms from the viewpoint of photosensitivity. In addition, $m_{2c}$ is an integer of 2 to 10, and preferably an integer of 2 to 4, from the viewpoint of photosensitivity.

In the case of using a polyimide precursor for the resin (A), examples of methods used to impart photosensitivity to the photosensitive resin composition include ester bonding and ionic bonding. The former is a method consisting of introducing a photopolymerizable group, or in other words, a compound having an olefinic double bond, into a side chain of a polyimide precursor by ester bonding, while the latter is a method consisting of imparting a photopolymerizable group by bonding an amino group of (meth)acrylic compound having an amino group with a carboxyl group of a polyimide precursor through an ionic bond.

The aforementioned ester-bonded polyimide precursor is obtained by first preparing a partially esterified tetracarboxylic acid (to also be referred to as an acid/ester form) by reacting a tetracarboxylic dianhydride containing the aforementioned tetravalent organic group $X_{1c}$ with an alcohol having photopolymerizable unsaturated double bond, and optionally, a saturated aliphatic alcohol having 1 to 4 carbon atoms, followed by subjecting this to amide polycondensation with a diamine containing the aforementioned divalent organic group $Y_1$.

(Preparation of Acid/Ester Form)

In the present invention, examples of the tetracarboxylic dianhydride containing the tetravalent organic group $X_{1c}$ preferably used to prepare the ester-bonded polyimide precursor include, but are not limited to, tetracarboxylic dianhydrides represented by the aforementioned general formula (90) such as pyromellitic anhydride, diphenylether-3,3',4,4'-tetracarboxylic dianhydride, benzophenone-3,3',4,4'-tetracarboxylic dianhydride, biphenyl-3,3'4,4'-tetracarboxylic dianhydride, diphenylphosphone-3,3',4,4'-tetracarboxylic dianhydride, diphenylmethane-3,3'4,4'-tetracarboxylic dianhydride, 2,2-bis(3,4-phthalic anhydride)propane or 2,2-bis (3,4-phthalic anhydride)-1,1,1,3,3,3-hexafluoropropane, while preferable examples include, but are not limited to, pyromellitic anhydride, diphenylether-3,3',4,4'-tetracarboxylic dianhydride, benzophenone-3,3',4,4'-tetracarboxylic dianhydride and biphenyl-3,3'4,4'-tetracarboxylic dianhydride. In addition, these may be used alone or two or more types may be used as a mixture.

In the present invention, examples of alcohols having a photopolymerizable unsaturated double bond preferably used to prepare the ester-bonded polyimide precursor include 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butyoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, methylol vinyl ketone, 2-hydroxyethyl vinyl ketone, 2-hydroxy-3-methoxyopropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

Saturated aliphatic alcohols having 1 to 4 carbon atoms, such as methanol, ethanol, n-propanol, isopropanol, n-butanol or tert-butanol, can be partially mixed and used for the aforementioned alcohols.

A desired acid/ester form can be obtained by carrying out an acid anhydride esterification reaction by dissolving and mixing the aforementioned preferable tetracarboxylic dianhydride of the present invention with an aforementioned alcohol in the presence of a base catalyst such as pyridine and in a solvent to be subsequently described followed by stirring for 4 to 10 hours at a temperature of 20° C. to 50° C.

[Preparation of Polyimide Precursor]

The target polyimide precursor can be obtained by adding a suitable dehydration condensation agent, such as dicyclocarbodiimide, 1-ethoxycarbonyl-2-ethoxy-1,2-dihydroquinoline, 1,1-carbonyldioxy-di-1,2,3-benzotriazole or N,N'-disuccinimidyl carbonate, to the aforementioned acid/ester form (typically in the form of a solution dissolved in the a reaction solvent to be subsequently described) while cooling with ice and mixing therewith to convert the acid/ester form to a polyacid anhydride, and dropping in a solution or dispersion of a diamine containing the divalent organic group $Y_1$ preferably used in the present invention dissolved or dispersed in a different solvent followed by amide polycondensation. Alternatively, the target polyimide precursor can be obtained by converting the acid moiety of the aforementioned acid/ester form to an acid chloride using thionyl chloride and the like, followed by reacting with a diamine compound in the presence of a base such as pyridine.

Examples of diamines containing the divalent organic group $Y_{1c}$ preferably used in the present invention include diamines having a structure represented by the aforementioned general formula (91), and examples of specific compounds include, but are not limited to, p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl] ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, o-toluidine sulfone and 9,9-bis(4-aminophenyl)fluorene, those in which a portion of the hydrogen atoms on the benzene ring thereof is substituted with a substituent, such as a methyl group, ethyl group, hydroxymethyl group, hydroxyethyl group or halogen atom, such as 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, 2,2'-dimethylbenzidine, 2,2'-bis(trifluoromethyl)-4,4'-diaminobiphenyl, 2,2'-bis(fluoro)-4,4'-diaminobiphenyl or 4,4'-diaminooctafluorobiphenyl, and preferably p-phenylenediamine, m-phenylenediamine, 4,4'-diaminodiphenyl ether, 2,2'-dimethylbenzidine, 2,2'-bis(trifluoromethyl)-4,4'-diaminobiphenyl, 2,2'-bis(fluoro)-4,4'-diaminobiphenyl or 4,4'-diaminooctafluorobiphenyl, and mixtures thereof.

Diaminosiloxanes such as 1,3-bis(3-aminopropyl)tetramethyldisiloxane or 1,3-bis(3-aminopropyl)tetraphenyldisiloxane can be copolymerized when preparing the polyimide precursor for the purpose of improving adhesion between various types of substrates and a resin layer formed on the substrate by coating the substrate with the photosensitive resin composition of the present invention.

Following completion of the amide polycondensation reaction, after filtering out absorption byproducts of the dehydration condensation agent also present in the reaction solution as necessary, a suitable poor solvent such as water, an aliphatic lower alcohol or a mixture thereof is added to the resulting polymer component to precipitate the polymer component followed by purifying the polymer by repeating re-dissolution and re-precipitation procedures as necessary and vacuum drying to isolate the target polyimide precursor. In order to improve the degree of purification, a solution of this polymer may be passed through a column packed with an anion exchange resin and/or cation exchange resin swollen with a suitable organic solvent to remove any ionic impurities.

On the other hand, the aforementioned ionic-bonded polyimide precursor is typically obtained by reacting a diamine with a tetracarboxylic dianhydride. In this case, at least one of $R_{1c}$ and $R_{2c}$ in the aforementioned general formula (40) is a hydroxyl group.

An anhydride of a tetracarboxylic acid containing a structure represented by the aforementioned formula (90) is preferable for the tetracarboxylic dianhydride, and a diamine containing a structure represented by the aforementioned formula (91) is preferable for the diamine. A photopolymerizable group is imparted by ionic bonding between a carboxyl group and an amino group by adding a (meth)acrylic compound having an amino group to be subsequently described to the resulting polyimide precursor.

A dialkylaminoalkyl acrylate or methacrylate, such as dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, diethylaminopropyl acrylate, diethylaminopropyl methacrylate, dimethylaminobutyl acrylate, dimethylaminobutyl methacrylate, diethylaminobutyl acrylate or diethylaminobutyl methacrylate, is preferable for the (meth)acrylic compound having an amino group, and among these, a dialkylaminoalkyl acrylate or methacrylate in which the alkyl group on the amino group has 1 to 10 carbon atoms and the alkyl chain has 1 to 10 carbon atoms is preferable from the viewpoint of photosensitivity.

The incorporated amount of these (meth)acrylic compounds having an amino group based on 100 parts by weight of the resin (A) is 1 part by weight to 20 parts by weight and preferably 2 parts by weight to 15 parts by weight form the viewpoint of photosensitivity. The incorporation of 1 part by weight or more of the (meth)acrylic compound having an amino group as the photosensitizer (B) based on 100 parts by weight of the resin (A) results in superior photosensitivity, while the incorporation of 20 parts by weight or less results in superior thick film curability.

The molecular weight of the aforementioned ester-bonded and ionic-bonded polyimide precursors in the case of measuring by gel permeation chromatography based on standard polystyrene conversion is preferably 8,000 to 150,000 and more preferably 9,000 to 50,000. Mechanical properties are favorable in the case of a weight average molecular weight of 8,000 or more, while dispersibility in developer and resolution of the relief pattern are favorable in the case of a weight average molecular weight of 150,000 or less. The use of tetrahydrofuran or N-methyl-2-pyrrolidone is recommended for the developing solvent during gel permeation chromatography. In addition, weight average molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

[Polyamide (A)]

Another example of a preferable resin (A) in the photosensitive resin composition of the present invention is a polyamide having a structure represented by the following general formula (43):

[Chemical Formula 142]

(43)

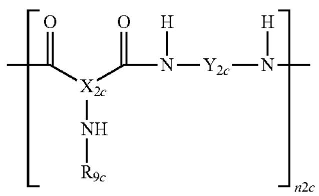

{wherein, $X_{2c}$ represents a trivalent organic group having 6 to 15 carbon atoms, $Y_{2c}$ represents a divalent organic group having 6 to 35 carbon atoms and may have the same structure or a plurality of structures, Rac represents an organic group having 3 to 20 carbon atoms and having at least one radical-polymerizable unsaturated bond, and $n_{2c}$ represents an integer of 1 to 1000}. This polyamide is preferable for use in negative-type photosensitive resin compositions.

In the aforementioned general formula (43), the group represented by $R_{9c}$ is preferably a group represented by the following general formula (100):

[Chemical Formula 143]

(100)

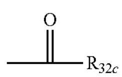

{wherein, $R_{32c}$ represents an organic group having 2 to 19 carbon atoms and at least one radical-polymerizable unsaturated bond} from the viewpoints of photosensitivity and chemical resistance.

In the aforementioned general formula (43), the trivalent organic group represented by $X_{2c}$ is preferably a trivalent organic group having 6 to 15 carbon atoms, preferably an aromatic group selected from, for example, those groups represented by the following formula (101),

[Chemical Formula 144]

(101)

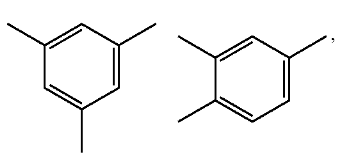

and more preferably an aromatic group in which the carboxyl group and amino group have been removed from the amino group-substituted isophthalic acid structure.

In the aforementioned general formula (43), the divalent organic group represented by $Y_{2c}$ is preferably an organic group having 6 to 35 carbon atoms, and more preferably a cyclic organic group having 1 to 4 optionally substituted aromatic rings or aliphatic rings or an aliphatic group or siloxane group not having a cyclic structure. Examples of the divalent organic group represented by $Y_{2c}$ include those represented by the following general formulas (102) and (102-1):

[Chemical Formula 145]

(102)

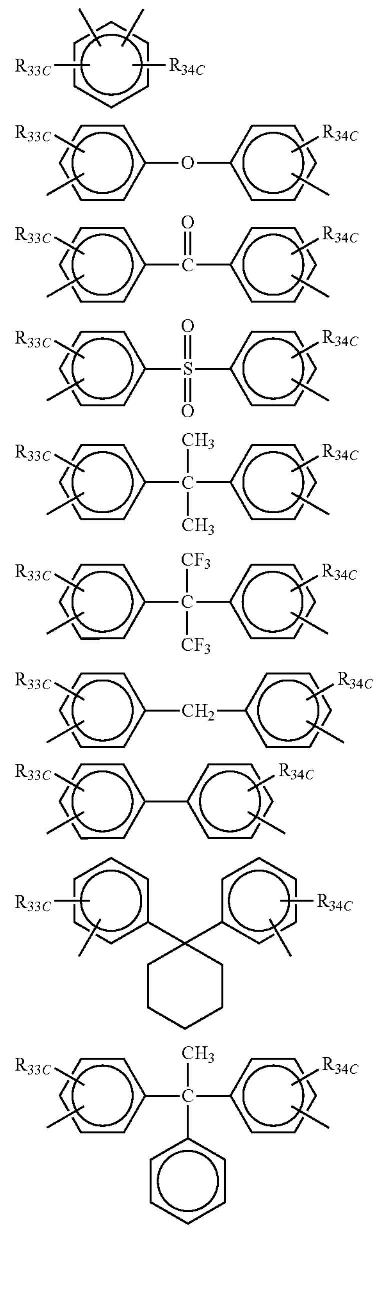

{wherein, $R_{33c}$ and $R_{34c}$ respectively and independently represent at least one group selected from the group consisting of a hydroxyl group, methyl group ($-CH_3$), ethyl group ($-C_2H_5$), propyl group ($-C_3H_7$) and butyl group ($-C_4H_9$), and the propyl group and butyl group include their respective isomers},

[Chemical Formula 146]

(102-1)

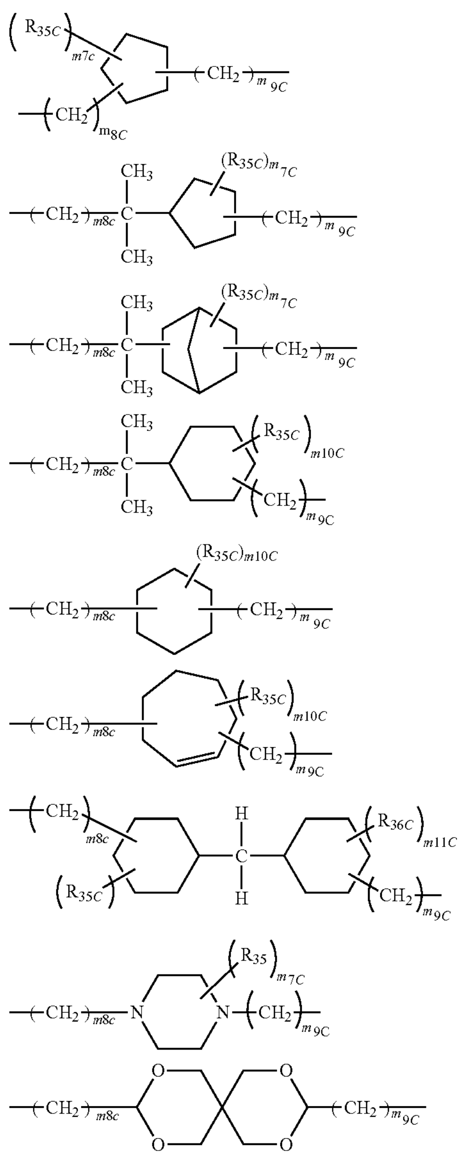

{wherein, $m_{7c}$ represents an integer of 0 to 8, $m_{8c}$ and $m_{9c}$ respectively and independently represent an integer of 0 to 3, $m_{10c}$ and $m_{11c}$ respectively and independently represent an integer of 0 to 10, and $R_{35c}$ and $R_{36c}$ represent methyl groups (—$CH_3$), ethyl groups (—$C_2H_5$), propyl groups (—$C_3H_7$), butyl groups (—$C_4H_9$) or isomers thereof}.

Preferable examples of an aliphatic group or siloxane group not having a cyclic structure include those represented by the following general formula (103):

[Chemical Formula 147]

(103)

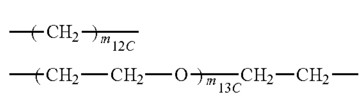

-continued

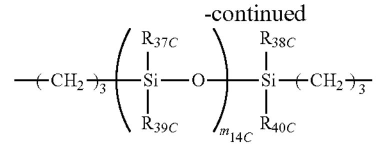

{wherein, $m_{12c}$ represents an integer of 2 to 12, $m_{13c}$ represents an integer of 1 to 3, $m_{14c}$ represents an integer of 1 to 20, and $R_{37c}$, $R_{38c}$, $R_{39c}$ and $R_{40c}$ respectively and independently represent an alkyl group having 1 to 3 carbon atoms or an optionally substituted phenyl group}.

The polyamide resin of the present invention can be synthesized, for example, in the manner indicated below.

(Synthesis of Blocked Phthalic Acid Compound)

First, a compound in which the amino group of a phthalic acid compound is modified and blocked with a group containing a radical-polymerizable unsaturated bond to be subsequently described (to be referred to as a "blocked phthalic acid compound") is synthesized by reacting 1 mole of a compound having a trivalent aromatic group $X_{2c}$, such as at least one compound selected from phthalic acid substituted with an amino group, isophthalic acid substituted with an amino group and terephthalic acid substituted with an amino group (to be referred to as a "phthalic acid compound"), with 1 mole of a compound that reacts with an amino group. These may be used alone or as a mixture.

The use of a structure in which the phthalic acid compound is blocked with the aforementioned group containing a radical-polymerizable unsaturated bond, negative-type photosensitivity (photocurability) can be imparted to the polyamide resin.

The group containing a radical-polymerizable unsaturated bond is preferably an organic group having 3 to 20 carbon atoms and a radical-polymerizable unsaturated bond, and particularly preferably a group containing a methacryloyl group or acryloyl group.

The aforementioned blocked phthalic acid compound can be obtained by reacting the amino group of the phthalic acid compound with an acid chloride, isocyanate or epoxy compound having 3 to 20 carbon atoms and at least one radical-polymerizable unsaturated bond.

Preferable examples of acid chlorides include (meth)acryloyl chloride, 2-[(meth)acryloyloxy]acetyl chloride, 3-[(meth)acryloyloxy]propionyl chloride, 2-[(meth)acryloyloxy]ethyl chloroformate and 3-[(meth)acryloyloxypropyl] chloroformate. Preferable examples of isocyanates include 2-(meth)acryloyloxyethyl isocyanate, 1,1-bis[(meth)acryloyloxymethyl]ethyl isocyanate and 2-[2-(meth)acryloyloxyethoxy]ethyl isocyanate. Preferable examples of epoxy compounds include glycidyl (meth)acrylate. Although these may be used alone or as a mixture, methacryloyl chloride and/or 2-(methacryloyloxy)ethyl isocyanate are used particularly preferably.

The use of these blocked phthalic acid compounds in which the phthalic acid compound is 5-aminoisophthalic acid is preferable since this allows the obtaining of a polyamide having superior photosensitivity as well as superior film properties following heat curing.

The aforementioned blocking reaction can be allowed to proceed by stirring, dissolving or mixing the phthalic acid compound and a blocking agent in the presence of a base catalyst such as pyridine or a tin-based catalyst such as di-n-butyltin dilaurate in solvent to be subsequently described as necessary.

Hydrogen chloride may be produced as a by-product during the course of the blocking reaction depending on the type of blocking agent such as in the case of an acid chloride. In this case, purification is preferably carried out as suitable, such as by re-precipitating in water or rinsing with water, or by reducing or removing ionic components by passing through a column packed with an ion exchange resin, for the purpose of preventing contamination of subsequent steps.

(Synthesis of Polyamide)

The polyamide of the present invention can be obtained by mixing the aforementioned blocked phthalic acid compound and diamine compound having the divalent organic group $Y_{2c}$ in the presence of a base catalyst such as pyridine or triethylamine in a solvent to be subsequently described followed by subjecting to amide polycondensation.

Examples of methods used to carry out amide polycondensation include a method consisting of mixing the blocked phthalic acid compound with the diamine compound after having converted to a symmetrical polyacid anhydride using a dehydration condensation agent, a method consisting of mixing the blocked phthalic acid compound with the diamine compound after having converted to an acid chloride according to a known method, and a method consisting of reacting a dicarboxylic acid component with an active esterifying agent in the presence of a dehydration condensation agent to convert to an active ester followed by mixing with the diamine compound.

Preferable examples of dehydration condensation agents include dicyclohexylcarbodiimide, 1-ethoxycarbonyl-2-ethoxy-1,2-dihydroquinoline, 1,1-carbonyldioxy-di-1,2,3-benzotriazole and N,N'-disuccinimidyl carbonate.

An example of chlorinating agents includes thionyl chloride.

Examples of active esterifying agents include ti-hydroxysuccinimide, 1-hydroxybenzotriazole, N-hydroxy-5-norbornene-2,3-dicarboxylic acid imide, ethyl 2-hydroxyimino-2-cyanoacetate and 2-hydroxyimino-2-cyanoacetoamide.

The diamine compound having the organic group $Y_{2c}$ is preferably at least one diamine compound selected from the group consisting of aromatic diamine compounds, aromatic bisaminophenol compounds, alicyclic diamine compounds, linear aliphatic diamine compounds and siloxane diamine compounds, and a plurality thereof can be used in combination as desired.

Examples of aromatic diamine compounds include p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4'-bis(4-aminophenoxy)biphenyl, 4,4'-bis(3-aminophenoxy)biphenyl, bis[4-(4-aminophenoxy)phenyl] ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, o-toluidine sulfone or 9,9-bis(4-aminophenyl)fluorene, and compounds in which a portion of the hydrogen atoms on the benzene ring thereof is substituted with one or more groups selected from the group consisting of a methyl group, ethyl group, hydroxymethyl group, hydroxyethyl group and halogen atom.

Examples of diamine compounds in which a hydrogen atom on the benzene ring is substituted include 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl and 3,3'-dichloro-4,4'-diaminobiphenyl.

Examples of aromatic bisaminophenol compounds include 3,3'-dihydroxybenzidine, 3,3'-diamino-4,4'-dihydroxybiphenyl, 3,3'-dihydroxy-4,4'-diaminodiphenylsulfone, bis(3-amino-4-hydroxyphenyl)methane, 2,2-bis-(3-amino-4-hydroxyphenyl)propane, 2,2-bis-(3-amino-4-hydroxyphenyl)hexafluoropropane, 2,2-bis-(3-hydroxy-4-aminophenyl)hexafluoropropane, bis-(3-hydroxy-4-aminophenyl)methane, 2,2-bis-(3-hydroxy-4-aminophenyl)propane, 3,3'-dihydroxy-4,4'-diaminobenzophenone, 3,3'-dihydroxy-4,4'-diaminodiphenyl ether, 4,4'-dihydroxy-3,3'-diaminodiphenyl ether, 2,5-dihydroxy-1,4-diaminobenzene, 4,6-diaminoresorcinol, 1,1-bis(3-amino-4-hydroxyphenyl)cyclohexane and 4,4-(α-methylbenzylidene)-bis(2-aminophenol).

Examples of alicyclic diamine compounds include 1,3-diaminocyclopentane, 1,3-diaminocyclohexane, d1,3-diamino-1-methylcyclohexane, 3,5-diamino-1,1-dimethylcyclohexane, 1,5-diamino-1,3-dimethylcyclohexane, 1,3-diamino-1-methyl-4-isopropylcyclohexane, 1,2-diamino-4-methylcyclohexane, 1,4-diaminocyclohexane, 1,4-diamino-2,5-diethylcyclohexane, 1,3-bis(aminomethyl)cyclohexane, 1,4-bis(aminomethyl)cyclohexane, 2-(3-aminocyclopentyl)-2-propylamine, menthane diamine, isophorone diamine, norbornane diamine, 1-cycloheptene-3,7-diamine, 4,4'-methylenebis(cyclohexylamine), 4,4'-methylenebis(2-methylcyclohexylamine), 1,4-bis(3-aminopropyl)piperazine and 3,9-bis(3-aminopropyl)-2,4,8,10-tetraoxaspiro[5,5]-undecane.

Examples of linear aliphatic diamines include hydrocarbon-based diamines such as 1,2-diaminoethane, 1,4-diaminobutane, 1,6-diaminohexane, 1,8-diaminooctane, 1,10-diaminodecane or 1,12-diaminododecane, and alkylene oxide-based diamines such as 2-(2-aminoethoxy)ethylamine, 2,2'-(ethylenedioxy)diethylamine or bis[2-(2-aminoethoxy)ethyl]ether.

Examples of siloxane diamine compounds dimethyl(poly)siloxane diamine, such as PAM-E, KF-8010 or X-22-161A (trade names) manufactured by Shin-etsu Chemical Co., Ltd.

Following completion of the amide polycondensation reaction, precipitates derived from the dehydration condensation agent that have precipitated in the reaction solution are filtered out as necessary. Next, a poor solvent of polyamide, such as water, an aliphatic lower alcohol or a mixture thereof, is added to the reaction solution to precipitate polyamide. Moreover, the precipitated polyamide is purified by repeatedly re-dissolving and re-precipitating in a solvent followed by vacuum drying to isolate the target polyamide. Furthermore, in order to improve the degree of purification, a solution of this polyamide may be passed through a column packed with an ion exchange resin to remove any ionic impurities.

The weight average molecular weight as of the polyamide as polystyrene as determined by gel permeation chromatography (GPC) is preferably 7,000 to 70,000 and more preferably 10,000 to 50,000. Basic physical properties of the cured relief pattern are ensured if the weight average molecular weight as polystyrene is 7,000 or more. In addition, development solubility is ensured when forming a relief pattern if the weight average molecular weight as polystyrene is 70,000 or less.

The use of tetrahydrofuran or N-methyl-2-pyrrolidone is recommended for the eluent used during GPC. In addition, weight average molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

[Polyhydroxyamide (A)]

Still another example of a preferable resin (A) in the photosensitive resin composition of the present invention is a polyhydroxyamide having a structure represented by the following general formula (44):

[Chemical Formula 148]

(44)

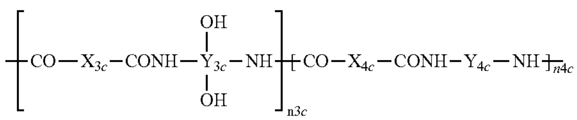

{wherein, $Y_{3c}$ represents a tetravalent organic group having a carbon atom, and preferably represents a tetravalent organic group having two or more carbon atoms, $Y_{4c}$, $X_{3c}$ and $X_{4c}$ respectively and independently represent a divalent organic group having two or more carbon atoms, $n_{3c}$ represents an integer of 1 to 1000, $n_{4c}$ represents an integer of 0 to 500, $n_{3c}/(n_{3c}+n_{4c})$ is greater than 0.5, and there are no restrictions on the arrangement order of the $n_{3c}$ number of dihydroxydiamide units containing $X_{3c}$ and $Y_{3c}$ or the $n_{4c}$ number of diamide units containing $X_{4c}$ and $Y_{4c}$} (and a polyhydroxyamide represented by the aforementioned general formula (44) may simply be referred to as "polyhydroxyamide").

The polyoxazole precursor is a polymer having $n_{3c}$ number of dihydroxydiamide units (which may be simply referred to as the dihydroxydiamide unit) in the aforementioned general formula (44), and may have $n_{4c}$ number of diamine units (which may be simply referred to as the diamine unit) in the aforementioned general formula (44).

The number of carbon atoms of $X_{3c}$ is preferably 2 to 40 for the purpose of obtaining photosensitivity, the number of carbon atoms of $X_{4c}$ is preferably 2 to 40 for the purpose of obtaining photosensitivity, and number of carbon atoms of $Y_{3c}$ is preferably 2 to 40 for the purpose of obtaining photosensitivity, and the number of carbons of $Y_{4c}$ is preferably 2 to 40 for the purpose of obtaining photosensitivity.

The dihydroxydiamide unit can be formed by synthesizing from a diaminodihydroxy compound (preferably bisaminophenol) having the structure $Y_{3c}(NH_2)_2(OH)_2$ and a dicarboxylic acid having the structure $X_{3c}(COOH)_2$. The following provides an explanation of a typical aspect thereof using as an example the case in which the aforementioned diaminodihydroxy compound is bisaminophenol. The two sets of amino groups and hydroxyl groups of the bisaminophenol are respectively and mutually in the ortho position, and the dihydroxydiamide unit changes to a heat-resistant polyoxazole structure following ring closure caused by heating at about 250° C. to 400° C. Thus, polyhydroxyamide can also be said to be a polyoxazole precursor. $n_{3c}$ in general formula (44) is preferably 1 to 1000 for the purpose of obtaining photosensitivity. $n_{3c}$ is preferably within the range of 2 to 1000, more preferably within the range of 3 to 50, and most preferably within the range of 3 to 20.

An $n_{4c}$ number of the aforementioned diamide units may be condensed in the polyhydroxyamide as necessary. The diamide unit can be formed by synthesizing from a diamine having the structure $Y_{4c}(NH_2)_2$ and a dicarboxylic acid having the structure $X_{4c}(COOH)_2$. $n_{4c}$ in general formula (44) is within the range of 0 to 500, and preferable photosensitivity is obtained as a result of $n_{4c}$ being 500 or less. $n_{4c}$ is more preferably within the range of 0 to 10. Since solubility in the aqueous alkaline solution used for the developer decreases if the ratio of the diamide unit to the dihydroxydiamide unit is excessively high, the value of $n_{3c}/(n_{3c}+n_{4c})$ of general formula (44) is greater than 0.5, preferably 0.7 or more, and most preferably 0.8 or more.

Examples of bisaminophenols in the form of diaminodihydroxy compounds having the structure $Y_{3c}(NH_2)_2(OH)_7$ include 3,3'-dihydroxybenzidine, 3,3'-diamino-4,4'-dihydroxybiphenyl, 4,4'-diamino-3,3'-dihydroxybiphenyl, 3,3'-diamino-4,4'-dihydroxybiphenylsulfone, 4,4'-diamino-3,3'-dihydroxydiphenylsulfone, bis-(3-amino-4-hydroxyphenyl)methane, 2,2-bis-(3-amino-4-hydroxyphenyl propane, 2,2-bis-(3-amino-4-hydroxyphenyl)hexafluoropropane, 2,2-bis-(4-amino-3-hydroxyphenyl)hexafluoropropane, bis-(4-amino-3-hydroxyphenyl)methane, 2,2-bis-(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxyphenyl ether, 3,3'-diamino-4,4'-dihydroxyphenyl ether, 1,4-diamino-2,5-dihydroxybenzene, 1,3-diamino-2,4-dihydroxybenzene and 1,3-diamino-4,6-dihydroxybenzene. These bisaminophenol can be used alone or two or more types can be used in combination. The $Y_{3c}$ group in these bisaminophenols is preferably represented by the following general formula (104):

[Chemical Formula 149]

(104)

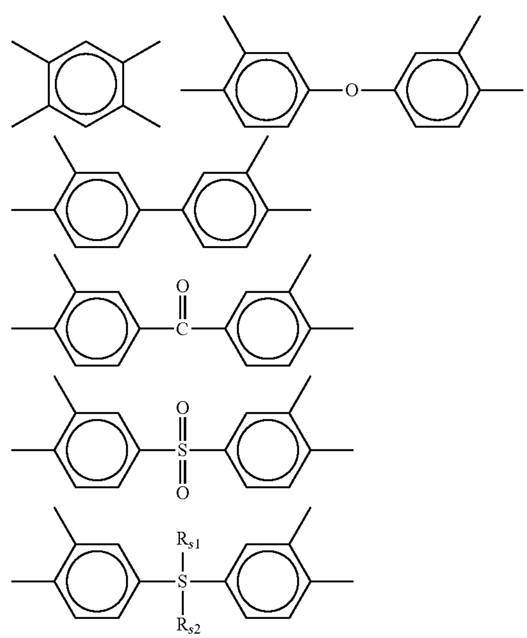

{wherein, $R_{s1}$ and $R_{s2}$ respectively and independently represent a hydrogen atom, methyl group, ethyl group, propyl group, cyclopentyl group, cyclohexyl group, phenyl group or trifluoromethyl group} from the viewpoint of photosensitivity.

Examples of diamines having the structure $Y_{4c}$ $(NH_2)_2$ include aromatic diamines and silicone diamines. Among these, examples of aromatic diamines include m-phenylenediamine, p-phenylenediamine, 2,4-tolylenediamine, 3,3'-diaminodiphenyl ether, 3,4'-diaminodiphenyl ether, 4,4'-diaminodiphenyl ether, 3,3'-diaminodiphenylsulfone, 4,4'-diaminodiphenylsulfone, 3,4'-diaminodiphenylsulfone, 3,3'-diaminodiphenylmethane, 4,4'-diaminodiphenylmethane, 3,4'-diaminodiphenylmethane, 4,4'-diaminodiphenyl sulfide, 3,3'-diaminodiphenyl ketone, 4,4'-diaminodiphenyl ketone, 3,4'-diaminodiphenyl ketone, 2,2-bis(4-aminophenyl)propane, 2,2-bis(4-aminophenyl)hexafluoropropane, 1,3-bis(3-aminophenoxy)benzene, 1,3-bis(4-aminophenoxy)benzene, 1,4-bis(4-aminophenoxy)benzene, 4-methyl-2,4-bis(4-aminophenyl)-1-pentene, 4-methyl-2,4-bis(4-aminophenyl)-2-pentene, 1,4-bis(α,α-dimethyl-4-aminobenzyl)benzene, imino-di-p-phenylenediamine, 1,5-diaminonaphthalene, 2,6-diaminonaphthalene, 4-methyl-2,4-bis(4-aminophenyl)pentane, 5 (or 6)-amino-1-(4-aminophenyl)-1,3,3-trimethylindane, bis(p-aminophenyl)phosphine oxide, 4,4'-diaminoazobenzene, 4,4'-diaminodiphenyl urea, 4,4'-bis(4-aminophenoxy)biphenyl, 2,2-bis[4-(4-aminophenoxy)phenyl]propane, 2,2-bis[4-(4-aminophenoxy)phenyl]hexafluoropropane, 2,2-bis[4-(3-aminophenoxy)phenyl]benzophenone, 4,4'-bis(4-aminophenoxy)diphenylsulfone, 4,4'-bis[4-(α,α-dimethyl-4-aminobenzyl)phenoxy]benzophenone, 4,4'-bis[4-(α,α-dimethyl-4-aminobenzyl)phenoxy]diphenylsulfone, 4,4'-diaminobiphenyl, 4,4'-diaminobenzophenone, phenylindanediamine, 3,3'-dimethoxy-4,4'-diaminobiphenyl, 3,3'-dimethyl-4,4'-diaminobiphenyl, o-toluidine sulfone, 2,2-bis(4-aminophenoxyphenyl)propane, bis(4-aminophenoxyphenyl)sulfone, bis(4-aminophenoxyphenyl)sulfide, 1,4-(4-aminophenoxyphenyl)benzene, 1,3-(4-aminophenoxyphenyl)benzene, 9,9-bis(4-aminophenyl)fluorene, 4,4'-di-(3-aminophenoxy)diphenylsulfone, 4,4'-diaminobenzanilide, and compounds in which a portion of the hydrogen atoms of the aromatic core of these aromatic diamines is substituted with one or more groups or atoms selected from the group consisting of a chlorine atom, fluorine atom, bromine atom, methyl group, methoxy group, cyano group and phenyl group.

In addition, a silicone diamine can be selected for the aforementioned diamine in order to enhance adhesion with a base material. Examples of silicone diamines include bis(4-aminophenyl)dimethylsilane, bis(4-aminophenyl)tetramethylsiloxane, bis(4-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane and bis(γ-aminopropyl)tetraphenyldisiloxane.

In addition, preferable examples of dicarboxylic acids having the structure $X_{3c}$ $(COOH)_2$ or $X_{4c}$ $(COOH)_2$ include those in which $X_{3c}$ and $X_{4c}$ are respectively an aliphatic group or aromatic group having a linear, branched or cyclic structure. Among these, an organic group having 2 to 40 carbon atoms optionally containing an aromatic ring or aliphatic ring is preferable, and $X_{3c}$ and $X_{4c}$ can be selected from aromatic groups represented by the following formula (105):

[Chemical Formula 150]

(105)

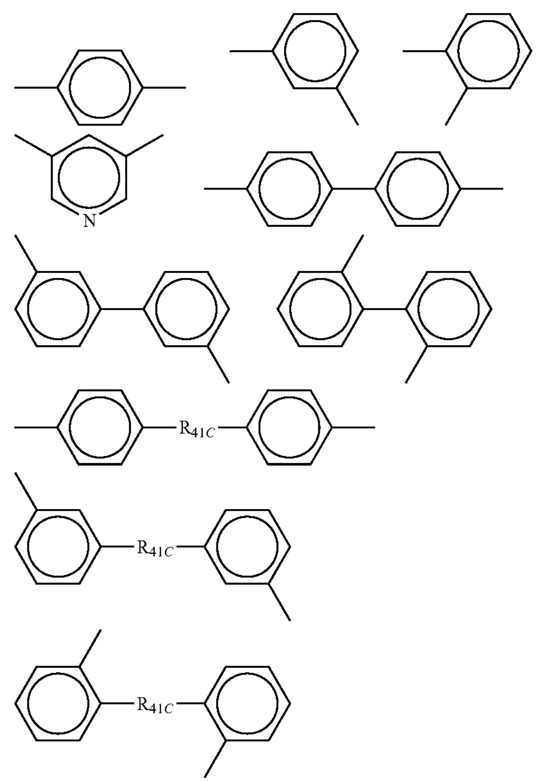

{wherein, $R_{41c}$ represents a divalent group selected from the group consisting of —$CH_2$—, —O—, —S—, —$SO_2$—, —CO—, —NHCO— and —$C(CF_3)_2$—}, and these are preferable from the viewpoint of photosensitivity.

The terminal group of the polyoxazole precursor may be blocked with a specific organic group. In the case of using a polyoxazole precursor blocked with a blocking group, mechanical properties (and particularly elongation) and the form of the cured relief pattern of a coating film following heat curing of the photosensitive resin composition of the present invention can be expected to be favorable. Preferable examples of such blocking groups include those represented by the following formula (106):

[Chemical Formula 151]

(106)

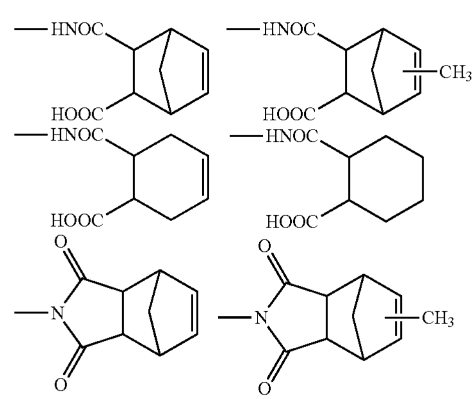

-continued

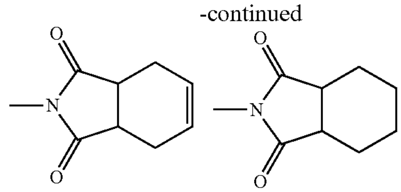

The weight average molecular weight as of the polyoxazole precursor as polystyrene as determined by gel permeation chromatography is preferably 3,000 to 70,000 and more preferably 6,000 to 50,000. In addition, the weight average molecular weight is preferably 3,000 or more from the viewpoint of physical properties of the cured relief pattern. The weight average molecular weight is preferably 70,000 or less from the viewpoint of resolution. The use of tetrahydrofuran or N-methyl-2-pyrrolidone is recommended for the developing solvent of gel permeation chromatography. In addition, molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

[Polyimide (A)]

Still another example of a preferable resin (A) in the photosensitive resin composition of the present invention is a polyimide having a structure represented by the following general formula (45):

[Chemical Formula 152]

(45)

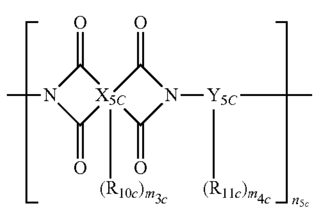

{wherein, $X_{5c}$ represents a tetravalent to tetradecavalent organic group, $Y_{5c}$ represents a divalent to dodecavalent organic group, $R_{10c}$ and $R_{11c}$ represent organic groups having at least one group selected from the group consisting of a phenolic hydroxyl group, sulfonate group and thiol group, and may be the same or different, $n_{5c}$ represents an integer of 3 to 200 and $m_{3c}$ and $m_{4c}$ represent integers of 1 to 10}. Here, a resin represented by general formula (45) does not require chemical alteration in a heat treatment step since it already demonstrates adequate film properties, it is particularly preferable since treatment can be carried out at a lower temperature.

$X_{5c}$ in the structural unit represented by the aforementioned general formula (45) is preferably a tetravalent to tetradecavalent organic group having 4 to 40 carbon atoms, and is more preferably an organic group having 5 to 40 carbon atoms containing an aromatic ring or aliphatic ring from the viewpoint of realizing both heat resistance and photosensitivity.

The polyimide represented by the aforementioned general formula (45) can be obtained by reacting a tetracarboxylic acid, corresponding tetracarboxylic dianhydride or tetracarboxylic acid diester dichloride with a diamine, corresponding diisocyanate compound or trimethylsilylated diamine. The polyamide can be typically obtained by reacting a tetracarboxylic dianhydride and diamine and dehydrating the polyamic acid, which is one the resulting polyimide precursors, by heating or by chemically treating with acid or base to close the ring.

Preferable examples of tetracarboxylic dianhydrides include aromatic tetracarboxylic dianhydrides such as pyromellitic dianhydride, 3,3',4,4'-biphenyltetracarboxylic dianhydride, 2,3,3',4,'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl) propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl) ether dianhydride, 1,2,5,6-naphthalenetetracarboxylic dianhydride, 9,9-bis(3,4-dicarboxyphenyl)fluorene dianhydride, 9,9-bis[4-(3,4-dicarboxyphenoxy)phenyl]fluorene dianhydride, 2,3,6,7-naphthalenetetracarboxylic dianhydride, 2,3,5,6-pyridinetetracarboxylic dianhydride, 3,4,9,10-perylenetetracarboxylic dianhydride or 2,2-bis(3,4-dicarboxyphenyl)hexafluoropropane dianhydride, aliphatic tetracarboxylic dianhydrides such as butanetetracarboxylic dianhydride or 1,2,3,4-cyclopentanetetracarboxylic dianhydride; 3,3',4,4'-diphenylsulfonetetracarboxylic dianhydride, and a compound represented by the following general formula (107);

[Chemical Formula 153]

(107)

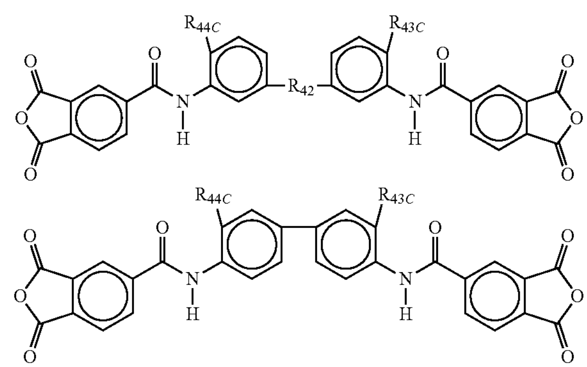

{wherein, $R_{42}$ represents an oxygen atom or a group selected from $C(CF_3)_2$, $C(CH_3)_2$ and $SO_2$, and $R_{43c}$ and $R_{44c}$ may be the same or different and represent hydrogen atoms or groups selected from a hydroxyl group and thiol group}.

Among these, 3,3',4,4'-biphenyltetracarboxylic dianhydride, 2,3,3',4,'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4- dicarboxyphenyl)sulfone dianhydride, 20 [0325]bis(3,4-dicarboxyphenyl)ether dianhydride, 2,2-bis(3,4-dicarboxyphenyl)hexafluoropropane dianhydride, 3,3',4,4'-diphenylsulfonetetracarboxylic dianhydride, 9,9-bis(3,4-dicarboxyphenyl)fluorene dianhydride, 9,9-bis[4-(3,4-dicarboxyphenyl)phenyl]fluorene dianhydride, and dianhydrides having a structure represented by the following general formula (108):

[Chemical Formula 154]

(108)

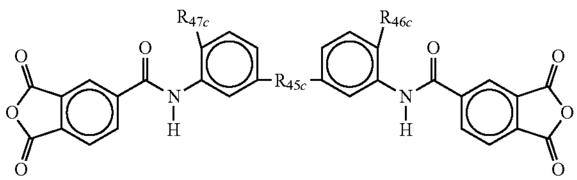

{wherein, $R_{45c}$ represents an oxygen atom or a group selected from $C(CF_3)_2$, $C(CH_3)_2$ and $SO_2$, and $R_{46c}$ and $R_{47c}$ may be the same or different and represent hydrogen atoms or groups selected from a hydroxyl group and thiol group}. These are used alone or two or more types are used in combination.

$Y_{5c}$ in the aforementioned general formula (45) represents a constituent component of a diamine, and this diamine preferably represents a divalent to dodecavalent organic group containing an aromatic ring or aliphatic ring, and is particularly preferably an organic group having 5 to 40 carbon atoms.

Specific examples of diamines include 3,4'-diaminodiphenyl ether, 4,4'-diaminodiphenyl ether, 3,4*-diaminodiphenylmethane, 4,4'-diaminodiphenylmethane, 3,4'-diaminodiphenylsulfone, 4,4'-diaminodiphenylsulfone, 3,4'-diaminodiphenyl sulfide, 4,4'-diaminodiphenyl sulfide, 1,4-bis(4-aminophenoxy)benzene, benzene, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluorophenyl)-4,4'-diaminobiphenyl, 9,9-bis(4-aminophenyl)fluorene, compounds in which the aromatic ring thereof is substituted with an alkyl group or halogen atom, aliphatic cyclohexyldiamines, methylenebis(cyclohexylamines), and diamines having a structure represented by the following general formula (109):

[Chemical Formula 155]

(109)

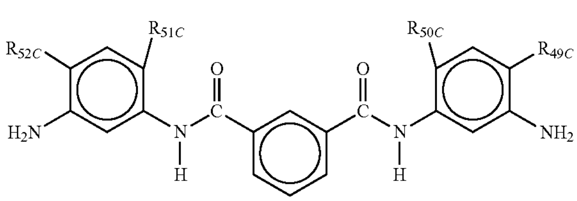

-continued

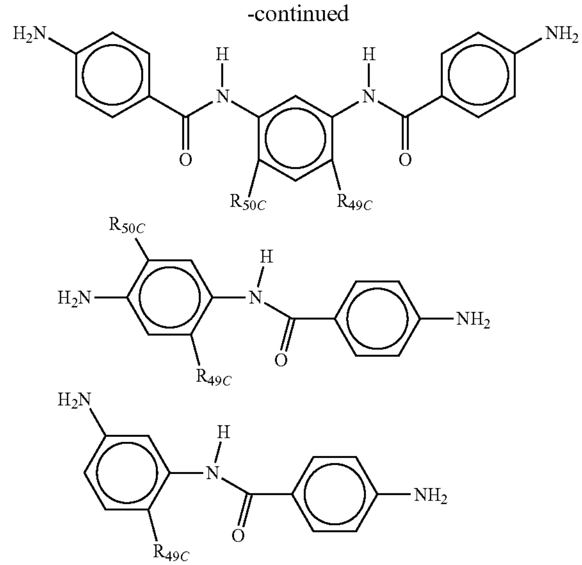

{wherein, $R_{48c}$ represents an oxygen atom or group selected from $C(CF_3)_2$, $C(CH_3)_2$ and $SO_2$, and $R_{49c}$ to $R_{52c}$ may be the same or different and represent hydrogen atoms or groups selected from a hydroxyl group and thiol group}.

Among these, 3,4'-diaminodiphenyl ether, 4,4'-diaminodiphenyl ether, 3,4'-diaminodiphenylmethane, 4,4'-diaminodiphenylmethane, 3,4'-diaminodiphenylsulfone, 4,4'-diaminodiphenylsulfone, 3,4'-diaminodiphenyl sulfide, 4,4'-diaminodiphenyl sulfide, m-phenylenediamine, p-phenylenediamine, 1,4-bis(4-aminophenoxy)benzene and diamines having a structure represented by the following general formula (110):

[Chemical Formula 156]

(110)

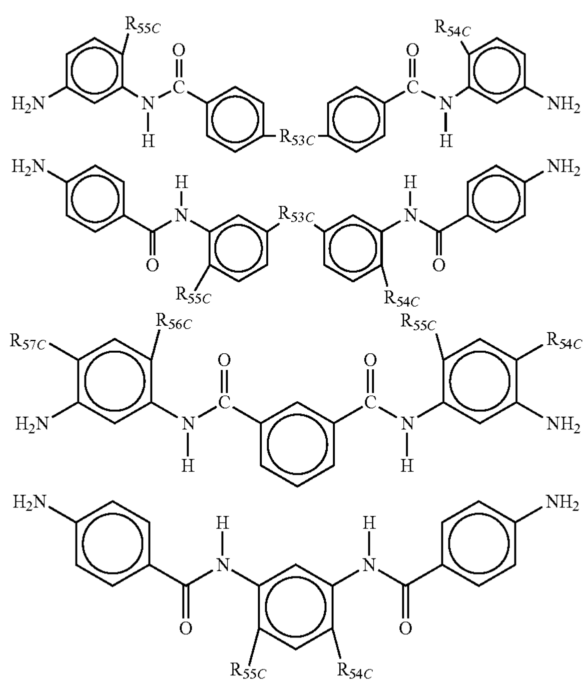

{wherein, $R_{53c}$ represents an oxygen atom or group selected from $C(CF_3)_2$, $C(CH_3)_2$ and $SO_2$, and $R_{54c}$ to $R_{57c}$ may be the same or different and represent hydrogen atoms or groups selected from a hydroxyl group and thiol group} are preferable.

Among these, 3,4'-diaminodiphenyl ether, 4,4'-diaminodiphenyl ether, 3,4'-diaminodiphenylmethane, 4,4'-diaminodiphenylmethane, 3,4'-diaminodiphenylsulfone, 4,4'-diaminodiphenylsulfone, 1,4-bis(4-aminophenoxy)benzene and diamines having a structure represented by the following general formula (111):

[Chemical Formula 157]

(111)

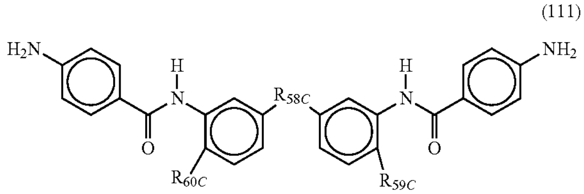

{wherein, $R_{58c}$ represents an oxygen atom or group selected from $C(CF_3)_2$, $C(CH_3)_2$ and $SO_2$, and $R_{58c}$ and $R_{60c}$ may be the same or different and represent hydrogen atoms or groups selected from a hydroxyl group and thiol group} are particularly preferable. These are used alone or two or more types are used in combination.

$R_{10c}$ and $R_{11c}$ in general formula (45) represent phenolic hydroxyl groups, sulfonate groups or thiol groups. In the present invention, $R_{10c}$ and $R_{11c}$ can consist of a mixture of phenolic hydroxyl groups, sulfonate groups and/or thiol groups.

Since the dissolution rate in an aqueous alkaline solution can be changed by controlling the amount of alkaline-soluble groups of $R_{10c}$ and $R_{11c}$, a photosensitive resin composition having a suitable dissolution rate can be obtained by adjusting in this manner.

Moreover, in order to improve adhesion with a base material, an aliphatic group having a siloxane structure may be copolymerized for $X_{5c}$ and $Y_{5c}$ within a range that does not lower heat resistance. Specific examples thereof include compounds obtained by copolymerizing 1 mol % to 10 mol % of a diamine component in the form bis(3-aminopropyl) tetramethylsiloxane or bis(p-aminophenyl)octamethylpentasiloxane.

The aforementioned polyimide can be synthesized by using a method consisting of obtaining a polyimide precursor by using, for example, a method consisting of reacting a tetracarboxylic dianhydride and a diamine compound (in which a portion thereof is substituted with a monoamine as a terminal blocking agent) at a low temperature, a method consisting of reacting a tetracarboxylic dianhydride (in which a portion thereof is substituted with an acid anhydride, monoacid chloride compound, mono-active ester compound as a terminal blocking agent) and a diamine compound at a low temperature, a method consisting of obtaining a diester from a tetracarboxylic acid and alcohol followed by reacting with a diamine (in which a portion thereof is substituted with a monoamine as a terminal blocking agent) in the presence of a condensation agent, or a method consisting of obtaining a diester from a tetracarboxylic dianhydride and alcohol followed by converting the remaining dicarboxylic acid to an acid chloride and reacting with a diamine (in which a portion thereof is substituted with a monoamine as a terminal blocking agent), and then completely imidizing this using a known imidization reaction method, or by using the method in which the imidization reaction is interrupted so as to incorporate a partial imide structure into a product (i.e., poly amide imide in this case), or by using a method consisting of blending a completely imidized polymer and other polyimide precursor and partially introducing an imide structure therein.

The aforementioned polyimide is preferably incorporated so that the imidization rate is 15% or more based on the total amount of resin that composes the photosensitive resin composition. The imidization rate is more preferably 20% or more. Here, imidization rate refers to the percentage of imide present in all of the resin that composes the photosensitive resin composition. If the imidization rate is less than 15%, the amount of shrinkage during heat curing increases, thereby making this unsuitable for producing a thick film.

Imidization rate can be easily calculated using the method indicated below. First, the infrared absorption spectrum of the polymer is measured to confirm the presence of absorption peaks of imide structures attributable to polyimide (present in the vicinity of 1780 $cm^{-1}$ and 1377 $cm^{-1}$). Next, the polymer is heat-treated for 1 hour at 350° C., the infrared absorption spectrum following heat treatment is measured, and peak intensity in the vicinity of 1377 $cm^{-1}$ is compared with the intensity prior to heat treatment to calculate the imidization rate in the polymer prior to heat treatment.

The molecular weight of the aforementioned polyimide is preferably 3,000 to 200,000 and more preferably 5,000 to 50,000 in the case of having measured weight average molecular weight as polystyrene by gel permeation chromatography. Mechanical properties are favorable in the case the weight average molecular weight is 3,000 or more, and dispersibility in the developer and resolution of the relief pattern are favorable in the case the weight average molecular weight is 50,000 or less.

The use of tetrahydrofuran or N-methyl-2-pyrrolidone is recommended for the developing solvent of gel permeation chromatography. In addition, molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

Phenol resin can also be preferably used in the present invention.

[Phenol Resin (A)]

The phenol resin in the present embodiment refers to a resin having a repeating unit having a phenolic hydroxyl group. The phenol resin (A) has the advantage of being able to be cured at a low temperature (such as 250° C. or lower) since structural changes in the manner of cyclization (imidization) of the polyimide precursor during heat curing do not occur.

In the present embodiment, the weight average molecular weight of the phenol resin (A) is preferably 700 to 100,000, more preferably 1,500 to 80,000, and even more preferably 2,000 to 50,000. The weight average molecular weight is preferably 700 or more from the viewpoint of the applicability to reflow treatment of the cured film, while on the other hand, the weight average molecular weight is preferably 100,000 or less from the viewpoint of alkaline solubility of the photosensitive resin composition.

Measurement of weight average molecular weight in the present disclosure is carried out by gel permeation chromatography (GPC), and can be calculated from a calibration curve prepared using standard polystyrene.

From the viewpoints of solubility in an aqueous alkaline solution, sensitivity and resolution when forming a resist pattern, and residual stress of the cured film, the phenol resin (A) is preferably at least one type of phenol resin selected from a novolac resin, polyhydroxystyrene, phenol resin having a repeating unit represented by the following general formula (46):

[Chemical Formula 158]

(46)

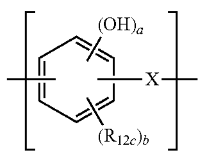

{wherein, a represents an integer of 1 to 3, b represents an integer of 0 to 3, 1≤(a+b)≤4, $R_{12c}$ represents a monovalent substituent selected from the group consisting of a monovalent organic group having 1 to 20 carbon atoms, halogen atom, nitro group and cyano group, a plurality of $R_{12c}$ may be mutually the same or different in the case b is 2 or 3, and X represents a divalent organic group selected from the group consisting of a divalent aliphatic group having 2 to 10 carbon atoms that may or may not have an unsaturated bond, divalent alicyclic group having 3 to 20 carbon atoms, divalent alkylene oxide group represented by the following general formula (47):

[Chemical Formula 159]

$$\text{—}C_pH_{2p}O\text{—} \tag{47}$$

(wherein, p represents an integer of 1 to 10), and divalent organic group having an aromatic ring having 6 to 12 carbon atoms}, and a phenol resin modified with a compound having an unsaturated hydrocarbon group having 4 to 100 carbon atoms.

(Novolac Resin)

In the present disclosure, novolac resin refers to all polymers obtained by condensing a phenol and formaldehyde in the presence of a catalyst. In general, novolac resin can be obtained by condensing less than 1 mole of formaldehyde to 1 mole of phenol. Examples of the aforementioned phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol. Specific examples of novolac resins include phenol/formaldehyde condensed novolac resin, cresol/formaldehyde condensed novolac resin and phenol-naphthol/formaldehyde condensed novolac resin.

The weight average molecular weight of the novolac resin is preferably 700 to 100,000, more preferably 1,500 to 80,000 and even more preferably 2,000 to 50,000. The weight average molecular weight is preferably 700 or more from the viewpoint of applicability to reflow treatment of the cured film, while on the other hand, the weight average molecular weight is preferably 100,000 or less from the viewpoint of alkaline solubility of the photosensitive resin composition.

(Polyhydroxystyrene)

In the present disclosure, polyhydroxystyrene refers to all polymers containing hydroxystyrene as a polymerized unit. A preferable example of a polyhydroxystyrene is poly(para-vinyl)phenol. Poly(para-vinyl) phenol refers to all polymers containing para-vinyl phenol as a polymerized unit. Thus, a polymerized unit other than hydroxystyrene (such as para-vinyl phenol) can be used to compose the hydroxystyrene (such as poly(para-vinyl)phenol) provided it is not inconsistent with the object of the present invention. The ratio of the number of moles of hydroxystyrene units in the polyhydroxystyrene based on the total number of moles of polymerized units is preferably 10 mol % to 99 mol %, more preferably 20 mol % to 97 mol %, and even more preferably 30 mol %; to 95 mol %. The case of this ratio being 10 mol % or more is advantageous from the viewpoint of alkaline solubility of the photosensitive resin composition, while the case of this ratio being 99 mol % or less is advantageous from the viewpoint of the applicability of reflow treatment to a cured film obtained by curing a composition containing a copolymer component to be subsequently described. A polymerized unit other than a hydroxystyrene (such as para-vinyl phenol) can be any arbitrary polymerized unit able to copolymerize with a hydroxystyrene (such as para-vinyl phenol). Examples of copolymer components that yield a polymerized unit other than a hydroxystyrene (such as para-vinyl phenol) include, but are not limited to, esters of acrylic acid such as methyl acrylate, methyl methacrylate, hydroxyethyl acrylate, butyl methacrylate, octyl acrylate, 2-ethoxyethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, 2,2-di-(p-hydroxyphenyl)propane dimethacrylate, triethylene glycol diacrylate, polyoxyethyl-2,2-di(p-hydroxyphenyl)propane dimethacrylate, triethylene glycol dimethacrylate, polyoxypropyltrimethyololpropane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenylethylene-1,2-dimethacrylate, pentaerythritol tetramethacrylate, trimethylolpropane trimethacrylate, 1,5-pentanediol dimethacrylate or 1,4-benzenediol dimethacrylate, styrene, and substituted styrenes in the manner of 2-methylstyrene or vinyltoluene, vinyl ester monomers such as vinyl acrylate or vinyl methacrylate, and o-vinylphenol and m-vinylphenol.

In addition, one type of the novolac resin and polyhydroxystyrene explained above can be used or two or more types can be used in combination.

The weight average molecular weight of the polyhydroxystyrene is preferably 700 to 100,000, more preferably 1,500 to 80,000 and even more preferably 2,000 to 50,000. The weight average molecular weight is preferably 700 or more from the viewpoint of applicability to reflow treatment of the cured film, while on the other hand, the weight average molecular weight is preferably 100,000 or less from the viewpoint of alkaline solubility of the photosensitive resin composition.

(Phenol Resins Represented by General Formula (46))

In the present embodiment, the phenol resin (A) preferably also contains a phenol resin having a repeating unit represented by the following general formula (46):

[Chemical Formula 160]

(46)

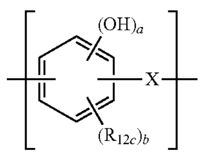

{wherein, a represents an integer of 1 to 3, b represents an integer of 0 to 3, $1 \leq (a+b) \leq 4$, $R_{12c}$ represents a monovalent substituent selected from the group consisting of a monovalent organic group having 1 to 20 carbon atoms, halogen atom, nitro group and cyano group, a plurality of $R_{12c}$ may be mutually the same or different in the case b is 2 or 3, and X represents a divalent organic group selected from the group consisting of a divalent aliphatic group having 2 to 10 carbon atoms that may or may not have an unsaturated bond, divalent alicyclic group having 3 to 20 carbon atoms, divalent alkylene oxide group represented by the following general formula (47):

[Chemical Formula 161]

$$—C_pH_{2p}O— \quad (47)$$

(wherein, p represents an integer of 1 to 10), and divalent organic group having an aromatic ring having 6 to 12 carbon atoms}. A phenol resin having the aforementioned repeating unit can be cured at a lower temperature in comparison with conventionally used polyimide resin or polybenzoxazole resin, for example, and is particularly advantageous from the viewpoint of allowing the formation of a cured film having favorable elongation. One type of the aforementioned repeating unit can be present in a phenol resin molecule or a combination of two or more types can be present.

In the aforementioned general formula (46), $R_{12c}$ represents a monovalent substituent selected from the group consisting of a monovalent organic group having 1 to 20 carbon atoms, halogen atom, nitro group and cyano group from the viewpoint of reactivity when synthesizing a resin according to general formula (46). From the viewpoint of alkaline solubility, $R_{12c}$ preferably represents a monovalent substituent selected from the group consisting of a halogen atom, nitro group, cyano group, aliphatic group having 1 to 10 carbon atoms which may or may not have an unsaturated bond, aromatic group having 6 to 20 carbon atoms, and the four groups represented by the following general formula (112):

[Chemical Formula 162]

(112)

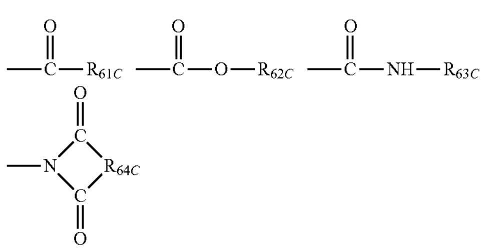

{wherein, $R_{61c}$, $R_{62c}$ and $R_{64c}$ respectively and independently represent a hydrogen atom, aliphatic group having 1 to 10 carbon atoms which may or may not have an unsaturated bond, alicyclic group having 3 to 20 carbon atoms or aromatic group having 6 to 20 carbon atoms, and $R_{64c}$ represents a divalent aliphatic group having 1 to 10 carbon atoms which may or may not have an unsaturated bond, divalent alicyclic group having 3 to 20 carbon atoms, or divalent aromatic group having 6 to 20 carbon atoms}.

In the present embodiment, in the aforementioned general formula (46), although a represents an integer of 1 to 3, a is preferably 2 from the viewpoints of alkaline solubility and elongation. In addition, in the case a is 2, the substituted locations of hydroxyl groups may be any of the ortho, meta or para positions. In the case a is 3, substituted locations of hydroxyl groups may be at the 1,2,3-positions, 1,2,4-positions or 1,3,5-positions.

In the present embodiment, in the aforementioned general formula (46), since alkaline solubility improves in the case a is 1, a phenol resin selected from a novolac resin and polyhydroxystyrene (to also be referred to as resin (a2)) can be further mixed with the phenol resin having a repeating unit represented by general formula (46) (to also be referred to as resin (a1)).

The mixing ratio between resin (a1) and resin (a2) in terms of the weight ratio thereof is preferably such that (a1)/(a2) is within the range of 10/90 to 90/10. This mixing ratio is such that (a1)/(a2) is preferably within the range of 10/90 to 90/10, more preferably within the range of 20/80 to 80/20, and even more preferably within the range of 30/70 to 70/30 from the viewpoints of solubility in an aqueous alkaline solution and elongation of the cured film.

The same resins as those indicated in the aforementioned sections on Novolac Resin and Polyhydroxystyrene can be used for the novolac resin and polyhydroxystyrene of the aforementioned resin (a2).

In the present embodiment, in the aforementioned general formula (46), although b represents an integer of 0 to 3, b is preferably 0 or 1 from the viewpoint of alkaline solubility and elongation. In addition, a plurality of $R_{12c}$ may be mutually the same or different in the case b is 2 or 3.

Moreover, in the present embodiment, in the aforementioned general formula (46), a and b satisfy the relationship $1 \leq (a+b) \leq 4$.

In the present embodiment, in the aforementioned general formula (46), X represents a divalent organic group selected from the group consisting of a divalent aliphatic group having 2 to 10 carbon atoms that may or may not have an unsaturated bond, divalent alicyclic group having 3 to 20 carbon atoms, alkylene oxide group represented by the aforementioned general formula (47) and divalent organic group having an aromatic ring having 6 to 12 carbon atoms from the viewpoint of the form of a cured relief pattern and elongation of a cured film. Among these divalent organic groups, from the viewpoint of film toughness after curing, X preferably represents a divalent organic group selected from the group consisting of a divalent group represented by the following general formula (48):

[Chemical Formula 163]

(48)

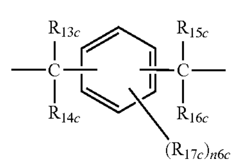

{wherein, $R_{13c}$, $R_{14c}$, $R_{15c}$ and $R_{16c}$ respectively and independently represent a hydrogen atom, monovalent aliphatic group having 1 to 10 carbon atoms or monovalent aliphatic group having 1 to 10 carbon atoms in which all or a portion of the hydrogen atoms are substituted with fluorine atoms, $n_{6c}$ represents an integer of 0 to 4, and in the case $n_{6c}$ represents an integer of 1 to 4, $R_{17c}$ represents a halogen atom, hydroxyl group or monovalent organic group having 1 to 12 carbon atoms, at least one of $R_{17c}$ is a hydroxyl group, and a plurality of $R_{17c}$ may be mutually the same or different in the case $n_{6c}$ is an integer of 2 to 4}, and a divalent group represented by the following general formula (49):

[Chemical Formula 164]

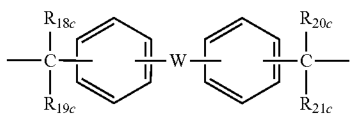

(49)

{wherein, $R_{18c}$, $R_{19c}$, $R_{20c}$ and $R_{21c}$ respectively and independently represent a hydrogen atom, monovalent aliphatic group having 1 to 10 carbon atoms or monovalent aliphatic group having 1 to 10 carbon atoms in which all or a portion of the hydrogen atoms are substituted with fluorine atoms, W represents a single bond, aliphatic group having 1 to 10 carbon atoms optionally substituted with fluorine atoms, alicyclic group having 3 to 20 carbon atoms optionally substituted with fluorine atoms, divalent alkylene oxide group represented by the following general formula (47):

[Chemical Formula 165]

$$—C_pH_{2p}O— \quad (47)$$

(wherein, p represents an integer of 1 to 10), and a divalent organic group selected from the group consisting of divalent groups represented by the following formula (50)

[Chemical Formula 166]

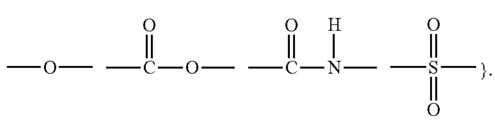

(50)

The number of carbon atoms of the aforementioned divalent organic group X having an aromatic ring having 6 to 12 carbon atoms is preferably 8 to 75 and more preferably 8 to 40. Furthermore, the structure of the aforementioned divalent organic group X having an aromatic ring having 6 to 12 carbon atoms typically differs from a structure in the aforementioned general formula (46) in which the OH group and any $R_{12c}$ group are bound to the aromatic ring.

Moreover, from the viewpoints of pattern formability of a resin composition and elongation of a cured film after curing, the divalent organic group represented by the aforementioned general formula (49) is more preferably a divalent organic group represented by the following formula (113):

[Chemical Formula 167]

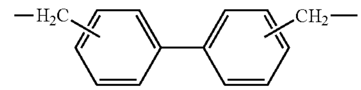

(113)

and particularly preferably a divalent organic group represented by the following formula (114).

[Chemical Formula 168]

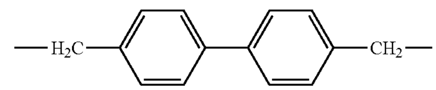

(114)

Among the structures represented by general formula (46), a structure in which X is represented by the aforementioned formula (113) or (114) is particularly preferable, the ratio of sites represented by a structure in which X is represented by formula (113) or formula (114) is preferably 20% by weight or more and more preferably 30% by weight or more from the viewpoint of elongation. The aforementioned ratio is preferably 80% by weight or less, and more preferably 70% by weight or less, from the viewpoint of alkaline solubility of the composition.

In addition, among the phenol resins having a structure represented by the aforementioned general formula (46), a structure having both a structure represented by the following general formula (115) and a structure represented by the following general formula (116) within the same resin backbone is particularly preferable from the viewpoints of alkaline solubility of the composition and elongation of a cured film.

The following general formula (115) is represented by:

[Chemical Formula 169]

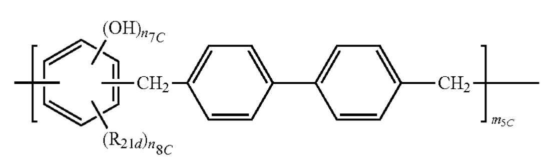

(115)

{wherein, $R_{21d}$ represents a monovalent group having 1 to 10 carbon atoms selected from the group consisting of hydrocarbon groups and alkoxy groups, $n_{7c}$ represents an integer of 2 or 3, $n_{8c}$ represents an integer of 0 to 2, $m_{5c}$ represents an integer of 1 to 500, $2 \leq (n_{7c}+n_{8c}) \leq 4$, and in the case $n_{8c}$ is 2, a plurality of $R_{21d}$ may be mutually the same or different}, and the following general formula (116) is represented by:

[Chemical Formula 170]

(116)

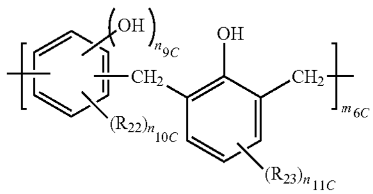

{wherein, $R_{22c}$ and $R_{23c}$ respectively and independently represent a monovalent group having 1 to 10 carbon atoms selected from the group consisting of hydrocarbon groups and alkoxy groups, $n_{9c}$ represents an integer of 1 to 3, $n_{10c}$ represents an integer of 0 to 2, $n_{11c}$ represents an integer of 0 to 3, $m_{6c}$ represents an integer of 1 to 500, $2 \leq (n_{9c}+n_{10c}) \leq 4$, in the case $n_{10c}$ is 2, a plurality of $R_{22c}$ may be mutually the same or different, and in the case $n_{11c}$ is 2 or 3, a plurality of $R_{23c}$ may be mutually the same or different}.

$m_{5c}$ in the aforementioned general formula (115) and $m_{6c}$ in the aforementioned general formula (116) respectively indicate the total number of repeating units in the main chain of a phenol resin. Namely, the repeating unit indicated in brackets in the structure represented by the aforementioned general formula (115) and the repeating unit indicated in brackets in the structure represented by the aforementioned general formula (116) in the main chain of the phenol resin (A) can be arranged randomly, in blocks or in a combination thereof. $m_{5c}$ and $m_{6c}$ respectively and independently represent an integer of 1 to 500, the lower limit thereof is preferably 2 and more preferably 3, and the upper limit thereof is preferably 450, more preferably 400 and even more preferably 350. $m_{5c}$ and $m_{6c}$ are respectively and independently preferably 2 or more from the viewpoint of film toughness after curing and preferably 450 or less from the viewpoint of solubility in an aqueous alkaline solution. The sum of $m_{5c}$ and $m_{6c}$ is preferably 2 or more, more preferably 4 or more and even more preferably 6 or more from the viewpoint of film toughness after curing, and preferably 200 or less, more preferably 175 or less and even more preferably 150 or less from the viewpoint of solubility in an aqueous alkaline solution.

In the aforementioned phenol resin (A) having both a structure represented by the aforementioned general formula (115) and a structure represented by the aforementioned general formula (116) in the same resin backbone, a higher molar ratio of the structure represented by general formula (115) results in better film properties after curing and superior heat resistance, while on the other hand, a higher molar ratio of the structure represented by general formula (116) results in better alkaline solubility and superior pattern form after curing. Thus, the ratio $m_{5c}/m_{6c}$ of the structure represented by general formula (115) to the structure represented by general formula (116) is preferably 20/80 or more, more preferably 40/60 or more and particularly preferably 50/50 or more from the viewpoint of film properties after curing, and is preferably 90/10 or less, more preferably 80/20 or less and even more preferably 70/30 or less from the viewpoint of alkaline solubility and form of the cured relief pattern.

A phenol resin having a repeating unit represented by the aforementioned general formula (46) typically contains a phenol compound and a copolymer component (and more specifically, one or more types of compounds selected from the group consisting of a copolymer component (and more specifically, a compound having an aldehyde group (including a compound that forms an aldehyde compound following decomposition in the manner of trioxane), a compound having a ketone group, a compound having two methylol groups in a molecule thereof, a compound having two alkoxymethyl groups in a molecule thereof, and a compound having two haloalkyl groups in a molecule thereof), and more typically, can be synthesized by subjecting these monomer components to a polymerization reaction. For example, a copolymer component such as an aldehyde compound, ketone compound, methylol compound, alkoxymethyl compound, diene compound or haloalkyl compound can be polymerized with a phenol and/or phenol derivative like that indicated below (to also be collectively referred to as a "phenol compound") to obtain the phenol resin (A). In this case, the moiety in the aforementioned general formula (46) represented by a structure, in which an OH group and an arbitrary $R_{12c}$ group are bound to an aromatic ring, is derived from the aforementioned phenol compound, while the moiety represented by X is derived from the aforementioned copolymer component. The charged molar ratio between the phenol compound and the aforementioned copolymer component is such that (phenol compound):(copolymerization component) is preferably 5:1 to 1.01:1 and more preferably 2.5:1 to 1.1:1 from the viewpoints of controlling the reaction and stability of the resulting phenol resin (A) and photosensitive resin composition.

The weight average molecular weight of the phenol resin having a repeating unit represented by general formula (46) is preferably 700 to 100,000, more preferably 1,500 to 80,000, and even more preferably 2,000 to 50,000. The weight average molecular weight is preferably 700 or more from the viewpoint of the applicability to reflow treatment of the cured film, while on the other hand, the weight average molecular weight is preferably 100,000 or less from the viewpoint of alkaline solubility of the photosensitive resin composition.

Examples of phenol compounds that can be used to obtain a phenol resin having a repeating unit represented by general formula (46) include cresol, ethylcresol, propylphenol, butylphenol, amylphenol, cyclohexylphenol, hydroxyphenol, benzylphenol, nitrobenzylphenol, cyanobenzylphenol, adamantanephenol, nitrophenol, fluorophenol, chlorophenol, bromophenol, trifluoromethylphenol, N-(hydroxyphenyl)-5-norbornene-2,3-dicarboximide, N-(hydroxyphenyl-5-methyl-5-norbornene-2,3-dicarboximide, trifluoromethylphenol, hydroxybenzoate, methyl hydroxybenzoate, ethyl hydroxybenzoate, benzyl hydroxybenzoate, hydroxybenzamide, hydroxybenzaldehyde, hydroxyacetophenone, hydroxybenzophenone, hydroxybenzonitrile, resorcinol, xylenol, catechol, methyl catechol, ethyl catechol, hexyl catechol, benzyl catechol, nitrobenzyl catechol, methyl resorcinol, ethyl resorcinol, hexyl resorcinol, benzyl resorcinol, nitrobenzyl resorcinol, hydroquinone, caffeic acid, dihydroxybenzoate, methyl dihydroxybenzoate, ethyl dihydroxybenzoate, butyl dihydroxybenzoate, propyl dihydroxybenzoate, benzyl dihydroxybenzoate, dihydroxybenzamide, dihydroxybenzaldehyde, dihydroxyacetophenone, dihydroxybenzophenone, dihydroxybenzonitrile, N-(dihydroxyphenyl)-5-norbornene-2,3-dicarboximide, N-(dihydroxyphenyl)-5-methyl-5-norbornene-2,3-dicarboximide, nitrocatechol, fluorocatechol, chlorocatechol, bromocatechol, trifluoromethylcatechol, nitroresorcinol, fluororesorcinol, chlororesorcinol, bromoresorcinol, trifluoromethylresorcinol, pyrogallol, phloroglucinol, 1,2,4- trihydroxybenzene, trihydroxybenzoic acid, methyl trihydroxybenzoate, ethyl trihydroxybenzoate, butyl trihydroxybenzoate, propyl trihydroxybenzoate, benzyl trihydroxybenzoate, trihydroxybenzamide, trihydroxybenzaldehyde, trihydroxyacetophenone, trihydroxybenzophenone and trihydroxybenzenitrile.

Examples of the aforementioned aldehyde compound include acetoaldehyde, propionaldehyde, pivalaldehyde, butylaldehyde, pentanal, hexanal, trioxane, glyoxal, cyclohexyl aldehyde, diphenylacetaldehyde, ethylbutylaldehyde, benzaldehyde, glyoxylic acid, 5-norbornene-2-carboxyaldehyde, malondialdehyde, succindialdehyde, glutaraldehyde, salicylaldehyde, naphthoaldehyde and terephthalaldehyde.

Examples of the aforementioned ketone compound include acetone, methyl ethyl ketone, diethyl ketone, dipropyl ketone, dicyclohexyl ketone, dibenzyl ketone, cyclopentanone, cyclohexanone, bicyclohexanone, cyclohexanedione, 3-butyn-2-one, 2-norbornanone, adamantanone and 2,2-bis(4-oxocyclohexyl)propane.

Examples of the aforementioned methylol compound include 2,6-bis(hydroxymethyl)-p-cresol, 2,6-bis(hydroxymethyl)-4-ethylphenol, 2,6-bis(hydroxymethyl)-4-propylphenol, 2,6-bis(hydroxymethyl)-4-n-butylphenol, 2,6-bis(hydroxymethyl)-4-t-butylphenol, 2,6-bis(hydroxymethyl)-4-methoxyphenol, 2,6-bis(hydroxymethyl)-4-ethoxyphenol, 2,6-bis(hydroxymethyl)-4-propoxyphenol, 2,6-bis(hydroxymethyl)-4-n-butoxyphenol, 2,6-bis(hydroxymethyl)-4-t-butoxyphenol, 1,3-bis(hydroxymethyl) urea, ribitol, arabitol, allitol, 2,2-bis(hydroxymethyl)butyric acid, 2-benzyloxy-1,3-propanediol, 2,2-dimethyl-1,3-propanediol, 2,2-diethyl-1,3-propanediol, monoacetin, 2-methyl-2-nitro-1,3-propanediol, 5-norbornene-2,2-dimethanol, 5-norbornene-2,3-dimethanol, pentaerythritol, 2-phenyl-1,3-propanediol, trimethylolethane, trimethylolpropane, 3,6-bis(hydroxymethyl)durene, 2-nitro-p-xylylene glycol, 1,10-dihydroxydecane, 1,12-dihydroxydodecane, 1,4-bis(hydroxymethyl)cyclohexane, 1,4-bis(hydroxymethyl)cyclohexene, 1,6-bis(hydroxymethyl)adamantane, 1,4-benzenedimethanol, 1,3-benzenedimethanol, 2,6-bis(hydroxymethyl)-1,4-dimethoxybenzene, 2,3-bis(hydroxymethyl)naphthalene, 2,6-bis(hydroxymethyl)naphthalene, 1,8-bis(hydroxymethyl)anthracene, 2,2'-bis(hydroxymethyl)diphenyl ether, 4,4'-bis(hydroxymethyl) diphenyl ether, 4,4'-bis(hydroxymethyl)diphenyl thioether, 4,4'-bis(hydroxymethyl)benzophenone, 4-hydroxymethylbenzoate-4'-hydroxymethylphenyl, 4-hydroxymethylbenzoate-4'-hydroxymethylanilide, 4,4'-bis(hydroxymethyl)phenyl urea, 4,4'-bis(hydroxymethyl)phenyl urethane, 1,8-bis(hydroxymethyl)anthracene, 4,4'-bis(hydroxymethyl) biphenyl, 2,2'-dimethyl-4,4'-bis(hydroxymethyl)biphenyl, 2,2-bis(4-hydroxymethylphenyl)propane, ethylene glycol, diethylene glycol, triethylene glycol, tetraethylene glycol, propylene glycol, dipropylene glycol, tripropylene glycol and tetrapropylene glycol.

Examples of the aforementioned alkoxymethyl compound include 2,6-bis(methoxymethyl)-p-cresol, 2,6-bis(methoxymethyl)-4-ethylphenol, 2,6-bis(methoxymethyl)-4-propylphenol, 2,6-bis(methoxymethyl)-4-n-butylphenol, 2,6-bis(methoxymethyl)-4-t-butylphenol, 2,6-bis(methoxymethyl)-4-methoxyphenol, 2,6-bis(methoxymethyl)-4-ethoxyphenol, 2,6-bis(methoxymethyl)-4-propoxyphenol, 2,6-bis(methoxymethyl)-4-n-butoxyphenol, 2,6-bis(methoxymethyl)-4-t-butoxyphenol, 1,3-bis(methoxymethyl) urea, 2,2-bis(methoxymethyl) butyric acid, 2,2-bis(methoxymethyl)-5-norbornene, 2,3-bis(methoxymethyl)-5-norbornene, 1,4-bis(methoxymethyl) cyclohexane, 1,4-bis(methoxymethyl)cyclohexene, 1,6-bis(methoxymethyl)adamantane, 1,4-bis(methoxymethyl) benzene, 1,3-bis(methoxymethyl)benzene, 2,6-bis(methoxymethyl)-1,4-dimethoxybenzene, 2,3-bis(methoxymethyl)naphthalene, 2,6-bis(methoxymethyl) naphthalene, 1,8-bis(methoxymethyl)anthracene, 2,2'-bis(methoxymethyl)diphenyl ether, 4,4'-bis(methoxymethyl) diphenyl ether, 4,4'-bis(methoxymethyl)diphenyl thioether, 4,4'-bis(methoxymethyl)benzophenone, 4-methoxymethylbenzoate-4'-methoxymethylphenyl, 4-methoxymethylbenzoate-4'-methoxymethylanilide, 4,4'-bis(methoxymethyl) phenyl urea, 4,4'-bis(methoxymethyl)phenyl urethane, 1,8-bis(methoxymethyl)anthracene, 4,4'-bis(methoxymethyl) biphenyl, 2,2'-dimethyl-4,4'-bis(methoxymethyl)biphenyl, 2,2-bis(4-methoxymethylphenyl)propane, ethylene glycol dimethyl ether, diethylene glycol dimethyl ether, triethylene glycol dimethyl ether, tetraethylene glycol dimethyl ether, propylene glycol dimethyl ether, dipropylene glycol dimethyl ether, tripropylene glycol dimethyl ether and tetrapropylene glycol dimethyl ether.

Examples of the aforementioned diene compound include butadiene, pentadiene, hexadiene, heptadiene, octadiene, 3-methyl-1,3-butadiene, 1,3-butanediol dimethacrylate, 2,4-hexadien-1-ol, methylcyclohexadiene, cyclopentadiene, cyclohexadiene, cycloheptadiene, cyclooctadiene, dicyclopentadiene, 1-hydroxydicyclopentadiene, 1-methylcyclopentadiene, methyldicyclopentadiene, diallyl ether, diallyl sulfide, diallyl adipate, 2,5-norbornadiene, tetrahydroindene, 5-ethylidene-2-norbornene, 5-vinyl-2-norbornene, triallyl cyanurate, diallyl isocyanurate, triallyl isocyanurate and diallylpropyl isocyanurate.

Examples of the aforementioned haloalkyl compound include xylene dichloride, bis(chloromethyl)dimethoxybenzene, bis(chloromethyl)durene, bis(chloromethyl)biphenyl, bis(chloromethyl)biphenyl carboxylic acid, bis(chloromethyl)biphenyl dicarboxylic acid, bis(chloromethyl)methylbiphenyl, bis(chloromethyl)dimethylbiphenyl, bis(chloromethyl)anthracene, ethylene glycol bis(chloroethyl) ether, diethylene glycol bis(chloroethyl) ether, triethylene glycol bis(chloroethyl) ether and tetraethylene glycol bis(chloroethyl) ether.

Although the phenol resin (A) can be obtained by condensing the previously described phenol compound and copolymer component by dehydrating, dehydrohalogenating or dealcoholizing, or by copolymerizing while cleaving unsaturated bonds, a catalyst may also be used during polymerization. Examples of acid catalysts include hydrochloric acid, sulfuric acid, nitric acid, phosphoric acid, phosphorous acid, methanesulfonic acid, p-toluenesulfonic acid, dimethyl sulfate, diethyl sulfate, acetic acid, oxalic acid, 1-hydroxyethylidene-1,1'-diphosphonic acid, zinc acetate, boron trifluoride, boron trifluoride-phenol complex and boron trifluoride-ether complex. On the other hand, examples of alkaline catalysts include lithium hydroxide, sodium hydroxide, potassium hydroxide, calcium hydroxide, barium hydroxide, sodium carbonate, triethylamine, pyridine, 4-N,N-dimoethylaminopyridine, piperidine, piperazine, 1,4-diazabicyclo[2.2.2]octane, 1,8-diazabicyclo[5.4.0]-7-undecene, 1,5-diazabicyclo[4.3.0]-5-nonene, ammonia and hexamethylenetetramine.

The amount of catalyst used to obtain a phenol resin having a repeating structure represented by general formula (46) is preferably within the range of 0.01 mol % to 100 mol % based on 100 mol % for the total number of moles of the copolymer component (namely, component other than the phenol compound), and preferably the total number of moles of an aldehyde compound, ketone compound, methylol compound, alkoxymethyl compound, diene compound and haloalkyl compound.

Normally, the reaction temperature during the synthesis reaction of the phenol resin (A) is preferably within the range of 40° C. to 250° C. and more preferably 100° C. to 200° C., while generally the reaction time is preferably 1 hour to 10 hours. A solvent capable of adequately dissolving the resin can be used as necessary.

Furthermore, the phenol resin having a repeating structure represented by general formula (46) may also be that obtained by further polymerizing a phenol compound that is not a raw material of the structure represented by the aforementioned general formula (7) within a range that does not impair the effects of the present invention. A range that does not impair the effects of the present invention refers to, for example, being 30% or less of the total number of moles of phenol compound serving as raw material of phenol resin (A).

(Phenol Resin Modified with Compound Having Unsaturated Hydrocarbon Group Having 4 to 100 Carbon Atoms)

A phenol resin modified with a compound having an unsaturated hydrocarbon group having 4 to 100 carbon atoms is the reaction product of the reaction product of phenol or a derivative thereof and a compound having an unsaturated hydrocarbon group having 4 to 100 carbon atoms (which also may be simply referred to as the "unsaturated hydrocarbon group-containing compound" depending on the case) (and this reaction product may also be referred to as the "unsaturated hydrocarbon group-modified phenol derivative") and the polycondensation product with an aldehyde or a phenol compound and an unsaturated hydrocarbon group-containing compound.

A phenol derivative the same as that previously described as a raw material of the phenol resin having a repeating unit represented by general formula (46) can be used for the phenol derivative.

The unsaturated hydrocarbon group of the unsaturated hydrocarbon group-containing compound preferably contains two or more unsaturated groups from the viewpoint of residual stress of the cured film and applicability to reflow treatment. In addition, the unsaturated hydrocarbon group preferably has 4 to 100 carbon atoms, more preferably 8 to 80 carbon atoms, and even more preferably 10 to 60 carbon atoms from the viewpoints of compatibility when in the form of a resin composition and residual stress of the cured film.

Examples of the unsaturated hydrocarbon group-containing compound include unsaturated hydrocarbon groups having 4 to 100 carbon atoms, polybutadiene having a carboxyl group, epoxidated polybutadiene, linoleyl alcohol, oleyl alcohol, unsaturated fatty acids and unsaturated fatty acid esters. Preferable examples of unsaturated fatty acids include crotonic acid, myristoleic acid, palmitoleic acid, oleic acid, elaidic acid, vaccenic acid, gadoleic acid, erucic acid, nervonic acid, linoleic acid, α-linolenic acid, eleostearic acid, stearidonic acid, arachidonic acid, eisocapentaenoic acid, clupanodonic acid and docosahexaenoic acid. Among these, unsaturated fatty acid esters in the form of vegetable oils are particularly preferable from the viewpoints of elongation of the cured film and flexibility of the cured film.

Vegetable oils normally include esters of glycerin and unsaturated fatty acids and consist of non-drying oils having an iodine value of 100 or lower, semi-drying oils having an iodine value of greater than 100 to less than 130, and drying oils having an iodine value of 130 or higher. Examples of non-drying oils include olive oil, morning glory seed oil, cashew nut oil, sasanqua oil, camellia oil, castor oil and peanut oil. Examples of semi-drying oils include corn oil, cottonseed oil and sesame oil. Examples of drying oils include tung oil, linseed oil, soybean oil, walnut oil, safflower oil, sunflower oil, perilla oil and mustard oil. In addition, processed vegetable oils, obtained by processing these vegetable oils, may also be used.

Among the aforementioned vegetable oils, a non-drying oil is preferably used in the reaction between the phenol, phenol derivative or phenol resin and the vegetable oil from the viewpoints of improving yield and preventing gelation resulting from the reaction proceeding excessively rapidly. On the other hand, a drying oil is used preferably from the viewpoint of improving adhesion with a resist pattern, mechanical properties and thermal shock resistance. Among these drying oils, tung oil, linseed oil, soybean oil, walnut oil or safflower oil is preferable, and tung oil and linseed oil are more preferable, since they allow the effects of the present invention to be demonstrated more effectively and more reliably. One type of these oils is used alone or two or more types are used in combination.

The reaction between the phenol or phenol derivative and the unsaturated hydrocarbon group-containing compound is preferably carried out at 50° C. to 130° C. The reaction ratio between the phenol or phenol derivative and unsaturated hydrocarbon group-containing compound is such that preferably 1 part by weight to 100 parts by weight, and more preferably 5 parts by weigh to 50 parts by weight, of the unsaturated hydrocarbon group-containing compound is used based on 100 parts by weight of the phenol or phenol derivative from the viewpoint of lowering residual stress of the cured film. If the amount of the unsaturated hydrocarbon group-containing compound is less than 1 part by weight, flexibility of the cured film tends to decrease, while if that amount exceeds 100 parts by weight, heat resistance of the cured film tends to decrease. In the aforementioned reaction, a catalyst such as p-toluenesulfonic acid or trifluoromethanesulfonic acid may be used as necessary.

A phenol resin modified by an unsaturated hydrocarbon group-containing compound is formed by polycondensation of the unsaturated hydrocarbon group-modified phenol derivative formed according to the aforementioned reaction and an aldehyde. The aldehyde is selected from, for example, formaldehyde, acetoaldehyde, furfural, benzaldehyde, hydroxybenzaldehyde, methoxybenzaldehyde, hydroxyphenylacetoaldehyde, methoxyphenylacetoaldehyde, crotonaldehyde, chloroacetoaldehyde, chlorophenylacetoaldehyde, acetone, glyceraldehyde, glyoxylic acid, methyl glyoxylate, phenyl glyoxylate, hydroxyphenyl glyoxylate, formyl acetate, methyl formyl acetate, 2-formylpropionate, methyl 2-formylpropionate, pyruvic acid, levulinic acid, 4-acetyl butyrate, acetonedicarboxylic acid and 3,3',4,4'-benzophenone tetracarboxylic acid. In addition, a precursor of formaldehyde, such as paraformaldehyde or trioxane may also be used. One type of these aldehydes is used alone or two or more types are used in combination.

The reaction between the aforementioned aldehyde and the aforementioned unsaturated hydrocarbon group-modified phenol derivative is a polycondensation reaction, and conventionally known conditions for synthesizing phenol resins can be used. The reaction is preferably carried out in the presence of a catalyst such as an acid or base, and an acid catalyst is used preferably from the viewpoint of the degree of polymerization (molecular weight) of the resin. Examples of acid catalysts include hydrochloric acid, sulfuric acid, formic acid, acetic acid, p-toluenesulfonic acid and oxalic acid. One type of these acid catalysts can be used alone or two or more types can be used in combination.

The aforementioned reaction is preferably carried out at a normal reaction temperature of 100° C. to 120° C. In addition, although varying according to the type and amount of catalyst used, the reaction time is normally 1 hour to 50 hours. Following completion of the reaction, the reaction product is subjected to vacuum dehydration at a temperature of 200° C. or lower to obtain a phenol resin modified by an unsaturated hydrocarbon group-containing compound. Furthermore, a solvent such as toluene, xylene or methanol can be used in the reaction.

The phenol resin modified by an unsaturated hydrocarbon group-containing compound can also be obtained by polycondensing the previously described unsaturated hydrocarbon group-modified phenol derivative with an aldehyde together with a compound other than phenol in the manner of m-xylene. In this case, the charged molar ratio of the compound other than phenol to the compound obtained by reacting the phenol derivative and unsaturated hydrocarbon group-containing compound is preferably less than 0.5.

The phenol modified with an unsaturated hydrocarbon group-containing compound can also be obtained by reacting a phenol resin with an unsaturated hydrocarbon group-containing compound. The phenol resin used in this case is a polycondensation product of a phenol compound (namely, phenol and/or phenol derivative) and an aldehyde. In this case, the same phenol derivatives and aldehydes as those previously described can be used for the phenol derivative and aldehyde, and phenol resin can be synthesized under conventionally known conditions as previously described.

Specific examples of phenol resins obtained from a phenol compound and aldehyde that are preferably used to form the phenol resin modified with an unsaturated hydrocarbon group-containing compound include phenol/formaldehyde novolac resin, cresol/formaldehyde novolac resin, xylenol/formaldehyde novolac resin, resorcinol/formaldehyde novolac resin and phenol-naphthol/formaldehyde novolac resin.

The same unsaturated hydrocarbon group-containing compound as that previously described with respect to producing an unsaturated hydrocarbon group-modified phenol derivative that reacts with an aldehyde can be used for the unsaturated hydrocarbon group-containing compound that reacts with aldehyde.

Normally, the reaction between the phenol resin and unsaturated hydrocarbon group-containing compound is preferably carried out at 50° C. to 130° C. In addition, the reaction ratio between the phenol resin and unsaturated hydrocarbon group-containing compound is such that preferably 1 part by weight to 100 parts by weight, more preferably 2 parts by weight to 70 parts by weight, and even more preferably 5 parts by weight to 50 parts by weight of the unsaturated hydrocarbon group-containing compound, are used with respect to 100 parts by weight of the phenol resin, from the viewpoint of improving flexibility of the cured film (resist pattern). If the amount of the unsaturated hydrocarbon group-containing compound is less than 1 part by weight, flexibility of the cured film tends to decrease, while if that amount exceeds 100 parts by weight, the possibility of gelling during the reaction tends to increase and heat resistance of the cured film tends to decrease. A catalyst such as p-toluenesulfonic acid or trifluoromethanesulfonic acid may be used during the reaction between the phenol resin and unsaturated hydrocarbon group-containing compound as necessary. Furthermore, although subsequently described in detail, a solvent such as toluene, xylene, methanol or tetrahydrofuran can be used in the reaction.

An acid-modified phenol resin can also be used by allowing polybasic acid anhydride to further react with phenolic hydroxyl groups remaining in the phenol resin modified by an unsaturated hydrocarbon group-containing compound formed according to the method described below. Acid modification with a polybasic acid anhydride results in the introduction of a carboxyl group, thereby further improving solubility in an aqueous alkaline solution (used as developer).

There are no particular limitations on the polybasic acid anhydride provided it has an acid anhydride group formed by dehydration condensation of the carboxyl groups of a polybasic acid having a plurality of carboxyl groups. Examples of polybasic acid anhydrides include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyl tetrahydrophthalic anhydride, methyl hexahydrophthalic anhydride, nadic anhydride, 3,6-endomethylenetetrahydrophthalic anhydride, methyl endomethylenetetrahydrophthalic anhydride, tetrabromophthalic anhydride or trimellitic anhydride, and aromatic tetrabasic acid dianhydrides such as biphenyltetracarboxylic dianhydride, naphthalene tetracarboxylic dianhydride, diphenyl ether tetracarboxylic dianhydride, butane tetracarboxylic dianhydride, cyclopentane tetracarboxylic dianhydride, pyromellitic anhydride or benzophenone tetracarboxylic dianhydride. One type of these compounds may be used alone or two or more types may be used in combination. Among these, the polybasic acid anhydride is preferably a dibasic acid anhydride, and more preferably one or more types selected from the group consisting tetrahydrophthalic anhydride, succinic anhydride and hexahydrophthalic anhydride. In this case, there is the advantage of allowing the formation of a resist pattern having a more favorable form.

The reaction between a phenolic hydroxyl group and polybasic acid anhydride can be carried out at 50° C. to 130° C. In this reaction, preferably 0.10 moles to 0.80 moles, more preferably 0.15 moles to 0.60 moles, and even more preferably 0.20 moles to 0.40 moles of the polybasic acid anhydride are reacted for 1 mole of phenolic hydroxyl groups. If the amount of the polybasic acid anhydride is less than 0.10 moles, developability tends to decrease, while if the amount exceeds 0.80 moles, the alkaline resistance of unexposed portions tends to decrease.

Furthermore, in the aforementioned reaction, a catalyst may be contained as necessary from the viewpoint of carrying out the reaction rapidly. Examples of catalysts include tertiary amines such as triethylamine, quaternary ammonium salts such as triethylbenzyl ammonium chloride, imidazole compounds such as 2-ethyl-4-methylimidazole and phosphorous compounds such as triphenylphosphine.

The acid value of the phenol resin further modified with a polybasic acid anhydride is preferably 30 mgKOH/g to 200 mgKOH/g, more preferably 40 mgKOH/g to 170 mgKOH/g, and even more preferably 50 mgKOH/g to 150 mgKOH/g. If the acid value is lower than 30 mgKOH/g, a longer amount of time tends to be required for alkaline development in comparison with the case of the acid value being within the aforementioned ranges, while if the acid value exceeds 200 mgKOH/g, resistance to developer of unexposed portions tends to decrease in comparison with the case of the acid value being within the aforementioned ranges.

The molecular weight of the phenol resin modified with the unsaturated hydrocarbon group-containing compound is such that the weight average molecular weight is preferably 1,000 to 100,000 and more preferably 2,000 to 100,000 in consideration of solubility in an aqueous alkaline solution and the balance between photosensitivity and cured film properties.

The phenol resin (A) of the present embodiment is preferably a mixture of at least one type of phenol resin selected from a phenol resin having a repeating unit represented by the aforementioned general formula (46) and a phenol resin modified with the aforementioned compound having 4 to 100 carbon atoms and an unsaturated hydrocarbon group (to be referred to as resin (a3)), and a phenol resin selected from novolac resin and polyhydroxystyrene (to be referred to as resin (a4)). The mixing ratio between the resin (a3) and the resin (a4) in terms of the weight ratio thereof is such that the ratio of (a3)/(a4) is within the range of 5/95 to 95/5. This mixing ratio of (a3)/(a4) is preferably 5/95 to 95/5, more preferably 10/90 to 90/10 and even more preferably 15/85 to 85/15 from the viewpoints of solubility in an aqueous alkaline solution, sensitivity and resolution when forming a resist pattern, residual stress of the cured film, and applicability to reflow treatment. Those resins indicated in the previous sections describing novolac resin and polyhydroxystyrene can be used for the novolac resin and polyhydroxystyrene of the aforementioned resin (a4).

(B) Photosensitizer

The following provides an explanation of the photosensitizer (B) used in the present invention. The photosensitizer (B) differs according to whether the photosensitive resin composition of the present invention is of the negative type in which, for example, a polyimide precursor and/or polyamide is mainly used for the resin (A), or is of the positive type in which, for example, at least one type of polyoxazole precursor, soluble polyimide and phenol resin is mainly used for the resin (A).

The incorporated amount of the photosensitizer (B) in the photosensitive resin composition is 1 part by weight to 50 parts by weight based on 100 parts by weight of resin (A). The aforementioned incorporated amount is 1 part by weight or more from the viewpoint of photosensitivity or patterning properties, and is 50 parts by weight or less from the viewpoint curability of the photosensitive resin composition or physical properties of the photosensitive resin layer after curing.

[Negative-Type Photosensitizer (B): Photopolymerization Initiator and/or Photoacid Generator]

First, an explanation is provided of the case of desiring a negative type. In this case, a photopolymerization initiator and/or photoacid generator is used for the photosensitizer (B), the photopolymerization initiator is preferably a photoradical polymerization initiator, and preferable examples thereof include, but are not limited to, photoacid generators in the manner of benzophenone derivatives such as benzophenone and benzophenone derivatives such as methyl o-benzoyl benzoate, 4-benzoyl-4'-methyl diphenyl ketone, dibenzyl ketone or fluorenone, acetophenone derivatives such as 2,2'-diethoxyacetophenone, 2-hydroxy-2-methylpropiophenone or 1-hydroxycyclohexyl phenyl ketone, thioxanthone and thioxanthone derivatives such as 2-methylthioxanthone, 2-isopropylthioxanthone or diethylthioxanthone, benzyl and benzyl derivatives such as benzyldimethylketal or benzyl-β-methoxyethylacetal, benzoin and benzoin derivatives such as benzoin methyl ether, oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o-ethoxycarbonyl)oxime or 1-phenyl-3-ethoxypropanetrione-2-(o-benzoyl)oxime, N-arylglycines such as N-phenylglycine, peroxides such as benzoyl perchloride, aromatic biimidazoles, titanocenes or α-(n-octanesulfonyloxyimino)-4-methoxybenzyl cyanide. Among the aforementioned photopolymerization initiators, oximes are more preferable particularly from the viewpoint of photosensitivity.

In the case of using a photoacid generator for the photosensitizer (B) in a negative-type photosensitive resin composition, in addition to the photoacid generator demonstrating acidity by irradiating with an active light beam in the manner of ultraviolet light, due to that action, it has the effect of causing a crosslinking agent to crosslink with a resin in the form of component (A) or causing polymerization of crosslinking agents. Examples of this photoacid generator used include diaryl sulfonium salts, triaryl sulfonium salts, dialkyl phenacyl sulfonium salts, diaryl iodonium salts, aryl diazonium salts, aromatic tetracarboxylic acid esters, aromatic sulfonic acid esters, nitrobenzyl esters, oxime sulfonic acid esters, aromatic N-oxyimidosulfonates, aromatic sulfamides, haloalkyl group-containing hydrocarbon-based compounds, haloalkyl group-containing heterocyclic compounds and naphthoquinonediazido-4-sulfonic acid esters. Two or more types of these compounds can be used in combination or in combination with other sensitizers as necessary. Among the aforementioned photoacid generators, aromatic oxime sulfonic acid esters and aromatic N-oxyimidosulfonates are more preferable from the viewpoint of photosensitivity in particular.

The incorporated amount of these photosensitizers is 1 part by weight to 50 parts by weight, and preferably 2 parts by weight to 15 parts by weight from the viewpoint of photosensitivity, based on 100 parts by weight of the resin (A). An incorporated amount of 1 part by weight or more based on 100 parts by weight of the resin (A) results in superior photosensitivity, while an incorporated amount of 50 parts by weight or less results in superior thick film curability.

Moreover, as was previously described, in the case the resin (A) represented by general formula (1) is of the ionic bonded type, a (meth)acrylic compound having an amino group is used to impart photosensitivity to a side chain of the resin (A) through the ionic bond. In this case, a (meth)acrylic compound having an amino group is used for the photosensitizer (B), and as was previously described, a dialkylaminoalkyl acrylate or methacrylate, such as dimethylaminoethyl acrylate, dimethylaminoethyl methacrylate, diethylaminoethyl acrylate, diethylaminoethyl methacrylate, dimethylaminopropyl acrylate, dimethylaminopropyl methacrylate, diethylaminopropyl acrylate, diethylaminopropyl methacrylate, dimethylaminobutyl acrylate, dimethylaminobutyl methacrylate, diethylaminobutyl acrylate or diethylaminobutyl methacrylate, is preferable, and among these, a dialkylaminoalkyl acrylate or methacrylate, in which the alkyl group on the amino group has 1 to 10 carbon atoms and the alkyl chain has 1 to 10 carbon atoms, is preferable from the viewpoint of photosensitivity.

The incorporated amount of these (meth)acrylic compounds having an amino group is 1 part by weight to 20 parts by weight, and preferably 2 parts by weigh to 15 parts by weight from the viewpoint of photosensitivity, based on 100 parts by weight of the resin (A). Incorporating 1 part by weight or more of the (meth)acrylic compound having an amino group based on 100 parts by weight of the resin (A) results in superior photosensitivity, while incorporating 20 parts by weight or less results in superior thick film curability.

Next, an explanation is provided of the case of desired a positive type. In this case, a photoacid generator is used for the photosensitizer (B), and more specifically, although a diazoquinone compound, onium salt or halogen-containing compound and the like can be used, a compound having a diazoquinone structure is preferable from the viewpoints of solvent solubility and storage stability.

[Positive-Type Photosensitizer (B): Compound Having a Quinone Diazide Group]

Examples of compounds having a quinone diazide group (to also be referred to as the "quinone diazide compound (B)") include compounds having a 1,2-benzoquinone diazide structure and compounds having a 1,2-naphthquinone diazide structure, and include known substances described in, for example, U.S. Pat. Nos. 2,772,972, 2,797,213 and 3,669,658. The quinone diazide compound (B) is preferably at least one type of compound selected from the group consisting of 1,2-naphtoquinonediazido-4-sulfonic acid esters of polyhydroxy compounds having a specific structure to be subsequently described, and 1,2-naphthoquinonediazido-5-sulfonic acid esters of those polyhydroxy compounds (to also be referred to as "NQD compounds").

These NQD compounds are obtained by converting a naphthoquinonediazidosulfonic acid compound to a sulfonyl chloride with chlorosulfonic acid or thionyl chloride followed by subjecting the resulting naphthoquinonediazidosulfonyl chloride to a condensation reaction with a polyhydroxy compound. For example, an NQD compound can be obtained by esterifying prescribed amounts of a polyhydroxy compound and 1,2-naphthoquinonediazido-5-sulfonyl chloride or 1,2-naphthoquinonediazido-4-sulfonyl chloride in the presence of a base catalyst such as triethylamine and in a solvent such as dioxane, acetone or tetrahydrofuran, followed by rinsing the resulting product with water and drying.

In the present embodiment, the compound (B) having a quinone diazide group is preferably a 1,2-naphthoquinonediazido-4-sulfonic acid ester and/or 1,2-naphthoquinonediazido-5-sulfonic acid ester of a hydroxy compound represented by the following general formulas (120) to (124) from the viewpoint of sensitivity and resolution when forming a resist pattern.

General formula (120) is as indicated below:

[Chemical Formula 171]

(120)

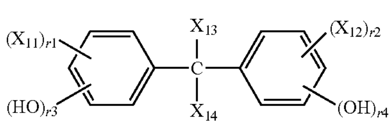

{wherein, $X_{11}$ and $X_{12}$ respectively and independently represent a hydrogen atom or monovalent organic group having 1 to 60 carbon atoms (and preferably 1 to 30 carbon atoms), $X_{13}$ and $X_{14}$ respectively and independently represent a hydrogen atom or monovalent organic group having 1 to 60 carbon atoms (and preferably 1 to 30 carbon atoms), r1, r2, r3 and r4 respectively and independently represent an integer of 0 to 5, at least one of r3 and r4 represents an integer of 1 to 5, $(r1+r3)\leq 5$ and $(r2+r4)\leq 5$}.

General formula (121) is as indicated below:

[Chemical Formula 172]

(121)

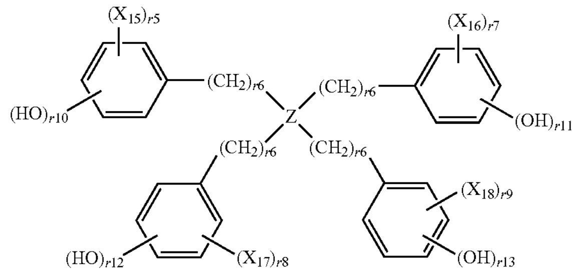

{wherein, Z represents a tetravalent organic group having 1 to 20 carbon atoms, $X_{15}$, $X_{16}$, $X_{17}$ and $X_{18}$ respectively and independently represent a monovalent organic group having 1 to 30 carbon atoms, r6 represents an integer of 0 or 1, r5, r7, r8 and r9 respectively and independently represent an integer of 0 to 3, r10, r11, r12 and r13 respectively and independently represent an integer of 0 to 2, and r10, r11, r12 and r13 are not all 0}.

General Formula (122) is as indicated below:

[Chemical Formula 173]

(122)

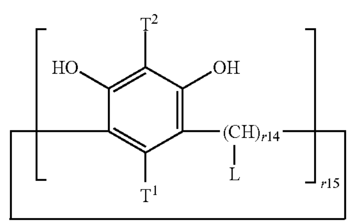

{wherein, r14 represents an integer of 1 to 5, r15 represents an integer of 3 to 8, the (r14×r15) number 5 of L respectively and independently represent a monovalent organic group having 1 to 20 carbon atoms, the r15 number of $T^1$ and the r15 number of $T^2$ respectively and independently represent a hydrogen atom or monovalent organic group having 1 to 20 carbon atoms}.

General formula (123) is as indicated below:

[Chemical Formula 174]

(123)

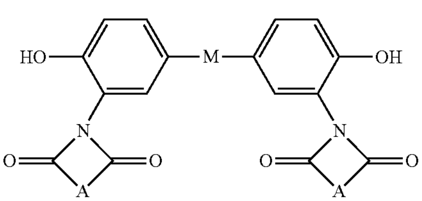

{wherein, A represents a divalent organic group containing an aliphatic tertiary or quaternary carbon atom, and M represents a divalent organic group and preferably represents a divalent group selected from three groups represented by the following chemical formulas}.

[Chemical Formula 175]

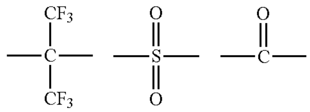

Moreover, general formula (124) is as indicated below:

[Chemical Formula 176]

(124)

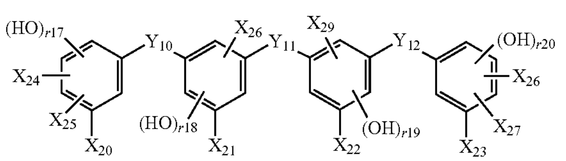

{wherein, r17, r18, r19 and r20 respectively and independently represent an integer of 0 to 2, at least one of r17, r18, r19 and r20 is 1 or 2, $X_{20}$ to $X_{29}$ respectively and independently represent a hydrogen atom, halogen atom, or a monovalent group selected from the group consisting of an alkyl group, alkenyl group, alkoxy group, allyl group and acyl group, and $Y_{10}$, $Y_{11}$ and $Y_{12}$ respectively and independently represent a divalent group selected from the group consisting of a single bond, —O—, —S—, —SO—, —$SO_2$—, —CO—, —$CO_2$—, cyclopentylidene group, cyclohexylidene group, phenylene group and divalent organic group having 1 to 20 carbon atoms}.

In still another embodiment, $Y_{10}$ to $Y_{12}$ in the aforementioned general formula (124) are preferably, respectively and independently selected from three divalent organic groups represented by the following general formulas:

[Chemical Formula 177]

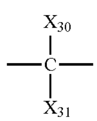

[Chemical Formula 178]

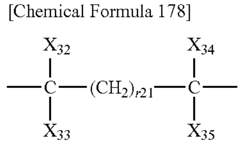

[Chemical Formula 179]

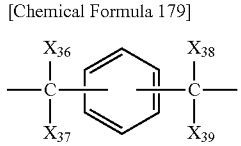

{wherein, $X_{30}$ and $X_{31}$ respectively and independently represent at least one monovalent group selected from the group consisting of a hydrogen atom, alkyl group, alkenyl group, aryl group and substituted aryl group, $X_{32}$, $X_{33}$, $X_{34}$ and $X_{35}$ respectively and independently represent a hydrogen atom or alkyl group, r21 represents an integer of 1 to 5, and $X_{36}$, $X_{37}$, $X_{38}$ and $X_{39}$ respectively and independently represent a hydrogen atom or alkyl group}.

Examples of compounds represented by the aforementioned general formula (120) include hydroxy compounds represented by the formulas (125) to (129).

Formula (125) is as indicated below:

[Chemical Formula 180]

(125)

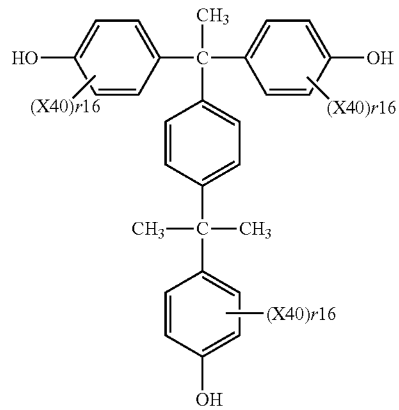

{wherein, r16 respectively and independently represent an integer of 0 to 2, $X_{40}$ respectively and independently represents a hydrogen atom or monovalent organic group having 1 to 20 carbon atoms, in the case a plurality of $X_{40}$ are present, $X_{40}$ may be mutually the same or different, and $X_{40}$ is preferably a monovalent organic group represented by the following general formula:

[Chemical Formula 181]

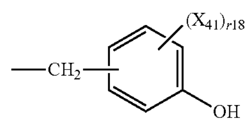

(wherein, r18 represents an integer of 0 to 2, $X_{41}$ represents a monovalent organic group selected from the group consisting of a hydrogen atom, alkyl group and cycloalkyl group, and in the case r18 is 2, the two $X_{41}$ may be mutually the same or different)}, general formula (126) is as indicated below:

[Chemical Formula 182]

(126)

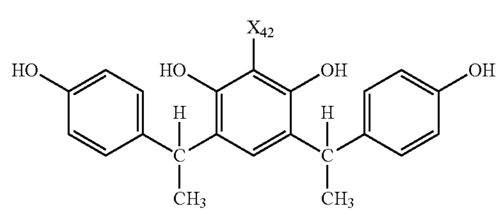

{wherein, $X_{42}$ represents a monovalent organic group selected from the group consisting of an alkyl group having 1 to 20 carbon atoms, alkoxy group having 1 to 20 carbon atoms, and cycloalkyl group having 1 to 20 carbon atoms}, general formula (127) is as indicated below:

[Chemical Formula 183]

(127)

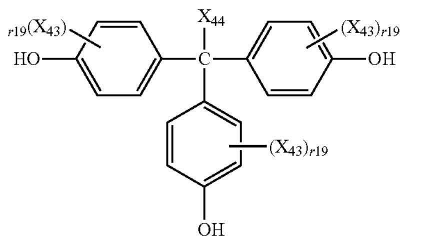

{wherein, r19 respectively and independently represents an integer of 0 to 2 and $X_{43}$ respectively and independently represents a hydrogen or a monovalent organic group represented by the following general formula:

[Chemical Formula 184]

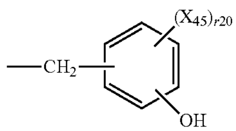

(wherein, r20 represents an integer of 0 to 2, $X_{45}$ is selected from the group consisting of a hydrogen atom, alkyl group and cycloalkyl group, and in the case r20 is 2, $X_{45}$ may be mutually the same or different), and $X_{44}$ is selected from the group consisting of a hydrogen atom, alkyl group having 1 to 20 carbon atoms and cycloalkyl group having 1 to 20 carbon atoms}, and formula (128) and formula (129) indicate the structures indicated below.

[Chemical Formula 185]

(128)

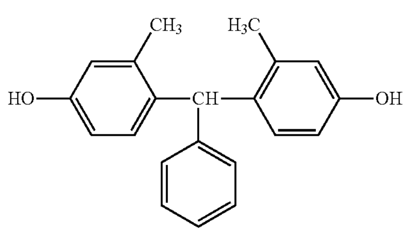

[Chemical Formula 186]

(129)

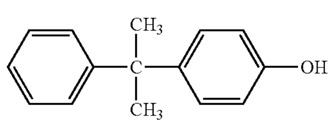

A hydroxy compound represented by the following formulas (130) to (132) is preferable as a compound represented by the aforementioned general formula (120) since it has high sensitivity when in the form of a NQD compound and demonstrates little precipitation in a photosensitive resin composition.

The structures of formulas (130) to (132) are as indicated below.

[Chemical Formula 187]

(130)

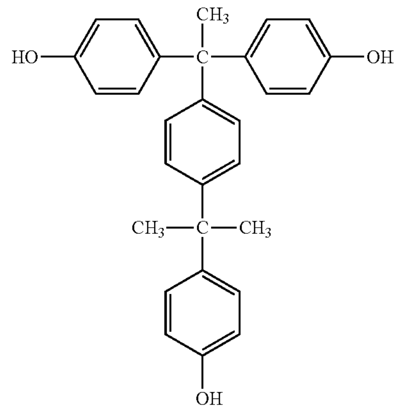

[Chemical Formula 188]

(131)

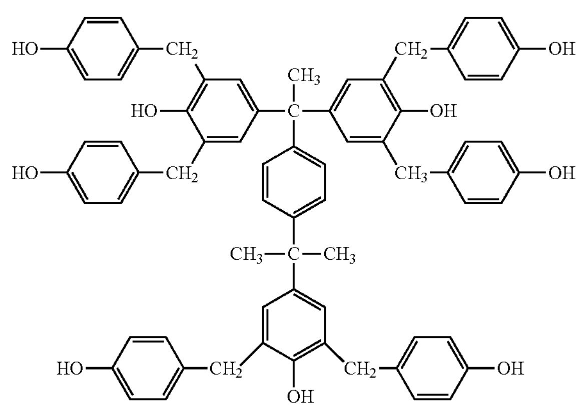

[Chemical Formula 189]

(132)

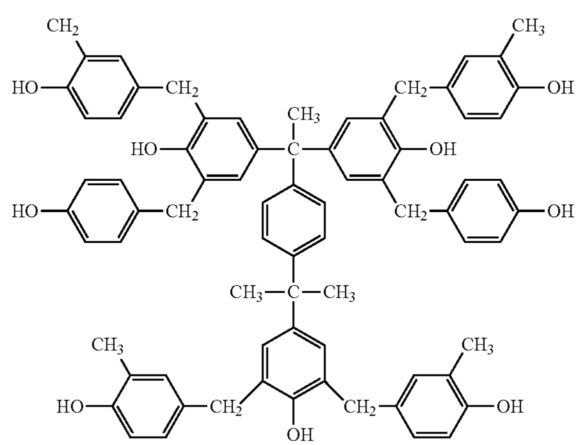

A hydroxy compound represented by the following formula (133) is preferable as a compound represented by the aforementioned general formula (126) since it has high sensitivity when in the form of a NQD compound and demonstrates little precipitation in a photosensitive resin composition.

[Chemical Formula 190]

(133)

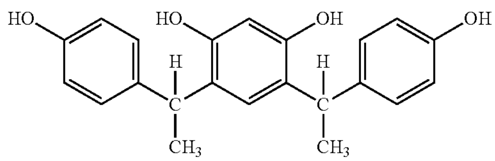

A hydroxy compound represented by the following formulas (134) to (136) is preferable as a compound represented by the aforementioned general formula (77) since it has high sensitivity when in the form of a NQD compound and demonstrates little precipitation in a photosensitive resin composition.

The structures of formulas (134) to (136) are as indicated below.

[Chemical Formula 191]

(134)

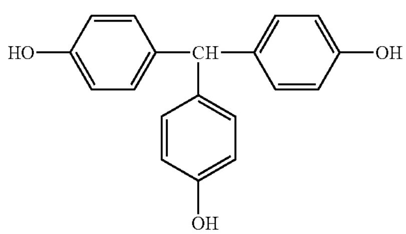

[Chemical Formula 192]

(135)

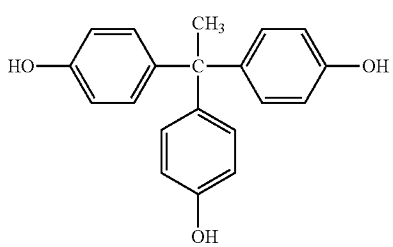

[Chemical Formula 193]

(136)

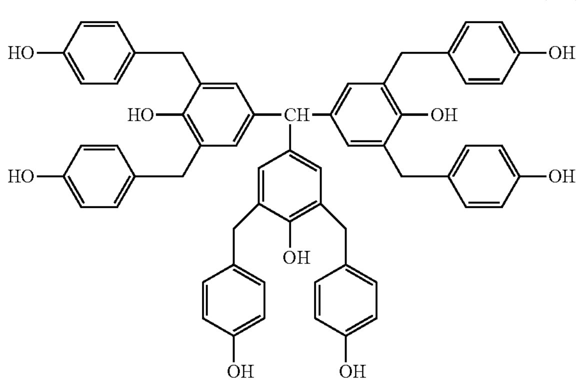

In the aforementioned general formula (121), although there are no particular limitations thereon provided it is a tetravalent organic group having 1 to 20 carbon atoms, Z is preferably a tetravalent group having a structure represented by the following general formulas:

[Chemical Formula 194]

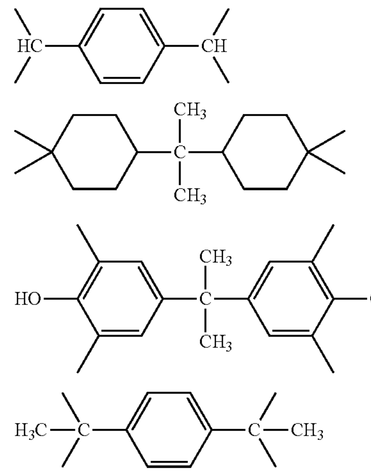

Among compounds represented by the aforementioned general formula (121), hydroxy compounds represented by the following formulas (137) to (140) are preferable since they have high sensitivity when in the form of a NQD compound and demonstrate little precipitation in a photosensitive resin composition.

The structures of formulas (137) to (140) are as indicated below.

[Chemical Formula 195]

(137)

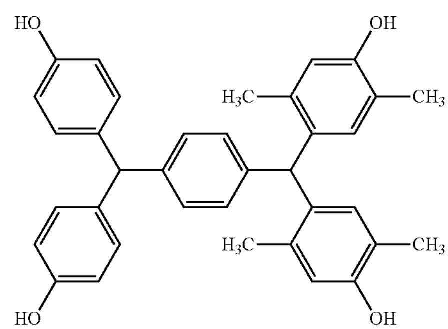

[Chemical Formula 196]

(138)

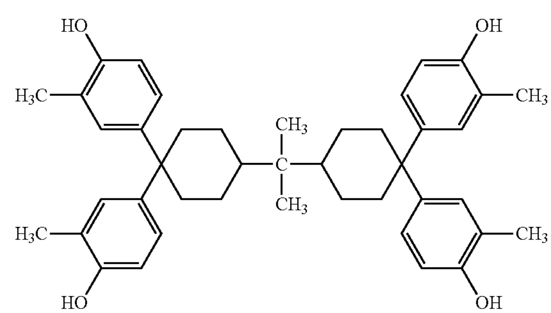

-continued

[Chemical Formula 197]

(139)

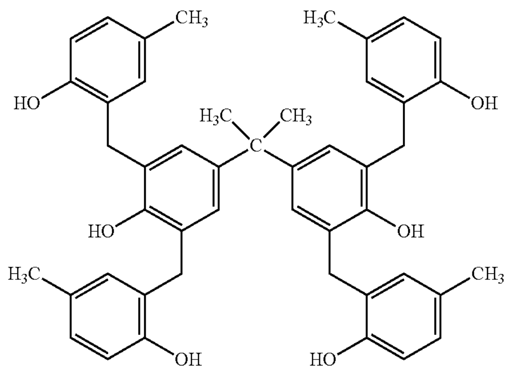

[Chemical Formula 198]

(140)

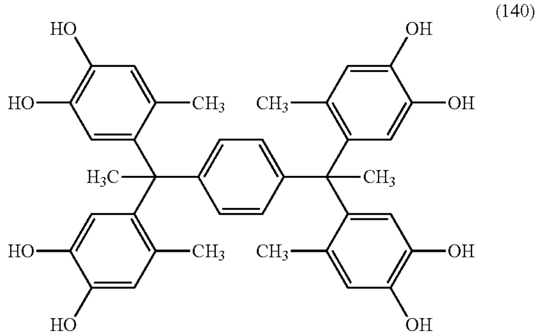

A hydroxy compound represented by the following formula (141):

[Chemical Formula 199]

(141)

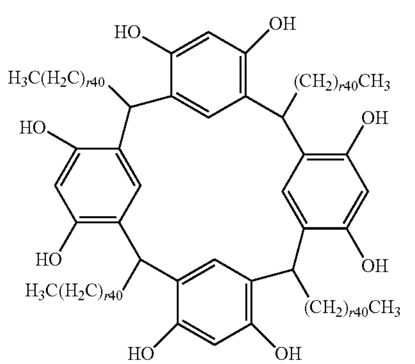

{wherein, r40 respectively and independently represents an integer of 0 to 9} is preferable as a compound represented by the aforementioned general formula (122) since it has high sensitivity when in the form of a NQD compound and demonstrates little precipitation in a photosensitive resin composition.

Hydroxy compounds represented by the following formulas (142) and (143) are preferable as compounds represented by the aforementioned general formula (122) since they have high sensitivity when in the form of a NQD compound and demonstrate little precipitation in a photosensitive resin composition.

The structures of formulas (142) and (143) are as indicated below.

[Chemical Formula 200]

(142)

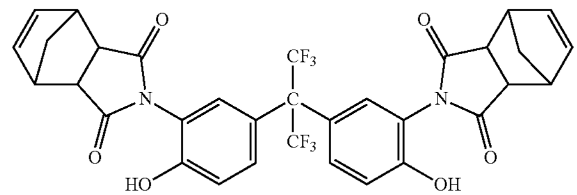

[Chemical Formula 201]

(143)

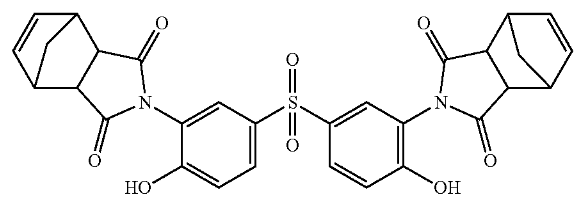

An NQD compound of a hydroxy compound represented by the following formula (144) is specifically preferable as a compound represented by the aforementioned general formula (123) since it has high sensitivity and demonstrates little precipitation in a photosensitive resin composition.

[Chemical Formula 202]

(144)

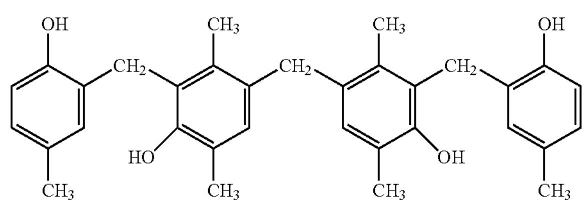

In the case the compound (B) having a quinone diazide group has a 1,2-naphtoquinonediazidosulfonyl group, this group may be any of a 1,2-naphthoquinonediazido-5-sulfonyl group or 1,2-naphthoquinonediazido-4-sulfonyl group. Since a 1,2-naphthoquinonediazido-4-sulfonyl group absorbs in the i-line region of a mercury lamp, it is suitable for exposure by i-line irradiation. On the other hand, since a 1,2-naphthoquinonediazido-5-sulfonyl group is able to also absorb in the g-line region of a mercury lamp, it is suitable for exposure by g-line irradiation.

In the present embodiment, one or both of a 1,2-naphthoquinonediazido-4-sulfonic acid ester compound and 1,2-naphthoquinonediazido-5-sulfonic acid ester compound are preferably selected corresponding to the wavelength used during exposure. In addition, a 1,2-naphthoquinonediazidosulfonic acid ester compound having a 1,2-naphthoquinonediazido-4-sulfonyl group and 1,2-naphthoquinonediazido-5-sulfonyl group in the same molecule can also be used, or a mixture of a 1,2-naphthoquinonediazido-4-sulfonic acid ester compound and a 1,2-naphthoquinonediazido-5-sulfonic acid ester compound can be used by mixing.

In the compound (B) having a quinone diazide group, the average esterification rate of the naphthoquinonediazidosulfonyl ester of the hydroxy compound is preferably 10% to 100% and more preferably 20% to 100% from the viewpoint of development contrast.

Examples of preferable NQD compounds from the viewpoint of sensitivity and cured film properties such as elongation include those represented by the following group of general formulas:

[Chemical Formula 203]

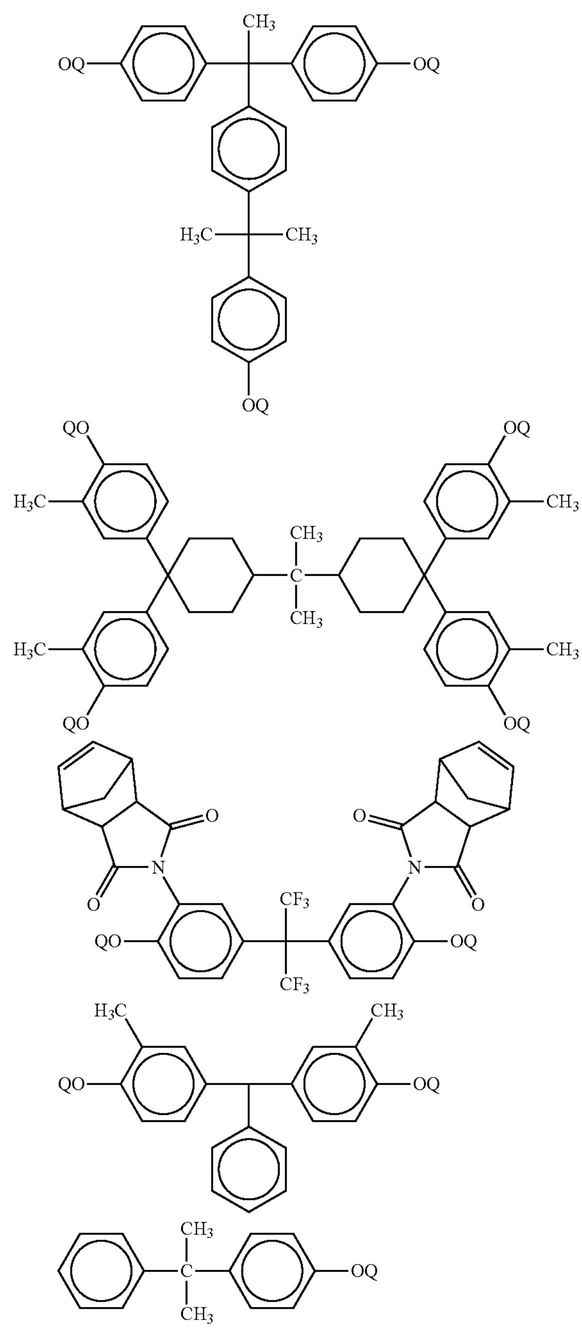

{wherein, Q represents a hydrogen atom or naphthoquinonediazidosulfonic acid ester group represented by either of the following formulas:

[Chemical Formula 204]

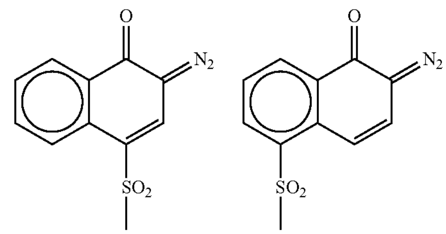

provided that all Q are not simultaneously hydrogen atoms}.

In this case, a naphthoquinonediazidosulfonyl ester compound having a 4-naphthoquinonediazidosulfonyl group and 5-naphthoquinonediazidosulfonyl group in the same molecule can be used as an NQD compound, or 4-naphthoquinonediazidosulfonyl ester compound and 5-naphthoquinonediazidosulfonyl ester compound can be used as a mixture.

Among the naphthoquinonediazidosulfonic acid ester groups described in the previously described in the previous paragraph, a group represented by the following general formula (145) is particularly preferable.

[Chemical Formula 205]

(145)

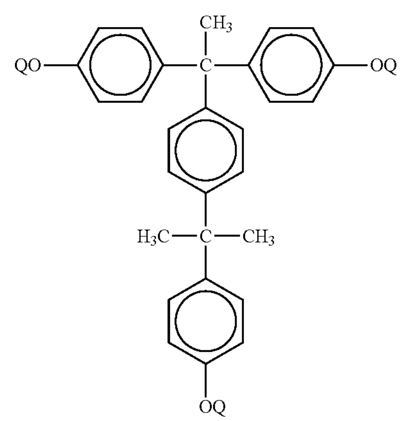

Examples of the aforementioned onium salt include iodonium salts, sulfonium salts, phosphonium salts, ammonium salt and diazonium salts, and is preferably an onium salt selected from the group consisting of a diaryliodonium salt, triarylsulfonium salt and trialkylsulfonium salt.

Examples of the aforementioned halogen-containing compound include haloalkyl group-containing hydrocarbon compounds, and trichloromethyltriazine is preferable.

The incorporated amount of these photoacid generators is 1 part by weight to 50 parts by weight and preferably 5 parts by weight to 30 parts by weight based on 100 parts by weight of the resin (A). Patterning properties of the photosensitive resin composition are preferable if the incorporated amount of the photoacid generator used for the photosensitizer (B) is 1 part by weight or more, while the tensile elongation rate of a film after curing the photosensitive resin composition is favorable and development residue (scum) of exposed portions is low if the incorporated amount is 50 parts by weight or less.

The aforementioned NQD compounds may be used alone or two or more types may be used as a mixture.

In the present embodiment, the incorporated amount of the compound (B) having a quinone diazide group in the photosensitive resin composition is 0.1 parts by weight to 70 parts by weight, preferably 1 part by weight to 40 parts by weight, more preferably 3 parts by weight to 30 parts by weight, and even more preferably 5 parts by weight to 30 parts by weight based on 100 parts by weight of the resin (A). Favorable sensitivity is obtained if the incorporated amount is 0.1 parts by weight or more, while mechanical properties of the cured film are favorable if the incorporated amount is 70 parts by weight or less.

A solvent can be contained in the negative-type resin composition of the present embodiment in the form of the previously described polyimide precursor resin composition and polyamide resin composition, or in the positive-type photosensitive resin composition in the form of the polyoxazole resin composition, soluble polyimide resin composition and phenol resin composition, for the purpose of dissolving these resins.

Examples of solvents include amides, sulfoxides, ureas, ketones, esters, lactones, ethers, halogenated hydrocarbons, hydrocarbons and alcohols, and examples of which that can be used include N-methyl-2-pyrrolidone, N,N-dimethylacetoamide, N,N-dimethylformamide, dimethylsulfoxide, tetramethylurea, acetone, methyl ethyl ketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene and mesitylene. Among these, from the viewpoint of resin solubility, resin composition stability and adhesion to a substrate, N-methyl-2-pyrrolidone, dimethylsulfoxide, tetramethylurea, butyl acetate, ethyl lactate, γ-butyrolactone, propylene glycol monomethyl ether acetate, propylene glycol monomethyl ether, diethylene glycol dimethyl ether, benzyl alcohol, phenyl glycol and tetrahydrofurfuryl alcohol are preferable.

Among these solvents, those capable of completely dissolving the polymer formed are particularly preferable, and examples thereof include N-methyl-2-pyrrolidone, N,N-dimethylacetoamide, N,N-dimethylformamide, dimethylsulfoxide, tetramethylurea and γ-butyrolactone.

Examples of preferable solvents for the aforementioned phenol resin include, but are not limited to, bis(2-methoxyethyl) ether, methyl cellosolve, ethyl cellosolve, propylene glycol monomethyl ether, propylene glycol monomethyl ether acetate, diethylene glycol dimethyl ether, dipropylene glycol dimethyl ether, cyclohexanone, cyclopentanone, toluene, xylene, γ-butyrolactone and N-methyl-2-pyrrolidone.

In the photosensitive resin composition of the present invention, the amount of solvent used is preferably within the range of 100 parts by weight to 1000 parts by weight, more preferably 120 parts by weight to 700 parts by weight, and even more preferably 125 parts by weight to 500 parts by weight based on 100 parts by weight of the resin (A).

The photosensitive resin composition of the present invention may further contain other components in addition to the aforementioned components (A) and (B).

For example, in the case of forming a cured film on a substrate composed of copper or copper alloy using the photosensitive resin composition of the present invention, a nitrogen-containing heterocyclic compound such as an azole compound or purine derivative can be optionally incorporated to inhibit discoloration of the copper.

Examples of azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl) triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]benzotriazole, 2-(3,5-di-t-butyl-2-hydroxyphenyl)benzotriazole, 2-(3-t-butyl-5-methyl-2-hydroxyphenyl)benzotriazole, 2-(3,5-ti-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole.

Particularly preferable examples include tolytriazole, 5-methyl-1H-benzotriazole and 4-methyl-1H-benzotriazole. In addition, one type of these azole compounds or a mixture of two or more types may be used.

Specific examples of purine derivatives include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanine oxime, trihydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, 8-azahypoxanthine and derivatives thereof.

The incorporated amount in the case the photosensitive resin composition contains the aforementioned azole compound or purine derivative is preferably 0.1 parts by weight to 20 parts by weight, and more preferably 0.5 parts by weight to 5 parts by weight from the viewpoint of photosensitivity, based on 100 parts by weight of the resin (A). In the case the incorporated amount of the azole compound based on 100 parts by weight of the resin (A) is 0.1 parts by weight or more, discoloration of the copper or copper alloy surface is inhibited in the case of having formed the photosensitive resin composition of the present invention on copper or copper alloy, while in the case the incorporated amount is 20 parts by weight or less, photosensitivity is superior.

A hindered phenol compound can be optionally incorporated in order to inhibit discoloration of the copper surface. Examples of hindered phenol compounds include, but are not limited to, 2,6-di-t-butyl-4-methylphenol, 2,5-di-t-butylhydroquinone, octadecyl-3-(3,5-di-t-butyl-4-hydroxyphenyl)propionate, isooctyl-3-(3,5-di-t-butyl-4-hydroxyphenyl) propionate, 4,4'-methylene-bis(2,6-di-t-butylphenol), 4,4'-thiobis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis [3-(3,5-di-t-butyl-4-hydroxyphenyl)propionate], 2,2-thio-diethylenebis[3-(3,5-di-t-butyl-4-hydroxphenyl) propionate], N,N'-hexamethylenebis(3,5-di-t-butyl-4- hydroxyhydrocinnamide), 2,2'-methylene-bis(4-methyl-6-t-butylphenol), 2,2'-methylene-bis(4-ethyl-6-t-butylphenol), pentaerythryl-tetrakis[3-(3,5-di-t-butyl-4-hydroxyphenyl)propionate], tris-(3,5-di-t-butyl-4-hydroxybenzyl)isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Among these, 1,3,5-tris(4-t-butyl-3-hydroxy-2,6-dimethylbenzyl)-1,3,5-triazine-2,4,6-(1H,3H,5H)-trione is particularly preferable.

The incorporated amount of the hindered phenol compound is preferably 0.1 parts by weight to 20 parts by weight, and more preferably 0.5 parts by weight to 10 parts by weight from the viewpoint of photosensitivity, based on 100 parts by weight of the resin (A). In the case the incorporated amount of the hindered phenol compound based on 100 parts by weight of the resin (A) is 0.1 parts by weight or more, discoloration and corrosion of the copper or copper alloy is prevented in the case of, for example, having formed the photosensitive resin composition of the present invention on copper or copper alloy, while in the case the incorporated amount is 20 parts by weight or less, photosensitivity is superior.

A crosslinking agent may also be contained in the photosensitive resin composition of the present invention. The crosslinking agent can be a crosslinking agent capable of crosslinking the resin (A) or forming a crosslinked network by itself when heat-curing a relief pattern formed using the photosensitive resin composition of the present invention. The crosslinking is further able to enhance heat resistance and chemical resistance of a cured film formed from the photosensitive resin composition.

Examples of crosslinking agents include compounds containing a methylol group and/or alkoxymethyl group in the form of Cymel (Registered Trade Mark) 300, 301, 303, 370, 325, 327, 701, 266, 267, 238, 1141, 272, 202, 1156, 1158, 1123, 1170 or 1174, UFR 65 or 300, and Mycoat 102 or 105 (all manufactured by Mitsui-Cytec), Nikalac (Registered Trade Mark) MX-270, -280 or -290, Nikalac MS-11 and Nikalac MW-30, -100, -300, -390 or -750 (all manufactured by Sanwa Chemical Co., Ltd.), DML-OCHP, DML-MBPC, DML-BPC, DML-PEP, DML-34X, DML-PSBP, DML-PTBP, DML-PCHP, DML-POP, DML-PFP, DML-MBOC, BisCMP-F, DML-BisOC-Z, DML-BisOCHP-Z, DML-BisOC-P, DMOM-PTBT, TMOM-BP, TMOM-BPA or TML-BPAF-MF (all manufactured by Honshu Chemical Industry Co., Ltd.), benzenedimethanol, bis(hydroxymethyl)cresol, bis(hydroxymethyl)dimethoxybenzene, bis(hydroxymethyl) diphenyl ether, bis(hydroxymethyl)benzophenone, hydroxymethylphenyl hydroxymethyl benzoate, bis(hydroxymethyl)biphenyl, dimethylbis(hydroxymethyl)biphenyl, bis(methoxymethyl)benzene, bis(methoxymethyl) cresol, bis(methoxymethyl)dimethoxybenzene, bis (methoxymethyl)diphenyl ether, bis(methoxymethyl) benzophenone, methoxymethylphenyl methoxymethyl benzoate, bis(methoxymethyl)biphenyl and dimethylbis (methoxymethyl)biphenyl.

In addition, other examples include oxirane compounds in the form of phenol novolac epoxy resin, cresol novolac epoxy resin, bisphenol epoxy resin, trisphenol epoxy resin, tetraphenol epoxy resin, phenol-xylylene epoxy resin, naphthol-xylylene epoxy resin, phenol-naphthol epoxy resin, phenol-dicyclopentadiene epoxy resin, alicyclic epoxy resin, aliphatic epoxy resin, diethylene glycol diglycidyl ether, sorbitol polyglycidyl ether, propylene glycol diglycidyl ether, trimethylolpropane polyglycidyl ether, 1,1,2,2-tetra(p-hydroxyphenyl)ethane tetraglycidyl ether, glycerol triglycidyl ether, ortho-secondary-butylphenyl glycidyl ether, 1,6-bis(2,3-epoxypropoxy)naphthalene, diglycerol polyglycidyl ether, polyethylene glycol glycidyl ether, YDB-340, YDB-412, YDF-2001, YDF-2004 (trade names, all manufactured by Nippon Steel Chemical Co., Ltd.), NC-3000-H, EPPN-501H, EOCN-1020, NC-7000L, EPPN-201L, XD-1000, EOCN-4600 (trade names, all manufactured by Nippon Kayaku Co, Ltd.), Epikote (Registered Trade Mark) 1001, Epikote 1007, Epikote 1009, Epikote 5050, Epikote 5051, Epikote 1031S, Epikote 180S65, Epikote 157H70, YX-315-75 (trade names, all manufactured by Japan Epoxy Resins Co., Ltd.), EHPE3150, Placcel G402, PUE101, PUE105 (trade names, all manufactured by Daicel Chemical Industries, Ltd.), Epiclon (Registered Trade Mark) 830, 850, 1050, N-680, N-690, N-695, N-770, HP-7200, HP-820, EXA-4850-1000 (trade names, all manufactured by DIC Corp.), Denacol (Registered Trade Mark) EX-201, EX-251, EX-203, EX-313, EX-314, EX-321, EX-411, EX-511, EX-512, EX-612, EX-614, EX-614B, EX-711, EX-731, EX-810, EX-911, EM-150 (trade names, all manufactured by Nagase Chemtex Corp.), Epolight (Registered Trade Mark) 70P and Epolight 100MF (trade names, both manufactured by Kyoeisha Chemical Co., Ltd.).

In addition, other examples include isocyanate compounds, such as 4,4'-diphenylmethane diisocyanate, tolylene diisocyanate, 1,3-phenylene-bismethylene diisocyanate, cyclohexylmethane-4,4'-diisocyanate, isophorone diisocyanate, hexamethylene diisocyanate, Takenate (Registered Trade Mark) 500, 600, Cosmonate (Registered Trade Mark) NBDI, ND (trade names, all manufactured by Mitsui Chemicals, Inc.), Duranate (Registered Trade Mark) 17B-60PX, TPA-B80E, MF-B60X, MF-K60X and E402-B80T (trade names, all manufactured by Asahi Kasei Chemicals Corp.).

In addition, although other examples include bismaleimide compounds, such as 4,4'-diphenylmethane bismaleimide, phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimido-(2,2,4-trimethyl)hexane, 4,4'-diphenyl ether bismaleimide, 4,4'-diphenylsulfide bismaleimide, 1,3-bis(3-maleimidophenoxy)benzene, 1,3-bis(4-maleimidophenoxy) benzene, BMI-1000, BMI-1100, BMI-2000, BMI-2300, BMI-3000, BMI-4000, BMI-5100, BMI-7000, BMI-TMH, BMI-6000 and BMI-8000 (trade names, all manufactured by Daiwa Kasei Kogyo Co., Ltd.), they are not limited thereto provided they are compounds that demonstrate thermal crosslinking in the manner described above.

The incorporated amount in the case of using a crosslinking agent is preferably 0.5 parts by weight to 20 parts by weight and more preferably 2 parts by weight to 10 parts by weight based on 100 parts by weight of the resin (A). In the case the incorporated amount is 0.5 parts by weight or more, favorable heat resistance and chemical resistance are demonstrated, while in the case the incorporated amount is 20 parts by weight or less, storage stability is superior.

The photosensitive resin composition of the present invention may also contain an organic titanium compound. The containing of an organic titanium compound allows the formation of a photosensitive resin layer having superior chemical resistance even in the case of having cured at a low temperature of about 250° C.

Examples of organic titanium compounds able to be used for the organic titanium compound include those in which an organic chemical substance is bound to a titanium atom through a covalent bond or ionic bond.

Specific examples of the organic titanium compound include following I) to VII):

I) titanium chelate compounds: titanium chelate compounds having two or more alkoxy groups are more preferable since they allow the obtaining of storage stability of a negative-type photosensitive resin composition as well as a favorable pattern, and specific examples thereof include titanium bis(triethanolamine)diisopropoxide, titanium di(n-butoxide)bis(2,4-pentanedionate), titanium diisopropoxide bis(2,4-pentanedionate), titanium diisopropoxide bis(tetramethylheptanedionate) and titanium diisopropoxide bis (ethylacetoacetate).

II) Tetraalkoxytitanium compounds: examples thereof include titanium tetra(n-butoxide), titanium tetraethoxide, titanium tetra(2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearyloxide and titanium tetrakis[bis{2, 2-(allyloxymethyl)butoxide}].

III) Titanocene compounds: examples thereof include titanium pentamethylcyclopentadienyl trimethoxide, bis ($\eta^5$2,4-cyclopentadien-1-yl) bis(2,6-difluorophenyl) titanium and bis($\eta^5$-2,4-cyclopentadien-1-yl) bis(2,6-difluoro-3-(1H-pyrrol-1-yl)phenyl) titanium.

IV) Monoalkoxy titanium compounds: examples thereof include titanium tris(dicetylphosphate)isopropoxide and titanium tris(dodecylbenzenesulfonate)isopropoxide.

V) Titanium oxide compounds: examples thereof include titanium oxide bis(pentanedionate), titanium oxide bis(tetramethylheptanedionate) and phthalocyanine titanium oxide.

VI) Titanium tetraacetylacetonate compounds: examples thereof include titanium tetraacetylacetonate.

VII) Titanate coupling agents: examples thereof include isopropyltridecylbenzenesulfonyl titanate.

Among these, the organic titanium compound is preferably at least one type of compound selected from the group consisting of the aforementioned titanium chelate compounds (I), tetraalkoxytitanium compounds (II) and titanocene compounds (III) from the viewpoint of demonstrating more favorable chemical resistance.

Titanium diisopropoxide bis(ethylacetoacetate), titanium tetra(n-butoxide) and bis($\eta^5$-2,4-cyclopentadien-1-yl) bis(2, 6-difluoro-3-(1H-pyrrol-1-yl)phenyl) titanium are particularly preferable.

The incorporated amount in the case of incorporating the organic titanium compound is preferably 0.05 parts by weight to 10 parts by weight and more preferably 0.1 parts by weight to 2 parts by weight based on 100 parts by weight of the resin (A). In the case the incorporated amount is 0.05 parts by weight or more, favorable heat resistance and chemical resistance are demonstrated, while in the case the incorporated amount is 10 parts by weight or less, storage stability is superior.

Moreover, an adhesive assistant can be optionally incorporated to improve adhesion between a substrate and a film formed using the photosensitive resin composition of the present invention. Examples of adhesive assistants include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis (N-[3-triethoxysilyl]propylamido)-4,4'-dicarboxylic acid, benzene-1,4-bis(N-[3-triethoxysilyl]propylamido)-2,5-dicarboxylic acid, 3-(triethoxysilyl)propylsuccinic anhydride, N-phenylaminopropyltrimethoxysilane, 3-ureidopropyltrimethoxysilane, 3-ureidopropyltriethoxysilane or 3-(trialkoxysilyl)propyl succinic anhydride, and aluminum-based adhesive assistants such as aluminum tris(ethylacetoacetate), aluminum tris(acetylacetonate) or ethylacetylacetate aluminum diisopropylate.

Among these adhesive assistants, silane coupling agents are more preferable from the viewpoint of adhesive strength. In the case the photosensitive resin composition contains an adhesive assistant, the incorporated amount of the adhesive assistant is preferably within the range of 0.5 parts by weight to 25 parts by weight based on 100 parts by weight of the resin (A).

Examples of silane coupling agents include, but are not limited to, 3-mercaptopropyltrimethoxysilane (KBM803: trade name, manufactured by Shin-etsu Chemical Co., Ltd., Sila-Ace S810: trade name, manufactured by Chisso Corp.), 3-mercaptopropyltriethoxysilane (SIM6475.0: trade name, manufactured by Azmax Corp.), 3-mercaptopropylmethyldimethoxysilane (LS1375: trade name, manufactured by Shin-Etsu Chemical Co., Ltd., SIM6474.0: trade name, manufactured by Azmax Corp.), mercaptomethyltrimethoxysilane (SIM6473.5C, trade name, manufactured by Azmax Corp.), mercaptomethylmethyldimethoxysilane (SIM6473.0, trade name, manufactured by Azmax Corp.), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane, N-(3-triethoxysilylpropyl)urea (LS3610: trade name, Shin-Etsu Chemical Co., Ltd., SIU9055.0, trade name, manufactured by Azmax Corp.), N-(3-trimethoxysilylpropyl)urea (SIU9058.0: trade name, manufactured by Azmax Corp.), N-(3-diethoxymethoxysilylpropyl)urea, N-(3-ethoxydimethoxysilylpropyl)urea, N-(3-tripropoxysilylpropyl)urea, N-(3-diethoxypropoxysilylpropyl)urea, N-(3-ethoxydipropoxysilylpropyl)urea, N-(3-dimethoxypropoxysilylpropyl)urea, N-(3-methoxydipropoxysilylpropyl)urea, N-(3-trimethoxysilylethyl)urea, N-(3-ethoxydimethoxysilylethyl)urea, N-(3-tripropoxysilylethyl)urea, N-(3-tripropoxysilylethyl)urea, N-(3-ethoxydipropoxysilylethyl)urea, N-(3-dimethoxypropoxysilylethyl)urea, N-(3-methoxydipropoxysilylethyl)urea, N-(3-trimethoxysilylbutyl)urea, N-(3-triethoxysilylbutyl)urea, N-(3-tripropoxysilylbutyl)urea, 3-(m-aminophenoxy)propyltrimethoxysilane (SLA0598.0: manufactured by Azmax Corp.), m-aminophenyltrimethoxysilane (SLA0599.0: trade name, manufactured by Azmax Corp.), p-aminophenyltrimethoxysilane (SLA0599.1: trade name, manufactured by Azmax Corp.), aminophenyltrimethoxysilane (SLA0599.2, trade name, manufactured by Azmax Corp.), 2-(trimethoxysilylethyl)pyridine (SIT8396.0: trade name, manufactured by Azmax Corp.), 2-(triethoxysilylethyl)pyridine, 2-(dimethoxysilylmethylethyl)pyridine, 2-(di(ethoxysilylmethylethyl)pyridine, (3-triethoxysilylpropyl)-t-butylcarbamate, (3-glycidoxypropyl)triethoxysilane, tetramethoxysilane, tetraethoxysilane, tetra-n-propoxysilane, tetra-i-propoxysilane, tetra-n-butoxysilane, tetra-i-butoxysilane, tetra-t-butoxysilane, tetrakis(methoxyethoxysilane), tetrakis(methoxy-n-propoxysilane), tetrakis(ethoxyethoxysilane), tetrakis(methoxyethoxyethoxysilane), bis(trimethoxysilyl)ethane, bis(trimethoxysilyl)hexane, bis(triethoxysilyl)methane, bis(triethoxysilyl)ethane, bis(triethoxysilyl)ethylene, bis(triethoxysilyl)octane, bis(triethoxysilyl)octadiene, bis[3-(triethoxysilyl)propyl]disulfide, bis[3-(triethoxysilyl)propyl] tetrasulfide, di-t-butoxydiacetoxysilane, di-i-butoxyaluminoxytriethoxysilane, bis(pentadionate) titanium-O,O'-bis(oxyethyl)-aminopropyltriethoxysilane, phenylsilanetriol, methylphenylsilanedol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, dimethoxydiphenylsilane, diethoxydiphenylsilane, dimethoxy-di-p-tolylsilane, ethylmethylphenylsilanol, n-propylmethylphenylsilanol, isopropylmethylphenylsilanol, rbutylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n propyldiphenylsilanol, isopropyldiphenylsilanol, n-butyldiphenylsilanol, isobutyldiphenylsilanol, tert-butyldiphenylsilanol and triphenylsilanol. These may be used alone or in combination.

Among the aforementioned silane coupling agents, phenylsilanetriol, trimethoxyphenylsilane, trimethoxy(p-tolyl) silane, diphenylsilanediol, dimethoxydiphenylsilane, diethoxydiphenylsilane, dimethoxy-di-p-tolylsilane, triphenylsilane and silane coupling agents represented by the following structures:

[Chemical Formula 206]

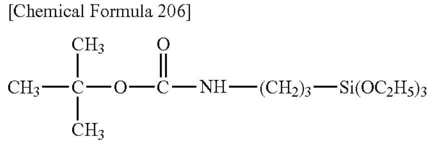

-continued

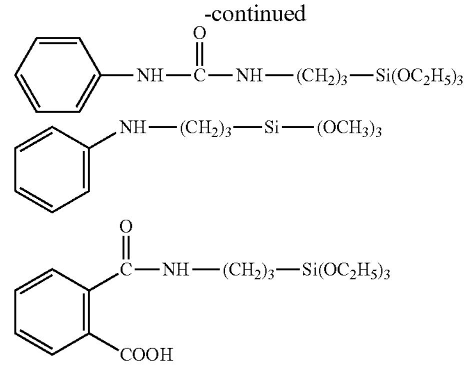

are particularly preferable as silane coupling agents.

0.01 parts by weight to 20 parts by weight based on 100 parts by weight of the resin (A) is preferable for the incorporated amount of silane coupling agent in the case of incorporating a silane coupling agent.

The photosensitive resin composition of the present invention may further include other components in addition to those described above. Preferable examples of these components vary according to whether a negative-type, using, for example, a polyimide precursor and polyamide, or positive-type, using a polyoxazole precursor, polyimide and phenol resin, is used for the resin (A).

A sensitizer for improving photosensitivity can be optionally incorporated in the case of a negative-type using a polyimide precursor and the like for the resin (A). Examples of sensitizers include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino) chalcone, p-diethylaminocinnamylidene indanone, p-dimethylaminobenzylidene indanone, 2-(p-dimethylaminophenylbiphenylene)benzothiazole, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-d)thiazole and 2-(p-dimethylaminobenzoyl)styrene. These can be used alone or, for example, 2 to 5 types can be used in combination.

The incorporated amount of the sensitizer in the case the photosensitive resin composition contains a sensitizer for improving photosensitivity is preferably 0.1 parts by weight to 25 parts by weight based on 100 parts by weight of the resin (A).

In addition, a monomer having a photopolymerizable unsaturated bond can be optionally incorporated to improve resolution of a relief pattern. The monomer is preferably a (meth)acrylic compound that undergoes a radical polymerization reaction by a photopolymerization initiator, and although not limited to that indicated below, examples thereof include compounds such as mono- or diacrylates and methacrylates of ethylene glycol or polyethylene glycol such as diethylene glycol dimethacrylate or tetraethylene glycol dimethacrylate, mono- or diacrylates and methacrylates of propylene glycol or polypropylene glycol, mono-, di- or triacrylates, methacrylates, cyclohexane diacrylates, and dimethacrylates of glycerol, diacrylates and dimethacrylates of 1,4-butanediol, diacrylates and dimethacrylates of 1,6-hexanediol, diacrylates and dimethacrylates of neopentyl glycol, mono- or diacrylates, methacrylates, benzene trimethacrylates, isobornyl acrylates and methacrylates, acrylamides and derivatives thereof, methacrylamides and derivatives thereof and trimethylolpropane triacrylates and methacrylates of bisphenol A, triacrylates and methacrylates of glycerol, di- tri- or tetraacrylates and methacrylates of pentaerythritol, and ethylene oxide or propylene oxide adducts of these compounds.

In the case the photosensitive resin composition contains the aforementioned monomer having a photopolymerizable unsaturated bond in order to improve the resolution of a relief pattern, the incorporated amount of the photopolymerizable monomer having an unsaturated bond is preferably 1 part by weight to 50 parts by weight based on 100 parts by weight of the resin (A).

In addition, in the case of a negative type using a polyimide precursor for the resin (A), a thermal polymerization inhibitor can be optionally incorporated to improve viscosity and photosensitivity stability of the photosensitive resin composition when storing in a state of a solution containing a solvent in particular. Examples of thermal polymerization inhibitors include hydroquinone, N-nitrosodiphenylamine, p-tert-butylcatechol, phenothiazine, N-phenylnaphthylamine, ethyldiamine tetraacetic acid, 1,2-cyclohexanediamine tetraacetic acid, glycol ether diamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt and N-nitroso-N-(1-naphthyl) hydroxylamine ammonium salt.

The incorporated amount of the thermal polymerization inhibitor in the case of incorporating in the photosensitive resin composition is preferably within the range of 0.005 parts by weight to 12 parts by weight based on 100 parts by weight of the resin (A).

On the other hand, in the case of a positive type using a polyoxazole derivative for the resin (A) in the photosensitive resin composition of the present invention, dyes, surfactants, thermal acid generators, solubility enhancers and adhesive assistants for enhancing adhesion with a base material conventionally used as additives of photosensitive resin compositions can be used as necessary in the photosensitive resin composition to enhance adhesion with a substrate.

In providing an even more detailed description of the aforementioned additives, examples of dyes include methyl violet, crystal violet and malachite green. In addition, examples of surfactants include nonionic surfactants composed of polyglycols or derivatives thereof, such as polypropylene glycol or polyoxyethylene lauryl ether, examples of which include fluorine-based surfactants such as Fluorad (trade name, Sumitomo 3M Ltd.), Megafac (trade name, Dainippon Ink & Chemicals, Inc.) or Lumiflon (trade name, Asahi Glass Co., Ltd.), and organic siloxane surfactants such as KP341 (trade name, Shin-Etsu Chemical Co., Ltd.), DBE (trade name, Chisso Corp.) or Granol (trade name, Kyoeisha Chemical Co., Ltd.). Examples of adhesive assistants include alkylimidazoline, butyric acid, alkyl acid, polyhydroxystyrene, poly(vinyl methyl ether), t-butyl novolac resin, epoxysilane and epoxy polymers, as well as various types of silane coupling agents.

The incorporated amounts of the aforementioned dyes and surfactants are preferably 0.01 parts by weight to 30 parts by weight based on 100 parts by weight of the resin (A).

In addition, a thermal acid generator can be optionally incorporated from the viewpoint of demonstrating favorable thermal properties and mechanical properties of the cured product even in the case of having lowered the curing temperature.

A thermal acid generator is preferably incorporated from the viewpoint of demonstrating favorable thermal properties and mechanical properties of the cured product even in the case of having lowered the curing temperature.

Examples of thermal acid generators include salts formed from strong acid and base such as onium salts and imidosulfonates having a function that forms an acid as a result of heating.

Examples of onium salts include diaryliodonium salts such as aryldiazonium salt or diphenyliodonium salt, di(alkylaryl)iodonium salts such as di(t-butylphenyl)iodonium salt, trialkylsulfonium salts such as trimethylsulfonium salt, dialkylmonoarylsulfonium salts such as dimethylphenylsulfonium salt, diarylmonoalkylsulfonium salts such as diphenylmethylsulfonium salt, and triarylsulfonium salts.

Among these, di(t-butylphenyl)iodonium salt of para-toluenesulfonic acid, di(t-butylphenyl)iodonium salt of trifluoromethanesulfonic acid, trimethylsulfonium salt of trifluoromethanesulfonic acid, dimethylphenylsulfonium salt of trifluoromethanesulfonic acid, diphenylmethylsulfonium salt of trifluoromethanesulfonic acid, di(t-butylphenyl)iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid and dimethylphenylsulfonium salt of toluenesulfonic acid are preferable.

In addition, salts such as pyridinium salts formed from strong acids and bases as indicated below can also be used as salts formed from strong acid and base in addition to the previously described onium salts. Examples of strong acids include arylsulfonic acids in the manner of p-toluenesulfonic acid or benzenesulfonic acid, perfluoroalkylsulfonic acids in the manner of camphorsulfonic acid, trifluoromethanesulfonic acid or nonafluorobutanesulfonic acid, and alkylsulfonic acids in the manner of methanesulfonic acid, ethanesulfonic acid or butanesulfonic acid. Examples of bases include pyridines and alkylpyridines in the manner of 2,4,6-trimethylpyridine, and N-alkylpyridines and halogenated N-alkylpyridines in the manner of 2-chloro-N-methylpyridine.

Although imidosulfonates such as naphthoylimidosulfonate or phthalimidosulfonate can be used as imidosulfonate, there are no particular limitations thereon provided they are compounds capable of generating acid in the presence of heat.

The incorporated amount in the case of using a thermal acid generator is preferably 0.1 parts by weight to 30 parts by weight, more preferably 0.5 parts by weight to 10 parts by weight, and even more preferably 1 part by weight to 5 parts by weight, based on 100 parts by weight of the resin (A).

In the case of a positive-type photosensitive resin composition, a solubility enhancer can be used to accelerate removal of resin that is no longer required following photosensitization. A compound having a hydroxyl group or carboxyl group, for example, is preferable. Examples of compounds having a hydroxyl group include ballast agents used in the previously described naphthoquinone diazide compounds, along with para-cumylphenol, bisphenols, resorcinols, linear phenol compounds such as MtrisPC or MtetraPC, non-linear phenol compounds such as TrisP-HAP, TrisP-PHBA or TrisP-PA (all manufactured by Honshu Chemical Industry Co., Ltd.), diphenylmethane having 2 to 5 phenol substituents, 3,3-diphenylpropane having 1 to 5 phenol substituents, compounds obtained by reacting 2,2-bis(3-amino-4-hydroxyphenyl)hexafluoropropane and 5-norbornene-2,3-dicarboxylic anhydride at a molar ratio of 1:2, compounds obtained by reacting bis(3-amino-4-hydroxyphenyl)sulfone and 1,2-cyclohexylcarboxylic anhydride at a molar ratio of 1:2, N-hydroxysuccinimide, N-hydroxyphthalimide and N-hydroxy-5-norbornene-2,3-dicarboxylic acid imide. Examples of compounds having a carboxyl group include 3-phenyllactic acid, 4-hydroxyphenyllactic acid, 4-hydroxymandelic acid, 3,4-dihydroxymandelic acid, 4-hydroxy-3-methoxymandelic acid, 2-methoxy-2-(1-naphthyl)propionic acid, mandelic acid, atrolactic acid, α-methoxyphenylacetic acid, O-acetylmandelic acid and itaconic acid.

The incorporated amount in the case of incorporating a solubility enhancer is preferably 0.1 parts by weight to 30 parts by weight based on 100 parts by weight of the resin (A).

<Method for Producing Rewiring Layer>

The present invention provides a method for producing a rewiring layer, comprising: (1) a step for forming a resin layer on a copper layer by coating the previously described photosensitive resin composition on copper subjected to surface treatment of the present invention, (2) a step for exposing the resin layer to light, (3) a step for forming a relief pattern by developing the resin layer after exposing to light, and (4) a step for forming a cured relief pattern by heat-treating the relief pattern. The following provides an explanation of a typical aspect of each step.

(1) Step for Forming a Resin Layer on Copper by Coating the Photosensitive Resin on the Copper Subjected to Surface Treatment In the present step, the photosensitive resin composition of the present invention is coated onto copper that has been subjected to the surface treatment of the present invention followed by drying as necessary to form a resin layer. A method conventionally used to coat photosensitive resin compositions can be used, examples of which include coating methods using a spin coater, bar coater, blade coater, curtain coater or screen printer, and spraying methods using a spray coater.

A coating film composed of the photosensitive resin composition can be dried as necessary. A method such as air drying, or heat drying or vacuum drying using an oven or hot plate, is used for the drying method. More specifically, in the case of carrying out air drying or heat drying, drying can be carried out under conditions consisting of 1 minute to 1 hour at 20° C. to 140° C. The resin layer can be formed on copper in this manner.

(2) Step for Exposing Resin Layer to Light

In the present step, the resin layer formed in the manner described above is exposed to an ultraviolet light source and the like either directly or through a photomask having a pattern or reticle using an exposure device such as a contact aligner, mirror projector or stepper.

Subsequently, post-exposure baking (PEB) and/or pre-development baking may be carried out using an arbitrary combination of temperature and time as necessary for the purpose of improving photosensitivity and the like. Although the range of baking conditions preferably consists of a temperature of 40° C. to 120° C. and time of 10 seconds to 240 seconds, the range is not limited thereto provided various properties of the photosensitive resin composition of the present invention are not impaired.

(3) Step for Forming Relief Pattern by Developing Resin Layer after Exposing to Light In the present step, exposed portions or unexposed portions of the photosensitive resin layer are developed and removed following exposure. Unexposed portions are developed and removed in the case of using a negative-type photosensitive resin composition (such as in the case of using a polyimide precursor for the resin (A)), while exposed portions are developed and removed in the case of using a positive-type photosensitive resin composition (such as in the case of using a polyoxazole derivative for the resin (A)). An arbitrary method can be selected and used for the development method from among conventionally known photoresist development methods, examples of which include the rotary spraying method, paddle method and immersion method accompanying ultrasonic treatment. In addition, post-development baking using an arbitrary combination of temperature and time may be carried out as necessary after development for the purpose of adjusting the form of the relief pattern.

A good solvent with respect to the photosensitive resin composition or a combination of this good solvent and a poor solvent is preferable for the developer used for development. In the case of a photosensitive resin composition that does not dissolve in an aqueous alkaline solution, for example, preferable examples of good solvents include N-methylpyrrolidone, N-cyclohexyl-2-pyrrolidone, N,N-dimethylacetoamide, cyclopentanone, cyclohexanone, γ-butyrolactone and α-acetyl-γ-butyrolactone, while preferable examples of poor solvents include toluene, xylene, methanol, ethanol, isopropyl alcohol, ethyl lactate, propylene glycol methyl ether acetate and water. In the case of using a mixture of good solvent and poor solvent, the proportion of poor solvent to good solvent is preferably adjusted according to the solubility of polymer in the photosensitive resin composition. In addition, two or more types of each solvent, such as a combination of several types of each solvent, can also be used.

On the other hand, in the case of a photosensitive resin composition that dissolves in an aqueous alkaline solution, the developer used for development dissolves and removes an aqueous alkaline solution-soluble polymer, and typically is an aqueous alkaline solution having an alkaline compound dissolved therein. The alkaline compound dissolved in the developer may be either an inorganic alkaline compound or organic alkaline compound.

Examples of inorganic alkaline compounds include lithium hydroxide, sodium hydroxide, potassium hydroxide, diammonium hydrogen phosphate, dipotassium hydrogen phosphate, disodium hydrogen phosphate, lithium silicate, sodium silicate, potassium silicate, lithium carbonate, sodium carbonate, potassium carbonate, lithium borate, sodium borate, potassium borate and ammonia.

Examples of organic alkaline compounds include tetramethylammonium hydroxide, tetraethylammonium hydroxide, trimethylhydroxyethylammonium hydroxide, methylamine, dimethylamine, trimethylamine, monoethylamine, diethylamine, triethylamine, n-propylamine, di-n-propylamine, isopropylamine, diisopropylamine, methyldiethylamine, dimethylethanolamine, ethanolamine and triethanolamine.

A water-soluble organic solvent such as methanol, ethanol, propanol or ethylene glycol, surfactant, storage stabilizer or resin dissolution inhibitor and the like can be added in a suitable amount thereof to the aforementioned aqueous alkaline solution as necessary. The relief pattern can be formed in the above manner.

(4) Step for Forming Cured Relief Pattern by Heat-Treating Relief Pattern

In the present step, the relief pattern obtained by developing in the manner previously described is converted to a cured relief pattern by heating. Various methods can be selected for the heat curing method, examples of which include heating with a hot plate, heating using an oven, and heating using a programmable oven that allows the setting of a temperature program. Heating can be carried out under conditions consisting of, for example, 30 minutes to 5 hours at 180° C. to 400° C. Air may be used for the atmospheric gas during heat curing, or an inert gas such as nitrogen or argon can be used.

<Semiconductor Device>

According to the fourth aspect of the present invention, the present invention also provides a semiconductor device that contains a rewiring layer obtained according to the method for producing a rewiring layer of the present invention described above. The present invention also provides a semiconductor device containing a semiconductor element in the form of a base material and a rewiring layer formed according to the aforementioned method for producing a rewiring layer on the aforementioned base material. In addition, the present invention can be applied to a method for producing a semiconductor device that uses a semiconductor element for the base material and contains the aforementioned method for producing a wiring pattern as a portion of the process thereof.

[Fifth Aspect]

Elements are mounted on printed boards using various methods corresponding to the purpose. Conventional elements were typically fabricated by a wire bonding method in which a connection is made from an external terminal of the element (pad) to a lead frame with a fine wire. However, with today's current higher element speeds in which the operating frequency has reached the GHz range, differences in the wiring lengths of each terminal during mounting are having an effect on element operation. Consequently, in the case of mounting elements for high-end applications, it has become necessary to accurately control the lengths of mounting wires, and it has become difficult to satisfy this requirement with wire bonding.

Thus, flip-chip mounting has been proposed in which, after having formed a rewiring layer on the surface of a semiconductor chip and formed a bump (electrode) thereon, the chip is turned over (flipped) followed by directly mounting on the printed board (see, for example, Japanese Unexamined Patent Publication No. 2001-338947). As a result of being able to accurately control wiring distance, this flip-chip mounting is being employed in elements for high-end applications handling high-speed signals, and because of its small mounting size, is also being employed in cell phone applications, thereby resulting in a rapid increase in demand. In the case of using a material such as polyimide, polybenzoxazole or phenol resin for flip-chip mounting, the process goes through a step for forming a metal wiring layer after a pattern has been formed on the resin layer. The metal wiring layer is normally formed by roughening the surface of the resin layer by subjecting to plasma etching, followed by forming a metal layer serving as the plating seed layer by sputtering at a thickness of 1 μm or less, and then forming the metal wiring layer by electrolytic plating using this metal layer as an electrode. Although Ti is typically used for the metal of the seed layer at this time, Cu is used as the metal of the rewiring layer formed by electrolytic plating.

With respect to this metal rewiring layer, the rewired metal layer and resin layer are required to demonstrate high adhesion. However, there have conventionally been cases in which adhesion between the rewiring Cu layer and resin layer decreases due to the effects of the resin and additives that form the photosensitive resin composition and the effects of the production method used when forming the rewiring layer. A decrease in adhesion between the rewired Cu layer and resin layer results in a decrease in insulation reliability of the rewiring layer.

On the other hand, microwaves are electromagnetic waves having a frequency of 300 MHz to 3 GHz, and when radiated onto a material, act on permanent dipoles contained in the material, having the effect of locally generating heat in the material. Ring-closure imidization of polyamic acid, which conventionally requiring heating to a high temperature of 300° C. or higher, is known to proceed at 250° C. or lower by utilizing this effect (see, for example, Japanese Examined Patent Publication No. 5121115). However, the effects of microwave radiation on adhesion between resin and Cu have yet to be determined.

With the foregoing in view, an object of the fifth aspect of the present invention is to provide a method for forming a rewiring layer demonstrating a high level of adhesion with a Cu layer.

The inventors of the present invention found that, during the course of curing a specific photosensitive resin composition, a rewiring layer demonstrating high adhesion between a Cu layer and resin layer can be obtained by irradiating with microwaves, thereby leading to completion of the present invention. Namely, the fifth aspect of the present invention is as indicated below.

[1] A method for producing a rewiring layer, comprising the steps of:

preparing a photosensitive resin composition containing 100 parts by weight of at least one type of resin (A) selected from the group consisting of polyamic acid ester, novolac resin, polyhydroxystyrene and phenol resin, and 1 part by weight to 50 parts by weight of a photosensitizer (B) based on 100 parts by weight of the resin (A), forming a photosensitive resin layer on a substrate by coating the photosensitive resin composition onto the substrate, exposing the photosensitive resin layer to light, forming a relief pattern by developing the photosensitive resin layer after exposing to light, and curing the relief pattern by irradiating with microwaves.

[2] The method described in [1], wherein the curing by microwave irradiation is carried out at 250° C. or lower.

[3] The method described in [1] or [2], wherein the substrate is formed from copper or copper alloy.

[4] The method described in any of [1] to [3], wherein the photosensitive resin is at least one type of resin selected from the group consisting of a polyamic acid ester containing a structure represented by the following general formula (40):

[Chemical Formula 207]

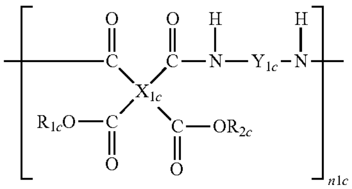

(40)

{wherein, $X_{1c}$ represents a tetravalent organic group, $Y_{1c}$ represents a divalent organic group, $n_{1c}$ represents an integer of 2 to 150 and $R_{1c}$ and $R_{2c}$ respectively and independently represent a hydrogen atom, saturated aliphatic group having 1 to 30 carbon atoms, aromatic group, monovalent organic group represented by the following general formula (41):

[Chemical Formula 208]

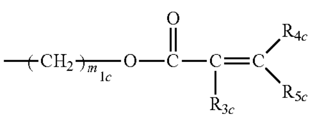

(41)

(wherein, $R_{3c}$, $R_{4c}$ and $R_{5c}$ respectively and independently represent a hydrogen atom or organic group having 1 to 3 carbon atoms, and $m_{1c}$ represents an integer of 2 to 10), or saturated aliphatic group having 1 to 4 carbon atoms}, novolac resin, polyhydroxystyrene, and phenol resin represented by the following general formula (46):

[Chemical Formula 209]

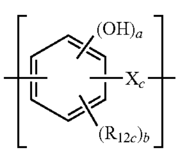

(46)

{wherein, a represents an integer of 1 to 3, b represents an integer of 0 to 3, 1≤(a+b)≤4, $R_{12c}$ represents a monovalent substituent selected from the group consisting of a monovalent organic group having 1 to 20 carbon atoms, halogen atom, nitro group and cyano group, a plurality of $R_{12c}$ may be the same or different in the case b is 2 or 3, and $X_c$ represents a divalent organic group selected from the group consisting of a divalent aliphatic group having 2 to 10 carbon atoms that may or may not have an unsaturated bond, divalent alicyclic group having 3 to 20 carbon atoms, divalent alkylene oxide group represented by the following general formula (47):

[Chemical Formula 210]

$$—C_pH_{2p}O— \quad (47)$$

(wherein, p represents an integer of 1 to 10), and a divalent organic group with an aromatic ring having 6 to 12 carbon atoms}.

[5] The method described in [4], wherein the photosensitive resin composition contains a phenol resin having a repeating unit represented by general formula (46), and Xc in general formula (46) is represented by a divalent group represented by the following general formula (48):

[Chemical Formula 211]

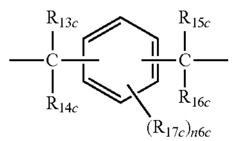

(48)

{wherein, $R_{13c}$, $R_{14c}$, $R_{15c}$ and $R_{16c}$ respectively and independently represent a hydrogen atom, monovalent aliphatic group having 1 to 10 carbon atoms, or monovalent aliphatic group having 1 to 10 carbon atoms in which all or a portion of the hydrogen atoms are substituted with fluorine atoms, $n_{6c}$ represents an integer of 0 to 4, $R_{17c}$ in the case $n_{6c}$ is an integer of 1 to 4 represents a halogen atom, hydroxyl group or monovalent organic group having 1 to 12 carbon atoms, at least one of $R_{6c}$ is a hydroxyl group, and a plurality of $R_{17c}$ may be mutually the same or different in the case $n_{6c}$ is an integer of 2 to 4}, and the following general formula (49):

[Chemical Formula 212]

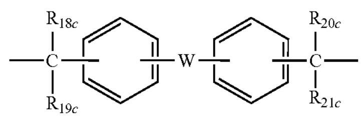

(49)

{wherein, $R_{18c}$, $R_{19c}$, $R_{20c}$ and $R_{21c}$ respectively and independently represent a hydrogen atom, monovalent aliphatic group having 1 to 10 carbon atoms, or monovalent aliphatic group having 1 to 10 carbon atoms in which all or a portion of the hydrogen atoms are substituted with fluorine atoms, and W represents a single bond, or a divalent group selected from the group consisting of aliphatic group having 1 to 10 carbon atoms optionally substituted with fluorine atoms, alicyclic group having 3 to 20 carbon atoms optionally substituted with fluorine atoms, divalent alkylene oxide group represented by the following general formula (47):

[Chemical Formula 213]

$$—C_pH_{2p}O— \quad (47)$$

(wherein, p represents an integer of 1 to 10), and a divalent group represented by the following formula (50)

[Chemical Formula 214]

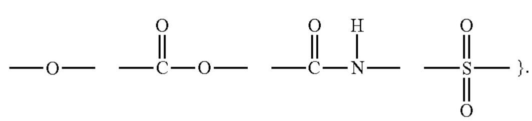

(50)

According to the fifth aspect of the present invention, a method can be provided for forming a rewiring layer demonstrating high adhesion between a Cu layer and resin layer by irradiating with microwaves during the course of curing a specific photosensitive resin composition.

<Photosensitive Resin Composition>

The present invention has as essential components thereof: (A) 100 parts by weight of at least one type of resin selected from the group consisting of polyamic acid ester, novolac resin, polyhydroxystyrene and phenol resin, and (B) 1 part by weight to 50 parts by weight of a photosensitizer based on 100 parts by weight of the resin (A).

Resin (A)

The following provides an explanation of the resin (A) used in the present invention. The resin (A) of the present invention has for the main component thereof at least one type of resin selected from the group consisting of polyamic acid ester, novolac resin, polyhydroxystyrene and phenol resin. Here, the main component refers to containing these resins at 60% by weight or more, and preferably at 80% by weight or more, based on the total amount of resin. In addition, other resins may be contained as necessary.

The weight average molecular weight of these resins as determined by gel permeation chromatography based on standard polystyrene conversion is preferably 1,000 or more and more preferably 5,000 or more from the viewpoints of heat resistance and mechanical properties following heat treatment. The upper limit is preferably 100,000 or less, and the case of using in the form of a photosensitive resin composition, the upper limit is more preferably 50,000 or less from the viewpoint of solubility with respect to the developer.

In the present invention, the resin (A) is a photosensitive resin in order to form a relief pattern. The photosensitive resin is a photosensitive resin composition used together with the photosensitizer (B) to be subsequently described that causes development by dissolving or not dissolving in the subsequent development step.

Polyamic acid ester, novolac resin, polyhydroxystyrene and phenol resin are used as photosensitive resins, and these photosensitive resins can be selected corresponding to the desired application, such as whether a negative-type or positive-type photosensitive resin composition is prepared together with the photosensitizer (B) to be subsequently described.

[Polyamic Acid Ester (A)]

One example of the most preferable resin (A) from the viewpoints of heat resistance and photosensitivity in the photosensitive resin composition of the present invention is a polyamic acid ester containing a structure represented by the general formula (40):

[Chemical Formula 215]

(40)

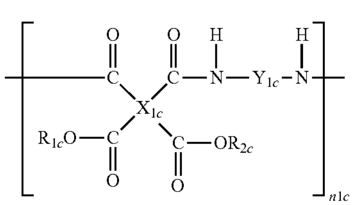

{wherein, $X_{1c}$ represents a tetravalent organic group, $Y_{1c}$ represents a divalent organic group, $n_{1c}$ represents an integer of 2 to 150 and $R_{1c}$ and $R_{2c}$ respectively and independently represent a hydrogen atom, monovalent organic group represented by the following general formula (41):

[Chemical Formula 216]

(41)

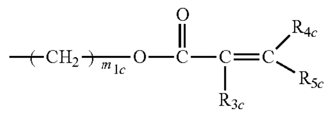

(wherein, $R_{3c}$, $R_{4c}$ and $R_{5c}$ respectively and independently represent a hydrogen atom or organic group having 1 to 3 carbon atoms, and $m_{1c}$ represents an integer of 2 to 10), or saturated aliphatic group having 1 to 4 carbon atoms}. The polyamic acid ester is converted to a polyimide by subjecting to cyclization treatment by heating (at, for example, 200° C. or higher). Thus, polyamic acid esters are also referred to as polyimide precursors. Polymide precursors are preferable for use in negative-type photosensitive resin compositions.

In the aforementioned general formula (40), the tetravalent organic group represented by $X_{1c}$ is preferably an organic group having 6 to 40 carbon atoms, and more preferably an aromatic group or alicyclic group having a —$COOR_{1c}$ group and a —$COOR_{2c}$ group at mutually ortho positions with a —CONH— group from the viewpoint of realizing both heat resistance and photosensitivity. Examples of the tetravalent organic group represented by $X_{1c}$ preferably include, but are not limited to, organic groups having 6 to 40 carbon atoms containing an aromatic ring, and more preferably structures represented by the following formula (90):

[Chemical Formula 217]

(90)

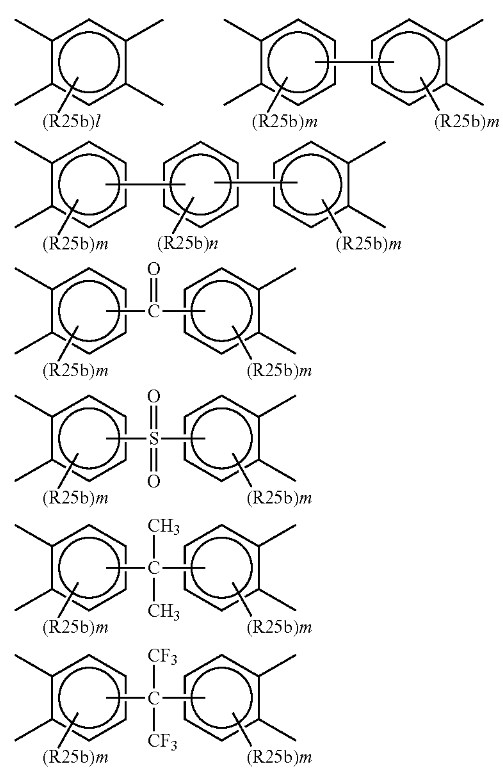

-continued

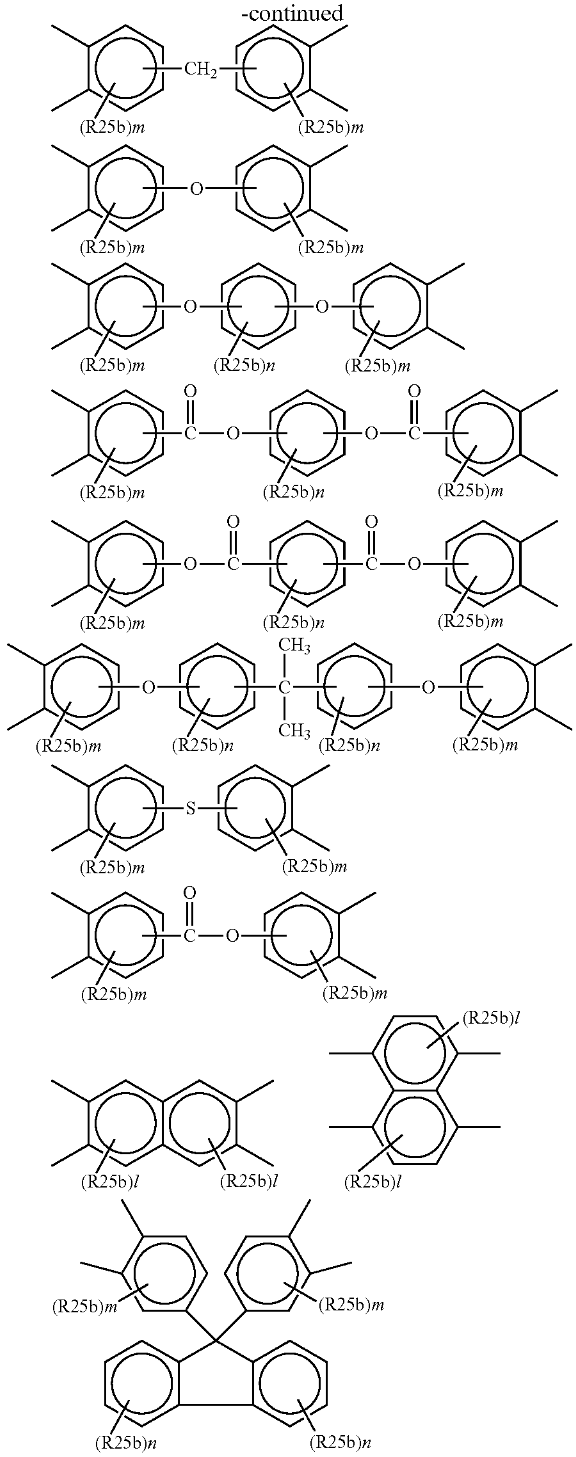

{wherein $R_{25b}$ represents a hydrogen atom, fluorine atom or monovalent group selected from hydrocarbon groups having 1 to 10 carbon atoms and fluorine-containing hydrocarbon groups having 1 to 10 carbon atoms, 1 represents an integer of 0 to 2, m represents an integer of 0 to 3 and n represents an integer of 0 to 4}. In addition, the structure of $X_{1C}$ may be one type or a combination of two or more types. Group $X_{1C}$ having a structure represented by the aforementioned formulas is particularly preferable from the viewpoint of realizing both heat resistance and photosensitivity.

From the viewpoint of realizing both heat resistance and photosensitivity, examples of the divalent organic group represented by $Y_{1c}$ in the aforementioned general formula (40) preferably include, but are not limited to, aromatic groups having 6 to 40 carbon atoms such as the structures represented by the following formula (91):

[Chemical Formula 218]

(91)

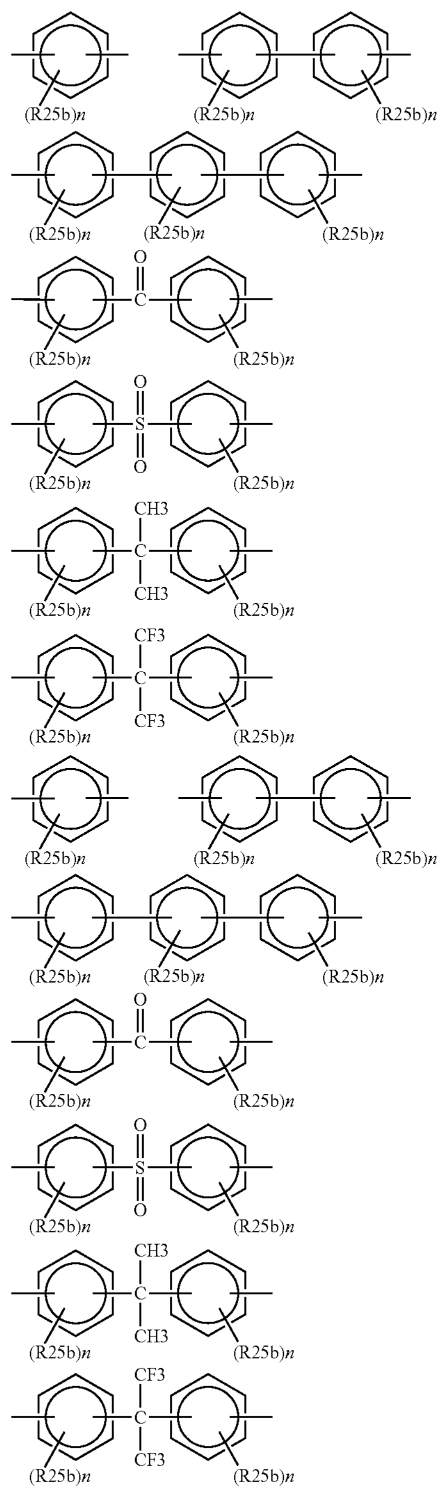

-continued

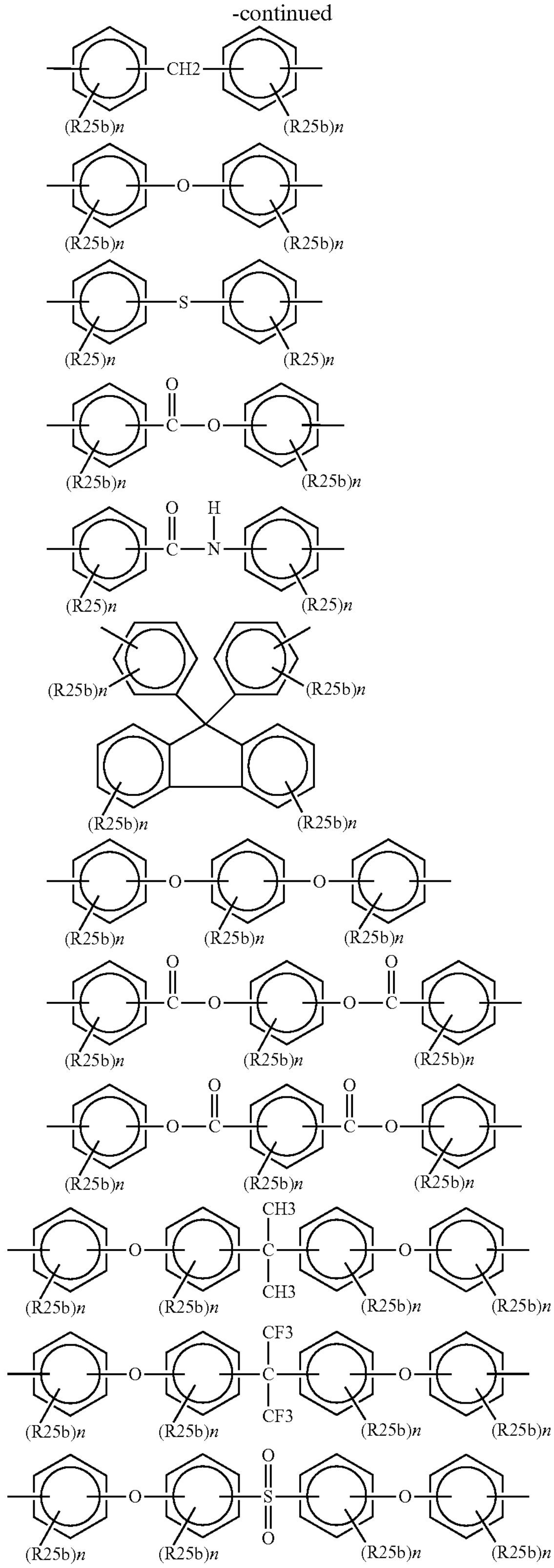

{wherein, $R_{25b}$ represents a hydrogen atom, fluorine atom or monovalent group selected from hydrocarbon groups having 1 to 10 carbon atoms and fluorine-containing hydrocarbon groups having 1 to 10 carbon atoms, m represents an integer of 0 to 3, and n represents an integer of 0 to 4}. In addition, the structure of $Y_{1c}$ may be one type or a combination of two or more types. Group $Y_{1c}$ having a structure represented by the aforementioned formula (91) is particularly preferable from the viewpoint of realizing both heat resistance and photosensitivity.

Group $R_{3c}$ in the aforementioned general formula (41) is preferably a hydrogen atom or methyl group, and $R_{4c}$ and $R_{5c}$ are preferably hydrogen atoms from the viewpoint of photosensitivity. In addition, $m_{1c}$ is an integer of 2 to 10, and preferably an integer of 2 to 4, from the viewpoint of photosensitivity.

The polyamic acid ester (A) is obtained by first preparing a partially esterified tetracarboxylic acid (to also be referred to as an acid/ester form) by reacting a tetracarboxylic dianhydride containing the aforementioned tetravalent organic group $X_{1c}$ with an alcohol having photopolymerizable unsaturated double bond, and optionally, a saturated aliphatic alcohol having 1 to 4 carbon atoms, followed by subjecting this to amide polycondensation with a diamine containing the aforementioned divalent organic group $Y_{1c}$.

(Preparation of Acid/Ester Form)

In the present invention, examples of the tetracarboxylic dianhydride containing the tetravalent organic group $X_{1c}$ preferably used to prepare the polyamic acid ester include, but are not limited to, acid dianhydrides represented by the aforementioned general formula (90) such as pyromellitic anhydride, diphenylether-3,3',4,4'-tetracarboxylic dianhydride, benzophenone-3,3',4,4'-tetracarboxylic dianhydride, biphenyl-3,3'4,4'-tetracarboxylic dianhydride, diphenylphosphone-3,3',4,4'-tetracarboxylic dianhydride, diphenylmethane-3,3'4,4'-tetracarboxylic dianhydride, 2,2-bis(3,4-phthalic anhydride)propane or 2,2-bis(3,4-phthalic anhydride)-1,1,1,3,3,3-hexafluoropropane, while preferable examples include, but are not limited to, pyromellitic anhydride, diphenylether-3,3',4,4'-tetracarboxylic dianhydride, benzophenone-3,3',4,4'-tetracarboxylic dianhydride and biphenyl-3,3'4,4'-tetracarboxylic dianhydride. In addition, these may be used alone or two or more types may be used as a mixture.

In the present invention, examples of alcohols having a photopolymerizable unsaturated double bond preferably used to prepare the polyamic acid ester include 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butyoxypropyl acrylate, 2-hydroxy-3-phenoxypropyl acrylate, 2-hydroxy-3-butoxypropyl acrylate, 2-hydroxy-3-t-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, methylol vinyl ketone, 2-hydroxyethyl vinyl ketone, 2-hydroxy-3-methoxyopropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-t-butoxypropyl methacrylate and 2-hydroxy-3-cyclohexyloxypropyl methacrylate.

Saturated aliphatic alcohols having 1 to 4 carbon atoms, such as methanol, ethanol, n-propanol, isopropanol, n-butanol or tert-butanol, can be partially mixed and used for the aforementioned alcohols.

A desired acid/ester form can be obtained by carrying out an acid anhydride esterification reaction by dissolving and mixing the aforementioned preferable tetracarboxylic dianhydride of the present invention with an aforementioned alcohol in the presence of a base catalyst such as pyridine and in a solvent to be subsequently described followed by stirring for 4 to 10 hours at a temperature of 20° C. to 50° C.

[Preparation of Polyamic Acid Ester]

The target polyimide precursor can be obtained by adding a suitable dehydration condensation agent, such as dicyclocarbodiimide, 1-ethoxycarbonyl-2-ethoxy-1,2-dihydroquinoline, 1,1-carbonyldioxy-di-1,2,3-benzotriazole or N,N'-disuccinimidyl carbonate, to the aforementioned acid/ester form (typically in the form of a solution dissolved in the aforementioned reaction solvent) while cooling with ice and mixing therewith to convert the acid/ester form to a polyacid anhydride, and dropping in a solution or dispersion of a diamine containing the divalent organic group $Y_{1c}$ preferably used in the present invention dissolved or dispersed in a different solvent followed by amide polycondensation. Alternatively, the target polyimide precursor can be obtained by converting the acid moiety of the aforementioned acid/ester form to an acid chloride using thionyl chloride and the like, followed by reacting with a diamine compound in the presence of a base such as pyridine.

Examples of diamines containing the divalent organic group $Y_{1c}$ preferably used in the present invention include diamines represented by the aforementioned general formula (II), and examples of specific compounds include, but are not limited to, p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'-diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl] ether, bis[4-(3-aminophenoxy)phenyl] ether, 1,4-bis(4-aminophenyl)benzene, 1,3-bis(4-aminophenyl)benzene, 9,10-bis(4-aminophenyl)anthracene, 2,2-bis(aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, ortho-toluidine sulfone and 9,9-bis(4-aminophenyl)fluorene, those in which a portion of the hydrogen atoms on the benzene ring thereof is substituted with a substituent, such as a methyl group, ethyl group, hydroxymethyl group, hydroxyethyl group or halogen atom, such as 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, 2,2'-dimethylbenzidine, 2,2'-bis(trifluoromethyl)-4,4'-diaminobiphenyl, 2,2'-bis(fluoro)-4,4'-diaminobiphenyl or 4,4'-diaminooctafluorobiphenyl, and preferably p-phenylenediamine, m-phenylenediamine, 4,4'-diaminodiphenyl ether, 2,2'-dimethylbenzidine, 2,2'-bis(trifluoromethyl)-4,4'-diaminobiphenyl, 2,2'-bis(fluoro)-4,4'-diaminobiphenyl or 4,4'-diaminooctafluorobiphenyl, and mixtures thereof.

Diaminosiloxanes such as 1,3-bis(3-aminopropyl)tetramethyldisiloxane or 1,3-bis(3-aminopropyl)tetraphenyldisiloxane can be copolymerized when preparing the polyamic acid ester for the purpose of improving adhesion between various types of substrates and a resin layer formed on the substrate by coating the substrate with the photosensitive resin composition of the present invention.

Following completion of the amide polycondensation reaction, after filtering out absorption byproducts of the dehydration condensation agent also present in the reaction solution as necessary, a suitable poor solvent such as water, an aliphatic lower alcohol or a mixture thereof is added to the resulting polymer component to precipitate the polymer component followed by purifying the polymer by repeating re-dissolution and re-precipitation procedures as necessary and vacuum drying to isolate the target polyamic acid ester. In order to improve the degree of purification, a solution of this polymer may be passed through a column packed with an anion exchange resin and/or cation exchange resin swollen with a suitable organic solvent to remove any ionic impurities.

The molecular weight of the aforementioned polyamic acid ester in the case of measuring by gel permeation chromatography based on standard polystyrene conversion is preferably 8,000 to 150,000 and more preferably 9,000 to 50,000. Mechanical properties are favorable in the case of a weight average molecular weight of 8,000 or more, while dispersibility in developer and resolution of the relief pattern are favorable in the case of a weight average molecular weight of 150,000 or less. The use of tetrahydrofuran or N-methyl-2-pyrrolidone is recommended for the developing solvent during gel permeation chromatography. In addition, weight average molecular weight is determined from a calibration curve prepared using standard monodisperse polystyrene. The standard monodisperse polystyrene is recommended to be selected from the organic solvent-based standard sample STANDARD SM-105 manufactured by Showa Denko K.K.

(Novolac Resin (A))

In the present disclosure, novolac resin refers to all polymers obtained by condensing a phenol and formaldehyde in the presence of a catalyst. In general, novolac resin can be obtained by condensing less than 1 mole of formaldehyde to 1 mole of phenol. Examples of the aforementioned phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol and β-naphthol. Specific examples of novolac resins include phenol/formaldehyde condensed novolac resin, cresol/formaldehyde condensed novolac resin and phenol-naphthol/formaldehyde condensed novolac resin.

The weight average molecular weight of the novolac resin is preferably 700 to 100,000, more preferably 1,500 to 80,000 and even more preferably 2,000 to 50,000. The weight average molecular weight is preferably 700 or more from the viewpoint of applicability to reflow treatment of the cured film, while on the other hand, the weight average molecular weight is preferably 100,000 or less from the viewpoint of alkaline solubility of the photosensitive resin composition.

(Polyhydroxystyrene (A))

In the present disclosure, polyhydroxystyrene refers to all polymers containing hydroxystyrene as a polymerized unit. A preferable example of a polyhydroxystyrene is poly(para-vinyl)phenol. Poly(para-vinyl) phenol refers to all polymers containing para-vinyl phenol as a polymerized unit. Thus, a polymerized unit other than hydroxystyrene (such as para-vinyl phenol) can be used to compose the hydroxystyrene (such as poly(para-vinyl) phenol) provided it is not inconsistent with the object of the present invention. The ratio of the number of moles of hydroxystyrene units in the polyhydroxystyrene based on the total number of moles of polymerized units is preferably 10 mol % to 99 mol %, more preferably 20 mol % to 97 mol %, and even more preferably 30 mol % to 95 mol %. The case of this ratio being 10 mol % or more is advantageous from the viewpoint of alkaline solubility of the photosensitive resin composition, while the case of this ratio being 99 mol % or less is advantageous from the viewpoint of the applicability of reflow treatment to a cured film obtained by curing a composition containing a copolymer component to be subsequently described. A polymerized unit other than a hydroxystyrene (such as para-vinyl phenol) can be any arbitrary polymerized unit able to copolymerize with a hydroxystyrene (such as para-vinyl phenol). Examples of copolymer components that yield a polymerized unit other than a hydroxystyrene (such as para-vinyl phenol) include, but are not limited to, esters of acrylic acid such as methyl acrylate, methyl methacrylate, hydroxyethyl acrylate, butyl methacrylate, octyl acrylate, 2-ethoxyethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, 2,2-di-(p-hydroxyphenyl)propane dimethacrylate, triethylene glycol diacrylate, polyoxyethyl-2,2-di(p-hydroxyphenyl)propane dimethacrylate, triethylene glycol dimethacrylate, polyoxypropyltrimethyololpropane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenylethylene-1,2-dimethacrylate, pentaerythritol tetramethacrylate, trimethylolpropane trimethacrylate, 1,5-pentanediol dimethacrylate or 1,4-benzenediol dimethacrylate, styrene, and substituted styrenes in the manner of 2-methylstyrene or vinyltoluene, vinyl ester monomers such as vinyl acrylate or vinyl methacrylate, and o-vinylphenol and m-vinylphenol.

In addition, one type of the novolac resin and polyhydroxystyrene explained above can be used or two or more types can be used in combination.

The weight average molecular weight of the polyhydroxystyrene is preferably 700 to 100,000, more preferably 1,500 to 80,000 and even more preferably 2,000 to 50,000. The weight average molecular weight is preferably 700 or more from the viewpoint of applicability to reflow treatment of the cured film, while on the other hand, the weight average molecular weight is preferably 100,000 or less from the viewpoint of alkaline solubility of the photosensitive resin composition.

(Phenol Resins (A) Represented by General Formula (46))

In the present embodiment, the phenol resin (A) preferably also contains a phenol resin having a repeating unit represented by the following general formula (46):

[Chemical Formula 219]

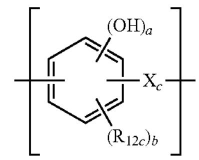

(46)

{wherein, a represents an integer of 1 to 3, b represents an integer of 0 to 3, $1 \leq (a+b) \leq 4$, $R_{12c}$ represents a monovalent substituent selected from the group consisting of a monovalent organic group having 1 to 20 carbon atoms, halogen atom, nitro group and cyano group, a plurality of $R_{12c}$ may be mutually the same or different in the case b is 2 or 3, and $X_c$ represents a divalent organic group selected from the group consisting of a divalent aliphatic group having 2 to 10 carbon atoms that may or may not have an unsaturated bond, divalent alicyclic group having 3 to 20 carbon atoms, divalent alkylene oxide group represented by the following general formula (47):

[Chemical Formula 220]

$$—C_pH_{2p}O— \quad (47)$$

(wherein, p represents an integer of 1 to 10), and divalent organic group having an aromatic ring having 6 to 12 carbon atoms}. A phenol resin having the aforementioned repeating unit can be cured at a lower temperature in comparison with conventionally used polyimide resin or polybenzoxazole resin, for example, and is particularly advantageous from the viewpoint of allowing the formation of a cured film having favorable elongation. One type of the aforementioned repeating unit can be present in a phenol resin molecule or a combination of two or more types can be present.

In the aforementioned general formula (46), $R_{12c}$ represents a monovalent substituent selected from the group consisting of a monovalent organic group having 1 to 20 carbon atoms, halogen atom, nitro group and cyano group from the viewpoint of reactivity when synthesizing a resin according to general formula (46). From the viewpoint of alkaline solubility, $R_{12c}$ preferably represents a monovalent substituent selected from the group consisting of a halogen atom, nitro group, cyano group, aliphatic group having 1 to 10 carbon atoms which may or may not have an unsaturated bond, aromatic group having 6 to 20 carbon atoms, and the four groups represented by the following general formula (160):

[Chemical Formula 221]

(160)

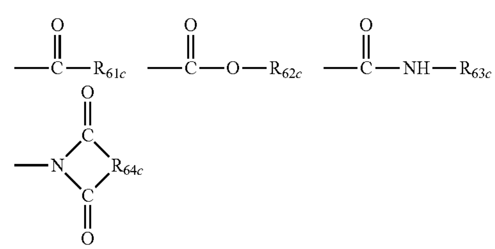

{wherein, $R_{61c}$, $R_{62c}$ and $R_{63c}$ respectively and independently represent a hydrogen atom, aliphatic group having 1 to 10 carbon atoms which may or may not have an unsaturated bond, alicyclic group having 3 to 20 carbon atoms or aromatic group having 6 to 20 carbon atoms, and $R_{64c}$ represents a divalent aliphatic group having 1 to 10 carbon atoms which may or may not have an unsaturated bond, divalent alicyclic group having 3 to 20 carbon atoms, or divalent aromatic group having 6 to 20 carbon atoms}.

In the present embodiment, in the aforementioned general formula (46), although a represents an integer of 1 to 3, a is preferably 2 from the viewpoints of alkaline solubility and elongation. In addition, in the case a is 2, the substituted locations of hydroxyl groups may be any of the ortho, meta or para positions. In the case a is 3, substituted locations of hydroxyl groups may be at the 1,2,3-positions, 1,2,4-positions or 1,3,5-positions.

In the present embodiment, in the aforementioned general formula (46), since alkaline solubility improves in the case a is 1, a phenol resin selected from a novolac resin and polyhydroxystyrene (to also be referred to as resin (a2)) can be further mixed with the phenol resin having a repeating unit represented by general formula (46) (to also be referred to as resin (a1)).

The mixing ratio between resin (a1) and resin (a2) in terms of the weight ratio thereof is preferably such that (a1)/(a2) is within the range of 10/90 to 90/10. This mixing ratio is such that (a1)/(a2) is preferably within the range of 10/90 to 90/10, more preferably within the range of 20/80 to 80/20, and even more preferably within the range of 30/70 to 70/30 from the viewpoints of solubility in an aqueous alkaline solution and elongation of the cured film.

The same resins as those indicated in the aforementioned sections on Novolac Resin and Polyhydroxystyrene can be used for the novolac resin and polyhydroxystyrene of the aforementioned resin (a2).

In the present embodiment, in the aforementioned general formula (46), although b represents an integer of 0 to 3, b is preferably 0 or 1 from the viewpoint of alkaline solubility and elongation. In addition, a plurality of $R_{12c}$ may be mutually the same or different in the case b is 2 or 3.

Moreover, in the present embodiment, in the aforementioned general formula (46), a and b satisfy the relationship $1 \leq (a+b) \leq 4$.

In the present embodiment, in the aforementioned general formula (46), $X_c$ represents a divalent organic group selected from the group consisting of a divalent aliphatic group having 2 to 10 carbon atoms that may or may not have an unsaturated bond, divalent alicyclic group having 3 to 20 carbon atoms, alkylene oxide group represented by the aforementioned general formula (47) and divalent organic group having an aromatic ring having 6 to 12 carbon atoms from the viewpoint of the form of a cured relief pattern and elongation of a cured film. Among these divalent organic groups, from the viewpoint of film toughness after curing, $X_c$ preferably represents a divalent organic group selected from the group consisting of a divalent group represented by the following general formula (48):

[Chemical Formula 222]

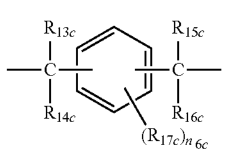
(48)

{wherein, $R_{13c}$, $R_{14c}$, $R_{15c}$ and $R_{16c}$ respectively and independently represent a hydrogen atom, monovalent aliphatic group having 1 to 10 carbon atoms or monovalent aliphatic group having 1 to 10 carbon atoms in which all or a portion of the hydrogen atoms are substituted with fluorine atoms, $n_{6c}$ represents an integer of 0 to 4, and in the case $n_{6c}$ represents an integer of 1 to 4, $R_{17c}$ represents a halogen atom, hydroxyl group or monovalent organic group having 1 to 12 carbon atoms, at least one of $R_{17c}$ is a hydroxyl group, and a plurality of $R_{17c}$ may be mutually the same or different in the case $n_{6c}$ is an integer of 2 to 4}, and a divalent group represented by the following general formula (49):

[Chemical Formula 223]

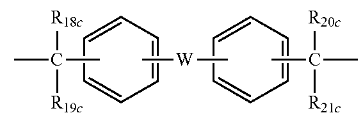
(49)

{wherein, $R_{18c}$, $R_{19c}$, $R_{20c}$ and $R_{21c}$ respectively and independently represent a hydrogen atom, monovalent aliphatic group having 1 to 10 carbon atoms or monovalent aliphatic group having 1 to 10 carbon atoms in which all or a portion of the hydrogen atoms are substituted with fluorine atoms, W represents a single bond, aliphatic group having 1 to 10 carbon atoms optionally substituted with fluorine atoms, alicyclic group having 3 to 20 carbon atoms optionally substituted with fluorine atoms, divalent alkylene oxide group represented by the following general formula (47):

[Chemical Formula 224]

$$—C_pH_{2p}O— \quad (47)$$

(wherein, p represents an integer of 1 to 10), and a divalent organic group selected from the group consisting of divalent groups represented by the following formula (50)

[Chemical Formula 225]

(50)

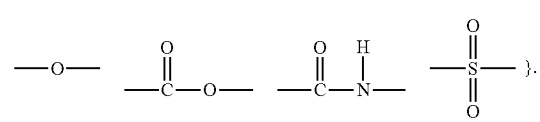

The number of carbon atoms of the aforementioned divalent organic group having an aromatic ring having 6 to 12 carbon atoms is preferably 8 to 75 and more preferably 8 to 40. Furthermore, the structure of the aforementioned divalent organic group having an aromatic ring having 6 to 12 carbon atoms typically differs from a structure in the aforementioned general formula (46) in which the OH group and any $R_{12c}$ group are bound to the aromatic ring.

Moreover, from the viewpoints of pattern formability of a resin composition and elongation of a cured film after curing, the divalent organic group represented by the aforementioned general formula (50) is more preferably a divalent organic group represented by the following formula (161):

[Chemical Formula 226]

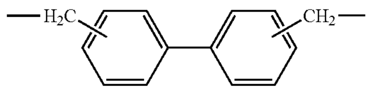

(161)

and particularly preferably a divalent organic group represented by the following formula (162).

[Chemical Formula 227]

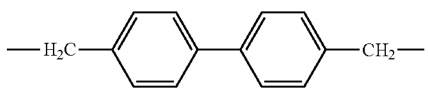

(162)

Among the structures represented by general formula (46), a structure in which $X_c$ is represented by the aforementioned formula (161) or (162) is particularly preferable, the ratio of sites represented by a structure in which $X_c$ is represented by formula (161) or formula (162) is preferably 20% by weight or more and more preferably 30% by weight or more from the viewpoint of elongation. The aforementioned ratio is preferably 80% by weight or less, and more preferably 70% by weight or less, from the viewpoint of alkaline solubility of the composition.

In addition, among the phenol resins having a structure represented by the aforementioned general formula (46), a structure having both a structure represented by the following general formula (163) and a structure represented by the following general formula (164) within the same resin backbone is particularly preferable from the viewpoints of alkaline solubility of the composition and elongation of a cured film.

The following general formula (163) is represented by:

[Chemical Formula 228]

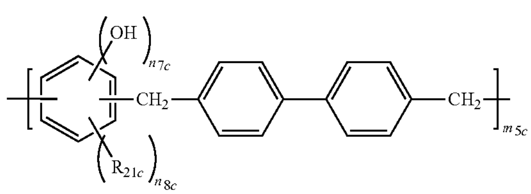

(163)

{wherein, $R_{21c}$ represents a monovalent group having 1 to 10 carbon atoms selected from the group consisting of hydrocarbon groups and alkoxy groups, $n_{7c}$ represents an integer of 2 or 3, $n_{8c}$ represents an integer of 0 to 2, $m_{5c}$ represents an integer of 1 to 500, $2 \leq (n_{7c}+n_{8c}) \leq 4$, and in the case $n_{8c}$ is 2, a plurality of $R_{21c}$ may be mutually the same or different}, and the following general formula (164) is represented by:

[Chemical Formula 229]

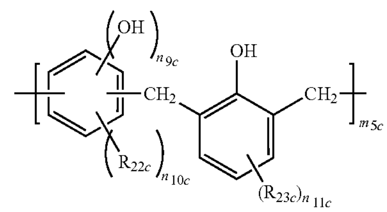

(164)

{wherein, $R_{22c}$ and $R_{23c}$ respectively and independently represent a monovalent group having 1 to 10 carbon atoms selected from the group consisting of hydrocarbon groups and alkoxy groups, $n_{9c}$ represents an integer of 1 to 3, $n_{10c}$ represents an integer of 0 to 2, $n_{11c}$ represents an integer of 0 to 3, $m_{6c}$ represents an integer of 1 to 500, $2 \leq (n_{9c}+n_{10c}) \leq 4$, in the case $n_{10c}$ is 2, a plurality of $R_{22c}$ may be mutually the same or different, and in the case $n_{11c}$ is 2 or 3, a plurality of $R_{23c}$ may be mutually the same or different}.

$m_{5c}$ in the aforementioned general formula (163) and $m_{6c}$ in the aforementioned general formula (164) respectively indicate the total number of repeating units in the main chain of a phenol resin. Namely, the repeating unit indicated in brackets in the structure represented by the aforementioned general formula (163) and the repeating unit indicated in brackets in the structure represented by the aforementioned general formula (164) in the main chain of the phenol resin (A) can be arranged randomly, in blocks or in a combination thereof. $m_{5c}$ and $m_{6c}$ respectively and independently represent an integer of 1 to 500, the lower limit thereof is preferably 2 and more preferably 3, and the upper limit thereof is preferably 450, more preferably 400 and even more preferably 350. $m_{5c}$ and $m_{6c}$ are respectively and independently preferably 2 or more from the viewpoint of film toughness after curing and preferably 450 or less from the viewpoint of solubility in an aqueous alkaline solution. The sum of $m_{5c}$ and $m_{6c}$ is preferably 2 or more, more preferably 4 or more and even more preferably 6 or more from the viewpoint of film toughness after curing, and preferably 200 or less, more preferably 175 or less and even more preferably 150 or less from the viewpoint of solubility in an aqueous alkaline solution.

In the aforementioned phenol resin (A) having both a structure represented by the aforementioned general formula (163) and a structure represented by the aforementioned general formula (164) in the same resin backbone, a higher molar ratio of the structure represented by general formula (163) results in better film properties after curing and superior heat resistance, while on the other hand, a higher molar ratio of the structure represented by general formula (164) results in better alkaline solubility and superior pattern form after curing. Thus, the ratio $m_{5c}/m_{6c}$ of the structure represented by general formula (163) to the structure represented by general formula (164) is preferably 20/80 or more, more preferably 40/60 or more and particularly preferably 50/50 or more from the viewpoint of film properties after curing, and is preferably 90/10 or less, more preferably 80/20 or less and even more preferably 70/30 or less from the viewpoint of alkaline solubility and form of the cured relief pattern.

A phenol resin having a repeating unit represented by the aforementioned general formula (46) typically contains a phenol compound and a copolymer component (and more specifically, one or more types of compounds selected from the group consisting of a copolymer component (and more specifically, a compound having an aldehyde group (including a compound that forms an aldehyde compound following decomposition in the manner of trioxane), a compound having a ketone group, a compound having two methylol groups in a molecule thereof, a compound having two alkoxymethyl groups in a molecule thereof, and a compound having two haloalkyl groups in a molecule thereof), and more typically, can be synthesized by subjecting these monomer components to a polymerization reaction. For example, a copolymer component such as an aldehyde compound, ketone compound, methylol compound, alkoxymethyl compound, diene compound or haloalkyl compound can be polymerized with a phenol and/or phenol derivative like that indicated below (to also be collectively referred to as a "phenol compound") to obtain the phenol resin (A). In this case, the moiety in the aforementioned general formula (46) represented by a structure, in which an OH group and an arbitrary $R_{12c}$ group are bound to an aromatic ring, is derived from the aforementioned phenol compound, while the moiety represented by $X_c$ is derived from the aforementioned copolymer component. The charged molar ratio between the phenol compound and the aforementioned copolymer component is such that (phenol compound):(copolymerization component) is preferably 5:1 to 1.01:1 and more preferably 2.5:1 to 1.1:1 from the viewpoints of controlling the reaction and stability of the resulting phenol resin (A) and photosensitive resin composition.

The weight average molecular weight of the phenol resin having a repeating unit represented by general formula (46) is preferably 700 to 100,000, more preferably 1,500 to 80,000, and even more preferably 2,000 to 50,000. The weight average molecular weight is preferably 700 or more from the viewpoint of the applicability to reflow treatment of the cured film, while on the other hand, the weight average molecular weight is preferably 100,000 or less from the viewpoint of alkaline solubility of the photosensitive resin composition.

Examples of phenol compounds that can be used to obtain a phenol resin having a repeating unit represented by general formula (46) include cresol, ethylcresol, propylphenol, butylphenol, amylphenol, cyclohexylphenol, hydroxyphenol, benzylphenol, nitrobenzylphenol, cyanobenzylphenol, adamantanephenol, nitrophenol, fluorophenol, chlorophenol, bromophenol, trifluoromethylphenol, N-(hydroxyphenyl)-5-norbornene-2,3-dicarboximide, N-(hydroxyphenyl-5-methyl-5-norbornene-2,3-dicarboximide, trifluoromethylphenol, hydroxybenzoate, methyl hydroxybenzoate, ethyl hydroxybenzoate, benzyl hydroxybenzoate, hydroxybenzamide, hydroxybenzaldehyde, hydroxyacetophenone, hydroxybenzophenone, hydroxybenzonitrile, resorcinol, xylenol, catechol, methyl catechol, ethyl catechol, hexyl catechol, benzyl catechol, nitrobenzyl catechol, methyl resorcinol, ethyl resorcinol, hexyl resorcinol, benzyl resorcinol, nitrobenzyl resorcinol, hydroquinone, caffeic acid, dihydroxybenzoate, methyl dihydroxybenzoate, ethyl dihydroxybenzoate, butyl dihydroxybenzoate, propyl dihydroxybenzoate, benzyl dihydroxybenzoate, dihydroxybenzamide, dihydroxybenzaldehyde, dihydroxyacetophenone, dihydroxybenzophenone, dihydroxybenzonitrile, N-(dihydroxyphenyl)-5-norbornene-2,3-dicarboximide, N-(dihydroxyphenyl)-5-methyl-5-norbornene-2,3-dicarboximide, nitrocatechol, fluorocatechol, chlorocatechol, bromocatechol, trifluoromethylcatechol, nitroresorcinol, fluororesorcinol, chlororesorcinol, bromoresorcinol, trifluoromethylresorcinol, pyrogallol, phloroglucinol, 1,2,4-trihydroxybenzene, trihydroxybenzoic acid, methyl trihydroxybenzoate, ethyl trihydroxybenzoate, butyl trihydroxybenzoate, propyl trihydroxybenzoate, benzyl trihydroxybenzoate, trihydroxybenzamide, trihydroxybenzaldehyde, trihydroxyacetophenone, trihydroxybenzophenone and trihydroxybenzonitrile.

Examples of the aforementioned aldehyde compound include acetoaldehyde, propionaldehyde, pivalaldehyde, butylaldehyde, pentanal, hexanal, trioxane, glyoxal, cyclohexyl aldehyde, diphenylacetaldehyde, ethylbutylaldehyde, benzaldehyde, glyoxylic acid, 5-norbornene-2-carboxyaldehyde, malondialdehyde, succindialdehyde, glutaraldehyde, salicylaldehyde, naphthoaldehyde and terephthalaldehyde.

Examples of the aforementioned ketone compound include acetone, methyl ethyl ketone, diethyl ketone, dipropyl ketone, dicyclohexyl ketone, dibenzyl ketone, cyclopentanone, cyclohexanone, bicyclohexanone, cyclohexanedione, 3-butyn-2-one, 2-norbornanone, adamantanone and 2,2-bis(4-oxocyclohexyl)propane.

Examples of the aforementioned methylol compound include 2,6-bis(hydroxymethyl)-p-cresol, 2,6-bis(hydroxymethyl)-4-ethylphenol, 2,6-bis(hydroxymethyl)-4-propylphenol, 2,6-bis(hydroxymethyl)-4-n-butylphenol, 2,6-bis(hydroxymethyl)-4-t-butylphenol, 2,6-bis(hydroxymethyl)-4-methoxyphenol, 2,6-bis(hydroxymethyl)-4-ethoxyphenol, 2,6-bis(hydroxymethyl)-4-propoxyphenol, 2,6-bis(hydroxymethyl)-4-n-butoxyphenol, 2,6-bis(hydroxymethyl)-4-t-butoxyphenol, 1,3-bis(hydroxymethyl) urea, ribitol, arabitol, allitol, 2,2-bis(hydroxymethyl)butyric acid, 2-benzyloxy-1,3-propanediol, 2,2-dimethyl-1,3-propanediol, 2,2-diethyl-1,3-propanediol, monoacetin, 2-methyl-2-nitro-1,3-propanediol, 5-norbornene-2,2-dimethanol, 5-norbornene-2,3-dimethanol, pentaerythritol, 2-phenyl-1,3-propanediol, trimethylolethane, trimethylolpropane, 3,6-bis(hydroxymethyl)durene, 2-nitro-p-xylylene glycol, 1,10-dihydroxydecane, 1,12-dihydroxydodecane, 1,4-bis(hydroxymethyl)cyclohexane, 1,4-bis(hydroxymethyl)cyclohexene, 1,6-bis(hydroxymethyl)adamantane, 1,4-benzenedimethanol, 1,3-benzenedimethanol, 2,6-bis(hydroxymethyl)-1,4-dimethoxybenzene, 2,3-bis(hydroxymethyl)naphthalene, 2,6-bis(hydroxymethyl)naphthalene, 1,8-bis(hydroxymethyl)anthracene, 2,2'-bis(hydroxymethyl)diphenyl ether, 4,4'-bis(hydroxymethyl)diphenyl ether, 4,4'-bis(hydroxymethyl)diphenyl thioether, 4,4'-bis(hydroxymethyl)benzophenone, 4-hydroxymethylbenzoate-4'-hydroxymethylphenyl, 4-hydroxymethylbenzoate-4'-hydroxymethylanilide, 4,4'-bis(hydroxymethyl)phenyl urea, 4,4'-bis(hydroxymethyl)phenyl urethane, 1,8-bis(hydroxymethyl)anthracene, 4,4'-bis(hydroxymethyl)biphenyl, 2,2'-dimethyl-4,4'-bis(hydroxymethyl)biphenyl, 2,2-bis(4-hydroxymethylphenyl)propane, ethylene glycol, diethylene glycol, triethylene glycol, tetraethylene glycol, propylene glycol, dipropylene glycol, tripropylene glycol and tetrapropylene glycol.

Examples of the aforementioned alkoxymethyl compound include 2,6-bis(methoxymethyl)-p-cresol, 2,6-bis(methoxymethyl)-4-ethylphenol, 2,6-bis(methoxymethyl)-4-propylphenol, 2,6-bis(methoxymethyl)-4-n-butylphenol, 2,6-bis(methoxymethyl)-4-t-butylphenol, 2,6-bis(methoxymethyl)-4-methoxyphenol, 2,6-bis(methoxymethyl)-4-ethoxyphenol, 2,6-bis(methoxymethyl)-4-propoxyphenol, 2,6-bis(methoxymethyl)-4-n-butoxyphenol, 2,6-bis(methoxymethyl)-4-t-butoxyphenol, 1,3-bis(methoxymethyl) urea, 2,2-bis(methoxymethyl) butyric acid, 2,2-bis(methoxymethyl)-5-norbornene, 2,3-bis(methoxymethyl)-5-norbornene, 1,4-bis(methoxymethyl) cyclohexane, 1,4-bis(methoxymethyl)cyclohexene, 1,6-bis (methoxymethyl)adamantane, 1,4-bis(methoxymethyl) benzene, 1,3-bis(methoxymethyl)benzene, 2,6-bis (methoxymethyl)-1,4-dimethoxybenzene, 2,3-bis (methoxymethyl)naphthalene, 2,6-bis(methoxymethyl) naphthalene, 1,8-bis(methoxymethyl)anthracene, 2,2'-bis (methoxymethyl)diphenyl ether, 4,4'-bis(methoxymethyl) diphenyl ether, 4,4'-bis(methoxymethyl)diphenyl thioether, 4,4'-bis(methoxymethyl)benzophenone, 4-methoxymethyl-benzoate-4'-methoxymethylphenyl, 4-methoxymethylbenzoate-4'-methoxymethylanilide, 4,4'-bis(methoxymethyl) phenyl urea, 4,4'-bis(methoxymethyl)phenyl urethane, 1,8-bis(methoxymethyl)anthracene, 4,4'-bis(methoxymethyl) biphenyl, 2,2'-dimethyl-4,4'-bis(methoxymethyl)biphenyl, 2,2-bis(methoxymethylphenyl)propane, ethylene glycol dimethyl ether, diethylene glycol dimethyl ether, triethylene glycol dimethyl ether, tetraethylene glycol dimethyl ether, propylene glycol dimethyl ether, dipropylene glycol dimethyl ether, tripropylene glycol dimethyl ether and tetrapropylene glycol dimethyl ether.

Examples of the aforementioned diene compound include butadiene, pentadiene, hexadiene, heptadiene, octadiene, 3-methyl-1,3-butadiene, 1,3-butanediol dimethacrylate, 2,4-hexadien-1-ol, methylcyclohexadiene, cyclopentadiene, cyclohexadiene, cycloheptadiene, cyclooctadiene, dicyclopentadiene, 1-hydroxydicyclopentadiene, 1-methylcyclopentadiene, methyldicyclopentadiene, diallyl ether, diallyl sulfide, diallyl adipate, 2,5-norbornadiene, tetrahydroindene, 5-ethylidene-2-norbornene, 5-vinyl-2-norbornene, triallyl cyanurate, diallyl isocyanurate, triallyl isocyanurate and diallylpropyl isocyanurate.

Examples of the aforementioned haloalkyl compound include xylene dichloride, bis(chloromethyl)dimethoxybenzene, bis(chloromethyl)durene, bis(chloromethyl)biphenyl, bis(chloromethyl)biphenyl carboxylic acid, bis(chloromethyl)biphenyl dicarboxylic acid, bis(chloromethyl)methylbiphenyl, bis(chloromethyl)dimethylbiphenyl, bis(chloromethyl)anthracene, ethylene glycol bis(chloroethyl) ether, diethylene glycol bis(chloroethyl) ether, triethylene glycol bis(chloroethyl) ether and tetraethylene glycol bis(chloroethyl) ether.

Although the phenol resin (A) can be obtained by condensing the previously described phenol compound and copolymer component by dehydrating, dehydrohalogenating or dealcoholizing, or by copolymerizing while cleaving unsaturated bonds, a catalyst may also be used during polymerization. Examples of acid catalysts include hydrochloric acid, sulfuric acid, nitric acid, phosphoric acid, phosphorous acid, methanesulfonic acid, p-toluenesulfonic acid, dimethyl sulfate, diethyl sulfate, acetic acid, oxalic acid, 1-hydroxyethylidene-1,1'-diphosphonic acid, zinc acetate, boron trifluoride, boron trifluoride-phenol complex and boron trifluoride-ether complex. On the other hand, examples of alkaline catalysts include lithium hydroxide, sodium hydroxide, potassium hydroxide, calcium hydroxide, barium hydroxide, sodium carbonate, triethylamine, pyridine, 4-N,N-dimoethylaminopyridine, piperidine, piperazine, 1,4-diazabicyclo[2.2.2]octane, 1,8-diazabicyclo [5.4.0]-7-undecene, 1,5-diazabicyclo[4.3.0]-5-nonene, ammonia and hexamethylenetetramine.

The amount of catalyst used to obtain a phenol resin having a repeating structure represented by general formula (46) is preferably within the range of 0.01 mol % to 100 mol % based on 100 mol % for the total number of moles of the copolymer component (namely, component other than the phenol compound), and preferably the total number of moles of an aldehyde compound, ketone compound, methylol compound, alkoxymethyl compound, diene compound and haloalkyl compound.

Normally, the reaction temperature during the synthesis reaction of the phenol resin (A) is preferably within the range of 40° C. to 250° C. and more preferably 100° C. to 200° C., while generally the reaction time is preferably 1 hour to 10 hours.

A solvent capable of adequately dissolving the resin can be used as necessary.

Furthermore, the phenol resin having a repeating structure represented by general formula (46) may also be that obtained by further polymerizing a phenol compound that is not a raw material of the structure represented by the aforementioned general formula (46) within a range that does not impair the effects of the present invention. A range that does not impair the effects of the present invention refers to, for example, being 30% or less of the total number of moles of phenol compound serving as raw material of phenol resin (A).

(Phenol Resin Modified with Compound Having Unsaturated Hydrocarbon Group Having 4 to 100 Carbon Atoms)

A phenol resin modified with a compound having an unsaturated hydrocarbon group having 4 to 100 carbon atoms is the reaction product of the reaction product of phenol or a derivative thereof and a compound having an unsaturated hydrocarbon group having 4 to 100 carbon atoms (which also may be simply referred to as the "unsaturated hydrocarbon group-containing compound" depending on the case) (and this reaction product may also be referred to as the "unsaturated hydrocarbon group-modified phenol derivative") and the polycondensation product with an aldehyde or a phenol compound and an unsaturated hydrocarbon group-containing compound.

A phenol derivative the same as that previously described as a raw material of the phenol resin having a repeating unit represented by general formula (46) can be used for the phenol derivative.

The unsaturated hydrocarbon group of the unsaturated hydrocarbon group-containing compound preferably contains two or more unsaturated groups from the viewpoint of residual stress of the cured film and applicability to reflow treatment. In addition, the unsaturated hydrocarbon group preferably has 4 to 100 carbon atoms, more preferably 8 to 80 carbon atoms, and even more preferably 10 to 60 carbon atoms from the viewpoints of compatibility when in the form of a resin composition and residual stress of the cured film.

Examples of the unsaturated hydrocarbon group-containing compound include unsaturated hydrocarbon groups having 4 to 100 carbon atoms, polybutadiene having a carboxyl group, epoxidated polybutadiene, linoleyl alcohol, oleyl alcohol, unsaturated fatty acids and unsaturated fatty acid esters. Preferable examples of unsaturated fatty acids include crotonic acid, myristoleic acid, palmitoleic acid, oleic acid, elaidic acid, vaccenic acid, gadoleic acid, erucic acid, nervonic acid, linoleic acid, α-linolenic acid, eleostearic acid, stearidonic acid, arachidonic acid, eisocapentaenoic acid, clupanodonic acid and docosahexaenoic acid. Among these, unsaturated fatty acid esters in the form of vegetable oils are particularly preferable from the viewpoints of elongation of the cured film and flexibility of the cured film.

Vegetable oils normally include esters of glycerin and unsaturated fatty acids and consist of non-drying oils having an iodine value of 100 or lower, semi-drying oils having an iodine value of greater than 100 to less than 130, and drying oils having an iodine value of 130 or higher. Examples of non-drying oils include olive oil, morning glory seed oil, cashew nut oil, sasanqua oil, camellia oil, castor oil and peanut oil. Examples of semi-drying oils include corn oil, cottonseed oil and sesame oil. Examples of drying oils include tung oil, linseed oil, soybean oil, walnut oil, safflower oil, sunflower oil, perilla oil and mustard oil. In addition, processed vegetable oils, obtained by processing these vegetable oils, may also be used.

Among the aforementioned vegetable oils, a non-drying oil is preferably used in the reaction between the phenol, phenol derivative or phenol resin and the vegetable oil from the viewpoints of improving yield and preventing gelation resulting from the reaction proceeding excessively rapidly. On the other hand, a drying oil is used preferably from the viewpoint of improving adhesion with a resist pattern, mechanical properties and thermal shock resistance. Among these drying oils, tung oil, linseed oil, soybean oil, walnut oil or safflower oil is preferable, and tung oil and linseed oil are more preferable, since they allow the effects of the present invention to be demonstrated more effectively and more reliably. One type of these oils is used alone or two or more types are used in combination.

The reaction between the phenol or phenol derivative and the unsaturated hydrocarbon group-containing compound is preferably carried out at 50° C. to 130° C. The reaction ratio between the phenol or phenol derivative and unsaturated hydrocarbon group-containing compound is such that preferably 1 part by weight to 100 parts by weight, and more preferably 5 parts by weigh to 50 parts by weight, of the unsaturated hydrocarbon group-containing compound is used based on 100 parts by weight of the phenol or phenol derivative from the viewpoint of lowering residual stress of the cured film. If the amount of the unsaturated hydrocarbon group-containing compound is less than 1 part by weight, flexibility of the cured film tends to decrease, while if that amount exceeds 100 parts by weight, heat resistance of the cured film tends to decrease. In the aforementioned reaction, a catalyst such as p-toluenesulfonic acid or trifluoromethanesulfonic acid may be used as necessary.

A phenol resin modified by an unsaturated hydrocarbon group-containing compound is formed by polycondensation of the unsaturated hydrocarbon group-modified phenol derivative formed according to the aforementioned reaction and an aldehyde. The aldehyde is selected from, for example, formaldehyde, acetoaldehyde, furfural, benzaldehyde, hydroxybenzaldehyde, methoxybenzaldehyde, hydroxyphenylacetoaldehyde, methoxyphenylacetoaldehyde, crotonaldehyde, chloroacetoaldehyde, chlorophenylacetoaldehyde, acetone, glyceraldehyde, glyoxylic acid, methyl glyoxylate, phenyl glyoxylate, hydroxyphenyl glyoxylate, formyl acetate, methyl formyl acetate, 2-formylpropionate, methyl 2-formylpropionate, pyruvic acid, levulinic acid, 4-acetyl butyrate, acetonedicarboxylic acid and 3,3',4,4'-benzophenone tetracarboxylic acid. In addition, a precursor of formaldehyde, such as paraformaldehyde or trioxane may also be used. One type of these aldehydes is used alone or two or more types are used in combination.

The reaction between the aforementioned aldehyde and the aforementioned unsaturated hydrocarbon group-modified phenol derivative is a polycondensation reaction, and conventionally known conditions for synthesizing phenol resins can be used. The reaction is preferably carried out in the presence of a catalyst such as an acid or base, and an acid catalyst is used preferably from the viewpoint of the degree of polymerization (molecular weight) of the resin. Examples of acid catalysts include hydrochloric acid, sulfuric acid, formic acid, acetic acid, p-toluenesulfonic acid and oxalic acid. One type of these acid catalysts can be used alone or two or more types can be used in combination.

The aforementioned reaction is preferably carried out at a normal reaction temperature of 100° C. to 120° C. In addition, although varying according to the type and amount of catalyst used, the reaction time is normally 1 hour to 50 hours. Following completion of the reaction, the reaction product is subjected to vacuum dehydration at a temperature of 200° C. or lower to obtain a phenol resin modified by an unsaturated hydrocarbon group-containing compound. Furthermore, a solvent such as toluene, xylene or methanol can be used in the reaction.

The phenol resin modified by an unsaturated hydrocarbon group-containing compound can also be obtained by polycondensing the previously described unsaturated hydrocarbon group-modified phenol derivative with an aldehyde together with a compound other than phenol in the manner of m-xylene. In this case, the charged molar ratio of the compound other than phenol to the compound obtained by reacting the phenol derivative and unsaturated hydrocarbon group-containing compound is preferably less than 0.5.

The phenol modified with an unsaturated hydrocarbon group-containing compound can also be obtained by reacting a phenol resin with an unsaturated hydrocarbon group-containing compound. The phenol resin used in this case is a polycondensation product of a phenol compound (namely, phenol and/or phenol derivative) and an aldehyde. In this case, the same phenol derivatives and aldehydes as those previously described can be used for the phenol derivative and aldehyde, and phenol resin can be synthesized under conventionally known conditions as previously described.

Specific examples of phenol resins obtained from a phenol compound and aldehyde that are preferably used to form the phenol resin modified with an unsaturated hydrocarbon group-containing compound include phenol/formaldehyde novolac resin, cresol/formaldehyde novolac resin, xylenol/formaldehyde novolac resin, resorcinol/formaldehyde novolac resin and phenol-naphthol/formaldehyde novolac resin.

The same unsaturated hydrocarbon group-containing compound as that previously described with respect to producing an unsaturated hydrocarbon group-modified phenol derivative that reacts with an aldehyde can be used for the unsaturated hydrocarbon group-containing compound that reacts with phenol resin.

Normally, the reaction between the phenol resin and unsaturated hydrocarbon group-containing compound is preferably carried out at 50° C. to 130° C. In addition, the reaction ratio between the phenol resin and unsaturated hydrocarbon group-containing compound is such that preferably 1 part by weight to 100 parts by weight, more preferably 2 parts by weight to 70 parts by weight, and even more preferably 5 parts by weight to 50 parts by weight, are used with respect to 100 parts by weight of phenol resin from the viewpoint of improving flexibility of the cured film (resist pattern). If the amount of the unsaturated hydrocarbon group-containing compound is less than 1 part by weight, flexibility of the cured film tends to decrease, while if that amount exceeds 100 parts by weight, the possibility of gelling during the reaction tends to increase and heat resistance of the cured film tends to decrease. A catalyst such as p-toluenesulfonic acid or trifluoromethanesulfonic acid may be used during the reaction between the phenol resin and unsaturated hydrocarbon group-containing compound as necessary. Furthermore, although subsequently described in detail, a solvent such as toluene, xylene, methanol or tetrahydrofuran can be used in the reaction.

An acid-modified phenol resin can also be used by allowing polybasic acid anhydride to further react with phenolic hydroxyl groups remaining in the phenol resin modified by an unsaturated hydrocarbon group-containing compound formed according to the method described below. Acid modification with a polybasic acid anhydride results in the introduction of a carboxyl group, thereby further improving solubility in an aqueous alkaline solution (used as developer).

There are no particular limitations on the polybasic acid anhydride provided it has an acid anhydride group formed by dehydration condensation of the carboxyl groups of a polybasic acid having a plurality of carboxyl groups. Examples of polybasic acid anhydrides include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyl tetrahydrophthalic anhydride, methyl hexahydrophthalic anhydride, nadic anhydride, 3,6-endomethylenetetrahydrophthalic anhydride, methyl endomethylenetetrahydrophthalic anhydride, tetrabromophthalic anhydride or trimellitic anhydride, and aromatic tetrabasic acid dianhydrides such as biphenyltetracarboxylic dianhydride, naphthalene tetracarboxylic dianhydride, diphenyl ether tetracarboxylic dianhydride, butane tetracarboxylic dianhydride, cyclopentane tetracarboxylic dianhydride, pyromellitic anhydride or benzophenone tetracarboxylic dianhydride. One type of these compounds may be used alone or two or more types may be used in combination. Among these, the polybasic acid anhydride is preferably a dibasic acid anhydride, and more preferably one or more types selected from the group consisting tetrahydrophthalic anhydride, succinic anhydride and hexahydrophthalic anhydride. In this case, there is the advantage of allowing the formation of a resist pattern having a more favorable form.

The reaction between a phenolic hydroxyl group and polybasic acid anhydride can be carried out at 50° C. to 130° C. In this reaction, preferably 0.10 moles to 0.80 moles, more preferably 0.15 moles to 0.60 moles, and even more preferably 0.20 moles to 0.40 moles of the polybasic acid anhydride are reacted for 1 mole of phenolic hydroxyl groups. If the amount of the polybasic acid anhydride is less than 0.10 moles, developability tends to decrease, while if the amount exceeds 0.80 moles, the alkaline resistance of unexposed portions tends to decrease.

Furthermore, in the aforementioned reaction, a catalyst may be contained as necessary from the viewpoint of carrying out the reaction rapidly. Examples of catalysts include tertiary amines such as triethylamine, quaternary ammonium salts such as triethylbenzyl ammonium chloride, imidazole compounds such as 2-ethyl-4-methylimidazole and phosphorous compounds such as triphenylphosphine.

The acid value of the phenol resin further modified with a polybasic acid anhydride is preferably 30 mgKOH/g to 200 mgKOH/g, more preferably 40 mgKOH/g to 170 mgKOH/g, and even more preferably 50 mgKOH/g to 150 mgKOH/g. If the acid value is lower than 30 mgKOH/g, a longer amount of time tends to be required for alkaline development in comparison with the case of the acid value being within the aforementioned ranges, while if the acid value exceeds 200 mgKOH/g, resistance to developer of unexposed portions tends to decrease in comparison with the case of the acid value being within the aforementioned ranges.

The molecular weight of the phenol resin modified with the unsaturated hydrocarbon group-containing compound is such that the weight average molecular weight is preferably 1,000 to 100,000 and more preferably 2,000 to 100,000 in consideration of solubility in an aqueous alkaline solution and the balance between photosensitivity and cured film properties.

The phenol resin (A) of the present embodiment is preferably a mixture of at least one type of phenol resin selected from a phenol resin having a repeating unit represented by the aforementioned general formula (46) and a phenol resin modified with the aforementioned compound having 4 to 100 carbon atoms and an unsaturated hydrocarbon group (to be referred to as resin (a3)), and a phenol resin selected from novolac resin and polyhydroxystyrene (to be referred to as resin (a4)). The mixing ratio between the resin (a3) and the resin (a4) in terms of the weight ratio thereof is such that the ratio of (a3)/(a4) is within the range of 5/95 to 95/5. This mixing ratio of (a3)/(a4) is preferably 5/95 to 95/5, more preferably 10/90 to 90/10 and even more preferably 15/85 to 85/15 from the viewpoints of solubility in an aqueous alkaline solution, sensitivity and resolution when forming a resist pattern, residual stress of the cured film, and applicability to reflow treatment. Those resins indicated in the previous sections describing novolac resin and polyhydroxystyrene can be used for the novolac resin and polyhydroxystyrene of the aforementioned resin (a4).

(B) Photosensitizer

The following provides an explanation of the photosensitizer (B) used in the present invention. The photosensitizer (B) differs according to whether the photosensitive resin composition of the present invention is of the negative type in which a polyamic acid ester is used for the resin (A), or is of the positive type in which, for example, at least one type of novolac resin, polyhydroxystyrene and phenol resin is mainly used for the resin (A).

The incorporated amount of the photosensitizer (B) in the photosensitive resin composition is 1 part by weight to 50 parts by weight based on 100 parts by weight of the resin (A). The aforementioned incorporated amount is 1 part by weight or more from the viewpoint of photosensitivity or patterning properties, and is 50 parts by weight or less from the viewpoint curability of the photosensitive resin composition or physical properties of the photosensitive resin layer after curing.

First, an explanation is provided of the case of desiring a negative type. In this case, a photopolymerization initiator and/or photoacid generator is used for the photosensitizer (B), the photopolymerization initiator is preferably a photoradical polymerization initiator, and preferable examples thereof include, but are not limited to, photoacid generators in the manner of benzophenone and benzophenone derivatives such as methyl o-benzoyl benzoate, 4-benzoyl-4'-methyl diphenyl ketone, dibenzyl ketone or fluorenone, acetophenone derivatives such as 2,2'-diethoxyacetophenone, 2-hydroxy-2-methylpropiophenone or 1-hydroxycyclohexyl phenyl ketone, thioxanthone and thioxanthone derivatives such as 2-methylthioxanthone, 2-isopropylthioxanthone or diethylthioxanthone, benzyl and benzyl derivatives such as benzyldimethylketal or benzyl-β-methoxyethylacetal, benzoin and benzoin derivatives such as benzoin methyl ether, oximes such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, 1-phenyl-1,2-propanedione-2-(o-benzoyl)oxime, 1,3-diphenylpropanetrione-2-(o- ethoxycarbonyl)oxime or 1-phenyl-3-ethoxypropanetrione-2-(o-benzoyl)oxime, N-arylglycines such as N-phenylglycine, peroxides such as benzoyl perchloride, aromatic biimidazoles, titanocenes or α-(n-octanesulfonyloxyimino)-4-methoxybenzyl cyanide. Among the aforementioned photopolymerization initiators, oximes are more preferable particularly from the viewpoint of photosensitivity.

In the case of using a photoacid generator for the photosensitizer (B) in a negative-type photosensitive resin composition, in addition to the photoacid generator demonstrating acidity by irradiating with an active light beam in the manner of ultraviolet light, due to that action, it has the effect of causing a crosslinking agent to crosslink with a resin in the form of component (A) or causing polymerization of crosslinking agents. Examples of this photoacid generator used include diaryl sulfonium salts, triaryl sulfonium salts, dialkyl phenacyl sulfonium salts, diaryl iodonium salts, aryl diazonium salts, aromatic tetracarboxylic acid esters, aromatic sulfonic acid esters, nitrobenzyl esters, oxime sulfonic acid esters, aromatic N-oxyimidosulfonates, aromatic sulfamides, haloalkyl group-containing hydrocarbon-based compounds, haloalkyl group-containing heterocyclic compounds and naphthoquinonediazido-4-sulfonic acid esters. Two or more types of these compounds can be used in combination or in combination with other sensitizers as necessary. Among the aforementioned photoacid generators, aromatic oxime sulfonic acid esters and aromatic N-oxyimidosulfonates are more preferable from the viewpoint of photosensitivity in particular.

The incorporated amount of these photosensitizers is 1 part by weight to 50 parts by weight, and preferably 2 parts by weight to 15 parts by weight from the viewpoint of photosensitivity, based on 100 parts by weight of the resin (A). An incorporated amount of 1 part by weight or more based on 100 parts by weight of the resin (A) results in superior photosensitivity, while an incorporated amount of 50 parts by weight or less results in superior thick film curability.

Next, an explanation is provided of the case of desired a positive type. In this case, a photoacid generator is used for the photosensitizer (B), and more specifically, although a compound having a quinone diazide group, onium salt or halogen-containing compound and the like can be used, a compound having a diazoquinone structure is preferable from the viewpoints of solvent solubility and storage stability.

Examples of compound (B) having a quinone diazide group (to also be referred to as the "quinone diazide compound (B)") include compounds having a 1,2-benzoquinone diazide structure and compounds having a 1,2-naphthoaquinone diazide structure, and include known substances described in, for example, U.S. Pat. Nos. 2,772,972, 2,797,213 and 3,669,658. The quinone diazide compound (B) is preferably at least one type of compound selected from the group consisting of 1,2-naphtoquinonediazido-4-sulfonic acid esters of polyhydroxy compounds having a specific structure to be subsequently described, and 1,2-naphthoquinonediazido-5-sulfonic acid esters of those polyhydroxy compounds (to also be referred to as "NQD compounds").

These NQD compounds are obtained by converting a naphthoquinonediazidosulfonic acid compound to a sulfonyl chloride with chlorosulfonic acid or thionyl chloride followed by subjecting the resulting naphthoquinonediazidosulfonyl chloride to a condensation reaction with a polyhydroxy compound. For example, an NQD compound can be obtained by esterifying prescribed amounts of a polyhydroxy compound and 1,2-naphthoquinonediazido-5-sulfonyl chloride or 1,2-naphthoquinonediazido-4-sulfonyl chloride in the presence of a base catalyst such as triethylamine and in a solvent such as dioxane, acetone or tetrahydrofuran, followed by rinsing the resulting product with water and drying.

In the present embodiment, the compound (B) having a quinone diazide group is preferably a 1,2-naphthoquinonediazido-4-sulfonic acid ester and/or 1,2-naphthoquinonediazido-5-sulfonic acid ester of a hydroxy compound represented by the following general formulas (120) to (124) from the viewpoint of sensitivity and resolution when forming a resist pattern.

General formula (120) is indicated below:

[Chemical Formula 230]

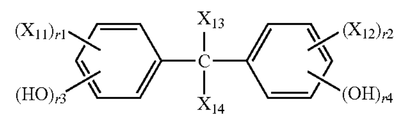

(120)

{wherein, $X_{11}$ and $X_{12}$ respectively and independently represent a hydrogen atom or monovalent organic group having 1 to 60 carbon atoms (and preferably 1 to 30 carbon atoms), $X_{13}$ and $X_{14}$ respectively and independently represent a hydrogen atom or monovalent organic group having 1 to 60 carbon atoms (and preferably 1 to 30 carbon atoms), r1, r2, r3 and r4 respectively and independently represent an integer of 0 to 5, at least one of r3 and r4 represents an integer of 1 to 5, $(r1+r3)\leq 5$ and $(r2+r4)\leq 5$}.

General formula (121) is as indicated below:

[Chemical Formula 231]

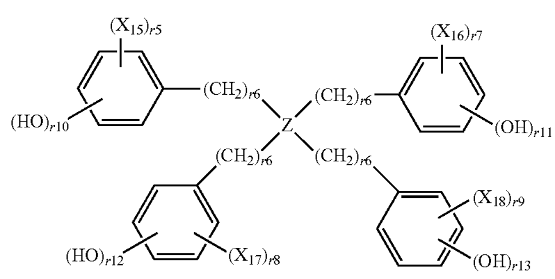

(121)

{wherein, Z represents a tetravalent organic group having 1 to 20 carbon atoms, $X_{15}$, $X_{16}$, $X_{17}$ and $X_{18}$ respectively and independently represent a monovalent organic group having 1 to 30 carbon atoms, r6 represents an integer of 0 or 1, r5, r7, r8 and r9 respectively and independently represent an integer of 0 to 3, r10, r11, r12 and r13 respectively and independently represent an integer of 0 to 2, and r10, r11, r12 and r13 are not all 0}.

General Formula (122) is as indicated below:

[Chemical Formula 232]

(122)

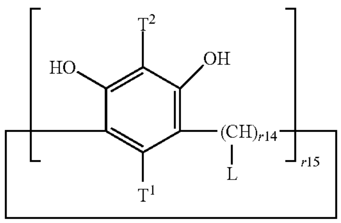

{wherein, r14 represents an integer of 1 to 5, r15 represents an integer of 3 to 8, the (r14×r15) number of L respectively and independently represent a monovalent organic group having 1 to 20 carbon atoms, the r15 number of $T^1$ and the r15 number of $T^2$ respectively and independently represent a hydrogen atom or monovalent organic group having 1 to 20 carbon atoms}.

General formula (123) is as indicated below:

[Chemical Formula 233]

(123)

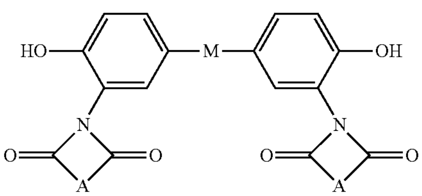

{wherein, A represents a divalent organic group containing an aliphatic tertiary or quaternary carbon atom, and M represents a divalent organic group and preferably represents a divalent group selected from three groups represented by the following chemical formulas}.

[Chemical Formula 234]

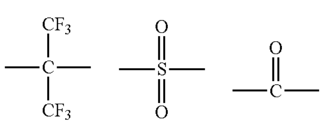

Moreover, general formula (124) is as indicated below:

[Chemical Formula 235]

(124)

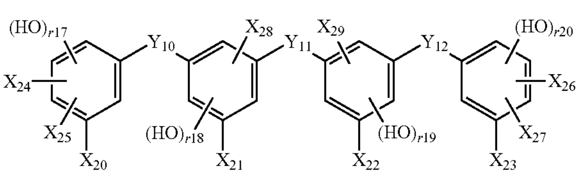

{wherein, r17, r18, r19 and r20 respectively and independently represent an integer of 0 to 2, at least one of r17, r18, r19 and r20 is 1 or 2, $X_{20}$ to $X_{29}$ respectively and independently represent a monovalent group selected from the group consisting of a hydrogen atom, halogen atom, alkyl group, alkenyl group, alkoxy group, allyl group and acyl group, and $Y_{10}$, $Y_{11}$ and $Y_{12}$ respectively and independently represent a divalent group selected from the group consisting of a single bond, —O—, —S—, —SO—, —$SO_2$—, —CO—, —$CO_2$—, cyclopentylidene group, cyclohexylidene group, phenylene group and divalent organic group having 1 to 20 carbon atoms}.

In still another embodiment, $Y_{10}$ to $Y_{12}$ in the aforementioned general formula (124) are preferably respectively and independently selected from three divalent organic groups represented by the following general formulas:

[Chemical Formula 236]

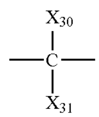

[Chemical Formula 237]

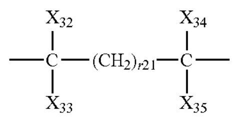

[Chemical Formula 238]

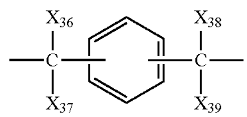

{wherein, $X_{30}$ and $X_{31}$ respectively and independently represent at least one monovalent group selected from the group consisting of a hydrogen atom, alkyl group, alkenyl group, aryl group and substituted aryl group, $X_{32}$, $X_{33}$, $X_{34}$ and $X_{35}$ respectively and independently represent a hydrogen atom or alkyl group, r21 represents an integer of 1 to 5, and $X_{36}$, $X_{37}$, $X_{38}$ and $X_{39}$ respectively and independently represent a hydrogen atom or alkyl group}.

Examples of compounds represented by the aforementioned general formula (120) include hydroxy compounds represented by the following formulas (125) to (129).

General Formula (125)

[Chemical Formula 239]

(125)

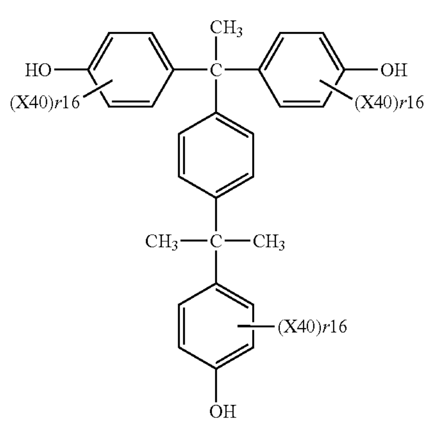

{wherein, r16 respectively and independently represent an integer of 0 to 2, $X_{40}$ respectively and independently represents a hydrogen atom or monovalent organic group having 1 to 20 carbon atoms, in the case a plurality of $X_{40}$ are present, $X_{40}$ may be mutually the same or different, and $X_{40}$ is preferably a monovalent organic group represented by the following general formula:

[Chemical Formula 240]

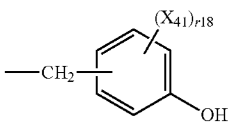

(wherein, r18 represents an integer of 0 to 2, $X_{41}$ represents a monovalent organic group selected from the group consisting of a hydrogen atom, alkyl group and cycloalkyl group, and in the case r18 is 2, the two $X_{41}$ may be mutually the same or different)}, general formula (126):

[Chemical Formula 241]

(126)

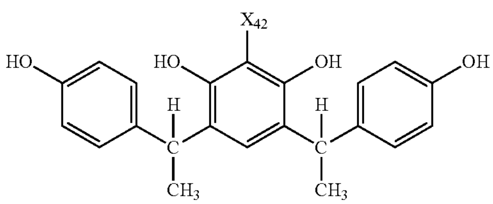

{wherein, $X_{42}$ represents a monovalent organic group selected from the group consisting of an alkyl group having 1 to 20 carbon atoms, alkoxy group having 1 to 20 carbon atoms, and cycloalkyl group having 1 to 20 carbon atoms}, general formula (127):

[Chemical Formula 242]

(127)

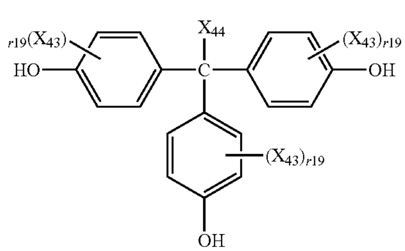

{wherein, r19 respectively and independently represents an integer of 0 to 2 and $X_{43}$ respectively and independently represents a hydrogen or a monovalent organic group represented by the following general formula:

[Chemical Formula 243]

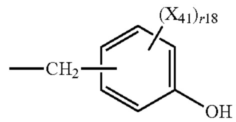

(wherein, r18 represents an integer of 0 to 2, $X_{41}$ is selected from the group consisting of a hydrogen atom, alkyl group and cycloalkyl group, and in the case r18 is 2, $X_{41}$ may be mutually the same or different)}.

[Chemical Formula 244]

(128)

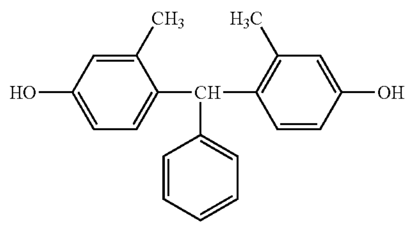

[Chemical Formula 245]

(129)

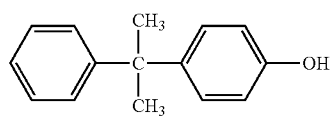

A hydroxy compound represented by the following formulas (130) to (132) is preferable as a compound represented by the aforementioned general formula (120) since it has high sensitivity when in the form of a NQD compound and demonstrates little precipitation in a photosensitive resin composition.

The structures of formulas (130) to (132) are as indicated below.

[Chemical Formula 246]

(130)

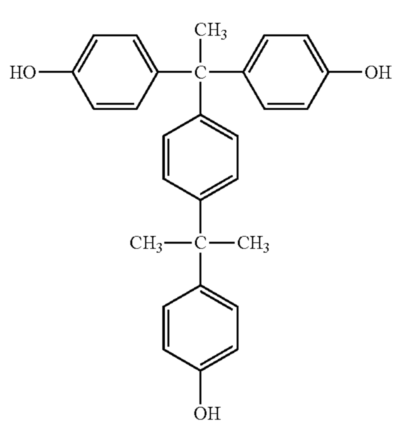

-continued

[Chemical Formula 247]

(131)

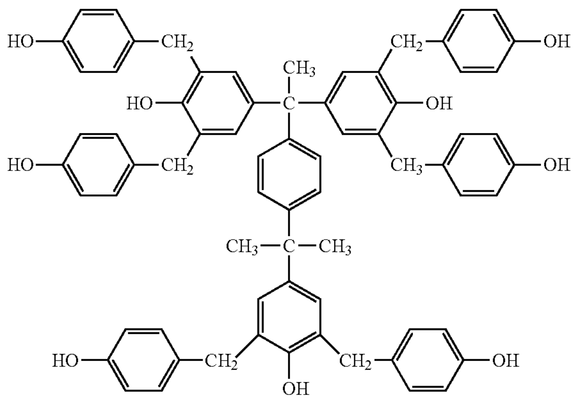

[Chemical Formula 248]

(132)

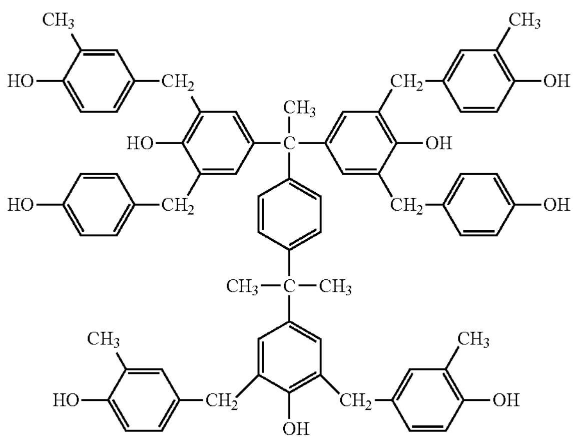

A hydroxy compound represented by the following formula (133) is preferable as a compound represented by the aforementioned general formula (126) since it has high sensitivity when in the form of a NQD compound and demonstrates little precipitation in a photosensitive resin composition.

[Chemical Formula 249]

(133)

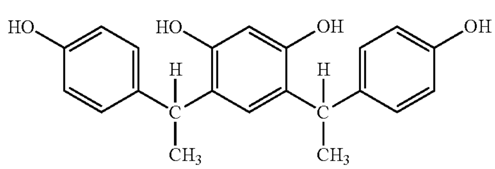

A hydroxy compound represented by the following formulas (134) to (136) is preferable as a compound represented by the aforementioned general formula (127) since it has high sensitivity when in the form of a NQD compound and demonstrates little precipitation in a photosensitive resin composition.

The structures of formulas (134) to (136) are as indicated below.

[Chemical Formula 250]

(134)

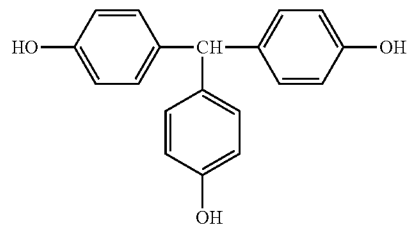

[Chemical Formula 251]

(135)

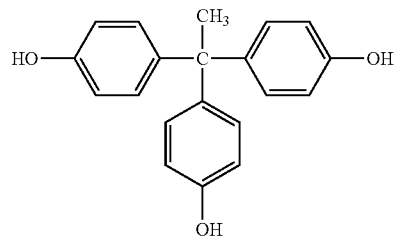

[Chemical Formula 252]

(136)

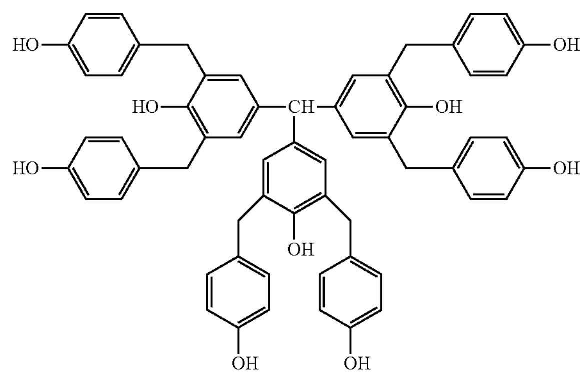

In the aforementioned general formula (121), although there are no particular limitations thereon provided it is a tetravalent organic group having 1 to 20 carbon atoms, Z is preferably a tetravalent group having a structure represented by the following general formulas:

[Chemical Formula 253]

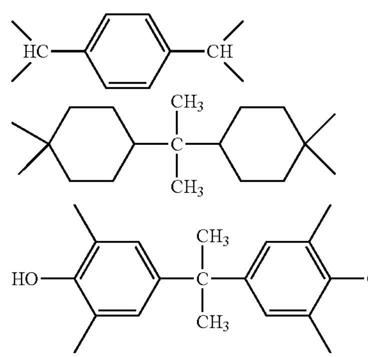

-continued

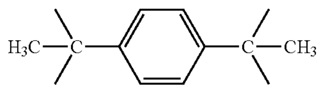

Among compounds represented by the aforementioned general formula (121), hydroxy compounds represented by the following formulas (137) to (140) are preferable since they have high sensitivity when in the form of a NQD compound and demonstrate little precipitation in a photosensitive resin composition.

The structures of formulas (137) to (140) are as indicated below.

[Chemical Formula 254]

(137)

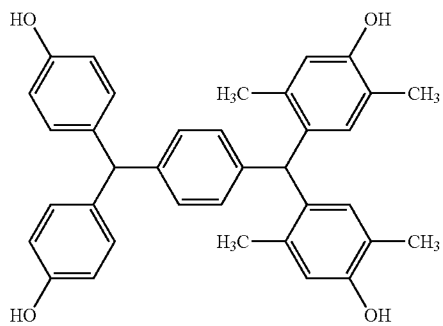

[Chemical Formula 255]

(138)

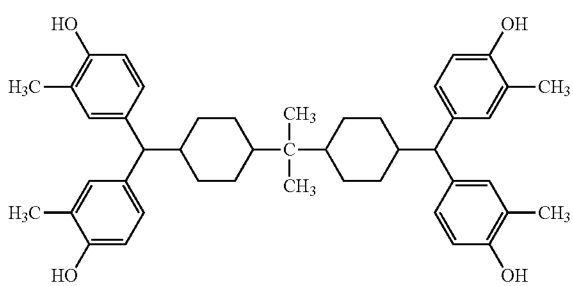

[Chemical Formula 256]

(139)

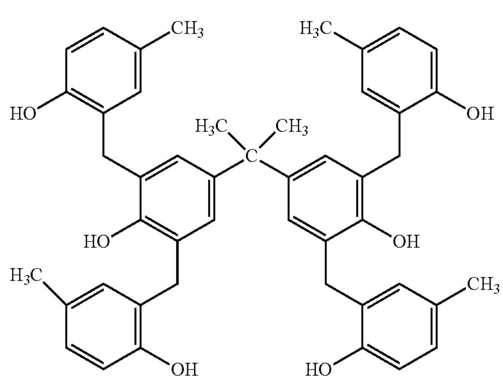

-continued

[Chemical Formula 257]

(140)

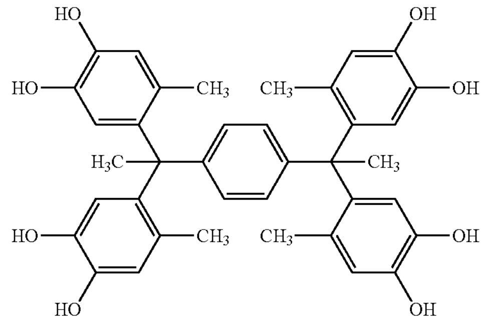

As the compound represented by general formula (122), a hydroxy compound represented by the following formula (141):

[Chemical Formula 258]

(141)

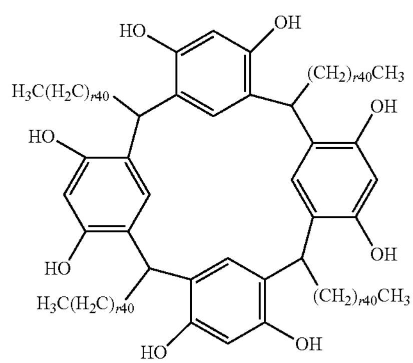

{wherein, r40 respectively and independently represents an integer of 0 to 9} is preferable, since it has high sensitivity when in the form of a NQD compound and demonstrates little precipitation in a photosensitive resin composition.

Hydroxy compounds represented by the following formulas (142) and (143) are preferable as compounds represented by the aforementioned general formula (123) since they have high sensitivity when in the form of a NQD compound and demonstrate little precipitation in a photosensitive resin composition.

The structures of formulas (142) and (143) are as indicated below.

[Chemical Formula 259]

(142)

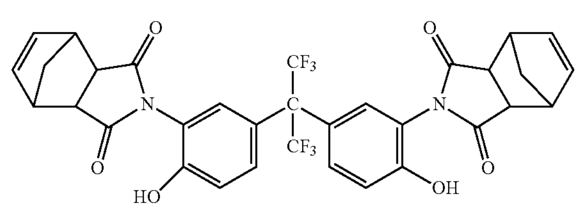

-continued

[Chemical Formula 260]

(143)

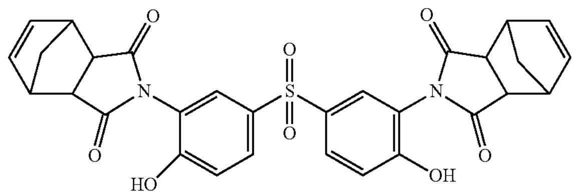

An NQD compound of a hydroxy compound represented by the following formula (144) is specifically preferable as a compound represented by the aforementioned general formula (124) since it has high sensitivity and demonstrates little precipitation in a photosensitive resin composition.

[Chemical Formula 261]

(144)

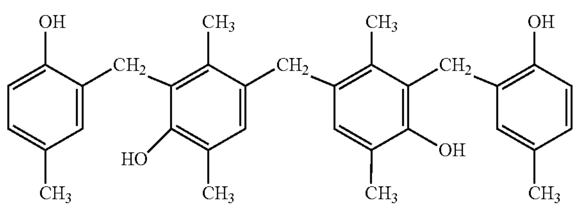

In the case the compound (B) having a quinone diazide group has a 1,2-naphtoquinonediazidosulfonyl group, this group may be any of a 1,2-naphthoquinonediazido-5-sulfonyl group or 1,2-naphthoquinonediazido-4-sulfonyl group. Since a 1,2-naphthoquinonediazido-4-sulfonyl group absorbs in the i-line region of a mercury lamp, it is suitable for exposure by i-line irradiation. On the other hand, since a 1,2-naphthoquinonediazido-5-sulfonyl group is able to also absorb in the g-line region of a mercury lamp, it is suitable for exposure by g-line irradiation.

In the present embodiment, one or both of a 1,2-naphthoquinonediazido-4-sulfonic acid ester compound and 1,2-naphthoquinonediazido-5-sulfonic acid ester compound are preferably selected corresponding to the wavelength used during exposure. In addition, a 1,2-naphthoquinonediazidosulfonic acid ester compound having a 1,2-naphthoquinonediazido-4-sulfonyl group and 1,2-naphthoquinonediazido-5-sulfonyl group in the same molecule can also be used, or a mixture of a 1,2-naphthoquinonediazido-4-sulfonic acid ester compound and a 1,2-naphthoquinonediazido-5-sulfonic acid ester compound can be used by mixing.

In the compound (B) having a quinone diazide group, the average esterification rate of the naphthoquinonediazidosulfonyl ester of the hydroxy compound is preferably 10% to 100% and more preferably 20% to 100% from the viewpoint of development contrast.

Examples of preferable NQD compounds from the viewpoint of sensitivity and cured film properties such as elongation include those represented by the following group of general formulas:

[Chemical Formula 262]

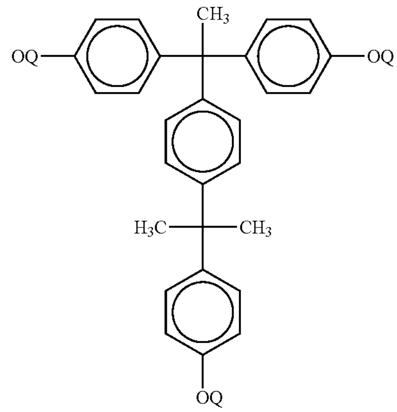

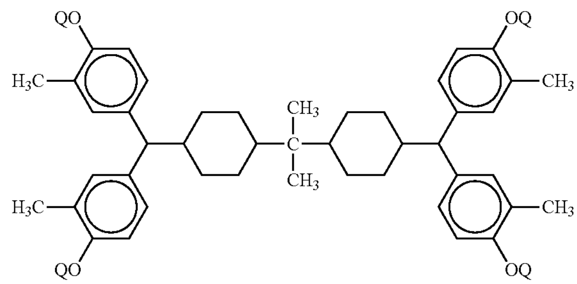

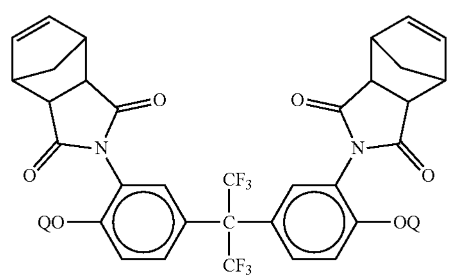

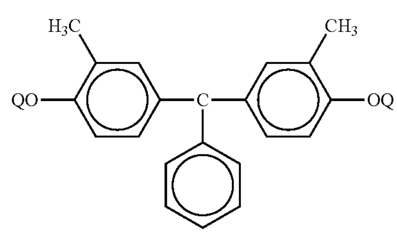

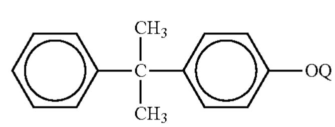

{wherein, Q represents a hydrogen atom or naphthoquinonediazidosulfonic acid ester group represented by either of the following formulas:

[Chemical Formula 263]

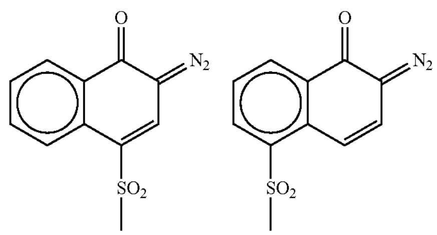

provided that all Q are not simultaneously hydrogen atoms}.

In this case, a naphthoquinonediazidosulfonyl ester compound having a 4-naphthoquinonediazidosulfonyl group and 5-naphthoquinonediazidosulfonyl group in the same molecule can be used as an NQD compound, or 4-naphthoquinonediazidosulfonyl ester compound and 5-naphthoquinonediazidosulfonyl ester compound can be used as a mixture.

The aforementioned NQD compounds may be used alone or two or more types may be mixed.

Examples of the aforementioned onium salt include iodonium salts, sulfonium salts, phosiphonium salts, phosphonium salts and diazonium salts, and is preferably an onium salt selected from the group consisting of a diaryliodonium salt, triarylsulfonium salt and trialkylsulfonium salt.

Examples of the aforementioned halogen-containing compound include haloalkyl group-containing hydrocarbon compounds, and trichloromethyltriazine is preferable.

The incorporated amount of these photoacid generators in the case of a positive type is 1 part by weight to 50 parts by weight and preferably 5 parts by weight to 30 parts by weight based on 100 parts by weight of the resin (A). Patterning properties of the photosensitive resin composition are preferable if the incorporated amount of the photoacid generator used for the photosensitizer (B) is 1 part by weight or more, while the tensile elongation rate of a film after curing the photosensitive resin composition is favorable and development residue (scum) of exposed portions is low if the incorporated amount is 50 parts by weight or less.

Other Components

The photosensitive resin composition of the present invention may also contain components other than the aforementioned components (A) and (B).

[Polyamic Acid Ester, Novolac Resin, Hydroxypolystyrene and Phenol Resin]

A solvent can be contained in the negative-type resin composition of the present embodiment in the form of the previously described polyamic acid resin composition, or in the positive-type photosensitive resin composition in the form of the novolac resin composition, polyhydroxystyrene resin composition and phenol resin composition, for the purpose of dissolving these resins.

Examples of solvents include amides, sulfoxides, ureas, ketones, esters, lactones, ethers, halogenated hydrocarbons, hydrocarbons and alcohols, and examples of which that can be used include N-methyl-2-pyrrolidone, N,N-dimethylacetoamide, N,N-dimethylformamide, dimethylsulfoxide, tetramethylurea, acetone, methyl ethyl ketone, methyl isobutyl ketone, cyclopentanone, cyclohexanone, methyl acetate, ethyl acetate, butyl acetate, diethyl oxalate, ethyl lactate, methyl lactate, butyl lactate, γ-butyrolactone, propylene glycol monomethyl ether acetate, propylene glycol monomethyl ether, benzyl alcohol, phenyl glycol, tetrahydrofurfuryl alcohol, ethylene glycol dimethyl ether, diethylene glycol dimethyl ether, tetrahydrofuran, morpholine, dichloromethane, 1,2-dichloroethane, 1,4-dichlorobutane, chlorobenzene, o-dichlorobenzene, anisole, hexane, heptane, benzene, toluene, xylene and mesitylene. Among these, from the viewpoint of resin solubility, resin composition stability and adhesion to a substrate, N-methyl-2-pyrrolidone, dimethylsulfoxide, tetramethylurea, butyl acetate, ethyl lactate, γ-butyrolactone, propylene glycol monomethyl ether acetate, propylene glycol monomethyl ether, diethylene glycol dimethyl ether, benzyl alcohol, phenyl glycol and tetrahydrofurfuryl alcohol are preferable.

Among these solvents, those capable of completely dissolving the polymer formed are particularly preferable, and examples thereof include N-methyl-2-pyrroliodone, N,N-dimethylacetoamide, N,N-dimethylformamide, dimethylsulfoxide, tetramethylurea and γ-butyrolactone.

Examples of preferable solvents for the aforementioned phenol resin include, but are not limited to, bis(2-methoxyethyl) ether, methyl cellosolve, ethyl cellosolve, propylene glycol monomethyl ether, propylene glycol monomethyl ether acetate, diethylene glycol dimethyl ether, dipropylene glycol dimethyl ether, cyclohexanone, cyclopentanone, toluene, xylene, γ-butyrolactone and N-methyl-2-pyrrolidone.

In addition, ketones, esters, lactones, ethers, hydrocarbons and halogenated hydrocarbons may also be used as reaction solvents depending on the case. More specifically, examples thereof include acetone, methyl ethyl ketone, methyl isobutyl ketone, cyclohexanone, methyl acetate, ethyl acetate, butyl acetate, diethyl oxalate, ethylene glycol dimethyl ether, diethylene glycol dimethyl ether, tetrahydrofuran, dichloromethane, 1,2-dichloroethane, 1,4-dichlorobutane, chlorobenzene, o-dichlorobenzene, hexane, heptane, benzene, toluene and xylene.

In the photosensitive resin composition of the present invention, the amount of solvent used is preferably within the range of 100 parts by weight to 1000 parts by weight, more preferably 120 parts by weight to 700 parts by weight, and even more preferably 125 parts by weight to 500 parts by weight based on 100 parts by weight of the resin (A).

In addition, in the case of forming a cured film on a substrate composed of copper or copper alloy using the photosensitive resin composition of the present invention, for example, a nitrogen-containing heterocyclic compound such as an azole compound or purine derivative can be optionally incorporated to inhibit discoloration of the copper.

Examples of azole compounds include 1H-triazole, 5-methyl-1H-triazole, 5-ethyl-1H-triazole, 4,5-dimethyl-1H-triazole, 5-phenyl-1H-triazole, 4-t-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]benzotriazole, 2-(3,5-di-t-butyl-2-hydroxyphenyl)benzotriazole, 2-(3-t-butyl-5-methyl-2-hydroxyphenyl)benzotriazole, 2-(3,5-ti-t-amyl-2-hydroxyphenyl)benzotriazole, 2-(2'-hydroxy-5'-t-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 1H-tetrazole, 5-methyl-1H-tetrazole, 5-phenyl-1H-tetrazole, 5-amino-1H-tetrazole and 1-methyl-1H-tetrazole.

Particularly preferable examples include tolyltriazole, 5-methyl-1H-benzotriazole and 4-methyl-1H-benzotriazole. One type of these azole compounds or a mixture of two or more types may be used.

Specific examples of purine derivatives include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanine oxime, trihydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)guanine, N-(3-chlorophenyl)guanine, N-(3-ethylphenyl)guanine, 2-azaadenine, 5-azaadenine, 8-azaadenine, 8-azaguanine, 8-azapurine, 8-azaxanthine, 8-azahypoxanthine and derivatives thereof.

The incorporated amount in the case the photosensitive resin composition contains the aforementioned azole compound or purine derivative is preferably 0.1 parts by weight to 20 parts by weight, and more preferably 0.5 parts by weight to 5 parts by weight from the viewpoint of photosensitivity, based on 100 parts by weight of the resin (A). In the case the incorporated amount of the azole compound based on 100 parts by weight of the resin (A) is 0.1 parts by weight or more, discoloration of the copper or copper alloy surface is inhibited in the case of having formed the photosensitive resin composition of the present invention on copper or copper alloy, while in the case the incorporated amount is 20 parts by weight or less, photosensitivity is superior.

A hindered phenol compound can be optionally incorporated in order to inhibit discoloration of the copper surface. Examples of hindered phenol compounds include, but are not limited to, 2,6-di-t-butyl-4-methylphenol, 2,5-di-t-butylhydroquinone, octadecyl-3-(3,5-di-t-butyl-4-hydroxyphenyl)propionate, isooctyl-3-(3,5-di-t-butyl-4-hydroxyphenyl) propionate, 4,4'-methylene-bis(2,6-di-t-butylphenol), 4,4'-thiobis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis [3-(3,5-di-t-butyl-4-hydroxyphenyl)propionate], 2,2-thiodiethylenebis[3-(3,5-di-t-butyl-4-hydroxphenyl) propionate], N,N'-hexamethylenebis(3,5-di-t-butyl-4-hydroxyhydrocinnamide), 2,2'-methylene-bis(4-methyl-6-t-butylphenol), 2,2'-methylene-bis(4-ethyl-6-t-butylphenol), pentaerythryl-tetrakis[3-(3,5-di-t-butyl-4-hydroxyphenyl)propionate], tris-(3,5-di-t-butyl-4-hydroxybenzyl)isocyanurate, 1,3,5-trimethyl-2,4,6-tris(3,5-di-t-butyl-4-hydroxybenzyl)benzene, 1,3,5-tris(3-hydroxy-2,6-dimethyl-4-isopropylbenzyl)-1,3,5-triazine-2,4,6-(1H,3H,5H)-trione, 1,3,5-tris(4-t-butyl-3-hydroxy-2,6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2,6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-t-butyl-3-hydroxy-2,5,6-trimethylbenzyl)-1,3,5-triazine-2,4,6-(1H,3H,5H)-trione, 1,3,5-tris(4-t-butyl-5-ethyl-3-hydroxy-2,6-dimethylbenzyl)-1,3,5-triazine-2,4,6-(1H,3H,5H)-trione, 1,3,5-tris(4-t-butyl-6-ethyl-3-hydroxy-2-methylbenzyl)-1,3,5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H,5H)-trione, 1,3,5-tris(4-t-butyl-5,6-diethyl-3-hydroxy-2-methylbenzyl)-1,3,5-triazine-2,4,6-(1H,3H,5H)-trione, 1,3,5-tris(4-t-butyl-3-hydroxy-2-methylbenzyl)-1,3,5-triazine-2,4,6-(1H,3H,5H)-trione, 1,3,5-tris(4-t-butyl-3-hydroxy-2,5-dimethylbenzyl)-1,3,5-triazine-2,4,6-(1H,3H,5H)-trione, and 1,3,5-tris(4-t-butyl-5-ethyl-3-hydroxy-2-methylbenzyl)-1,3,5-triazine-2,4,6-(1H,3H,5H)-trione. Among these, 1,3,5-tris(4-t-butyl-3-hydroxy-2,6-dimethylbenzyl)-1,3,5-triazine-2,4,6-(1H,3H,5H)-trione is particularly preferable.

The incorporated amount of the hindered phenol compound is preferably 0.1 parts by weight to 20 parts by weight, and more preferably 0.5 parts by weight to 10 parts by weight from the viewpoint of photosensitivity, based on 100 parts by weight of the resin (A). In the case the incorporated amount of the hindered phenol compound based on 100 parts by weight of the resin (A) is 0.1 parts by weight or more, discoloration and corrosion of the copper or copper alloy is prevented in the case of, for example, having formed the photosensitive resin composition of the present invention on copper or copper alloy, while in the case the incorporated amount is 20 parts by weight or less, photosensitivity is superior.

A crosslinking agent may also be contained in the photosensitive resin composition of the present invention. The crosslinking agent can be a crosslinking agent capable of crosslinking the resin (A) or forming a crosslinked network by itself when heat-curing a relief pattern formed using the photosensitive resin composition of the present invention. The crosslinking is further able to enhance heat resistance and chemical resistance of a cured film formed from the photosensitive resin composition.

Examples of crosslinking agents include compounds containing a methylol group and/or alkoxymethyl group in the form of Cymel (Registered Trade Mark) 300, 301, 303, 370, 325, 327, 701, 266, 267, 238, 1141, 272, 202, 1156, 1158, 1123, 1170 or 1174, UFR 65 or 300, and Mycoat 102 or 105 (all manufactured by Mitsui-Cytec), Nikalac (Registered Trade Mark) MX-270, -280 or -290, Nikalac MS-11 and Nikalac MW-30, -100, -300, -390 or -750 (all manufactured by Sanwa Chemical Co., Ltd.), DML-OCHP, DML-MBPC, DML-BPC, DML-PEP, DML-34X, DML-PSBP, DML-PTBP, DML-PCHP, DML-POP, DML-PFP, DML-MBOC, BisCMP-F, DML-BisOC-Z, DML-BisOCHP-Z, DML-BisOC-P, DMOM-PTBT, TMOM-BP, TMOM-BPA or TML-BPAF-MF (all manufactured by Honshu Chemical Industry Co., Ltd.), benzenedimethanol, bis(hydroxymethyl)cresol, bis(hydroxymethyl)dimethoxybenzene, bis(hydroxymethyl) diphenyl ether, bis(hydroxymethyl)benzophenone, hydroxymethylphenyl hydroxymethyl benzoate, bis(hydroxymethyl)biphenyl, dimethylbis(hydroxymethyl)biphenyl, bis(methoxymethyl)benzene, bis(methoxymethyl) cresol, bis(methoxymethyl)dimethoxybenzene, bis (methoxymethyl)diphenyl ether, bis(methoxymethyl) benzophenone, methoxymethylphenyl methoxymethyl benzoate, bis(methoxymethyl)biphenyl and dimethylbis (methoxymethyl)biphenyl.

In addition, other examples include oxirane compounds in the form of phenol novolac epoxy resin, cresol novolac epoxy resin, bisphenol epoxy resin, trisphenol epoxy resin, tetraphenol epoxy resin, phenol-xylylene epoxy resin, naphthol-xylylene epoxy resin, phenol-naphthol epoxy resin, phenol-dicyclopentadiene epoxy resin, alicyclic epoxy resin, aliphatic epoxy resin, diethylene glycol diglycidyl ether, sorbitol polyglycidyl ether, propylene glycol diglycidyl ether, trimethylolpropane polyglycidyl ether, 1,1,2,2-tetra(p-hydroxyphenyl)ethane tetraglycidyl ether, glycerol triglycidyl ether, ortho-secondary-butylphenyl glycidyl ether, 1,6-bis(2,3-epoxypropoxy)naphthalene, diglycerol polyglycidyl ether, polyethylene glycol glycidyl ether, YDB-340, YDB-412, YDF-2001, YDF-2004 (trade names, all manufactured by Nippon Steel Chemical Co., Ltd.), NC-3000-H, EPPN-501H, EOCN-1020, NC-7000L, EPPN-201L, XD-1000, EOCN-4600 (trade names, all manufactured by Nippon Kayaku Co, Ltd.), Epikote (Registered Trade Mark) 1001, Epikote 1007, Epikote 1009, Epikote 5050, Epikote 5051, Epikote 1031S, Epikote 180S65, Epikote 157H70, YX-315-75 (trade names, all manufactured by Japan Epoxy Resins Co., Ltd.), EHPE3150, Placcel G402, PUE101, PUE105 (trade names, all manufactured by Daicel Chemical Industries, Ltd.)/Epiclon (Registered Trade Mark) 830, 850, 1050, N-680, N-690, N-695, N-770, HP-7200, HP-820, EXA-4850-1000 (trade names, all manufactured by DIC Corp.), Denacol (Registered Trade Mark) EX-201, EX-251, EX-203, EX-313, EX-314, EX-321, EX-411, EX-511, EX-512, EX-612, EX-614, EX-614B, EX-711, EX-731, EX-810, EX-911, EM-150 (trade names, all manufactured by Nagase Chemtex Corp.), Epolight (Registered Trade Mark) 70P and Epolight 100MF (trade names, both manufactured by Kyoeisha Chemical Co., Ltd.).

In addition, other examples include isocyanate compounds in the form of 4,4'-diphenylmethane diisocyanate, tolylene diisocyanate, 1,3-phenylene-bismethylene diisocyanate, cyclohexylmethane-4,4'-diisocyanate, isophorone diisocyanate, hexamethylene diisocyanate, Takenate (Registered Trade Mark) 500, 600, Cosmonate (Registered Trade Mark) NBDI, ND (trade names, all manufactured by Mitsui Chemicals, Inc.), Duranate (Registered Trade Mark) 17B-60PX, TPA-B80E, MF-B60X, MF-K60X and E402-B80T (trade names, all manufactured by Asahi Kasei Chemicals Corp.).

In addition, although other examples include bismaleimide compounds in the form of 4,4'-diphenylmethane bismaleimide, phenylmethane maleimide, tri-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4'-diphenylsulfide bismaleimide, 1,3-bis(3-maleimidophenoxy)benzene, 1,3-bis(4-maleimidophenoxy)benzene, BMI-1000, BMI-1100, BMI-2000, BMI-2300, BMI-3000, BMI-4000, BMI-5100, BMI-7000, BMI-TMH, BMI-6000 and BMI-8000 (trade names, all manufactured by Daiwa Kasei Kogyo Co., Ltd.), they are not limited thereto provided they are compounds that demonstrate thermal crosslinking in the manner described above.

The incorporated amount in the case of using a crosslinking agent is preferably 0.5 parts by weight to 20 parts by weight and more preferably 2 parts by weight to 10 parts by weight based on 100 parts by weight of the resin (A). In the case the incorporated amount is 0.5 parts by weight or more, favorable heat resistance and chemical resistance are demonstrated, while in the case the incorporated amount is 20 parts by weight or less, storage stability is superior.

The photosensitive resin composition of the present invention may also contain an organic titanium compound. The containing of an organic titanium compound allows the formation of a photosensitive resin layer having superior chemical resistance even in the case of having cured at a low temperature of about 250° C.

Examples of organic titanium compounds able to be used for the organic titanium compound include those in which an organic chemical substance is bound to a titanium atom through a covalent bond or ionic bond.

Specific examples of the organic titanium compound include following I) to VII):

I) titanium chelate compounds: titanium chelate compounds having two or more alkoxy groups are more preferable since they allow the obtaining of storage stability of a negative-type photosensitive resin composition as well as a favorable pattern, and specific examples thereof include titanium bis(triethanolamine)diisopropoxide, titanium di(n-butoxide)bis(2,4-pentanedionate), titanium diisopropoxide bis(2,4-pentanedionate), titanium diisopropoxide bis(tetramethylheptanedionate) and titanium diisopropoxide bis(ethylacetoacetate).

II) Tetraalkoxytitanium compounds: examples thereof include titanium tetra(n-butoxide), titanium tetraethoxide, titanium tetra(2-ethylhexoxide), titanium tetraisobutoxide, titanium tetraisopropoxide, titanium tetramethoxide, titanium tetramethoxypropoxide, titanium tetramethylphenoxide, titanium tetra(n-nonyloxide), titanium tetra(n-propoxide), titanium tetrastearyloxide and titanium tetrakis[bis{2,2-(allyloxymethyl)butoxide}].

III) Titanocene compounds: examples thereof include titanium pentamethylcyclopent adienyl trimethoxide, bis($\eta^5$-2,4-cyclopentadien-1-yl) bis(2,6-difluorophenyl) titanium and bis($\eta^5$-2,4-cyclopentadien-1-yl) bis(2,6-difluoro-3-(1H-pyrrol-1-yl)phenyl) titanium.

IV) Monoalkoxy titanium compounds: examples thereof include titanium tris(dicetylphosphate)isopropoxide and titanium tris(dodecylbenzenesulfonate)isopropoxide.

V) Titanium oxide compounds: examples thereof include titanium oxide bis(pentanedionate), titanium oxide bis(tetramethylheptanedionate) and phthalocyanine titanium oxide.

VI) Titanium tetraacetylacetonate compounds: examples thereof include titanium tetraacetylacetonate.

VII) Titanate coupling agents: examples thereof include isopropyltridecylbenzenesulfonyl titanate.

Among these, the organic titanium compound is preferably at least one type of compound selected from the group consisting of the aforementioned titanium chelate compounds (I), tetraalkoxytitanium compounds (II) and titanocene compounds (III) from the viewpoint of demonstrating more favorable chemical resistance. Titanium diisopropoxide bis(ethylacetoacetate), titanium tetra(n-butoxide) and bis($\eta^5$-2,4-cyclopentadien-1-yl) bis(2,6-difluoro-3-(1H-pyrrol-1-yl)phenyl) titanium are particularly preferable.

The incorporated amount in the case of incorporating the organic titanium compound is preferably 0.05 parts by weight to 10 parts by weight and more preferably 0.1 parts by weight to 2 parts by weight based on 100 parts by weight of the resin (A). In the case the incorporated amount is 0.05 parts by weight or more, favorable heat resistance and chemical resistance are demonstrated, while in the case the incorporated amount is 10 parts by weight or less, storage stability is superior.

Moreover, an adhesive assistant can be optionally incorporated to improve adhesion between a substrate and a film formed using the photosensitive resin composition of the present invention. Examples of adhesive assistants include silane coupling agents such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis (N-[3-triethoxysilyl]propylamido)-4,4'-dicarboxylic acid, benzene-1,4-bis(N-[3-triethoxysilyl]propylamido)-2,5-dicarboxylic acid, 3-(triethoxysilyl)propylsuccinic anhydride, N-phenylaminopropyltrimethoxysilane, 3-ureidopropyltrimethoxysilane, 3-ureidopropyltriethoxysilane or 3-(trialkoxysilyl)propyl succinic anhydride, and aluminum-based adhesive assistants such as aluminum tris(ethylacetoacetate), aluminum tris(acetylacetonate) or ethylacetylacetate aluminum diisopropylate.

Among these adhesive assistants, silane coupling agents are more preferable from the viewpoint of adhesive strength. In the case the photosensitive resin composition contains an adhesive assistant, the incorporated amount of the adhesive assistant is preferably within the range of 0.5 parts by weight to 25 parts by weight based on 100 parts by weight of the resin (A).

Examples of silane coupling agents include, but are not limited to, 3-mercaptopropyltrimethoxysilane (KBM803: trade name, manufactured by Shin-etsu Chemical Co., Ltd., Sila-Ace S810: trade name, manufactured by Chisso Corp.), 3-mercaptopropyltriethoxysilane (SIM6475.0: trade name, manufactured by Azmax Corp.), 3-mercaptopropylmethyldimethoxysilane (LS1375: trade name, manufactured by Shin-Etsu Chemical Co., Ltd., SIM6474.0: trade name, manufactured by Azmax Corp.), mercaptomethyltrimethoxysilane (SIM6473.5C, trade name, manufactured by Azmax Corp.), mercaptomethylmethyldimethoxysilane (SIM6473.0, trade name, manufactured by Azmax Corp.), 3-mercaptopropyldiethoxymethoxysilane, 3-mercaptopropylethoxydimethoxysilane, 3-mercaptopropyltripropoxysilane, 3-mercaptopropyldiethoxypropoxysilane, 3-mercaptopropylethoxydipropoxysilane, 3-mercaptopropyldimethoxypropoxysilane, 3-mercaptopropylmethoxydipropoxysilane, 2-mercaptoethyltrimethoxysilane, 2-mercaptoethyldiethoxymethoxysilane, 2-mercaptoethylethoxydimethoxysilane, 2-mercaptoethyltripropoxysilane, 2-mercaptoethyltripropoxysilane, 2-mercaptoethylethoxydipropoxysilane, 2-mercaptoethyldimethoxypropoxysilane, 2-mercaptoethylmethoxydipropoxysilane, 4-mercaptobutyltrimethoxysilane, 4-mercaptobutyltriethoxysilane, 4-mercaptobutyltripropoxysilane, N-(3-triethoxysilylpropyl)urea (LS3610: trade name, Shin-Etsu Chemical Co., Ltd., SIU9055.0, trade name, manufactured by Azmax Corp.), N-(3-trimethoxysilylpropyl)urea (SIU9058.0: trade name, manufactured by Azmax Corp.), N-(3-diethoxymethoxysilylpropyl)urea, N-(3-ethoxydimethoxysilylpropyl)urea, N-(3-tripropoxysilylpropyl)urea, N-(3-diethoxypropoxysilylpropyl)urea, N-(3-ethoxydipropoxysilylpropyl)urea, N-(3-dimethoxypropoxysilylpropyl)urea, N-(3-methoxydipropoxysilylpropyl)urea, N-(3-trimethoxysilylethyl)urea, N-(3-ethoxydimethoxysilylethyl)urea, N-(3-tripropoxysilylethyl)urea, N-(3-tripropoxysilylethyl)urea, N-(3-ethoxydipropoxysilylethyl)urea, N-(3-dimethoxypropoxysilylethyl)urea, N-(3-methoxydipropoxysilylethyl)urea, N-(3-trimethoxysilylbutyl)urea, N-(3-triethoxysilylbutyl)urea, N-(3-tripropoxysilylbutyl)urea, 3-(m-aminophenoxy)propyltrimethoxysilane (SLA0598.0: manufactured by Azmax Corp.), m-aminophenyltrimethoxysilane (SLA0599.0: trade name, manufactured by Azmax Corp.), p-aminophenyltrimethoxysilane (SLA0599.1: trade name, manufactured by Azmax Corp.), aminophenyltrimethoxysilane (SLA0599.2 trade name, manufactured by Azmax Corp.), 2-(trimethoxysilylethyl)pyridine (SIT8396.0: trade name, manufactured by Azmax Corp.), 2-(triethoxysilylethyl)pyridine, 2-(dimethoxysilylmethylethyl)pyridine, 2-(diethoxysilylmethylethyl)pyridine, (3-triethoxysilylpropyl)-t-butylcarbamate, (3-glycidoxypropyl)triethoxysilane, tetramethoxysilane, tetraethoxysilane, tetra-n-propoxysilane, tetra-i-propoxysilane, tetra-n-butoxysilane, tetra-i-butoxysilane, tetra-t-butoxysilane, tetrakis(methoxyethoxysilane), tetrakis(methoxy-n-propoxysilane), tetrakis(ethoxyethoxysilane), tetrakis (methoxyethoxyethoxysilane), bis(trimethoxysilyl)ethane, bis(trimethoxysilyl)hexane, bis(triethoxysilyl)methane, bis (triethoxysilyl)ethane, bis(triethoxysilyl)ethylene, bis(triethoxysilyl)octane, bis(triethoxysilyl)octadiene, bis[3-(triethoxysilyl)propyl]disulfide, bis[3-(triethoxysilyl)propyl] tetrasulfide, di-t-butoxydiacetoxysilane, di-i-butoxyaluminoxytriethoxysilane, bis(pentadionate) titanium-O,O'-bis(oxyethyl)-aminopropyltriethoxysilane, phenylsilanetriol, methylphenylsilanediol, ethylphenylsilanediol, n-propylphenylsilanediol, isopropylphenylsilanediol, n-butylphenvsilanedio, isobutylphenylsilanediol, tert-butylphenylsilanediol, diphenylsilanediol, dimethoxydiphenylsilane, diethoxydiphenylsilane, dimethoxy-di-p-tolylsilane, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-buyldiphenylsilanol and triphenylsilanol. These may be used alone or in combination.

Among the aforementioned silane coupling agents, phenylsilanetriol, trimethoxyphenylsilane, trimethoxy(p-tolyl) silane, diphenylsilanediol, dimethoxydiphenylsilane, diethoxydiphenylsilane, dimethoxy-di-p-tolylsilane, triphenylsilane and silane coupling agents represented by the following structures are particularly preferable as silane coupling agents.

[Chemical Formula 264]

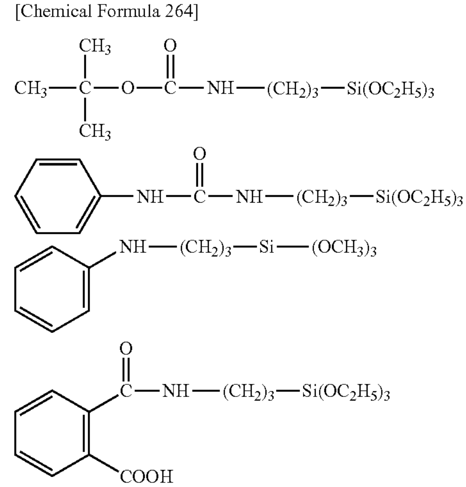

0.01 parts by weight to 20 parts by weight based on 100 parts by weight of the resin (A) is preferable for the incorporated amount of silane coupling agent in the case of incorporating a silane coupling agent.

The photosensitive resin composition of the present invention may further include other components in addition to those described above. Preferable examples of these components vary according to whether a negative-type, using, for example, a polyamic acid ester, or positive-type, using a phenol resin and the like, is used for the resin (A).

A sensitizer for improving photosensitivity can be optionally incorporated in the case of a negative-type using a polyimide precursor and the like for the resin (A). Examples of sensitizers include Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino) chalcone, p-diethylaminocinnamylidene indanone, p-dimethylaminobenzylidene indanone, 2-(p-dimethylaminophenylbiphenylene)benzothiazole, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminostyryl)benzoxazole, 2-(p-dimethylaminostyryl)benzothiazole, 2-(p-dimethylaminostyryl)naphtho(1,2-d)thiazole and 2-(p-dimethylaminobenzoyl)styrene. These can be used alone or, for example, 2 to 5 types can be used in combination.

The incorporated amount of the sensitizer in the case the photosensitive resin composition contains a sensitizer for improving photosensitivity is preferably 0.1 parts by weight to 25 parts by weight based on 100 parts by weight of the resin (A).

In addition, a monomer having a photopolymerizable unsaturated bond can be optionally incorporated to improve resolution of a relief pattern. The monomer is preferably a (meth)acrylic compound that undergoes a radical polymerization reaction by a photopolymerization initiator, and although not limited to that indicated below, examples thereof include compounds such as mono- or diacrylates and methacrylates of ethylene glycol or polyethylene glycol such as diethylene glycol dimethacrylate or tetraethylene glycol dimethacrylate, mono- or diacrylates and methacrylates of propylene glycol or polypropylene glycol, mono-, di- or triacrylates, methacrylates, cyclohexane diacrylates, and dimethacrylates of glycerol, diacrylates and dimethacrylates of 1,4-butanediol, diacrylates and dimethacrylates of 1,6-hexanediol, diacrylates and dimethacrylates of neopentyl glycol, mono- or diacrylates, methacrylates, benzene trimethacrylates, isobornyl acrylates and methacrylates, acrylamides and derivatives thereof, methacrylamides and derivatives thereof and trimethylolpropane triacrylates and methacrylates of bisphenol A, triacrylates and methacrylates of glycerol, di- tri- or tetraacrylates and methacrylates of pentaerythritol, and ethylene oxide or propylene oxide adducts of these compounds.

In the case the photosensitive resin composition contains the aforementioned monomer having a photopolymerizable unsaturated bond in order to improve the resolution of a relief pattern, the incorporated amount of the photopolymerizable monomer having an unsaturated bond is preferably 1 part by weight to 50 parts by weight based on 100 parts by weight of the resin (A).

In addition, in the case of a negative type using a polyamic acid ester for the resin (A), a thermal polymerization inhibitor can be optionally incorporated to improve viscosity and photosensitivity stability of the photosensitive resin composition when storing in a state of a solution containing a solvent in particular. Examples of thermal polymerization inhibitors include hydroquinone, N-nitrosodiphenylamine, p-tert-butylcatechol, phenothiazine, N-phenylnaphthylamine, ethyldiamine tetraacetic acid, 1,2-cyclohexanediamine tetraacetic acid, glycol ether diamine tetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt and N-nitroso-N-(1-naphthyl) hydroxylamine ammonium salt.

The incorporated amount of the thermal polymerization inhibitor in the case of incorporating in the photosensitive resin composition is preferably within the range of 0.005 parts by weight to 12 parts by weight based on 100 parts by weight of the resin (A).

On the other hand, in the case of a positive type using a phenol resin and the like for the resin (A) in the photosensitive resin composition of the present invention, dyes, surfactants, thermal acid generators, solubility enhancers and adhesive assistants for enhancing adhesion with a base material conventionally used as additives of photosensitive resin compositions can be used as necessary in the photosensitive resin composition to enhance adhesion with a substrate.

In providing an even more detailed description of the aforementioned additives, examples of dyes include methyl violet, crystal violet and malachite green. In addition, examples of surfactants include nonionic surfactants composed of polyglycols or derivatives thereof, such as polypropylene glycol or polyoxyethylene lauryl ether, examples of which include fluorine-based surfactants such as Fluorad (trade name, Sumitomo 3M Ltd.), Megafac (trade name, Dainippon Ink & Chemicals, Inc.) or Lumiflon (trade name, Asahi Glass Co., Ltd.), and organic siloxane surfactants such as KP341 (trade name, Shin-Etsu Chemical Co., Ltd.), DBE (trade name, Chisso Corp.) or Granol (trade name, Kyoeisha Chemical Co., Ltd.). Examples of adhesive assistants include alkylimidazoline, butyric acid, alkyl acid, polyhydroxystyrene, poly(vinyl methyl ether), t-butyl novolac resin, epoxysilane and epoxy polymers, as well as various types of silane coupling agents.

The incorporated amounts of the aforementioned dyes and surfactants are preferably 0.1 parts by weight to 30 parts by weight based on 100 parts by weight of the resin (A).

In addition, a thermal acid generator can be optionally incorporated from the viewpoint of demonstrating favorable thermal properties and mechanical properties of the cured product even in the case of having lowered the curing temperature.

A thermal acid generator is preferably incorporated from the viewpoint of demonstrating favorable thermal properties and mechanical properties of the cured product even in the case of having lowered the curing temperature.

Examples of thermal acid generators include salts formed from strong acid and base such as onium salts or imidosulfonates having a function that forms an acid as a result of heating.

Examples of onium salts include diaryliodonium salts such as aryldiazonium salt or diphenyliodonium salt, di(alkylaryl)iodonium salts such as di(t-butylphenyl)iodonium salt, trialkylsulfonium salts such as trimethylsulfonium salt, dialkylmonoarylsulfonium salts such as dimethylphenylsulfonium salt, diarylmonoalkylsulfonium salts such as diphenylmethylsulfonium salt, and triarylsulfonium salts.

Among these, di(t-butylphenyl)iodonium salt of para-toluenesulfonic acid, di(t-butylphenyl)iodonium salt of trifluoromethanesulfonic acid, trimethylsulfonium salt of trifluoromethanesulfonic acid, dimethylphenylsulfonium salt of trifluoromethanesulfonic acid, diphenylmethylsulfonium salt of trifluoromethanesulfonic acid, di(t-butylphenyl)iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid and dimethylphenylsulfonium salt of toluenesulfonic acid are preferable.

In addition, salts such as pyridinium salts formed from strong acids and bases as indicated below can also be used as salts formed from strong acid and base in addition to the previously described onium salts. Examples of strong acids include arylsulfonic acids in the manner of p-toluenesulfonic acid or benzenesulfonic acid, perfluoroalkylsulfonic acids in the manner of camphorsulfonic acid, trifluoromethanesulfonic acid or nonafluorobutanesulfonic acid, and alkylsulfonic acids in the manner of methanesulfonic acid, ethanesulfonic acid or butanesulfonic acid. Examples of bases include pyridines and alkylpyridines in the manner of 2,4,6-trimethylpyridine, and N-alkylpyridines and halogenated N-alkylpyridines in the manner of 2-chloro-N-methylpyridine.

Although imidosulfonates such as naphthoylimidosulfonate or phthalimidosulfonate can be used as imidosulfonate, there are no particular limitations thereon provided they are compounds capable of generating acid in the presence of heat.

The incorporated amount in the case of using a thermal acid generator is preferably 0.1 parts by weight to 30 parts by weight, more preferably 0.5 parts by weight to 10 parts by weight, and even more preferably 1 part by weight to 5 parts by weight, based on 100 parts by weight of the resin (A).

In the case of a positive-type photosensitive resin composition, a solubility enhancer can be used to accelerate removal of resin that is no longer required following photosensitization. A compound having a hydroxyl group or carboxyl group, for example, is preferable. Examples of compounds having a hydroxyl group include ballast agents used in the previously described naphthoquinone diazide compounds, along with para-cumylphenol, bisphenols, resorcinols, linear phenol compounds such as MtrisPC or MtetraPC, non-linear phenol compounds such as TrisP-HAP, TrisP-PHBA or TrisP-PA (all manufactured by Honshu Chemical Industry Co., Ltd.), diphenylmethane having 2 to 5 phenol substituents, 3,3-diphenylpropane having 1 to 5 phenol substituents, compounds obtained by reacting 2,2-bis(3-amino-4-hydroxyphenyl)hexafluoropropane and 5-norbornene-2,3-dicarboxylic anhydride at a molar ratio of 1:2, compounds obtained by reacting bis(3-amino-4-hydroxyphenyl)sulfone and 1,2-cyclohexylcarboxylic anhydride at a molar ratio of 1:2, N-hydroxysuccinimide, N-hydroxyphthalimide and N-hydroxy-5-norbornene-2,3-dicarboxylic acid imide. Examples of compounds having a carboxyl group include 3-phenyllactic acid, 4-hydroxyphenyllactic acid, 4-hydroxymandelic acid, 3,4-dihydroxymandelic acid, 4-hydroxy-3-methoxymandelic acid, 2-methoxy-2-(1-naphthyl)propionic acid, mandelic acid, atrolactic acid, α-methoxyphenylacetic acid, O-acetylmandelic acid and itaconic acid.

The incorporated amount in the case of incorporating a solubility enhancer is preferably 0.1 parts by weight to 30 parts by weight based on 100 parts by weight of the resin (A).

<Method for Producing Cured Relief Pattern and Semiconductor Device>

In addition, the present invention provides a method for producing a cured relief pattern, comprising: (1) a step for forming a resin layer on a substrate by coating the previously described photosensitive resin composition of the present invention on the substrate, (2) a step for exposing the resin layer to light, (3) a step for forming a relief pattern by developing the resin layer after exposing to light, and (4) a step for forming a cured relief pattern by heat-treating the relief pattern by irradiating with microwaves. The following provides an explanation of a typical aspect of each step.

(1) Step for Forming a Resin Layer on a Substrate by Coating the Photosensitive Resin Composition on the Substrate In the present step, the photosensitive resin composition of the present invention is coated onto a substrate followed by drying as necessary to form a resin layer. A method conventionally used to coat photosensitive resin compositions can be used, examples of which include coating methods using a spin coater, bar coater, blade coater, curtain coater or screen printer, and spraying methods using a spray coater.

A coating film composed of the photosensitive resin composition can be dried as necessary. A method such as air drying, or heat drying or vacuum drying using an oven or hot plate, is used for the drying method. More specifically, in the case of carrying out air drying or heat drying, drying can be carried out under conditions consisting of 1 minute to 1 hour at 20° C. to 140° C. The resin layer can be formed on a substrate in this manner.

(2) Step for Exposing Resin Layer to Light

In the present step, the resin layer formed in the manner described above is exposed to an ultraviolet light source and the like either directly or through a photomask having a pattern or reticle using an exposure device such as a contact aligner, mirror projector or stepper.

Subsequently, post-exposure baking (PEB) and/or pre-development baking may be carried out using an arbitrary combination of temperature and time as necessary for the purpose of improving photosensitivity and the like. Although the range of baking conditions preferably consists of a temperature of 40° C. to 120° C. and time of 10 seconds to 240 seconds, the range is not limited thereto provided various properties of the photosensitive resin composition of the present invention are not impaired.

(3) Step for Forming Relief Pattern by Developing Resin Layer after Exposing to Light In the present step, exposed portions or unexposed portions of the photosensitive resin layer are developed and removed following exposure. Unexposed portions are developed and removed in the case of using a negative-type photosensitive resin composition (such as in the case of using a polyamic acid ester for the resin (A)), while exposed portions are developed and removed in the case of using a positive-type photosensitive resin composition (such as in the case of using a phenol resin for the resin (A)). An arbitrary method can be selected and used for the development method from among conventionally known photoresist development methods, examples of which include the rotary spraying method, paddle method and immersion method accompanying ultrasonic treatment. In addition, post-development baking using an arbitrary combination of temperature and time may be carried out as necessary after development for the purpose of adjusting the form of the relief pattern.

A good solvent with respect to the photosensitive resin composition or a combination of this good solvent and a poor solvent is preferable for the developer used for development. In the case of a photosensitive resin composition that does not dissolve in an aqueous alkaline solution, for example, preferable examples of good solvents include N-methylpyrrolidone, N-cyclohexyl-2-pyrrolidone, N,N-dimethylacetoamide, cyclopentanone, cyclohexanone, γ-butyrolactone and α-acetyl-γ-butyrolactone, while preferable examples of poor solvents include toluene, xylene, methanol, ethanol, isopropyl alcohol, ethyl lactate, propylene glycol methyl ether acetate and water. In the case of using a mixture of good solvent and poor solvent, the proportion of poor solvent to good solvent is preferably adjusted according to the solubility of polymer in the photosensitive resin composition. In addition, two or more types of each solvent, such as a combination of several types of each solvent, can also be used.

On the other hand, in the case of a photosensitive resin composition that dissolves in an aqueous alkaline solution, the developer used for development dissolves and removes an aqueous alkaline solution-soluble polymer, and typically is an aqueous alkaline solution having an alkaline compound dissolved therein. The alkaline compound dissolved in the developer may be either an inorganic alkaline compound or organic alkaline compound.

Examples of inorganic alkaline compounds include lithium hydroxide, sodium hydroxide, potassium hydroxide, diammonium hydrogen phosphate, dipotassium hydrogen phosphate, disodium hydrogen phosphate, lithium silicate, sodium silicate, potassium silicate, lithium carbonate, sodium carbonate, potassium carbonate, lithium borate, sodium borate, potassium borate and ammonia.

Examples of organic alkaline compounds include tetramethylammonium hydroxide, tetraethylammonium hydroxide, trimethylhydroxyethylammonium hydroxide, methylamine, dimethylamine, trimethylamine, monoethylamine, diethylamine, triethylamine, n-propylamine, di-n-propylamine, isopropylamine, diisopropylamine, methyldiethylamine, dimethylethanolamine, ethanolamine and triethanolamine.

Moreover. a water-soluble organic solvent such as methanol, ethanol, propanol or ethylene glycol, surfactant, storage stabilizer or resin dissolution inhibitor and the like can be added in a suitable amount thereof to the aforementioned aqueous alkaline solution as necessary. The relief pattern can be formed in the above manner.

(4) Step for Forming Cured Relief Pattern by Heat-Treating Relief Pattern by Irradiating with Microwaves In the present step, the relief pattern obtained by developing in the manner previously described is converted to a cured relief pattern by heating by irradiating with microwaves. There are no particular limitations on the frequency or output of the radiated microwaves or on the radiation method. Heat curing is required to be carried out in an oven capable of radiating microwaves. Although heating can be carried out under conditions consisting of, for example, 30 minutes to 5 hours at 180° C. to 400° C., it is preferably carried out within a temperature range of 180° C. to 250° C. Air may be used for the atmospheric gas during heat curing, or an inert gas such as nitrogen or argon can be used.

<Semiconductor Device>

The present invention also provides a semiconductor device that contains a cured relief pattern obtained according to the method for producing a cured relief pattern of the present invention described above. The present invention also provides a semiconductor device containing a semiconductor element in the form of a base material and a cured relief pattern formed according to the aforementioned method for producing a cured relief pattern on the aforementioned base material. In addition, the present invention can be applied to a method for producing a semiconductor device that uses a semiconductor element for the base material and contains the aforementioned method for producing a cured relief pattern as a portion of the process thereof. The semiconductor device of the present invention can be produced by combining with known methods for producing semiconductor devices by forming the cured relief pattern formed according to the aforementioned method for producing a cured relief pattern as a surface protective film, interlayer insulating film, rewiring insulating film, flip-chip device protective film or protective film of a semiconductor device having a bump structure.

The photosensitive resin composition is also useful in applications such as the interlayer insulation of a multilayer circuit, cover coating of a flexible copper-clad board, solder-resistive film or liquid crystal alignment film in addition to a semiconductor device as described above.

EXAMPLES

First Embodiment

The following provides an explanation of Examples 1 to 24 and Comparative Examples 1 to 6 as a first embodiment of the present invention.

Although the following provides a detailed explanation of the present invention using examples thereof, the present invention is not limited thereto. In the examples, comparative examples and production examples, physical properties of the photosensitive resin composition were measured and evaluated in accordance with the methods indicated below.

<Weight Average Molecular Weight>

The weight average molecular weight (Mw) of each resin was measured by gel permeation chromatography (standard polystyrene conversion). The Shodex 805M/806M serial columns (trade name) manufactured by Showa Denko K.K. were used for measurement, Shodex STANDARD SM-105 (trade name) manufactured by Showa Denko K.K. was selected for the standard monodisperse polystyrene, N-methyl-2-pyrrolidone was used for the developing solvent, and the Shodex RI-930 (trade name) manufactured by Showa Denko K.K. was used for the detector.

<Evaluation of Copper Adhesion of Cured Film>

Ti at a thickness of 200 nm and copper at a thickness of 400 nm were sequentially sputtered on a 6-inch silicon wafer (Fujimi Inc., thickness: 625±25 μm) using a sputtering device (Model L-440S-FHL, Canon Anelva Corp.). Continuing, a photosensitive polyamic acid ester composition prepared according to the method to be subsequently described was spin-coated on the wafer using a coater developer (Model D-Spin60A, Sokudo Co., Ltd.) followed by drying to form a coating film having a thickness of 10 nm. This coating film was then irradiated at an energy level of 300 mJ/cm$^2$ with a parallel light mask aligner (Model PLA-501FA, Canon Inc.) using a mask having a test pattern. Next, the wafer having the coating film formed thereon was subjected to heat treatment for 2 hours at 230° C. in a nitrogen atmosphere using a programmable curing oven (Model VF-2000, Koyo Lindberg Ltd.) to obtain a cured relief pattern composed of polyimide resin having a thickness of about 7 nm on the copper. The resulting cured film was treated for 100 hours under conditions of 120° C., 2 atm and relative humidity of 100% with a pressure cooker tester (Model PC-422R8D, Hirayama Manufacturing Corp.), followed by making 11 cuts each in the vertical and horizontal directions at 1 mm intervals in a grid pattern with a box knife to form 100 independent films. Subsequently, a peel test was carried out using Scotch tape (Registered Trade Mark) and the number of films that peeled off was recorded in Table 1 to be subsequently described. A smaller number of peeled films indicates favorable reliability during use as a semiconductor.

<Chemical Resistance Test>

A photosensitive polyamic acid ester composition prepared according to the method to be subsequently described was spin-coated on a 6-inch silicon wafer (Fujimi Inc., thickness: 625±25 μm) using a coater developer (Model D-Spin60A, Sokudo Co., Ltd.) followed by drying to form a coating film having a thickness of 10 Urn. This coating film was then irradiated at an energy level of 300 mJ/cm$^2$ with a parallel light mask aligner (Model PLA-501FA, Canon Inc.) using a mask having a test pattern. Next, the wafer having the coating film formed thereon was subjected to heat treatment for 2 hours at 230° C. in a nitrogen atmosphere using a programmable curing oven (Model VF-2000, Koyo Lindberg Ltd.) to obtain a cured relief pattern composed of polyimide resin having a thickness of about 7 μm on the silicon. The resulting cured film was treated for 1000 hours at 150° C. with a pressure cooker tester (Model PC-422R8D, Hirayama Manufacturing Corp.), followed by immersing for 60 minutes in a chemical solution (1% by weight potassium hydroxide/tetramethyl ammonium hydroxide solution) at 110° C. and observing the residual film rate and the presence of cracks. Those cured films having a residual film rate of 90% or more and observed to be free of cracks were evaluated as “A”, while those not satisfying either one of the above requirements were evaluated as “B”.

Production Example 1 (Synthesis of Polymer 1)

147.1 g of 3,3',4,4'-biphenyltetracarboxylic dianhydride (BPDA) were placed in a separable flask having a volume of 2 liters followed by adding 131.2 g of 2-hydroxyethyl methacrylate (HEMA) and 400 ml of γ-butyrolactone, stirring at room temperature and adding 81.5 g of pyridine while stirring to obtain a reaction mixture. Following completion of generation of heat by the reaction, the reaction mixture was allowed to cool to room temperature and then allowed to stand for 16 hours.

Next, a solution obtained by dissolving 206.3 g of dicyclohexylcarbodiimide (DCC) in 180 ml of γ-butyrolactone was added to the reaction mixture over the course of 40 minutes while cooling with ice and stirring followed by adding a suspension of 93.0 g of 4,4'-diaminodiphenyl ether (DADPE) in 350 ml of γ-butyrolactone over the course of 60 minutes while stirring. After further stirring for 2 hours at room temperature, 30 ml of ethyl alcohol were added followed by stirring for 1 hour and then adding 400 ml of γ-butyrolactone. The precipitate that formed in the reaction mixture was removed by filtration to obtain a reaction liquid.

The resulting reaction liquid was added to 3 L of ethyl alcohol to form a precipitate composed of a crude polymer. The resulting crude polymer was filtered out and dissolved in 1.5 L of tetrahydrofuran to obtain a crude polymer solution. The resulting crude polymer solution was dropped into 28 L of water to precipitate the polymer, and after filtering out the resulting precipitate, the precipitate was vacuum-dried to obtain a powdered polymer (Polymer 1). When the molecular weight of Polymer 1 was measured by gel permeation chromatography (standard polystyrene conversion), the weight average molecular weight (Mw) thereof was 22,000.

Production Example 2 (Synthesis of Polymer 2)

A reaction was carried out in the same manner as the method described in the aforementioned Production Example 1 with the exception of using a mixture of a 54.5 g of pyromellitic anhydride (PMDA) and 80.6 g of benzophenone-3,3',4,4'-tetracarboxylic dianhydride (BTDA) instead of the 147.1 g of 3,3',4,4'-biphenyltetracarboxylic dianhydride (BPDA) used in Production Example 1 to obtain Polymer 2. When the molecular weight of Polymer 2 was measured by gel permeation chromatography (standard polystyrene conversion), the weight average molecular weight (Mw) thereof was 22,000.

Production Example 3 (Synthesis of Polymer 3)

A reaction was carried out in the same manner as the method described in the aforementioned Production Example 1 with the exception of using 155.1 g of 4,4'-oxydiphthalic dianhydride (ODPA) instead of the 147.1 g of 3,3',4,4'-biphenyltetracarboxylic dianhydride (BPDA) of Production Example 1 and using 50.2 g of p-phenylenediamine (p-PD) instead of the 93.0 g of 4,4'-diaminodiphenyl ether (DADPE) to obtain Polymer 3. When the molecular weight of Polymer 3 was measured by gel permeation chromatography (standard polystyrene conversion), the weight average molecular weight (Mw) thereof was 20,000.

Production Example 4 (Synthesis of Polymer 4)

A reaction was carried out in the same manner as the method described in the aforementioned Production Example 1 with the exception of using 148.8 g of 2,2'-bis(trifluoromethyl)benzidine instead of the 93.0 g of the 4,4'-diaminobiphenyl ether (DADPE) used in Production Example 1 to obtain Polymer 4. When the molecular weight of Polymer 4 was measured by gel permeation chromatography (standard polystyrene conversion), the weight average molecular weight (Mw) thereof was 20,000.

Production Example 5 (Synthesis of Polymer 5)

A reaction was carried out in the same manner as the method described in the aforementioned Production Example 1 with the exception of using 155.1 g of 4,4'-oxydiphthalic dianhydride (ODPA) instead of the 147.1 g of 3,3',4,4'-biphenyltetracarboxylic dianhydride (BPDA) used in Production Example 1 to obtain Polymer 5. When the molecular weight of Polymer 5 was measured by gel permeation chromatography (standard polystyrene conversion), the weight average molecular weight (Mw) thereof was 22,000.

Production Example 6 (Synthesis of Polymer 6)

A reaction was carried out in the same manner as the method described in the aforementioned Production Example 1 with the exception of using 155.1 g of 4,4'-oxydiphthalic dianhydride (ODPA) instead of the 147.1 g of 3,3',4,4'-biphenyltetracarboxylic dianhydride (BPDA) of Production Example 1 and using 105.5 g of 4,4'-diamino-3,3'-dimethylphenylmethane (MDT) instead of the 93.0 g of 4,4'-diaminodiphenyl ether (DADPE) to obtain Polymer 6. When the molecular weight of Polymer 6 was measured by gel permeation chromatography (standard polystyrene conversion), the weight average molecular weight (Mw) thereof was 22,000.

Production Example 7 (Synthesis of Polymer 7)

A reaction was carried out in the same manner as the method described in the aforementioned Production Example 1 with the exception of using a mixture of a 54.5 g of pyromellitic anhydride (PMDA) and 73.55 g of 3,3',4,4'-biphenyltetracarboxylic dianhydride (BPDA) instead of the 147.1 g of 3,3',4,4'-biphenyltetracarboxylic dianhydride (BPDA) used in Production Example 1 to obtain Polymer 7. When the molecular weight of Polymer 7 was measured by gel permeation chromatography (standard polystyrene conversion), the weight average molecular weight (Mw) thereof was 21,000.

Production Example 8 (Synthesis of Polymer 8)

A reaction was carried out in the same manner as the method described in the aforementioned Production Example 1 with the exception of using a mixture of a 54.5 g of pyromellitic anhydride (PMDA) and 77.55 g of 4,4'-oxydiphthalic dianhydride (ODPA) instead of the 147.1 g of 3,3',4,4'-biphenyltetracarboxylic dianhydride (BPDA) used in Production Example 1 to obtain Polymer 8. When the molecular weight of Polymer 8 was measured by gel permeation chromatography (standard polystyrene conversion), the weight average molecular weight (Mw) thereof was 22,000.

Production Example 9 (Synthesis of Polymer 9)

A reaction was carried out in the same manner as the method described in the aforementioned Production Example 1 with the exception of using 155.1 g of 4,4'-oxydiphthalic dianhydride (ODPA) instead of the 147.1 g of 3,3',4,4'-biphenyltetracarboxylic dianhydride (BPDA) of Production Example 1 and using a mixture of 46.5 g of DADPE and 25.11 g of p-phenylenediamine (p-PD) instead of the 147.1 g of the 3,3',4,4'-biphenyltetracarboxylic dianhydride (BPDA) used in Production Example 1 instead of the 93.0 g of 4,4'-diaminodiphenyl ether (DADPE) to obtain Polymer 9. When the molecular weight of Polymer 9 was measured by gel permeation chromatography (standard polystyrene conversion), the weight average molecular weight (Mw) thereof was 23,000.

Example 1

A negative-type photosensitive resin composition was prepared according to the method indicated below followed by evaluation of the resulting photosensitive resin composition. 50 g of a polyimide precursor in the form of Polymer 1 (corresponding to resin (A1)), 50 g of Polymer 5 (corresponding to resin (A4)), 2 g of TR-PBG-305 (trade name, Changzhou Tronly New Electronic Materials Co., Ltd., corresponding to photosensitive component (B)), 4 g of N-phenyldiethanolamine, 0.1 g of titanium diisopropoxide bis(ethylacetoacetate) (corresponding to organic titanium compound (E)), 10 g of tetraethylene glycol dimethacrylate, 0.5 g of 5-methyl-1H-benzotriazole and 0.05 g of 2-nitroso-1-naphthol were dissolved in a mixed solvent composed of 160 g of γ-butyrolactone (corresponding to solvent (C1), to be referred to as "GBL") and 40 g of dimethylsulfoxide (corresponding to solvent (C2)) to obtain a negative-type photosensitive resin composition. The resulting resin composition was evaluated in accordance with the previously described methods and the results are shown in Table 1.

Example 2

A photosensitive resin composition was produced and evaluated in the same manner as the method described in the aforementioned Example 1 with the exception of using 20 g instead of 50 g of the Polymer 1 and using 80 g instead of 50 g of the Polymer 5 used in Example 1. The evaluation results are shown in Table 1.

Example 3

A photosensitive resin composition was produced and evaluated in the same manner as the method described in the aforementioned Example 1 with the exception of using 80 g instead of 50 g of the Polymer 1 and using 20 g instead of 50 g of the Polymer 5 used in Example 1. The evaluation results are shown in Table 1.

Example 4

A photosensitive resin composition was produced and evaluated in the same manner as the method described in the aforementioned Example 1 with the exception of using Polymer 2 instead of the Polymer 1 used in Example 1. The evaluation results are shown in Table 1.

Example 5

A photosensitive resin composition was produced and evaluated in the same manner as the method described in the aforementioned Example 1 with the exception of using Polymer 3 instead of the Polymer 1 used in Example 1. The evaluation results are shown in Table 1.

Example 6

A photosensitive resin composition was produced and evaluated in the same manner as the method described in the aforementioned Example 1 with the exception of using Polymer 4 instead of the Polymer 1 used in Example 1. The evaluation results are shown in Table 1.

Example 7

A photosensitive resin composition was produced and evaluated in the same manner as the method described in the aforementioned Example 1 with the exception of using Polymer 5 instead of the Polymer 1 used in Example 1. The evaluation results are shown in Table 1.

Example 8

A photosensitive resin composition was produced and evaluated in the same manner as the method described in the aforementioned Example 1 with the exception of using 200 g of GBL instead of the 160 g used in Example 1 and omitting the DMSO. The evaluation results are shown in Table 1.

Example 9

A photosensitive resin composition was produced and evaluated in the same manner as the method described in the aforementioned Example 1 with the exception of using 200 g of N-methylpyrrolidone (NMP) instead of the GBL used in Example 1 and omitting the DMSO. The evaluation results are shown in Table 1.

Example 10

A photosensitive resin composition was produced and evaluated in the same manner as the method described in the aforementioned Example 1 with the exception of using Polymer 3 instead of the Polymer 1 used in Example 1 and further using 200 g of NMP instead of the GBL. The evaluation results are shown in Table 1.

Example 11

A photosensitive resin composition was produced and evaluated in the same manner as the method described in the aforementioned Example 1 with the exception of omitting the GBL used in Example 1 and using 200 g of NMP instead of the 40 g of DMSO. The evaluation results are shown in Table 1.

Example 12

A photosensitive resin composition was produced and evaluated in the same manner as the method described in the aforementioned Example 1 with the exception of using NMP instead of the GBL used in Example 1 and using ethyl lactate instead of the DMSO. The evaluation results are shown in Table 1.

Example 13

A photosensitive resin composition was produced and evaluated in the same manner as the method described in the aforementioned Example 1 with the exception of using OXE-01 (trade name, BASF Corp.) instead of the TR-PBG-305 used in Example 1. The evaluation results are shown in Table 1.

Example 14

A photosensitive resin composition was produced and evaluated in the same manner as the method described in the aforementioned Example 1 with the exception of using 1-phenyl-1,2-propanedione-2-(O-ethoxycarbonyl) oxime (Initiator A) instead of the TR-PBG-305 used in Example 1. The evaluation results are shown in Table 1.

Comparative Examples 1 to 5

Evaluations were carried out in the same manner as Example 1 with the exception of changing the compositions to those shown in Table 1. The evaluation results are shown in Table 1.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Resin (A1) | Polymer 1 (g) | 50 | 20 | 80 | | | | 50 | 50 | 50 | |
| | Polymer 2 (g) | | | | 50 | | | | | | |
| Resin (A2) | Polymer 3 (g) | | | | | 50 | | | | | 50 |
| Resin (A3) | Polymer 4 (g) | | | | | | 50 | | | | |
| Resin (A4) | Polymer 5 (g) | 50 | 80 | 20 | 50 | 50 | 50 | | 50 | 50 | 50 |
| | Polymer 6 (g) | | | | | | | 50 | | | |
| Photosensitive Component (B) | TR-PBG-305 (g) | 2 | 2 | 2 | 2 | 2 | 2 | 2 | 2 | 2 | 2 |
| | OXE-01 | | | | | | | | | | |
| | Initiator A (g) | | | | | | | | | | |
| Solvent (C1) | GBL (g) | 160 | 160 | 160 | 160 | 160 | 160 | 160 | 200 | | |
| | NMP (g) | | | | | | | | | 200 | 200 |
| Solvent (C2) | DMSO (g) | 40 | 40 | 40 | 40 | 40 | 40 | 40 | | | |
| Other Solvent | Ethyl Lactate (g) | | | | | | | | | | |
| Copper adhesion | | 0/100 | 0/100 | 10/100 | 0/100 | 0/100 | 0/100 | 10/100 | 30/100 | 30/100 | 30/100 |

| | | Ex. 11 | Ex. 12 | Ex. 13 | Ex. 14 | Comp. Ex. 1 | Comp. Ex. 2 | Comp. Ex. 3 | Comp. Ex. 4 | Comp. Ex. 5 |
|---|---|---|---|---|---|---|---|---|---|---|
| Resin (A1) | Polymer1 (g) | 50 | 50 | 50 | 50 | | | | | |
| | Polymer2 (g) | | | | | | | | | |
| Resin (A2) | Polymer3 (g) | | | | | | | | | |
| Resin (A3) | Polymer4 (g) | | | | | | | | | |
| Resin (A4) | Polymer5 (g) | 50 | 50 | 50 | 50 | 100 | | 100 | 100 | 100 |

TABLE 1-continued

| | | | | | | | | | | |
|---|---|---|---|---|---|---|---|---|---|---|
| | Polymer 6 (g) | | | | | | 100 | | | |
| Photosensitive Component (B) | TR-PBG-305 (g) | 2 | 2 | | | 2 | 2 | 2 | | |
| | OXE-01 | | | 2 | | | | | 2 | |
| | Initiator A(g) | | | | 4 | | | | | 2 |
| Solvent (C1) | GBL(g) | | | 160 | 160 | 160 | 160 | | 160 | 160 |
| | NMP(g) | | 160 | | | | | 200 | | |
| Solvent (C2) | DMSO(g) | 200 | | 40 | 40 | 40 | 40 | | 40 | 40 |
| Other Solvent | Ethyl Lactate (g) | | 40 | | | | | | | |
| Copper adhesion | | 40/100 | 30/100 | 0/100 | 20/100 | 70/100 | 80/100 | 90/100 | 70/100 | 80/100 |

Based on the results shown in Table 1, Examples 1 to 14 were indicated to yield resin films demonstrating favorable adhesion of the cured film to copper wiring in comparison with Comparative Examples 1 to 5.

Examples 15 to 21

Negative-type photosensitive resin compositions were produced and evaluated using the same method as Example 1 with the exception of using the proportions shown in Table 2.

Examples 22 to 24 and Comparative Example 6

Negative-type photosensitive resin compositions were produced and evaluated using the same method as Example 1 with the exception of using the proportions shown in Table 3.

TABLE 2

| | | Ex. 15 | Ex. 16 | Ex. 17 | Ex. 18 | Ex. 19 | Ex. 20 | Ex. 21 |
|---|---|---|---|---|---|---|---|---|
| Resin (A1) | Polymer 1 (g) | 50 | 50 | 50 | 50 | 50 | 50 | 50 |
| | Polymer 2 (g) | | | | | | | |
| Resin (A2) | Polymer 3 (g) | | | | | | | |
| Resin (A3) | Polymer 4 (g) | | | | | | | |
| Resin (A4) | Polymer 5 (g) | 50 | 50 | 50 | 50 | 50 | 50 | 50 |
| | Polymer 6 (g) | | | | | | | |
| Photosensitive | TR-PBG-305 (g) | 2 | 2 | 2 | 2 | 2 | 2 | 2 |
| Component (B) | OXE-01 (g) | | | | | | | |
| | Initiator A (g) | | | | | | | |
| Solvent (C1) | GBL (g) | 160 | 160 | 160 | 160 | 160 | 160 | 160 |
| Solvent (C2) | Tetrahydrofurfuryl alcohol (g) | 40 | | | | | | |
| | Ethyl acetoacetate (g) | | 40 | | | | | |
| | Dimethyl succinate (g) | | | 40 | | | | |
| | Dimethyl malonate (g) | | | | 40 | | | |
| | N,N-dimethylacetoamide (g) | | | | | 40 | | |
| | γ-butyrolactone (g) | | | | | | 40 | |
| | 1,3-dimethyl-2-imidazolinone (g) | | | | | | | 40 |
| Copper Adhesion | | 25/100 | 25/100 | 25/100 | 25/100 | 20/100 | 20/100 | 20/100 |

TABLE 3

| | | Ex. 22 | Ex. 23 | Ex. 24 | Comp. Ex. 6 |
|---|---|---|---|---|---|
| Resin (A) | Polymer 5 (g) | | | | 100 |
| | Polymer 7 (g) | 100 | | | |
| | Polymer 8 (g) | | 100 | | |
| | Polymer 9 (g) | | | 100 | |

TABLE 3-continued

| | | Ex. 22 | Ex. 23 | Ex. 24 | Comp. Ex. 6 |
|---|---|---|---|---|---|
| Photosensitive Component (B) | TR-PBG-305 (g) | 2 | 2 | 2 | 2 |
| | OXE-01 (g) | | | | |
| | Initiator A | | | | |
| Solvent (C1) | GBL (g) | 160 | 160 | 160 | 160 |
| Solvent (C2) | DMSO (g) | 40 | 40 | 40 | 40 |
| Chemical Resistance | | A | A | A | B |
| Copper Adhesion | | 15/100 | 10./100 | 10/100 | 70/100 |

Second Embodiment

The following provides an explanation of Examples 25 to 44 and Comparative Examples 7 and 8 as a second embodiment of the present invention. In the examples and comparative examples, physical properties of the photosensitive resin composition were measured and evaluated in accordance with the methods indicated below.

(1) Weight Average Molecular Weight

The weight average molecular weight (Mw) of each polyimide precursor was determined in the same manner as the previously described first embodiment.

(2) Fabrication of Rounded Out Concave Relief Patterns and Evaluation of Focus Margin <Steps (1) and (2)>

Ti at a thickness of 200 nm and copper at a thickness of 400 nm were sequentially sputtered on a 6-inch silicon wafer (Fujimi Inc., thickness: 625±25 μm) using a sputtering device (Model L-440S-FHL, Canon Anelva Corp.) to prepare sputtered Cu wafer substrates.

A photosensitive resin composition was spin-coated on the aforementioned sputtered Cu wafer substrates using a spin coating device (Model D-Spin60A, Sokudo Co., Ltd.) followed by heating and drying for 270 seconds at 110° C. to prepare a spin-coated film having a film thickness of 13 μm±0.2 μm.

<Steps (3) and (4)>

The spin-coated film was irradiated at an energy level of 300 mJ/cm$^2$ to 700 mJ/cm$^2$ in 100 mJ/cm$^2$ increments with the Prisma GHI S/N 5503 equal-magnification projection exposure device (Ultratech, Inc.) using a test pattern reticule having a circular pattern of a mask size of 8 μm in diameter. At this time, the focus was moved 2 μm at a time towards the bottom of the film for each exposure level using the surface of the spin-coated film as a reference.

Next, the coating film formed on the sputtered Cu wafer was spray-developed with a developing machine (Model D-SPIN636, Dainippon Screen Mfg. Co., Ltd.) using cyclopentanone to obtain a rounded out concave relief pattern of a polyamic acid ester by rinsing with propylene glycol methyl ether acetate. Furthermore, the duration of spray development for the above-mentioned 13 μm spin-coated film was defined as the amount of time equal to 1.4 times the minimum amount of time for developing unexposed portions of the resin composition.

<Step (5)>

The sputtered Cu wafer having the rounded out concave relief pattern formed thereon was subjected to heat treatment by heating to 230° C. at a heating rate of 5° C./min in a nitrogen atmosphere using a programmable curing oven (Model VF-2000, Koyo Lindberg Ltd.) and holding at 230° C. for 2 hours to obtain a polyimide rounded out concave relief pattern having a mask size of 8 μm on the sputtered Cu wafer substrate. Each of the resulting patterns was observed for pattern form and pattern width with a light microscope followed by determination of focus margin.

<Evaluation of Focus Margin>

The propriety of openings in the rounded out concave relief pattern having a mask size of 8 μm obtained by going through steps (1) to (5) in order was judged to be acceptable if it satisfied either of the following criteria (I) and (II).

(I) Area of the pattern openings is equal to ½ of more the opening area of the corresponding pattern mask.

(II) The pattern cross-section does not demonstrating tailing and there is no occurrence of undercutting, swelling or bridging.

<Evaluation of Opening Pattern Cross-Sectional Angle>

Figure 1B:
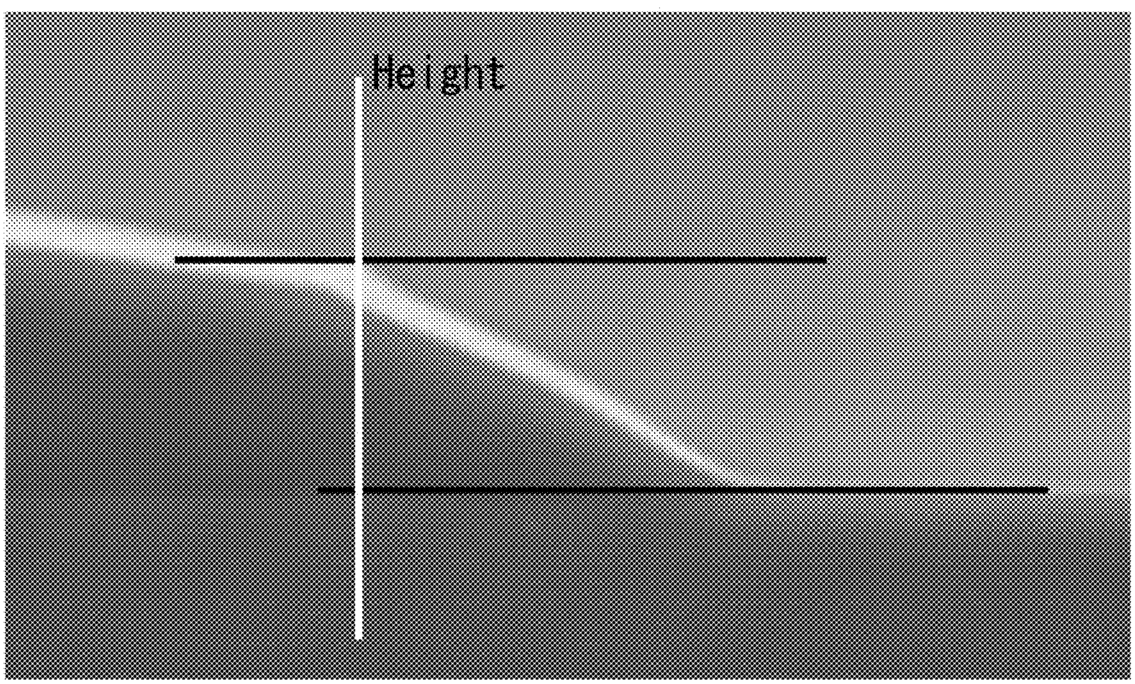
FIG. 1B is a drawing for explaining a cross-sectional angle of a relief pattern of the present invention along with a method for evaluating the same.
Figure 1C:
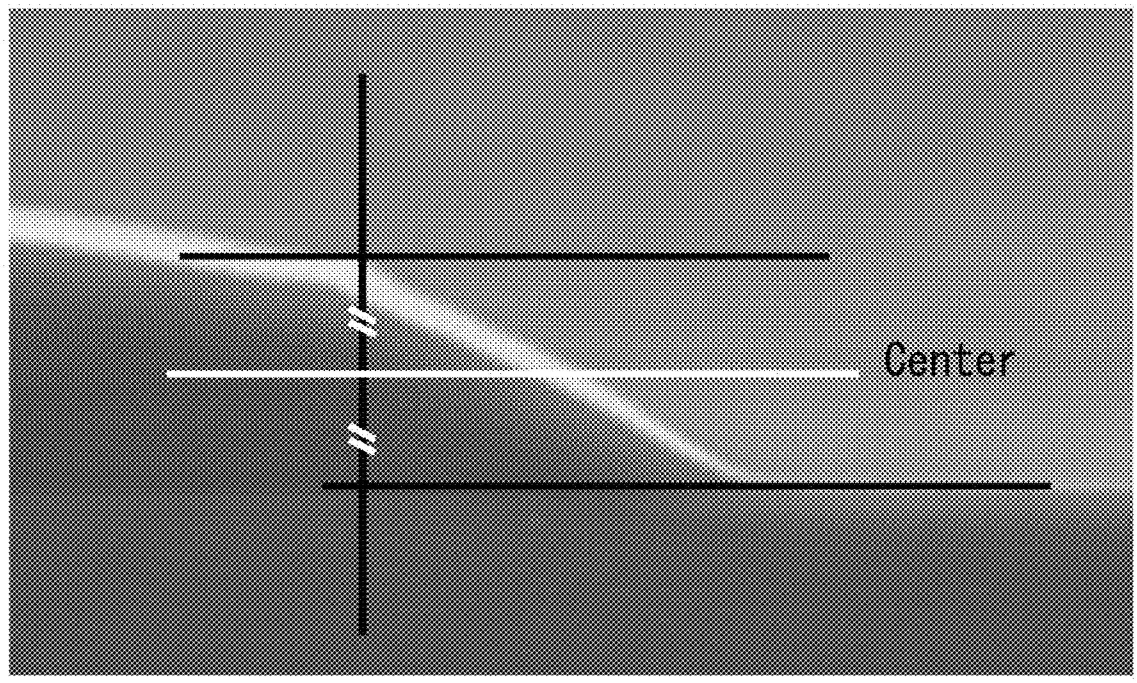
FIG. 1C is a drawing for explaining a cross-sectional angle of a relief pattern of the present invention along with a method for evaluating the same.
Figure 1D:
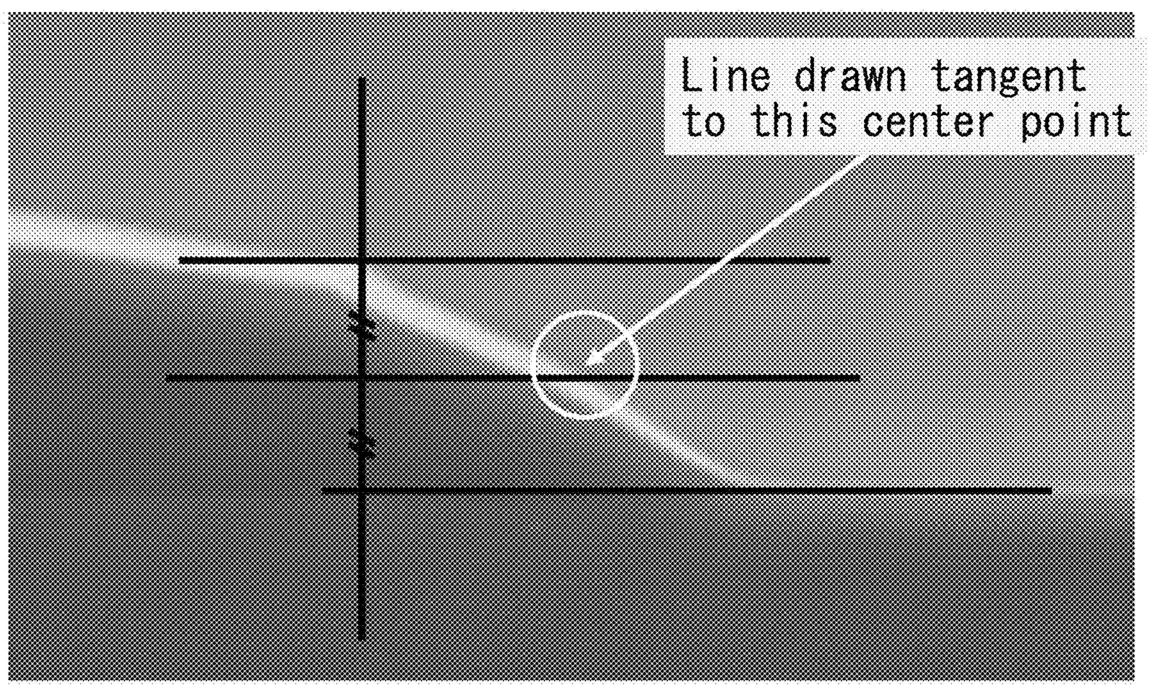
FIG. 1D is a drawing for explaining a cross-sectional angle of a relief pattern of the present invention along with a method for evaluating the same.
Figure 1E:
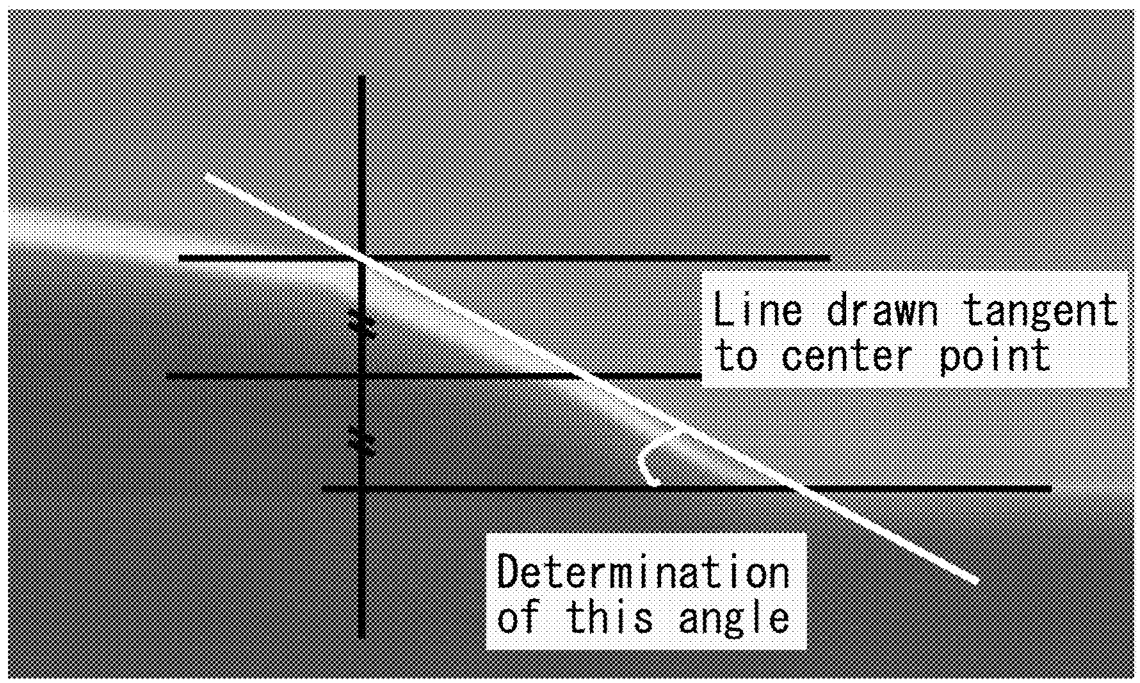
FIG. 1E is a drawing for explaining a cross-sectional angle of a relief pattern of the present invention along with a method for evaluating the same.

The following provides an explanation of the method used to evaluate the cross-sectional angle of a relief pattern obtained by going through steps (1) to (5) in order. A sputtered Cu wafer obtained by going through steps (1) to (5) in order was immersed in liquid nitrogen and a portion consisting of a line and space (1:1) having a width of 50 μm was fractured in the vertical direction relative to the line. The resulting cross-section was observed with a scanning electron microscope (SEM, Model S-4800, Hitachi High-Technologies Corp.). Cross-sectional angle was evaluated according to the method described in the following steps a to e with reference to FIGS. 1A to 1E:

a. lines are drawn on the upper side and lower side of the opening (FIG. 1A);

b. the height of the opening is determined (FIG. 1B);

c. a straight line parallel to the upper side and lower side that passes through the midpoint of height (center line) is drawn (FIG. 1C);

d. the intersection between the center line and opening pattern (center point) is determined (FIG. 1D); and, e. A line is drawn on the center line that is tangent to the slope of the pattern, and the angle formed by that tangent line and the lower side is treated as the cross-sectional angle (FIG. 1E).

<Evaluation of Electrical Properties>

The following provides an explanation of the method used to evaluate electrical properties of a semiconductor device produced using a varnish of the resulting photosensitive polyimide precursor. A silicon nitride layer (PD-220NA, Samco Inc.) was formed on a 6-inch silicon wafer (Fujimi Inc., thickness: 625±25 μm). The photosensitive resin compositions obtained in Examples 1 to 15 and Comparative Examples 1 to 5 were coated onto the silicon nitride layer with a spin coating device (Model D-Spin60A, Sokudo Co., Ltd.) to obtain a resin film of a photosensitive polyimide precursor. A prescribed pattern was formed using the Prisma GHI S/N 5503 equal-magnification projection exposure device (Ultratech, Inc.). Next, the resin film formed on the wafer was spray-developed with a developing machine (Model D-SPIN636, Dainippon Screen Mfg. Co., Ltd.) using cyclopentanone to obtain a prescribed relief pattern of a polyamic acid ester by rinsing with propylene glycol methyl ether acetate. The resulting wafer was subjected to heat treatment for 2 hours at a temperature of 230° C. in a nitrogen atmosphere using a programmable curing oven (Model VF-2000, Koyo Lindberg Ltd.) to obtain an interlayer insulating film. Next, metal wiring was formed on the aforementioned interlayer insulating film so as to form a prescribed pattern to obtain a semiconductor device. The degree of wiring delay was compared between the semiconductor device obtained in this manner and a semiconductor device having a silicon oxide insulating film employing the same configuration as this semiconductor device. The signal delay time determined by converting from the oscillation frequency of a ring oscillator was used for the evaluation reference. Both of the semiconductor devices were compared and evaluated for acceptability according to the criteria indicated below.

Acceptable: Semiconductor device has a smaller signal delay than the semiconductor device obtained using a silicon oxide insulating film.

Unacceptable: Semiconductor device has a larger signal delay than the semiconductor device obtained using a silicon oxide insulating film.

Production Example 1a (Synthesis of Polyimide Precursor (A)-1)

155.1 g of 4,4'-oxydiphthalic dianhydride (ODPA) were placed in a separable flask having a volume of 2 liters followed by adding 131.2 g of 2-hydroxyethyl methacrylate (HEMA) and 400 ml of γ-butyrolactone, stirring at room temperature, and adding 81.5 g of pyridine while stirring to obtain a reaction mixture. Following completion of generation of heat by the reaction, the reaction mixture was allowed to cool to room temperature and then allowed to stand for 16 hours.

Next, a solution obtained by dissolving 206.3 g of dicyclohexylcarbodiimide (DCC) in 180 ml of γ-butyrolactone was added to the reaction mixture over the course of 40 minutes while cooling with ice and stirring followed by adding a suspension of 93.0 g of 4,4'-diaminodiphenyl ether (DADPE) in 350 ml of γ-butyrolactone over the course of 60 minutes while stirring. After further stirring for 2 hours at room temperature, 30 ml of ethyl alcohol were added followed by stirring for 1 hour and then adding 400 ml of γ-butyrolactone. The precipitate that formed in the reaction mixture was removed by filtration to obtain a reaction liquid.

The resulting reaction liquid was added to 3 L of ethyl alcohol to form a precipitate composed of a crude polymer. The resulting crude polymer was filtered out and dissolved in 1.5 L of tetrahydrofuran to obtain a crude polymer solution. The resulting crude polymer solution was dropped into 28 L of water to precipitate the polymer, and after filtering out the resulting precipitate, the precipitate was vacuum-dried to obtain a powdered polymer (Polyimide Precursor (A)-1). When the molecular weight of Polyimide Precursor (A)-1 was measured by gel permeation chromatography (standard polystyrene conversion), the weight average molecular weight (Mw) thereof was 20,000.

Production Example 2a (Synthesis of Polyimide Precursor (A)-2)

A reaction was carried out in the same manner as the method described in the previously described Production Example 1 with the exception of using 147.1 g of 3,3',4,4'-biphenyltetracarboxylic dianhydride (BPDA) instead of the 155.1 g of 4,4'-oxydiphthalic dianhydride (ODPA) used in Production Example 1a to obtain Polymer (A)-2). When the molecular weight of Polymer (A)-2 was measured by gel permeation chromatography (standard polystyrene conversion), the weight average molecular weight (Mw) thereof was 22,000.

Production Example 3a (Synthesis of Polyimide Precursor (A)-3)

A reaction was carried out in the same manner as the method described in the previously described Production Example 1 with the exception of using 98.6 g of 2,2'-dimethylbiphenyl-4,4'-diamine (m-TB) instead of the 93.0 g of 4,4'-diaminodiphenyl ether (DADPE) used in Production Example 1a to obtain Polymer (A)-3. When the molecular weight of Polymer (A)-3 was measured by gel permeation chromatography (standard polystyrene conversion), the weight average molecular weight (Mw) thereof was 21,000.

Production Example 4a (Synthesis of Polyimide Precursor (A)-4)

A reaction was carried out in the same manner as the method described in the previously described Production Example 1 with the exception of using 147.1 g of 3,3',4,4'-biphenyltetracarboxylic dianhydride (BPDA) instead of the 155.1 g of 4,4'-oxydiphthalic dianhydride (ODPA) used in Production Example 1a and using 98.6 g of 2,2'-dimethylbiphenyl-4,4'-diamine (m-TB) instead of the 93.0 g of 4,4'-diaminodiphenyl ether (DADPE) to obtain Polymer (A)-4. When the molecular weight of Polymer (A)-4 was measured by gel permeation chromatography (standard polystyrene conversion), the weight average molecular weight (Mw) thereof was 21,000.

Production Example 5a (Synthesis of Polyimide Precursor (A)-5)

A reaction was carried out in the same manner as the method described in the previously described Production Example 1 with the exception of using 109.1 g of pyromellitic anhydride (PMDA) instead of the 155.1 g of 4,4'-oxydiphthalic dianhydride (ODPA) used in Production Example 1a and using 148.7 g of 2,2'-bis(trifluoromethyl) benzidine (TFMB) instead of the 93.0 g of 4,4'-diaminodiphenyl ether (DADPE) to obtain Polymer (A)-5. When the molecular weight of Polymer (A)-5 was measured by gel permeation chromatography (standard polystyrene conversion), the weight average molecular weight (Mw) thereof was 21,000.

Production Example 6a (Synthesis of Polyimide Precursor (A)-6)

A reaction was carried out in the same manner as the method described in the previously described Production Example 1 with the exception of using 148.7 g of 2,2'-bis (trifluoromethyl)benzidine (TFMB) instead of the 93.0 g of 4,4'-diaminodiphenyl ether (DADPE) used in Production Example 1a to obtain Polymer (A)-6. When the molecular weight of Polymer (A)-6 was measured by gel permeation chromatography (standard polystyrene conversion), the weight average molecular weight (Mw) thereof was 22,000.

Production Example 7a (Synthesis of Polyimide Precursor (A)-7)

A reaction was carried out in the same manner as the method described in the previously described Production Example 1 with the exception of using a mixture of 77.6 g of 4,4'-oxydiphthalic dianhydride (ODPA) and 73.6 g of 3,3',4,4'-biphenyltetracarboxylic dianhydride (BPDA) instead of the 155.1 g of 4,4'-oxydiphthalic dianhydride (ODPA) used in Production Example 1a to obtain Polymer (A)-7. When the molecular weight of Polymer (A)-7 was measured by gel permeation chromatography (standard polystyrene conversion), the weight average molecular weight (Mw) thereof was 21,000.

Example 25

A photosensitive resin composition was prepared according to the method indicated below using Polyimide Precursor (A)-1 followed by evaluation of the focus margin and electrical properties thereof. 100 g of Polyimide Precursor (A)-1, 2 g of TR-PBG-305 ((B)-1, trade name, Changzhou Tronly New Electronic Materials Co., Ltd.), 12 g of tetraethylene glycol dimethacrylate ((C)-2), 0.2 g of 2,6-di-tert-butyl-p-cresol ((D)-1) and 4 g of 2,2'-(phenylimino)diethanol ((E)-1) were dissolved in a mixed solvent composed of 80 g of N-methyl-2-pyrrolidone (NMP) and 20 g of ethyl lactate. The viscosity of the resulting solution was adjusted to about 35 poise by further adding a small amount of the aforementioned mixed solvent to obtain a photosensitive resin composition.

A polyimide rounded out concave relief pattern was produced on a sputtered Cu wafer substrate using this composition according to the aforementioned steps (1) to (5), and when focus margin was determined according to the method described in the previous section on "Evaluation of Focus Margin", the focus margin was 16 μm.

In addition, when cross-sectional angle was determined according to the method described in the previous section on "Evaluation of Opening Pattern Cross-Sectional Angle", cross-sectional angle was 83°. Moreover, when electrical properties were evaluated according to the method described in the previous section on "Evaluation of Electrical Properties", the composition was judged to be acceptable.

Example 26

Focus margin, cross-sectional angle and electrical properties were evaluated in the same manner as Example 25 with the exception of changing component (B)-1 used in the aforementioned Example 25 to 2 g of TR-PBG-3057 ((B)-2, trade name, Changzhou Tronly New Electronic Materials Co., Ltd.) and changing the amount of (E)-1 to 8 g. As a result, focus margin was 16 μm, cross-sectional angle was 78°, and electrical properties were acceptable.

Example 27

Focus margin, cross-sectional angle and electrical properties were evaluated in the same manner as Example with the exception of changing component (B)-1 used in the aforementioned Example 25 to 2 g of 1,2-octandione, 1-{4-(phenylthio)-, 2-(O-benzoyloxime)} ((B)-3), Irgacure OXE01, trade name, BASF Corp.). As a result, focus margin was 16 μm, cross-sectional angle was 77°, and electrical properties were acceptable.

Example 28

Focus margin, cross-sectional angle and electrical properties were evaluated in the same manner as Example 25 with the exception of changing component (B)-1 used in the aforementioned Example 25 to 2 g of a compound represented by formula (66) ((B)-4) and changing the amount of (E)-1 to 8 g. As a result, focus margin was 14 μm, cross-sectional angle was 70°, and electrical properties were acceptable.

Example 29

Focus margin, cross-sectional angle and electrical properties were evaluated in the same manner as Example 25 with the exception of changing the added amount of component (B)-1 used in the aforementioned Example 25 to 4 g. As a result, focus margin was 12 μm, cross-sectional angle was 85°, and electrical properties were acceptable.

Example 30

Focus margin, cross-sectional angle and electrical properties were evaluated in the same manner as Example 25 with the exception of changing component (C)-1 used in the aforementioned Example 25 to 12 g of nonaethylene glycol dimethacrylate ((C)-2). As a result, focus margin was 8 μm, cross-sectional angle was 83°, and electrical properties were acceptable.

Example 31

Focus margin, cross-sectional angle and electrical properties were evaluated in the same manner as Example 25 with the exception of changing component (C)-1 used in the aforementioned Example 25 to 12 g of diethylene glycol dimethacrylate ((C)-3). As a result, focus margin was 12 μm, cross-sectional angle was 83°, and electrical properties were acceptable.

Example 32

Focus margin, cross-sectional angle and electrical properties were evaluated in the same manner as Example 25 with the exception of changing component (A)-1 used in the aforementioned Example 25 to 100 g of (A)-2 and changing the added amount of component (E)-1 to 12 g. As a result, focus margin was 16 μm, cross-sectional angle was 68°, and electrical properties were acceptable.

Example 33

Focus margin, cross-sectional angle and electrical properties were evaluated in the same manner as Example 25 with the exception of changing component (A)-1 used in the aforementioned Example 25 to 100 g of (A)-3. As a result, focus margin was 10 μm, cross-sectional angle was 85°, and electrical properties were acceptable.

Example 34

Focus margin, cross-sectional angle and electrical properties were evaluated in the same manner as Example 25 with the exception of changing component (A)-1 used in the aforementioned Example 25 to 100 g of (A)-4. As a result, focus margin was 10 μm, cross-sectional angle was 85°, and electrical properties were acceptable.

Example 35

Focus margin, cross-sectional angle and electrical properties were evaluated in the same manner as Example 25 with the exception of changing component (A)-1 used in the aforementioned Example 25 to 100 g of (A)-5. As a result, focus margin was 8 μm, cross-sectional angle was 75°, and electrical properties were acceptable.

Example 36

Focus margin, cross-sectional angle and electrical properties were evaluated in the same manner as Example 25 with the exception of changing component (A)-1 used in the aforementioned Example 25 to 100 g of (A)-6. As a result, focus margin was 14 nm, cross-sectional angle was 70°, and electrical properties were acceptable.

Example 37

Focus margin, cross-sectional angle and electrical properties were evaluated in the same manner as Example 25 with the exception of changing component (A)-1 used in the aforementioned Example 25 to a mixture of 50 g of (A)-1) and 50 g of (A)-2 and changing the added amount of component (E)-1 to 8 g. As a result, focus margin was 14 Urn, cross-sectional angle was 80°, and electrical properties were acceptable.

Example 38

Focus margin, cross-sectional angle and electrical properties were evaluated in the same manner as Example 25 with the exception of changing the added amount of component (D)-1 used in the aforementioned Example 25 to 1 g. As a result, focus margin was 10 μm, cross-sectional angle was 75°, and electrical properties were acceptable.

Example 39

Focus margin, cross-sectional angle and electrical properties were evaluated in the same manner as Example 25 with the exception of changing the solvent used in the aforementioned Example 25 from NMP to a mixture of 80 g of γ-butyrolactone and 20 g of dimethylsulfoxide. As a result, focus margin was 12 μm, cross-sectional angle was 85°, and electrical properties were acceptable.

Example 40

Focus margin, cross-sectional angle and electrical properties were evaluated in the same manner as Example 25 with the exception of changing (D)-1 used in the aforementioned Example 25 to (D)-2 in the form of p-methoxyphenol. As a result, focus margin was 16 μm, cross-sectional angle was 82°, and electrical properties were acceptable.

Example 41

Focus margin, cross-sectional angle and electrical properties were evaluated in the same manner as Example 25 with the exception of changing (D)-1 used in the aforementioned Example 25 to (D)-3 in the form of 4-t-butylpyrocatechol. As a result, focus margin was 16 μm, cross-sectional angle was 80°, and electrical properties were acceptable.

Example 42

Focus margin, cross-sectional angle and electrical properties were evaluated in the same manner as Example 25 with the exception of changing (D)-1 used in the aforementioned Example 25 to (D)-4 in the form of N,N-diphenylnitrosoamide. As a result, focus margin was 16 μm, cross-sectional angle was 78°, and electrical properties were acceptable.

Example 43

Focus margin, cross-sectional angle and electrical properties were evaluated in the same manner as Example 25 with the exception of changing (D)-1 used in the aforementioned Example 25 to (D)-5 in the form of ammonium N-nitrosophenylhydroxylamine. As a result, focus margin was 16 μm, cross-sectional angle was 80°, and electrical properties were acceptable.

Example 44

Focus margin, cross-sectional angle and electrical properties were evaluated in the same manner as Example 25 with the exception of changing component (A)-1 used in the aforementioned Example 25 to 100 g of (A)-7. As a result, focus margin was 10 μm, cross-sectional angle was 82°, and electrical properties were acceptable.

Comparative Example 7

Focus margin, cross-sectional angle and electrical properties were evaluated in the same manner as Example 25 with the exception of changing component (B)-1 used in the aforementioned Example 25 to 2 g of 1-phenyl-1,2-propanedione-2-(O-ethoxycarbonyl) oxime ((B)-5). As a result, focus margin was 4 μm, cross-sectional angle was 88°, and electrical properties were unacceptable.

Comparative Example 8

Focus margin, cross-sectional angle and electrical properties were evaluated in the same manner as Example 25 with the exception of changing (D)-1 used in the aforementioned Example 25 to (D)-5 in the form of 1,1-diphenyl-2-picrylhydrazyl free radical. As a result, focus margin was 4 μm, cross-sectional angle was 92°, and electrical properties were unacceptable.

The results for Examples 25 to 44 and Comparative Examples 7 and 8 are collectively shown in Table 4.

TABLE 4

| | | Ex. 25 | Ex. 26 | Ex. 27 | Ex. 28 | Ex. 29 | Ex. 30 | Ex. 31 | Ex. 32 |
|---|---|---|---|---|---|---|---|---|---|
| Polymer Component (A) | (A)-1 | 100 | 100 | 100 | 100 | 100 | 100 | 100 | |
| | (A)-2 | | | | | | | | 100 |
| | (A)-3 | | | | | | | | |
| | (A)-4 | | | | | | | | |
| | (A)-5 | | | | | | | | |
| | (A)-6 | | | | | | | | |
| | (A)-7 | | | | | | | | |
| Initiator Component (B) | (B)-1 | 2 | | | | 4 | 2 | 2 | 2 |
| | (B)-2 | | 2 | | | | | | |
| | (B)-3) | | | 2 | | | | | |
| | (B)-4 | | | | 2 | | | | |
| | (B)-5 | | | | | | | | |
| Monomer Component (C) | (C)-1 | 12 | 12 | 12 | 12 | 12 | | | 12 |
| | (C)-2 | | | | | | 12 | | |
| | (C)-3 | | | | | | | 12 | |
| Poly-merization Inhibitor | (D)-1 | 0.2 | 0.2 | 0.2 | 0.2 | 0.2 | 0.2 | 0.2 | 0.2 |
| | (D-2) | | | | | | | | |
| | (D)-3 | | | | | | | | |
| | (D)-4 | | | | | | | | |
| | (D)-5 | | | | | | | | |
| | (D)-6 | | | | | | | | |
| Intensifier | (E)-1 | 4 | 8 | 4 | 8 | 4 | 4 | 4 | 12 |
| Solvent | NMP | 100 | 100 | 100 | 100 | 100 | 100 | 100 | 100 |
| | GBL | | | | | | | | |
| | DMSO | | | | | | | | |
| Focus Margin | | 16 μm | 16 μm | 16 μm | 14 μm | 12 μm | 8 μm | 12 μm | 16 μm |
| Cross-Sectional Angle | | 83 | 78 | 77 | 70 | 85 | 83 | 83 | 68 |
| Electrical Properties | | Acceptable | Acceptable | Acceptable | Acceptable | Acceptable | Acceptable | Acceptable | Acceptable |

TABLE 4-continued

| | | Ex. 33 | Ex. 34 | Ex. 35 | Ex. 36 | Ex. 37 | Ex. 38 | Ex. 39 | Ex. 40 |
|---|---|---|---|---|---|---|---|---|---|
| Polymer Component (A) | (A)-1 | | | | | 50 | 100 | 100 | 100 |
| | (A)-2 | | | | | 50 | | | |
| | (A)-3 | 100 | | | | | | | |
| | (A)-4 | | 100 | | | | | | |
| | (A)-5 | | | 100 | | | | | |
| | (A)-6 | | | | 100 | | | | |
| | (A)-7 | | | | | | | | |
| Initiator Component (B) | (B)-1 | 2 | 2 | 2 | 2 | 2 | 2 | 2 | 2 |
| | (B)-2 | | | | | | | | |
| | (B)-3) | | | | | | | | |
| | (B)-4 | | | | | | | | |
| | (B)-5 | | | | | | | | |
| Monomer Component (C) | (C)-1 | 12 | 12 | 12 | 12 | 12 | 12 | 12 | 12 |
| | (C)-2 | | | | | | | | |
| | (C)-3 | | | | | | | | |
| Poly-merization Inhibitor | (D)-1 | 0.2 | 0.2 | 0.2 | 0.2 | 0.2 | 1 | 0.2 | |
| | (D-2) | | | | | | | | 0.2 |
| | (D)-3 | | | | | | | | |
| | (D)-4 | | | | | | | | |
| | (D)-5 | | | | | | | | |
| | (D)-6 | | | | | | | | |
| Intensifier | (E)-1 | 4 | 4 | 4 | 4 | 8 | 4 | 4 | 4 |
| Solvent | NMP | 100 | 100 | 100 | 100 | 100 | 100 | | 100 |
| | GBL | | | | | | | 80 | |
| | DMSO | | | | | | | 20 | |
| Focus Margin | | 10 μm | 10 μm | 8 μm | 14 μm | 14 μm | 10 μm | 12 μm | 16 μm |
| Cross-Sectional Angle | | 85 | 85 | 75 | 70 | 80 | 75 | 85 | 82 |
| Electrical Properties | | Acceptable | Acceptable | Acceptable | Acceptable | Acceptable | Acceptable | Acceptable | Acceptable |

| | | Ex. 41 | Ex. 42 | Ex. 43 | Ex. 44 | Comp. Ex. 7 | Comp. Ex. 8 |
|---|---|---|---|---|---|---|---|
| Polymer Component (A) | (A)-1 | 100 | 100 | 100 | | 100 | 100 |
| | (A)-2 | | | | | | |
| | (A)-3 | | | | | | |
| | (A)-4 | | | | | | |
| | (A)-5 | | | | | | |
| | (A)-6 | | | | | | |
| | (A)-7 | | | | 100 | | |
| Initiator Component (B) | (B)-1 | 2 | 2 | 2 | 2 | | 2 |
| | (B)-2 | | | | | | |
| | (B)-3) | | | | | | |
| | (B)-4 | | | | | | |
| | (B)-5 | | | | | 2 | |
| Monomer Component (C) | (C)-1 | 12 | 12 | 12 | 12 | 12 | 12 |
| | (C)-2 | | | | | | |
| | (C)-3 | | | | | | |
| Polymerization Inhibitor | (D)-1 | | | | 0.2 | 0.2 | |
| | (D-2) | | | | | | |
| | (D)-3 | 0.2 | | | | | |
| | (D)-4 | | 0.2 | | | | |
| | (D)-5 | | | 0.2 | | | |
| | (D)-6 | | | | | | 0.2 |
| Intensifier | (E)-1 | 4 | 4 | 4 | 4 | 4 | 4 |
| Solvent | NMP | 100 | 100 | 100 | 100 | 100 | 100 |
| | GBL | | | | | | |
| | DMSO | | | | | | |
| Focus Margin | | 16 μm | 16 μm | 16 μm | 10 μm | 4 μm | 4 μm |
| Cross-Sectional Angle | | 80 | 78 | 80 | 82 | 88 | 92 |
| Electrical Properties | | Acceptable | Acceptable | Acceptable | Acceptable | Unacceptable | Unacceptable |

Third Embodiment

The following provides an explanation of Examples 45 to 51 and Comparative Examples 9 and 10 as a third embodiment of the present invention. In the examples and comparative examples, physical properties of the photosensitive resin composition were measured and evaluated in accordance with the methods indicated below.

(1) Weight Average Molecular Weight

The weight average molecular weight (Mw) of each polyamic acid ester synthesized according to the previously described method was measured using gel permeation chromatography by standard polystyrene conversion. GPC analysis conditions are indicated below.

Column: Shodex 805M/806M serial columns (trade name, Showa Denko K.K.)

Standard monodisperse polystyrene: Shodex STANDARD SM-105 (trade name,

Showa Denko K.K.)

Eluent: N-methyl-2-pyrrolidone, 40° C.

Flow rate: 1.0 ml/min

Detector: Shodex RI-930 (trade name, Showa Denko K.K.)

(2) Production of Cured Film on Cu

Ti at a thickness of 200 nm and copper at a thickness of 400 nm were sequentially sputtered on a 6-inch silicon wafer (Fujimi Inc., thickness: 625±25 μm) using a sputtering device (Model L-440S-FHL, Canon Anelva Corp.). Continuing, a photosensitive resin composition prepared according to the method to be subsequently described was spin-coated on the wafer using a coater developer (Model D-Spin60A, Sokudo Co., Ltd.) followed by drying to form a coating film having a thickness of about 15 μm. The entire surface of this coating film was then irradiated at an energy level of 900 mJ/cm$^2$ with a parallel light mask aligner (Model PLA-501FA, Canon Inc.). Next, coating film was spray-developed with a coater developer (Model D-Spin60A, Sokudo Co., Ltd.) using cyclopentanone for the developer followed by rinsing with propylene glycol methyl ether acetate to obtain a developed film on Cu.

The wafer having the developed film on Cu was subjected to heat treatment for 2 hours at the temperature described in each example in a nitrogen atmosphere using a programmable curing oven (Model VF-2000, Koyo Lindberg Ltd.) to obtain a cured film composed of a polyimide resin having a thickness of about 10 μm to 15 μm on the Cu.

(3) Measurement of Peel Strength of Cured Film on Cu

After affixing adhesive step (thickness: 500 μm) to the cured film formed on the Cu, cut portions having a width of 5 mm were made in the cured film with a box knife, and the cut portions were measured for 180° peel strength based on JIS K 6854-2. The conditions for the tensile test at that time were as indicated below.

Load cell: 50 N

Pulling speed: 50 mm/min

Travel: 60 mm

Production Example 1b (Synthesis of Photosensitive Polyimide Precursor (A)

(Polymer A-1))

155.1 g of 4,4'-oxydiphthalic dianhydride (ODPA) were placed in a separable flask having a volume of 2 liters followed by the addition of 134.0 g of 2-hydroxyethyl methacrylate (HEMA) and 400 ml of γ-butyrolactone and adding 79.1 g of pyridine while stirring at room temperature to obtain a reaction mixture. Following completion of generation of heat by the reaction, the reaction mixture was allowed to cool to room temperature and then allowed to stand undisturbed for 16 hours.

Next, a solution obtained by dissolving 206.3 g of dicyclohexylcarbodiimide (DCC) in 180 ml of γ-butyrolactone was added to the reaction mixture over the course of 40 minutes while cooling with ice and stirring followed by adding a suspension of 93.0 g of 4,4'-diaminodiphenyl ether (DADPE) in 350 ml of γ-Butyrolactone over the course of 60 minutes while stirring. After further stirring for 2 hours at room temperature, 30 ml of ethyl alcohol were added followed by stirring for 1 hour and then adding 400 ml of γ-butyrolactone. The precipitate that formed in the reaction mixture was removed by filtration to obtain a reaction liquid.

The resulting reaction liquid was added to 3 L of ethyl alcohol to form a precipitate composed of a crude polymer. The resulting crude polymer was filtered out and dissolved in 1.5 L of tetrahydrofuran to obtain a crude polymer solution. The resulting crude polymer solution was dropped into 28 L of water to precipitate the polymer, and after filtering out the resulting precipitate, the precipitate was vacuum-dried to obtain a powdered polymer A-1.

When the weight average molecular weight (Mw) of this Polymer A-1 was measured, the weight average molecular weight (Mw) thereof was 20,000.

Production Example 2b (Synthesis of Photosensitive Polyimide Precursor (A)

(Polymer A-2))

Polymer A-2 was obtained by carrying out a reaction in the same manner as the method described in Production Example 1b with the exception of using 147.1 g of 3,3',4,4'-biphenyltetracarboxylic dianhydride instead of the 155.1 g of 4,4'-oxydiphthalic dianhydride used in the aforementioned Production Example 1b. When the weight average molecular weight (Mw) of Polymer A-2 was measured, the weight average molecular weight (Mw) thereof was 22,000.

Production Example 3b (Synthesis of Photosensitive Polyimide Precursor (A)

(Polymer A-3))

Polymer A-3 was obtained by carrying out a reaction in the same manner as the method described in Production Example 1b with the exception of using 147.8 g of 2,2'-bis (trifluoromethyl)-4,4'-diaminobiphenyl (TFMB) instead of the 93.0 g of 4,4'-diaminodiphenyl ether (DADPE) used in the aforementioned Production Example 1b. When the weight average molecular weight (Mw) of Polymer A-3 was measured, the weight average molecular weight (Mw) thereof was 21,000.

Example 45

Component (A) in the form of 50 g of Polymer A-1 and 50 g of Polymer A-2, 2 g of Component (B) in the form of TR-PBG-346 (trade name, Changzhou Tronly New Electronic Materials Co., Ltd.), 8 g of Component (C) in the form of tetraethylene glycol dimethacrylate, 0.05 g of 2-nitroso-1-naphthol, 4 g of N-phenyldiethanolamine, 0.5 g of N-(3-(triethoxysilyl)propyl)phthalamic acid and 0.5 g of benzophenone-3,3'-bis(N-(3-triethoxysilyl)propylamide)-4,4'-dicarboxylic acid were dissolved in a mixed solvent of N-methylpyrrolidone and ethyl lactate (mixing ratio 8:2), and viscosity was adjusted to about 35 poise by adjusting the amount of solvent to obtain a photosensitive resin composition solution.

After coating, exposing and developing this composition on Cu according to the previously described methods, the composition was cured at 230° C. to produce a cured film on a Cu layer, and measurement of the peel strength thereof yielded a value of 0.63 N/mm.

Example 46

A photosensitive resin composition solution was prepared in the same manner as Example 45 with the exception of changing the amount of TR-PBG-346 added as Component (B) in the aforementioned Example 45 to 4 g.

After coating, exposing and developing this composition on Cu according to the previously described methods, the composition was cured at 230° C. to produce a cured film on a Cu layer, and measurement of the peel strength thereof yielded a value of 0.61 N/mm.

Example 47

A photosensitive resin composition solution was prepared in the same manner as Example 45 with the exception of changing the amount of TR-PBG-346 added as Component (B) in the aforementioned Example 45 to 1 g.

After coating, exposing and developing this composition on Cu according to the previously described methods, the composition was cured at 230° C. to produce a cured film on a Cu layer, and measurement of the peel strength thereof yielded a value of 0.60 N/mm.

Example 48

A photosensitive resin composition solution was prepared in the same manner as Example 45. After coating, exposing and developing this composition on Cu according to the previously described methods, the composition was cured at 350° C. to produce a cured film on a Cu layer, and measurement of the peel strength thereof yielded a value of 0.58 N/mm.

Example 49

A photosensitive resin composition solution was prepared in the same manner as Example 45 with the exception of using 100 g of Polymer A-1 instead of the mixture of 50 g of Polymer A-1 and 50 g of Polymer A-2 used as Component (A) in the aforementioned Example 45.

After coating, exposing and developing this composition on Cu according to the previously described methods, the composition was cured at 230° C. to produce a cured film on a Cu layer, and measurement of the peel strength thereof yielded a value of 0.66 N/mm.

Example 50

A photosensitive resin composition solution was prepared in the same manner as Example 45 with the exception of using 100 g of Polymer A-1 instead of the mixture of 50 g of Polymer A-1 and 50 g of Polymer A-2 used as Component (A) in the aforementioned Example 45, and changing the solvent used as Component (C) from the mixed solvent of N-methylpyrrolidone and ethyl lactate (mixing ratio 8:2) to γ-butyrolactone and dimethylsulfoxide (mixing ratio 85:15).

After coating, exposing and developing this composition on Cu according to the previously described methods, the composition was cured at 230° C. to produce a cured film on a Cu layer, and measurement of the peel strength thereof yielded a value of 0.65 N/mm.

Example 51

A photosensitive resin composition solution was prepared in the same manner as Example 45 with the exception of using 100 g of Polymer A-3 instead of the mixture of 50 g of Polymer A-1 and 50 g of Polymer A-2 used as Component (A) in the aforementioned Example 45.

After coating, exposing and developing this composition on Cu according to the previously described methods, the composition was cured at 350° C. to produce a cured film on a Cu layer, and measurement of the peel strength thereof yielded a value of 0.50 N/mm.

Comparative Example 9

A photosensitive resin composition solution was prepared in the same manner as Example 45 with the exception of using 2 g of TR-PBG-304 (trade name, Changzhou Tronly New Electronic Materials Co., Ltd.) instead of Component (B) in the aforementioned Example 45.

After coating, exposing and developing this composition on Cu according to the previously described methods, the composition was cured at 230° C. to produce a cured film on a Cu layer, and measurement of the peel strength thereof yielded a value of 0.41 N/mm.

Comparative Example 10

A photosensitive resin composition solution was prepared in the same manner as Example 45 with the exception of using 2 g of TR-PBG-304 (trade name, Changzhou Tronly New Electronic Materials Co., Ltd.) instead of Component (B) in the aforementioned Example 45.

After coating, exposing and developing this composition on Cu according to the previously described methods, the composition was cured at 350° C. to produce a cured film on a Cu layer, and measurement of the peel strength thereof yielded a value of 0.38 N/mm.

The results of evaluating peel strength of the adhesive film from the Cu for the photosensitive resin compositions of Examples 45 to 51 and Comparative Examples 9 and 10 are shown in Table 5. Since PBG-304 (b-1) does not demonstrate absorbance in the g-line and h-line regions, peel strength of the cured film obtained by using PBG-304, from Cu, was lower in comparison with PBG-346 (B-1) that demonstrates absorbance in the g-line and h-line regions.

TABLE 5

| | Component (A) | Component (B) | Alternative Component | Ratio of Number of Parts Added of Component (B)/Component (A) | Curing Temperature ° C. | Cu Peel Strength N/mm |
|---|---|---|---|---|---|---|
| Example 45 | Polymer A-1/ Polymer A-2 | B-1 | | 2/100 | 230 | 0.63 |
| Example 46 | Polymer A-1/ Polymer A-2 | B-1 | | 4/100 | 230 | 0.61 |
| Example 47 | Polymer A-1/ Polymer A-2 | B-1 | | 1/100 | 230 | 0.60 |
| Example 48 | Polymer A-1/ Polymer A-2 | B-1 | | 2/100 | 230 | 0.58 |

TABLE 5-continued

| | Component (A) | Component (B) | Alternative Component | Ratio of Number of Parts Added of Component (B)/Component (A) | Curing Temperature ° C. | Cu Peel Strength N/mm |
|---|---|---|---|---|---|---|
| Example 49 | Polymer A-1/ Polymer A-2 | B-1 | | 2/100 | 350 | 0.66 |
| Example 50 | Polymer A-1 | B-1 | | 2/100 | 230 | 0.65 |
| Example 51 | Polymer A-3 | B-1 | | 2/100 | 350 | 0.50 |
| Comparative Example 9 | Polymer A-1/ Polymer A-2 | | b-1 | 2/100 | 230 | 0.41 |
| Comparative Example 10 | Polymer A-1/ Polymer A-2 | | b-1 | 2/100 | 350 | 0.38 |

Explanation of abbreviations used in Table 5:

(Component B)

B-1: TR-PBG-346 (trade name, Changzhou Tronly New Electronic Materials Co., Ltd.)

[Chemical Formula 265]

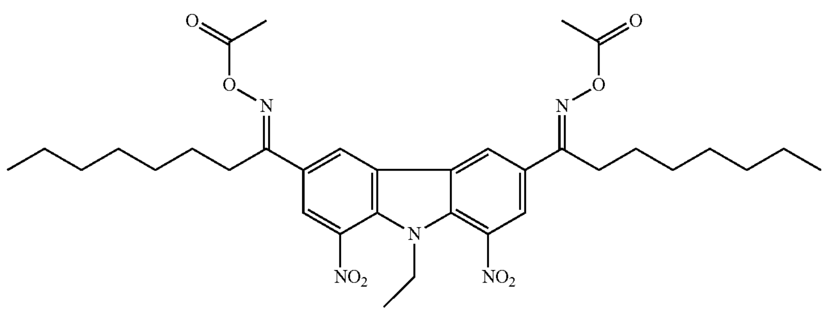

b-1: TR-PBG-304 (trade name, Changzhou Tronly New Electronic Materials Co., Ltd.)

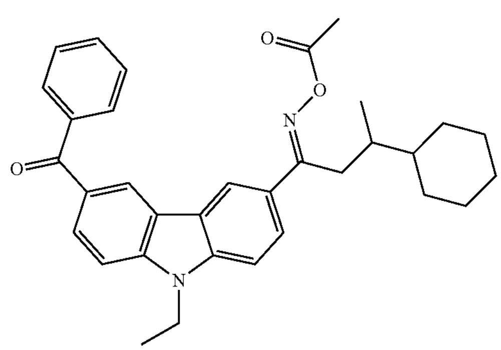 [SMILES: CCn1c2ccc(C(=O)c3ccccc3)cc2c2cc(/C(CC(C)C3CCCCC3)=N/OC(C)=O)ccc21]

Fourth Embodiment

The following provides an explanation of Examples 52 to 67 and Comparative Examples 11 to 13 as a fourth embodiment of the present invention. In the examples and comparative examples, physical properties of the photosensitive resin composition were measured and evaluated in accordance with the methods indicated below.

(1) Weight Average Molecular Weight

The weight average molecular weight (Mw) of each polyimide precursor was determined in the same manner as the previously described first embodiment.

(2) Production of Cured Relief Pattern on Cu Subjected to Surface Treatment

A photosensitive resin composition prepared according to the method to be subsequently described was spin-coated on Cu subjected to surface treatment using a coater developer (Model D-Spin60A, Sokudo Co., Ltd.) followed by drying to form a coating film having a thickness of 10 μm. This coating film was then irradiated at an energy level of 300 $mJ/cm^2$ with a parallel light mask aligner (Model PLA-501FA, Canon Inc.) using a mask having a test pattern. Next, this coating film was spray-developed with a coater developer (Model D-Spin60A, Sokudo Co., Ltd.) using cyclopentanone in the case of a negative type or using 2.38% TMAH in the case of a positive type followed by rinsing with propylene glycol methyl ether acetate in the case of a negative type or pure water in the case of a positive type to obtain a relief pattern on Cu.

The wafer having the relief pattern formed on Cu was subjected to heat treatment for 2 hours at the temperature indicated in each example in a nitrogen atmosphere using a programmable curing oven (Model VF-2000, Koyo Lindberg Ltd.) to obtain a cured relief pattern composed of resin having a thickness of about 6 μm to 7 μm on Cu.

(3) High Temperature Storage Test of Cured Relief Pattern on Cu Subjected to Surface Treatment and Subsequent Evaluation A wafer having a relief pattern formed on Cu subjected to surface treatment was subjected to heat treatment for 168 hours at 150° C. in air using a programmable curing oven (Model VF-2000, Koyo Lindberg Ltd.). Continuing, the resin layer on the Cu was completely removed by plasma etching using a plasma surface treatment device (Model EXAM, Shinko Seiki Co., Ltd.). The plasma etching conditions are indicated below.

Output: 133 W

Gas types and flow rates: $O_2$: 40 ml/min and $CF_4$: 1 ml/min

Gas pressure: 50 Pa

Mode: Hard mode

Etching time: 1800 sec

The surface of the Cu from which the resin layer had been completely removed was observed with a field emission scanning electron microscope (FE-SEM, Model S-4800, Hitachi High-Technologies Corp.), and the ratio of the surface area occupied by voids to the total surface area of the Cu layer was calculated using image analysis software (A-ZO Kun, Asahi Kasei Corp.).

Production Example 1 (Synthesis of Polymer A as Polyimide Precursor)

155.1 g of 4,4'-oxydiphthalic dianhydride (ODPA) were placed in a separable flask having a volume of 2 liters followed by adding 131.2 g of 2-hydroxyethyl methacrylate (HEMA) and 400 ml of γ-butyrolactone, stirring at room temperature, and adding 81.5 g of pyridine while stirring to obtain a reaction mixture. Following completion of generation of heat by the reaction, the reaction mixture was allowed to cool to room temperature and then allowed to stand for 16 hours.

Next, a solution obtained by dissolving 206.3 g of dicyclohexylcarbodiimide (DCC) in 180 ml of γ-butyrolactone was added to the reaction mixture over the course of 40 minutes while cooling with ice and stirring followed by adding a suspension of 93.0 g of 4,4'-diaminodiphenyl ether (DADPE) in 350 ml of γ-butyrolactone over the course of 60 minutes while stirring. After further stirring for 2 hours at room temperature, 30 ml of ethyl alcohol were added followed by stirring for 1 hour and then adding 400 ml of γ-butyrolactone. The precipitate that formed in the reaction mixture was removed by filtration to obtain a reaction liquid.

The resulting reaction liquid was added to 3 L of ethyl alcohol to form a precipitate composed of a crude polymer. The resulting crude polymer was filtered out and dissolved in 1.5 L of tetrahydrofuran to obtain a crude polymer solution. The resulting crude polymer solution was dropped into 28 L of water to precipitate the polymer, and after filtering out the resulting precipitate, the precipitate was vacuum-dried to obtain a powdered polymer (Polymer A). When the molecular weight of Polymer A was measured by gel permeation chromatography (standard polystyrene conversion), the weight average molecular weight (Mw) thereof was 20,000.

Furthermore, the weight average molecular weights of the resins obtained in each production example were measured under the following conditions using gel permeation chromatography (GPC), and weight average molecular weight was determined by standard polystyrene conversion.

Pump: JASCO PU-980

Detector: JASCO RI-930

Column oven: JASCO CO-965, 40° C.

Column: Two Shodex KD-806M columns connected in series

Mobile phase: 0.1 mol/1 LiBr/NMP

Flow rate: 1 ml/min

Production Example 2 (Synthesis of Polymer B as Polyimide Precursor (A))

A reaction was carried out in the same manner as the method described in the previously described Production Example 1 with the exception of using 147.1 g of 3,3'4,4'-biphenyltetracarboxylic dianhydride (BPDA) instead of the 155.1 g of 4,4'-oxydiphthalic dianhydride (ODPA) used in Production Example 1 to obtain Polymer B. When the molecular weight of Polymer B was measured by gel permeation chromatography (standard polystyrene conversion), the weight average molecular weight (Mw) thereof was 22,000.

Production Example 3 (Synthesis of Polymer C as Polyimide Precursor (A))

A reaction was carried out in the same manner as the method described in the previously described Production Example 1 with the exception of using 147.8 g of 2,2-bis (trifluoromethyl)-4,4'-diaminobiphenyl (TFMB) instead of the 93.0 g of 4,4'-diaminodiphenyl ether (DADPE) used in Production Example 1 to obtain Polymer C. When the molecular weight of Polymer C was measured by gel permeation chromatography (standard polystyrene conversion), the weight average molecular weight (Mw) thereof was 21,000.

Production Example 4 (Synthesis of Polymer D as Polyimide Precursor (A))

(Synthesis of Blocked Phthalic Acid Compound AIPA-MO)

543.5 g of 5-aminoisophthalic acid (AIPA) and 1700 g of N-methyl-2-pyrrolidone were placed in a separable flask having a volume of 5 liters followed by mixing, stirring and heating to 50° C. with a water bath. 512.0 g (3.3 mol) of 2-methacryloyloxyethyl isocyanate diluted with 500 g of γ-butyrolactone were dropped therein with a dropping funnel, followed by stirring for about 2 hours at 50° C.

After confirming completion of the reaction (disappearance of 5-aminoisophthalic acid) by low molecular weight gel permeation chromatography (to be referred to as "low molecular weight GPC"), the reaction liquid was added to 15 liters of ion exchange water followed by stirring, allowing to stand undisturbed, filtering out the crystalline precipitate of the reaction product, suitably rinsing with water and finally vacuum-drying for 48 hours at 40° C. to obtain AIPA-MO obtained by a reaction of the amino group of the 5-aminoisophthalic acid with the isocyanate group of the 2-methacryloxyethyl isocyanate. The low molecular weight GPC purity of the resulting AIPA-MO was about 100%.

(Synthesis of Polymer D)

100.89 g (0.3 mol) of the resulting AIPA-MO, 71.2 g (0.9 mol) of pyridine and 400 g of GBL were placed in a separable flask having a volume of 2 liters followed by mixing and cooling to 5° C. with an ice bath. A solution obtained by dissolving and diluting 125.0 g (0.606 mol) of dicyclohexylcarbodiimide (DCC) in 125 g of GBL was dropped therein over the course of about 20 minutes while cooling with ice followed by dropping in a solution obtained by dissolving 103.16 g (0.28 mol) of 4,4'-bis(4-aminophenoxy)biphenyl (BAPB) in 168 g of NMP over the course of 20 minutes and then stirring for 3 hours in an ice bath while holding at a temperature below 5° C. followed by removing from the ice bath and stirring for 5 hours at room temperature. The precipitate that formed in the reaction mixture was removed by filtration to obtain a reaction liquid.

A mixture of 840 g of water and 560 g of isopropanol was dropped into the resulting reaction liquid followed by re-dissolving in 560 g of NMP. The resulting crude polymer solution was dropped into 5 liters of water, and after filtering out the resulting precipitate, the precipitate was vacuum-dried to obtain a powdered polymer (Polymer D). When the molecular weight of Polymer D was measured by gel permeation chromatography (standard polystyrene conversion), the weight average molecular weight (Mw) thereof was 34,700.

Production Example 5 (Synthesis of Polymer E as Polyoxazole Precursor (A))

183.1 g of 2,2-bis(3-amino-4-hydroxyphenyl) hexafluoropropane, 640.9 g of N,N-dimethylacetoamide (DMAc) and 63.3 g of pyridine were mixed and stirred in a separable flask having a volume of 3 liters at room temperature (25° C.) to obtain a homogeneous solution. A solution obtained by dissolving 118.0 g of 4,4'-diphenyl ether dicarbonyl chloride in 354 g of diethylene glycol dimethyl ether (DMDG) was dropped therein with a dropping funnel. At this time, the separable flask was cooled with a water bath at 15° C. to 20° C. The time required for dropping was 40 minutes and the reaction temperature was a maximum of 30° C.

3 hours after completion of dropping, 30.8 g (0.2 mol) of 1,2-cyclohexyldicarboxylic anhydride were added to the reaction liquid, followed by stirring and allowing to stand for 15 hours at room temperature to block 99% of all terminal amino groups of the polymer chain with carboxycyclohexylamide groups. The reaction rate at this time can be easily calculated by monitoring the residual amount of 1,2-cyclohexyldicarboxylic anhydride added by high-performance liquid chromatography (HPLC). Subsequently, the aforementioned reaction liquid was dropped into 2 liters of water while stirring rapidly to precipitate the polymer, and the polymer was then recovered, suitably rinsed with water and dehydrated followed by vacuum-drying to obtain a crude polybenzoxazole precursor having a weight average molecular weight as measured by gel permeation chromatography (GPC) of 9,000 (as polystyrene).

The crude polybenzoxazole precursor obtained in the above manner was re-dissolved in γ-butyrolactone (GBL) followed by treating this with a cation exchange resin and anion exchange resin, adding the resulting solution to ion exchange water, filtering out the precipitated polymer, rinsing with water and vacuum-drying to obtain a purified polybenzoxazole precursor (Polymer E).

Production Example 6 (Synthesis of Polymer F as Polyimide (A))

A condenser tube equipped with a Dean-Stark trap was attached to a glass, 4-neck separable flask equipped with a Teflon (Registered Trade Mark) paddle stirrer. The aforementioned flask was immersed in a silicon oil bath and agitated while passing nitrogen gas there through.

72.28 g (280 mmol) of 2,2-bis(3-amino-4-hydroxyphenyl)propane (BAP, Clariant Japan K.K.), 70.29 g (266 mmol) of 5-(2,5-dioxotetrahydro-3-furanyl)-3-methylcyclohexene-1,2-dicarboxylic anhydride (MCTC, Tokyo Chemical Industry Co., Ltd.), 254.6 g of γ-butyrolactone and 60 g of toluene were added, and after stirring for 4 hours at 100 rpm at room temperature, 4.6 g (28 mmol) of 5-norbornene-2,3-dicarboxylic anhydride (Tokyo Chemical Industry Co., Ltd.) were added followed by heating and stirring for 8 hours at 100 rpm and silicon bath temperature of 50° C. while allowing nitrogen gas to pass through. Subsequently, the temperature of the silicon bath was raised to 180° C. followed by stirring for 2 hours at 100 rpm. Toluene and water distillates that formed during the reaction were removed. The reaction liquid was returned to room temperature following completion of the imidization reaction.

Subsequently, the aforementioned reaction liquid was dropped into 3 liters of water while stirring rapidly to dispersed and precipitate a polymer, after which the polymer was recovered, suitably rinsed with water and vacuum-dried to obtain a crude polyimide (Polymer F) having a weight average molecular weight as measured by gel permeation chromatography (GPC) of 23,000 (as polystyrene).

Production Example 7 (Synthesis of Polymer G as Phenol Resin (A))

128.3 g (0.76 mol) of methyl 3,5-dihydroxybenzoate, 121.2 g (0.5 mol) of 4,4'-bis(methoxymethyl)biphenyl (BMMB), 3.9 g (0.025 mol) of diethyl sulfate and 140 g of diethylene glycol dimethyl ether were mixed and stirred at 70° C. in separable flask having a volume of 0.5 liters equipped with a Dean-Stark apparatus to dissolve the solids.

The mixed solution was heated to 140° C. with an oil bath and methanol was confirmed to be generated from the reaction liquid. The reaction liquid was then stirred for 2 hours at 140° C.

Next, the reaction vessel was cooled in air followed by the separate addition of 100 g of tetrahydrofuran and stirring. The aforementioned diluted reaction liquid was dropped into 4 liters of water while stirring rapidly to disperse and precipitate the resin followed by recovering the resin, suitably rinsing with water, dehydrating and then vacuum-drying to obtain a copolymer (Polymer G) composed of methyl 3,5-dihydroxybenzoate and BMMB at a yield of 70%. The weight average molecular weight of this Polymer G as determined by standard polystyrene conversion using GPC was 21,000.

Production Example 8 (Synthesis of Polymer H as Phenol Resin (A))

The air inside a separable flask having a volume of 1.0 liter equipped with a Dean-Stark apparatus was replaced with nitrogen, followed by mixing and stirring 81.3 g (0.738 mol) of resorcinol, 84.8 g (0.35 mol) of BMMB, 3.81 g (0.02 mol) of p-toluenesulfonic acid and 116 g of propylene glycol monomethyl ether (PGME) at 50° C. to dissolve the solids.

The mixed solution was heated to 120° C. with an oil bath and methanol was confirmed to be generated from the reaction liquid. The reaction liquid was then stirred for 3 hours at 120° C.

Next, 24.9 g (0.150 mol) of 2,6-bis(hydroxymethyl)-p-cresol and 249 g of PGME were mixed and stirred in a separate vessel, and the uniformly dissolved solution was dropped into the separable flask using a dropping funnel over the course of 1 hour, followed by additionally stirring for 2 hours after dropping.

Following completion of the reaction, treatment was carried out in the same manner as Production Example 7 to obtain a copolymer (Polymer H) composed of resorcinol, BMMB and 2,6-bis(hydroxymethyl)-P-cresol at a yield of 77%. The weight average molecular weight of this Polymer H as determined by standard polystyrene conversion using GPC was 9,900.

Example 52

50 g each of the polyimide precursors in the form of Polymer A and Polymer B (corresponding to resin (A) as the polyimide precursor) were dissolved in a mixed solvent composed of 80 g of N-methyl-2-pyrrolidone (NMP) and 20 g of ethyl lactate together with 4 g of 1-phenyl-1,2-propanedione-2-(O-ethoxycarbonyl) oxime (abbreviated as PDO in Table 6) (corresponding to Photosensitizer (B)), 8 g of tetraethylene glycol dimethacrylate and 1.5 g of N-[3-(triethoxysilyl)propyl]phthalamic acid. The viscosity of the resulting was adjusted to about 35 poise by further adding a small amount of the aforementioned mixed solvent to obtain a negative-type photosensitive resin composition.

After having coated the aforementioned composition onto a 6-inch silicon wafer (Fujimi Inc., thickness: 625±25 μm), a cured film of the aforementioned composition was formed by exposing, developing and curing the coating film. Ti at a thickness of 200 nm and Cu at a thickness of 400 nm were then sequentially sputtered thereon using a sputtering device (Model L-440S-FHL, Canon Anelva Corp.), and a Cu layer having a thickness of 5 μm was formed by electrolytic copper plating by using this sputtered Cu layer as a seed layer. Continuing, the substrate was immersed in an etching solution containing cupric chloride, acetic acid and ammonium acetate to form surface irregularities having a maximum height of 1 μm on the surface thereof.

A cured relief pattern was produced on the Cu layer subjected to this surface treatment using the aforementioned composition by curing at 230° C. according to the previously described method, and after carrying out a high-temperature storage test, the ratio of the surface area occupied by voids to the total surface area of the Cu layer was evaluated, yielding a result of 5.7%.

Example 53

A silicon wafer was produced having a Cu layer formed thereon in the same manner as the aforementioned Example 52 followed by carrying out surface treatment by etching in the same manner as Example 52 with the exception of making the maximum height following microetching of the Cu layer to be 2 μm.

A cured relief pattern was produced on the Cu layer subjected to this surface treatment using the same composition as Example 52 by curing at 230° C. according to the previously described method, and after carrying out a high-temperature storage test, the ratio of the surface area occupied by voids to the total surface area of the Cu layer was evaluated, yielding a result of 5.1%.

Example 54

A silicon wafer was produced having a Cu layer formed thereon in the same manner as the aforementioned Example 52 following by substituting a portion of the surface Cu layer with tin by carrying out electroless tin plating. Continuing, the wafer was immersed in a 1% by weight aqueous solution of 3-glycidoxypropyltrimethoxysilane to form a silane coupling agent on the surface thereof.

A cured relief pattern was produced on the Cu layer subjected to this surface treatment using the same composition as Example 52 by curing at 230° C. according to the previously described method, and after carrying out a high-temperature storage test, the ratio of the surface area occupied by voids to the total surface area of the Cu layer was evaluated, yielding a result of 5.8%.

Example 55

A Cu layer was formed that was subjected to surface treatment in the same manner as Example 52 with the exception of changing the 6-inch silicon wafer used in Example 52 to a glass substrate measuring 20 cm on a side.

A cured relief pattern was produced on the Cu layer subjected to this surface treatment using the same composition as Example 52 by curing at 230° C. according to the previously described method, and after carrying out a high-temperature storage test, the ratio of the surface area occupied by voids to the total surface area of the Cu layer was evaluated, yielding a result of 5.6%.

Example 56

A Cu layer was formed that was subjected to surface treatment in the same manner as Example 52 with the exception of changing the 6-inch silicon wafer used in Example 52 to a 4-inch SiC wafer.

A cured relief pattern was produced on the Cu layer subjected to this surface treatment using the same composition as Example 52 by curing at 230° C. according to the previously described method, and after carrying out a high-temperature storage test, the ratio of the surface area occupied by voids to the total surface area of the Cu layer was evaluated, yielding a result of 5.3%.

Example 57

A Cu layer was formed that was subjected to surface treatment in the same manner as Example 52 with the exception of changing the 6-inch silicon wafer used in Example 52 to an FR4 substrate measuring 20 cm on a side.

A cured relief pattern was produced on the Cu layer subjected to this surface treatment using the same composition as Example 52 by curing at 230° C. according to the previously described method, and after carrying out a high-temperature storage test, the ratio of the surface area occupied by voids to the total surface area of the Cu layer was evaluated, yielding a result of 5.5%.

Example 58

A Cu layer was formed that was subjected to surface treatment in the same manner as Example 52 with the exception of changing the 6-inch silicon wafer used in Example 25 to an 8-inch molded resin substrate obtained by embedding a singulated chip and then flattening the surface by CMP.

A cured relief pattern was produced on the Cu layer subjected to this surface treatment using the same composition as Example 52 by curing at 230° C. according to the previously described method, and after carrying out a high-temperature storage test, the ratio of the surface area occupied by voids to the total surface area of the Cu layer was evaluated, yielding a result of 5.7%.

Example 59

A Cu layer was produced that was subjected to surface treatment in the same manner as Example 52 and a relief pattern was produced on the surface-treated Cu layer using the same composition as Example 52 by curing at 350° C. according to the previously described method, and after carrying out a high-temperature storage test, the ratio of the surface area occupied by voids to the total surface area of the Cu layer was evaluated, yielding a result of 5.5%.

Example 60

A negative-type photosensitive resin composition solution was prepared in the same manner as the aforementioned Example 52 with the exception of changing resin (A) in the form of the 50 g of Polymer A and 50 g of Polymer B used in the Example 52 to 100 g of Polymer A, and changing component (B) in the form of the 4 g of PDO to 2.5 g of 1,2-octanedione, 1-{4-(phenylthio)-, 2-(O-benzoyloxime)} (Irgacure OXE01, trade name, BASF Corp.).

A Cu layer was produced that was subjected to surface treatment in the same manner as Example 52 and a relief pattern was produced on the surface-treated Cu layer using the aforementioned composition by curing at 230° C. according to the previously described method, and after carrying out a high-temperature storage test, the ratio of the surface area occupied by voids to the total surface area of the Cu layer was evaluated, yielding a result of 5.4%.

Example 61

A negative-type photosensitive resin composition solution was prepared in the same manner as the aforementioned Example 52 with the exception of changing resin (A) in the form of the 50 g of Polymer A and 50 g of Polymer B used in Example 52 to 100 g of Polymer A, and changing component (B) in the form of the 4 g of PDC to 2.5 g of 1,2-octanedione, 1-{4-(phenylthio)-, 2-(O-benzoyloxime)} (Irgacure OXE01, trade name, BASF Corp.) and further changing the solvent to 85 g of γ-butyrolactone and 15 g of dimethylsulfoxide.

A Cu layer was produced that was subjected to surface treatment in the same manner as Example 52 and a relief pattern was produced on the surface-treated Cu layer using the aforementioned composition by curing at 230° C. according to the previously described method, and after carrying out a high-temperature storage test, the ratio of the surface area occupied by voids to the total surface area of the Cu layer was evaluated, yielding a result of 5.4%.

Example 62

A negative-type photosensitive resin composition solution was prepared in the same manner as the aforementioned Example 52 with the exception of changing resin (A) in the form of the 50 g of Polymer A and 50 g of Polymer B used in Example 52 to 100 g of Polymer C.

A Cu layer was produced that was subjected to surface treatment in the same manner as Example 52 and a relief pattern was produced on the surface-treated Cu layer using the aforementioned composition by curing at 350° C. according to the previously described method, and after carrying out a high-temperature storage test, the ratio of the surface area occupied by voids to the total surface area of the Cu layer was evaluated, yielding a result of 4.9%.

Example 63

A negative-type photosensitive resin composition solution was prepared in the same manner as the aforementioned Example 52 with the exception of changing resin (A) in the form of the 50 g of Polymer A and 50 g of Polymer B used in Example 52 to 100 g of Polymer D.

A Cu layer was produced that was subjected to surface treatment in the same manner as Example 52 and a relief pattern was produced on the surface-treated Cu layer using the aforementioned composition by curing at 250° C. according to the previously described method, and after carrying out a high-temperature storage test, the ratio of the surface area occupied by voids to the total surface area of the Cu layer was evaluated, yielding a result of 5.6%

Example 64

A positive-type photosensitive resin composition was prepared according to the following method using Polymer E followed by evaluation of the prepared photosensitive resin composition. 100 g of a polyoxazole precursor in the form of Polymer E (corresponding to resin (A)) were dissolved in 100 g of γ-butyrolactone (as solvent) together with 15 g of a photosensitive diazoquinone compound (B1) (Toyo Gosei Co., Ltd., equivalent to photosensitizer (B)), obtained by esterifying 77% of the phenolic hydroxyl groups represented by the following formula (146):

[Chemical Formula 267]

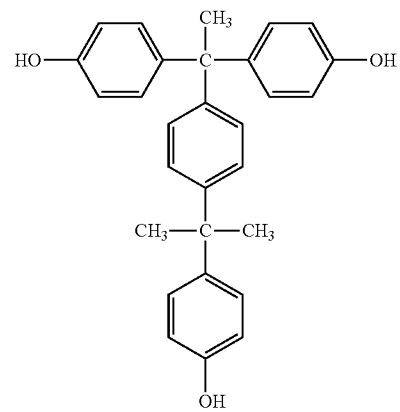

(146)

with naphthoquinonediazido-4-sulfonic acid, and 6 g of 3-t-butoxycarbonylaminopropyltriethoxysilane. The viscosity of the resulting solution was adjusted to about 20 poise by further adding a small amount of γ-butyrolactone to obtain a positive-type photosensitive resin composition.

A Cu layer was produced that was subjected to surface treatment in the same manner as Example 52 and a relief pattern was produced on the surface-treated Cu layer using the aforementioned composition by curing at 350° C. according to the previously described method, and after carrying out a high-temperature storage test, the ratio of the surface area occupied by voids to the total surface area of the Cu layer was evaluated, yielding a result of 5.3%.

Example 65

A positive-type photosensitive resin composition solution was prepared in the same manner as the aforementioned Example 64 with the exception of changing resin (A) in the form of the 100 g of Polymer E used in Example 64 to 100 g of Polymer F.

A Cu layer was produced that was subjected to surface treatment in the same manner as Example 52 and a relief pattern was produced on the surface-treated Cu layer using the aforementioned composition by curing at 250° C. according to the previously described method, and after carrying out a high-temperature storage test, the ratio of the surface area occupied by voids to the total surface area of the Cu layer was evaluated, yielding a result of 5.2%.

Example 66

A positive-type photosensitive resin composition solution was prepared in the same manner as the aforementioned Example 64 with the exception of changing resin (A) in the form of the 100 g of Polymer used in Example 64 to 100 g of Polymer G.

A Cu layer was produced that was subjected to surface treatment in the same manner as Example 52 and a relief pattern was produced on the surface-treated Cu layer using the aforementioned composition by curing at 220° C. according to the previously described method, and after carrying out a high-temperature storage test, the ratio of the surface area occupied by voids to the total surface area of the Cu layer was evaluated, yielding a result of 5.6%

Example 67

A positive-type photosensitive resin composition solution was prepared in the same manner as the aforementioned Example 64 with the exception of changing resin (A) in the form of the 100 g of Polymer E used in Example 64 to 100 g of Polymer H.

A Cu layer was produced that was subjected to surface treatment in the same manner as Example 52 and a relief pattern was produced on the surface-treated Cu layer using the aforementioned composition by curing at 220° C. according to the previously described method, and after carrying out a high-temperature storage test, the ratio of the surface area occupied by voids to the total surface area of the Cu layer was evaluated, yielding a result of 5.5%.

Comparative Example 11

A Cu layer was produced in the same manner as Example 52 with the exception of not carrying out surface treatment, a relief pattern was produced on the Cu layer using the same composition as Example 52 by curing at 230° C. according to the previously described method, and after carrying out a high-temperature storage test, the ratio of the surface area occupied by voids to the total surface area of the Cu layer was evaluated. The ratio was 14.3% since the Cu was not subjected to surface treatment.

Comparative Example 12

A Cu layer was produced in the same manner as Example 52 with the exception of not carrying out surface treatment, a relief pattern was produced on the Cu layer using the same composition as Example 60 by curing at 350° C. according to the previously described method, and after carrying out a high-temperature storage test, the ratio of the surface area occupied by voids to the total surface area of the Cu layer was evaluated. The ratio was 14.9% since the Cu was not subjected to surface treatment Comparative Example 13

A Cu layer was produced in the same manner as Example 52 with the exception of not carrying out surface treatment, a relief pattern was produced on the Cu layer using the same composition as Example 62 by curing at 350° C. according to the previously described method, and after carrying out a high-temperature storage test, the ratio of the surface area occupied by voids to the total surface area of the Cu layer was evaluated. The ratio was 14.6% since the Cu was not subjected to surface treatment.

TABLE 6

| | | Ex. 52 | Ex. 53 | Ex. 54 | Ex. 55 | Ex. 56 | Ex. 57 | Ex. 58 | Ex. 59 | Ex. 60 | Ex. 61 |
|---|---|---|---|---|---|---|---|---|---|---|---|
| Component (A) | Polymer A | 50 | 50 | 50 | 50 | 50 | 50 | 50 | 50 | 100 | 100 |
| | Polymer B | 50 | 50 | 50 | 50 | 50 | 50 | 50 | 50 | | |
| | Polymer C | | | | | | | | | | |
| | Polymer D | | | | | | | | | | |
| | Polymer E | | | | | | | | | | |
| | Polymer F | | | | | | | | | | |
| | Polymer G | | | | | | | | | | |
| | Polymer H | | | | | | | | | | |
| Component (B) | PDO | 4 | 4 | 4 | 4 | 4 | 4 | 4 | 4 | | |
| | OXE01 | | | | | | | | | 2.5 | 2.5 |
| | B1 | | | | | | | | | | |
| Silicon wafer | Max surface irregularity · height 1 μm | with | | | | | | | with | with | with |
| | Max surface irregularity · height 2 μm | | with | | | | | | | | |
| | Treatment of Silane coupling agent | | | done | | | | | | | |
| Glass substrate | Max surface irregularity · height 1 μm | | | | with | | | | | | |
| SiC wafer | Max surface irregularity height 1 μm | | | | | with | | | | | |
| FR4 substrate | Max surface irregularity · height 1 μm | | | | | | with | | | | |
| Molded substrate | Max surface irregularity · height 1 μm | | | | | | | with | | | |
| Solvent | N-methyl pyrrolidone | 80 | 80 | 80 | 80 | 80 | 80 | 80 | 80 | 80 | |
| | Ethyl lactate | 20 | 20 | 20 | 20 | 20 | 20 | 20 | 20 | 20 | |
| | γ-butyrolactone | | | | | | | | | | 85 |
| | Dimethyl sulfoxide | | | | | | | | | | 15 |

TABLE 6-continued

| | | | | | | | | | | |
|---|---|---|---|---|---|---|---|---|---|---|
| Curing temp. (° C.) | 230 | 230 | 230 | 230 | 230 | 230 | 230 | 350 | 230 | 230 |
| Void surface area ratio (%) | 5.7 | 5.1 | 5.8 | 5.6 | 5.3 | 5.5 | 5.7 | 5.5 | 5.4 | 5.4 |

| | | Ex. 62 | Ex. 63 | Ex. 64 | Ex. 65 | Ex. 66 | Ex. 67 | Comp. Ex. 11 | Comp. Ex. 12 | Comp. Ex. 13 |
|---|---|---|---|---|---|---|---|---|---|---|
| Component (A) | Polymer A | | | | | | | 50 | | |
| | Polymer B | | | | | | | 50 | | |
| | Polymer C | 100 | | | | | | | 100 | |
| | Polymer D | | 100 | | | | | | | |
| | Polymer E | | | 100 | | | | | | 100 |
| | Polymer F | | | | 100 | | | | | |
| | Polymer G | | | | | 100 | | | | |
| | Polymer H | | | | | | 100 | | | |
| Component (B) | PDO | 4 | 4 | | | | | 4 | 4 | |
| | OXE01 | | | | | | | | | |
| | B1 | | | 15 | 15 | 15 | 15 | | | 15 |
| Silicon wafer | Max surface irregularity · height 1 μm | with | with | with | with | with | with | | | |
| | Max surface irregularity · height 2 μm | | | | | | | | | |
| | Treatment of Silane coupling agent | | | | | | | | | |
| Glass substrate | Max surface irregularity · height 1 μm | | | | | | | | | |
| SiC wafer | Max surface irregularity height 1 μm | | | | | | | | | |
| FR4 substrate | Max surface irregularity · height 1 μm | | | | | | | | | |
| Molded substrate | Max surface irregularity · height 1 μm | | | | | | | | | |
| Solvent | N-methyl pyrrolidone | 80 | 80 | | | | | 80 | 80 | |
| | Ethyl lactate | 20 | 20 | | | | | 20 | 20 | |
| | γ-butyrolactone | | | 100 | 100 | 100 | 100 | | | 100 |
| | Dimethyl sulfoxide | | | | | | | | | |
| Curing temp. (° C.) | | 350 | 250 | 350 | 250 | 220 | 220 | 230 | 350 | 350 |
| Void surface area ratio (%) | | 4.9 | 5.6 | 5.3 | 5.2 | 5.6 | 5.5 | 14.3 | 14.9 | 14.6 |

Fifth Embodiment

The following provides an explanation of Examples 68 to 73 and Comparative Examples 14 to 18 as a fifth embodiment of the present invention. In the examples and comparative examples, physical properties of the photosensitive resin composition were measured and evaluated in accordance with the methods indicated below.

(1) Weight Average Molecular Weight

The weight average molecular weight (Mw) of each polyimide precursor was determined in the same manner as the previously described first embodiment.

(2) Production of Cured Film on Cu

Ti at a thickness of 200 nm and copper at a thickness of 400 nm were sequentially sputtered on a 6-inch silicon wafer (Fujimi Inc., thickness: 625±25 μm) using a sputtering device (Model L-440S-FHL, Canon Anelva Corp.). Continuing, a photosensitive resin composition prepared according to the method to be subsequently described was spin-coated on the wafer using a coater developer (Model D-Spin60A, Sokudo Co., Ltd.) followed by drying to form a coating film having a thickness of about 15 μm. The entire surface of this coating film was then irradiated at an energy level of 900 mJ/cm$^2$ with a parallel light mask aligner (Model PLA-501FA, Canon Inc.). Next, this coating film was spray-developed with a coater developer (Model D-Spin60A, Sokudo Co., Ltd.) using cyclopentanone in the case of a negative type or using 2.38% TMAH in the case of a positive type followed by rinsing with propylene glycol methyl ether acetate in the case of a negative type or pure water in the case of a positive type to obtain a developed film on the Cu.

The wafer having the developed film formed on Cu was irradiated with microwaves at 500 W and 7 GHz in a nitrogen atmosphere using a microwave continuous heating oven (Micro Denshi Co., Ltd.) while heating for 2 hours at the temperature described in each example to obtain a cured film having a thickness of about 10 μm to 15 μm on the Cu.

(3) Measurement of Peel Strength of Cured Film on Cu

After affixing adhesive step (thickness: 500 μm) to the cured film formed on the Cu, cut portions having a width of 5 mm were made in the cured film with a box knife, and the cut portions were measured for 180° peel strength based on JIS K 6854-2. The conditions for the tensile test at that time were as indicated below.

Load cell: 50 N

Pulling speed: 50 mm/min

Travel: 60 mm

Production Example 1d (Synthesis of Polymer A as Polyamic Acid Ester (A))

155.1 g of 4,4'-oxydiphthalic dianhydride (ODPA) were placed in a separable flask having a volume of 2 liters followed by the addition of 131.2 g of 2-hydroxyethyl methacrylate (HEMA) and 400 ml of γ-butyrolactone, stirring at room temperature, and adding 81.5 g of pyridine while stirring to obtain a reaction mixture. Following completion of generation of heat by the reaction, the reaction mixture was allowed to cool to room temperature and then allowed to stand for 16 hours.

Next, a solution obtained by dissolving 206.3 g of dicyclohexylcarbodiimide (DCC) in 180 ml of γ-butyrolactone was added to the reaction mixture over the course of 40 minutes while cooling with ice and stirring followed by adding a suspension of 93.0 g of 4,4'-diaminodiphenyl ether (DADPE) in 350 ml of γ-butyrolactone over the course of 60 minutes while stirring. After further stirring for 2 hours at room temperature, 30 ml of ethyl alcohol were added followed by stirring for 1 hour and then adding 400 ml of γ-butyrolactone. The precipitate that formed in the reaction mixture was removed by filtration to obtain a reaction liquid.

The resulting reaction liquid was added to 3 L of ethyl alcohol to form a precipitate composed of a crude polymer. The resulting crude polymer was filtered out and dissolved in 1.5 L of tetrahydrofuran to obtain a crude polymer solution. The resulting crude polymer solution was dropped into 28 L of water to precipitate the polymer, and after filtering out the resulting precipitate, the precipitate was vacuum-dried to obtain a powdered polymer (Polymer A). When the weight average molecular weight (Mw) of this Polymer A was measured by gel permeation chromatography (standard polystyrene conversion), the weight average molecular weight (Mw) thereof was 20,000.

Furthermore, the weight average molecular weights of the resins obtained in each production example were measured under the following conditions using gel permeation chromatography (GPC), and weight average molecular weight was determined by standard polystyrene conversion.

Pump: JASCO PU-980

Detector: JASCO RI-930

Column oven: JASCO CO-965, 40° C.

Column: Two Shodex KD-806M columns connected in series

Mobile phase: 0.1 mol/1 LiBr/NMP

Flow rate: 1 ml/min

Production Example 2d (Synthesis of Polymer B as Polyamic Acid Ester (A))

A reaction was carried out in the same manner as the method described in the previously described Production Example 1 with the exception of using 147.1 g of 3,3'4,4'-biphenyltetracarboxylic dianhydride (BPDA) instead of the 155.1 g of 4,4'-oxydiphthalic dianhydride (ODPA) used in Production Example 1 to obtain Polymer B. When the molecular weight of Polymer B was measured by gel permeation chromatography (standard polystyrene conversion), the weight average molecular weight (Mw) thereof was 22,000.

Production Example 3d (Synthesis of Polymer C as Polyamic Acid Precursor (A))

A reaction was carried out in the same manner as the method described in the previously described Production Example 1 with the exception of using 147.8 g of 2,2-bis (trifluoromethyl)-4,4'-diaminobiphenyl (TFMB) instead of the 93.0 g of 4,4'-diaminodiphenyl ether (DADPE) used in Production Example 1 to obtain Polymer C. When the molecular weight of Polymer C was measured by gel permeation chromatography (standard polystyrene conversion), the weight average molecular weight (Mw) thereof was 21,000.

Production Example 4d (Synthesis of Polymer D as Phenol Resin (A))

128.3 g (0.76 mol) of methyl 3,5-dihydroxybenzoate, 121.2 g (0.5 mol) of 4,4'-bis(methoxymethyl)biphenyl (BMMB), 3.9 g (0.025 mol) of diethyl sulfate and 140 g of diethylene glycol dimethyl ether were mixed and stirred at 70° C. in separable flask having a volume of 0.5 liters equipped with a Dean-Stark apparatus to dissolve the solids.

The mixed solution was heated to 140° C. with an oil bath and methanol was confirmed to be generated from the reaction liquid. The reaction liquid was then stirred for 2 hours at 140° C.

Next, the reaction vessel was cooled in air followed by the separate addition of 100 g of tetrahydrofuran and stirring. The aforementioned diluted reaction liquid was dropped into 4 liters of water while stirring rapidly to disperse and precipitate the resin followed by recovering the resin, suitably rinsing with water, dehydrating and then vacuum-drying to obtain a copolymer (Polymer D) composed of methyl 3,5-dihydroxybenzoate and BMMB at a yield of 70%. The weight average molecular weight of this Polymer D as determined by standard polystyrene conversion using GPC was 21,000.

Production Example 5d (Synthesis of Polymer E as Phenol Resin (A))

The air inside a separable flask having a volume of 1.0 liter equipped with a Dean-Stark apparatus was replaced with nitrogen followed by mixing and stirring 81.3 g (0.738 mol) of resorcinol, 84.8 g (0.35 mol) of BMMB, 3.81 g (0.02 mol) of p-toluenesulfonic acid and 116 g of propylene glycol monomethyl ether (PGME) at 50° C. to dissolve the solids.

The mixed solution was heated to 120° C. with an oil bath and methanol was confirmed to be generated from the reaction liquid. The reaction liquid was then stirred for 3 hours at 120° C.

Next, 24.9 g (0.150 mol) of 2,6-bis(hydroxymethyl)-p-cresol and 249 g of PGME were mixed and stirred in a separate vessel and the uniformly dissolved solution was dropped into the separable flask using a dropping funnel over the course of 1 hour followed by additionally stirring for 2 hours after dropping.

Following completion of the reaction, treatment was carried out in the same manner as Production Example 4 to obtain a copolymer (Polymer E) composed of resorcinol, BMMB and 2,6-bis(hydroxymethyl)-P-cresol at a yield of 77%. The weight average molecular weight of this Polymer E as determined by standard polystyrene conversion using GPC was 9,900.

Comparative Production Exampled 1d (Synthesis of Polymer F as Polyamic Acid)

93.0 g of diaminodiphenyl ether (DADPE) were placed in a 2-liter separable flask followed by the addition of 400 ml of N-methyl-2-pyrrolidone and stirring to dissolve. 155.1 g of 4,4'-oxydiphthalic anhydride were added thereto while still in solid form followed by stirring the solution to allow the components to react and dissolve, and continuing to stir for 2 hours at 80° C. to obtain a solution of Polymer F. The weight average molecular weight of this Polymer F as determined by standard polystyrene conversion using GPC was 20,000.

Comparative Production Example 2d (Synthesis of Polymer G as Polyamic Acid)

A reaction was carried out in the same manner as the method described in the previously described Comparative Production Example 1d with the exception of using 147.1 g of 3,3',4,4'-biphenyltetracarboxylic dianhydride (BPDA) instead of the 155.1 g of 4,4'-oxydiphthalic anhydride (ODPA) used in Comparative Production Example 1 to obtain a solution of Polymer G. The weight average molecular weight (Mw) of this Polymer G as measured by gel permeation chromatography (standard polystyrene conversion) was 22,000.

Comparative Production Example 3d (Synthesis of Polymer H as Polyamic Acid)

A reaction was carried out in the same manner as the method described in the previously described Comparative Production Example 1d with the exception of using 147.8 g of 2,2'-bis(trifluoromethyl)-4,4'-diaminobiphenyl (TFMB) instead of the 93.0 g of 4,4'-diaminodiphenyl ether (DADPE) used in Production Example 1 to obtain Polymer H. The weight average molecular weight (Mw) of this Polymer H as measured by gel permeation chromatography (standard polystyrene conversion) was 21,000.

Example 68

A negative-type photosensitive resin composition was prepared according to the method indicated below using Polymers A and B followed by evaluation of the prepared photosensitive resin composition. A polyamic acid ester in the form of 50 g of Polymer A and 50 g of Polymer B (equivalent to resin (A)) was dissolved in a mixed solvent composed of 80 g of N-methyl-2-pyrrolidone (NMP) and 20 g of ethyl lactate together with 4 g of 1-phenyl-1,2-propanedione-2-(O-ethoxycarbonyl) oxime (abbreviated as PDO in Table 7) (corresponding to photosensitive agent (B)), 8 g of tetraethylene glycol dimethacrylate and 1.5 g of N-[3-(triethoxysilyl)propyl]phthalamic acid. The viscosity of the resulting solution was adjusted to about 35 poise by further adding a small amount of the aforementioned mixed solvent to obtain a negative-type photosensitive resin composition.

After coating, exposing and developing this composition on Cu according to the previously described methods, the composition was cured at 230° C. while irradiating with microwaves to produce a cured film on a Cu layer, and measurement of the peel strength thereof yielded a value of 0.69 N/mm.

Example 69

A negative-type photosensitive resin composition solution was prepared in the same manner as the aforementioned Example 68 with the exception of changing resin (A) in the form of 50 g of Polymer A and 50 g of Polymer B used in Example 68 to 100 g of Polymer A.

After coating, exposing and developing this composition on Cu according to the previously described methods, the composition was cured at 230° C. while irradiating with microwaves to produce a cured film on a Cu layer, and measurement of the peel strength thereof yielded a value of 0.68 N/mm.

Example 70

A negative-type photosensitive resin composition solution was prepared in the same manner as the aforementioned Example 68 with the exception of changing resin (A) in the form of the 50 g of Polymer A and 50 g of Polymer B used in Example 68 to 100 g of Polymer A, changing the component (C) in the form of 4 g of PDC to 2.5 g of 1,2-octanedione, 1-{4-(phenylthio)-, 2-(O-benzoyloxime)} (Irgacure OXE01, trade name, BASF Corp.), and further changing the solvent to 85 g of γ-butyrolactone and 15 g of dimethylsulfoxide.

After coating, exposing and developing this composition on Cu according to the previously described methods, the composition was cured at 230° C. while irradiating with microwaves to produce a cured film on a Cu layer, and measurement of the peel strength thereof yielded a value of 0.68 N/mm.

Example 71

A negative-type photosensitive resin composition solution was prepared in the same manner as the aforementioned Example 68 with the exception of changing resin (A) in the form of 50 g of Polymer A and 50 g of Polymer B used in Example 68 to 100 g of Polymer C.

After coating, exposing and developing this composition on Cu according to the previously described methods, the composition was cured at 230° C. while irradiating with microwaves to produce a cured film on a Cu layer, and measurement of the peel strength thereof yielded a value of 0.65 N/mm.

Example 72

A positive-type photosensitive resin composition was prepared according to the following method using Polymer D followed by evaluation of the prepared photosensitive resin composition. 100 g of a phenol resin in the form of Polymer D (corresponding to resin (A)) were dissolved in 100 g of γ-butyrolactone (as solvent) together with 15 g of a photosensitive diazoquinone compound (B1) (Toyo Gosei Co., Ltd., equivalent to photosensitizer (B)), obtained by esterifying 77% of the phenolic hydroxyl groups represented by the following formula (146):

[Chemical Formula 268]

(146)

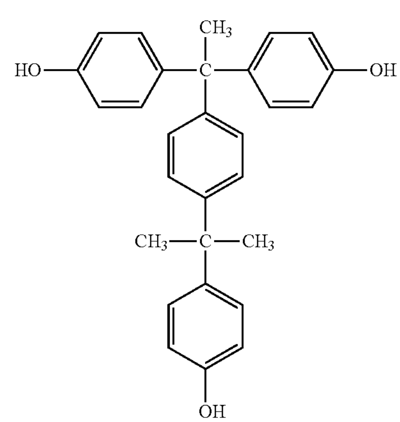

with naphthoquinonediazide-4-sulfonic acid, and 6 g of 3-t-butoxycarbonylaminopropyltriethoxysilane. The viscosity of the resulting solution was adjusted to about 20 poise by further adding a small amount of γ-butyrolactone to obtain a positive-type photosensitive resin composition.

After coating, exposing and developing this composition on Cu according to the previously described methods, the composition was cured at 220° C. while irradiating with microwaves to produce a cured film on a Cu layer, and measurement of the peel strength thereof yielded a value of 0.70 N/mm.

Example 73

A positive-type photosensitive resin composition solution was prepared in the same manner as the aforementioned Example 72 with the exception of changing resin (A) in the form of the 100 g of Polymer D used in Example 72 to 100 g of Polymer E.

After coating, exposing and developing this composition on Cu according to the previously described methods, the composition was cured at 220° C. while irradiating with microwaves to produce a cured film on a Cu layer, and measurement of the peel strength thereof yielded a value of 0.70 N/mm.

Comparative Example 14

A negative-type photosensitive resin composition was prepared in the same manner as Example 68 and the composition was evaluated in the same manner as Example 68 with the exception of not irradiating with microwaves during curing. At this time, the peel strength was 0.43 N/mm.

Comparative Example 15

A negative-type photosensitive resin composition was prepared in the same manner as Example 68 with the exception of changing the 50 g of Polymer A and the 50 g of Polymer B used in Example 68 to 50 g of Polymer F and 50 g of Polymer G, followed by evaluating the composition in the same manner as Example 68. At this time, the peel strength was 0.47 N/mm.

Comparative Example 16

A negative-type photosensitive resin composition was prepared in the same manner as Example 71 and the composition was evaluated in the same manner as Example 71 with the exception of not irradiating with microwaves during curing. At this time, the peel strength was 0.42 N/mm.

Comparative Example 17

A negative-type photosensitive resin composition was prepared in the same manner as Example 71 with the exception of changing the 100 g of Polymer C used in Example 71 to 100 g of Polymer H, followed by evaluating the composition in the same manner as Example 68. At this time, the peel strength was 0.41 N/mm.

Comparative Example 18

A negative-type photosensitive resin composition was prepared in the same manner as Example 73 and the composition was evaluated in the same manner as Example 73 with the exception of not irradiating with microwaves during curing. At this time, the peel strength was 0.46 N/mm.

The results for Examples 68 to 73 and Comparative Examples 14 to 18 are summarized in Table 7.

TABLE 7

| | | Ex. 68 | Ex. 69 | Ex. 70 | Ex. 71 | Ex. 72 | Ex. 73 | Comp. Ex. 14 | Comp. Ex. 15 | Comp. Ex. 16 | Comp. Ex. 17 | Comp. Ex. 18 |
|---|---|---|---|---|---|---|---|---|---|---|---|---|
| Component (A) | Polymer A | 50 | 100 | 100 | | | | 50 | | | | |
| | Polymer B | 50 | | | | | | 50 | | | | |
| | Polymer C | | | | 100 | | | | | 100 | | |
| | Polymer D | | | | | 100 | | | | | | |
| | Polymer E | | | | | | 100 | | | | | 100 |
| | Polymer F | | | | | | | | 50 | | | |
| | Polymer G | | | | | | | | 50 | | | |
| | Polymer H | | | | | | | | | | 100 | |
| Component (B) | PDO | 4 | | | 4 | | | 4 | 4 | 4 | 4 | |
| | OXE01 | | 2.5 | 2.5 | | | | | | | | |
| | B1 | | | | | 15 | 15 | | | | | 15 |
| Microwave irradiation | | Yes | Yes | Yes | Yes | Yes | Yes | No | Yes | No | Yes | No |
| Solvent | N-methylpyrrolidone | 80 | 80 | | 80 | | | 80 | 80 | 80 | 80 | |
| | Ethyl lactate | 20 | 20 | | 20 | | | 20 | 20 | 20 | 20 | |
| | γ-butyrolactone | | | 85 | | 100 | 100 | | | | | 100 |
| | Dimethylsulfoxide | | | 15 | | | | | | | | |
| Curing temperature (° C.) | | 230 | 230 | 230 | 230 | 220 | 220 | 230 | 230 | 230 | 230 | 220 |
| Peel strength (N/mm) | | 0.69 | 0.68 | 0.69 | 0.65 | 0.70 | 0.70 | 0.43 | 0.47 | 0.42 | 0.41 | 0.46 |

INDUSTRIAL APPLICABILITY

The photosensitive resin composition of the present invention can be preferably used in the field of photosensitive materials useful for the production of, for example, electrical and electronic materials of semiconductor devices and multilayer wiring boards.

The invention claimed is:

1. A photosensitive resin composition, comprising:

(A) a polyimide precursor in the form of a polyamic acid, polyamic acid ester or polyamic acid salt represented by the following general formula (1):

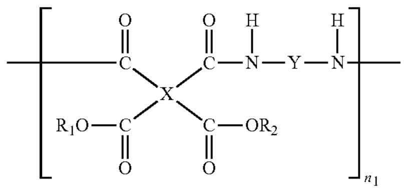

(1)

{wherein, X represents a tetravalent organic group, Y represents a divalent organic group, $n_1$ represents an integer of 2 to 150, and $R_1$ and $R_2$ respectively and independently represent a hydrogen atom, saturated aliphatic group having 1 to 30 carbon atoms, aromatic group, monovalent organic group represented by the following general formula (2):

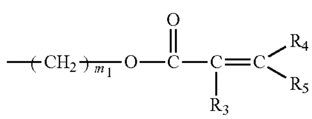

(2)

(wherein, $R_3$, $R_4$ and $R_5$ respectively and independently represent a hydrogen atom or organic group having 1 to 3 carbon atoms, and $m_1$ represents an integer of 2 to 10), or monovalent ammonium ion represented by the following general formula (3):

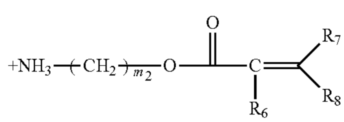

(3)

(wherein, $R_6$, $R_7$ and $R_8$ respectively and independently represent a hydrogen atom or organic group having 1 to 3 carbon atoms, and $m_2$ represents an integer of 2 to 10)}, (B) a photosensitizer, and (C) a solvent;

wherein the component (A) is a blend of at least one of the following resins (A1) to (A3) with the following resin (A4):

(A1) a resin in which X in general formula (1) is a group represented by the following general formula (4):

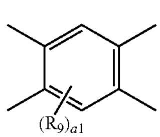

(4)

{wherein, a1 represents an integer of 0 to 2, $R_9$ represents a hydrogen atom, fluorine atom or monovalent organic group having 1 to 10 carbon atoms, and in the case a plurality of $R_9$ are present, may be mutually the same or different}, a group represented by the following general formula (5):

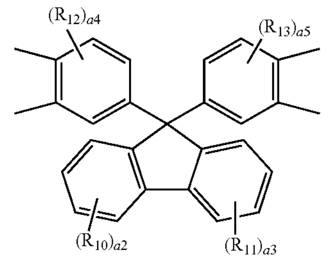

(5)

{wherein, a2 and a3 respectively and independently represent an integer of 0 to 4, a4 and a5 respectively and independently represent an integer of 0 to 3, $R_{10}$ to $R_{13}$ respectively and independently represent a hydrogen atom, fluorine atom or monovalent organic group having 1 to 10 carbon atoms, and in the case a plurality of $R_{10}$ to $R_{13}$ are present, may mutually be the same or different}, or a group represented by the following general formula (6):

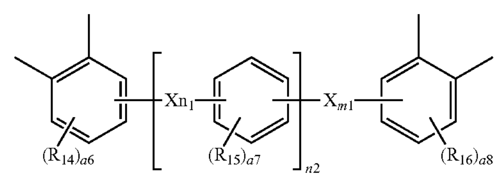

(6)

{wherein, n2 represents an integer of 0 to 5, $X_{n1}$ represents a single bond or divalent organic group, in the case a plurality of $X_{n1}$ are present, may mutually be the same or different, $X_{m1}$ represents a single bond or divalent organic group, at least one of $X_{m1}$ and $X_{n1}$ represents a single bond, an organic group selected from the group consisting of an oxycarbonyl group, oxycarbonylmethylene group, carbonylamino group and carbonyl group, or a sulfonyl group, a6 and a8 respectively and independently represent an integer of 0 to 3, a7 represents an integer of 0 to 4, $R_{14}$, $R_{15}$ and $R_{16}$ respectively and independently represent a hydrogen atom, fluorine atom or monovalent organic group having 1 to 10 carbon atoms, and in the case a plurality of $R_{10}$, $R_{15}$ and $R_{16}$ are present, may mutually be the same or different}; and, Y in general formula (1) represents a group represented by the following general formula (7):

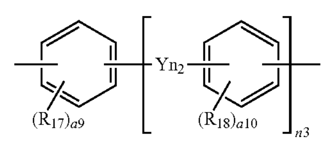

(7)

{wherein, n3 represents an integer of 1 to 5, $Y_{n2}$ represents an organic group having 1 to 10 carbon atoms that may contain a fluorine atom but does not contain a heteroatom other than fluorine, an oxygen atom or a sulfur atom, in the case a plurality of $Y_{n2}$ are present, may mutually be the same or different, in the case where $Y_{n2}$ contains at least one of an oxygen atom and a sulfur atom, a carbon number of $Y_{n2}$ may be zero (0), a9 and a10 respectively and independently represent an integer of 0 to 4, $R_{17}$ and $R_{18}$ respectively and independently represent a hydrogen atom, fluorine atom or monovalent organic group having 1 to 10 carbon atoms, and in the case a plurality of $R_{17}$ and $R_{18}$ are present, may mutually be the same or different};

(A2) a resin in which X in general formula (1) is a group represented by the following general formula (8):

(8)

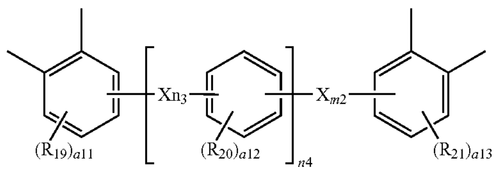

{wherein, n4 represents an integer of 0 to 5, $X_{m2}$ and $X_{n3}$ respectively and independently represent an organic group having 1 to 10 carbon atoms that may contain a fluorine atom but does not contain a heteroatom other than fluorine, an oxygen atom or a sulfur atom, in the case of a plurality of $X_{n3}$ are present, may be mutually the same or different, in the case where $X_{m2}$ contains at least one of an oxygen atom and a sulfur atom, a carbon number of $X_{m2}$ may be zero (0), and/or in the case where $X_{n3}$ contains at least one of an oxygen atom and a sulfur atom, a carbon number of $X_{n3}$ may be zero (0), a11 and a13 respectively and independently represent an integer of 0 to 3, a12 represents an integer of 0 to 4, $R_{19}$, $R_{20}$ and $R_{21}$ respectively and independently represent a hydrogen atom, fluorine atom or monovalent organic group having 1 to 10 carbon atoms, and in the case of a plurality of $R_{19}$, $R_{20}$ and $R_{21}$ are present, may mutually be the same or different}, and Y in general formula (1) is a group represented by the following general formula (9):

(9)

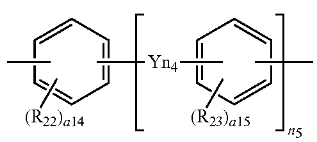

{wherein, n5 represents an integer of 0 to 5, $Y_{n4}$ represents a single bond or a divalent organic group, in the case of a plurality of $Y_{n4}$ are present, may be mutually the same or different, in the case n4 is 2 or more, at least one of $Y_{n4}$ represents a single bond, an organic group selected from the group consisting of an oxycarbonyl group, oxycarbonylmethylene group, carbonylamino group and carbonyl group, or a sulfonyl group, a14 and a15 respectively and independently represent an integer of 0 to 4, $R_{22}$ and $R_{23}$ respectively and independently represent a hydrogen atom, fluorine atom or monovalent organic group having 1 to 10 carbon atoms, and in the case a plurality of $R_{22}$ and $R_{23}$ are present, may be mutually the same or different}, or a group represented by the following general formula (10):

(10)

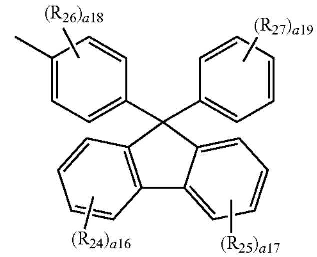

{wherein, a16 to a19 respectively and independently represent an integer of 0 to 4, $R_{24}$ to $R_{27}$ respectively and independently represent a hydrogen atom, fluorine atom or monovalent organic group having 1 to 10 carbon atoms, and in the case a plurality of $R_{24}$ to $R_{27}$ are present, may mutually be the same or different};

(A3) a resin in which X in general formula (1) is a group represented by general formula (4), (5) or (6), and Y in general formula (1) is a group represented by general formula (9) or (10); and, (A4) a resin in which X in general formula (1) is a group represented by general formula (8), and Y in general formula (1) is a group represented by general formula (7), and wherein the solvent (C) includes a solvent (C1) having a boiling point of 200° C. to 250° C. and a solvent (C2) having a boiling point of 160° C. to 190° C.

2. The photosensitive resin composition according to claim 1, wherein the group represented by general formula (6) is at least one group selected from the group consisting of groups represented by the following general formula (X1):

(X1)

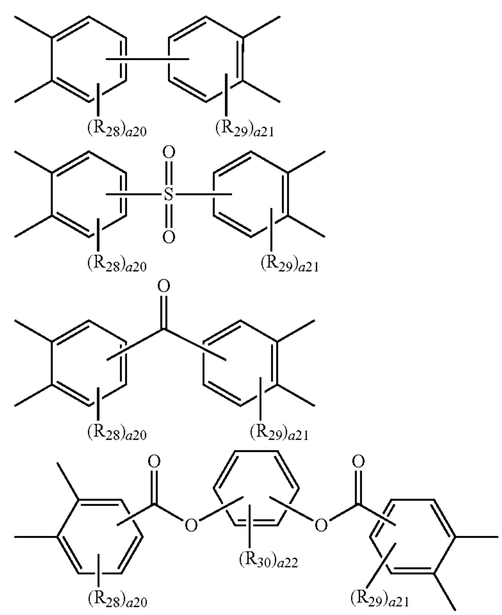

{wherein, a20 and a21 respectively and independently represent an integer of 0 to 3, a22 represents an integer of 0 to 4, $R_{28}$ to $R_{30}$ respectively and independently represent a hydrogen atom, fluorine atom or organic group having 1 to 10 carbon atoms, and in the case a plurality of $R_{28}$ to $R_{30}$ are present, may be mutually the same or different}, the group represented by general formula (7) is at least one group selected from the group consisting of groups represented by the following general formula (Y1):

(Y1)

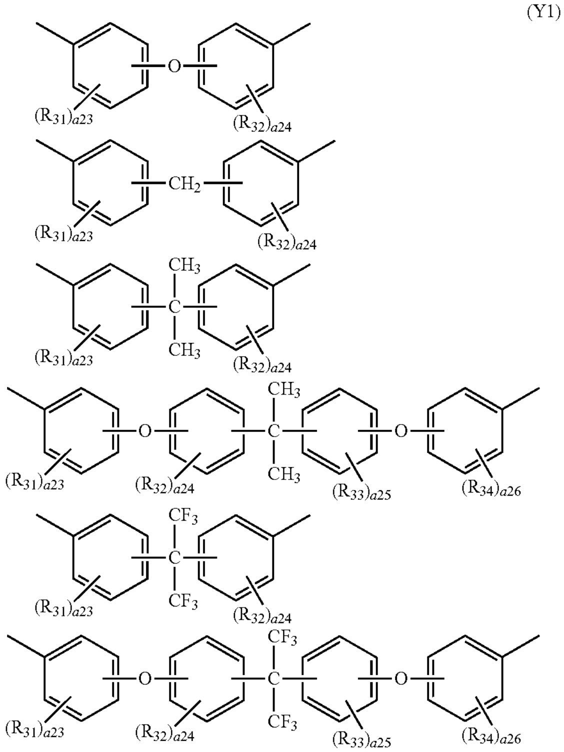

{wherein, a23 to a26 respectively and independently represent an integer of 0 to 4, $R_{31}$ to $R_{34}$ respectively and independently represent a hydrogen atom, fluorine atom or monovalent organic group having 1 to 10 carbon atoms, and in the case a plurality of $R_{31}$ to $R_{34}$ are present, may mutually be the same or different}, the group represented by general formula (8) is at least group selected from the group consisting of groups represented by the following general formula (X2):

(X2)

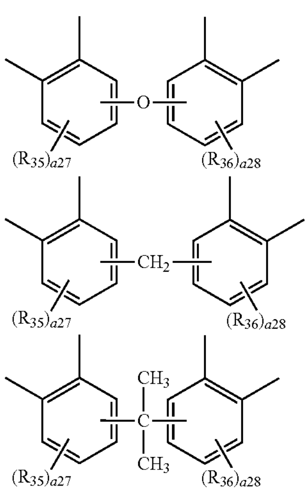

-continued

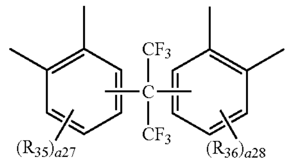

{wherein, a27 and a28 respectively and independently represent an integer of 0 to 3, $R_{35}$ and $R_{36}$ respectively and independently represent a hydrogen atom, fluorine atom or monovalent organic group having 1 to 10 carbon atoms, and in the case a plurality of $R_{35}$ and $R_{36}$ are present, may mutually be the same or different}, and the group represented by general formula (9) is at least one group selected from the group consisting of groups represented by the following general formula (Y2):

(Y2)

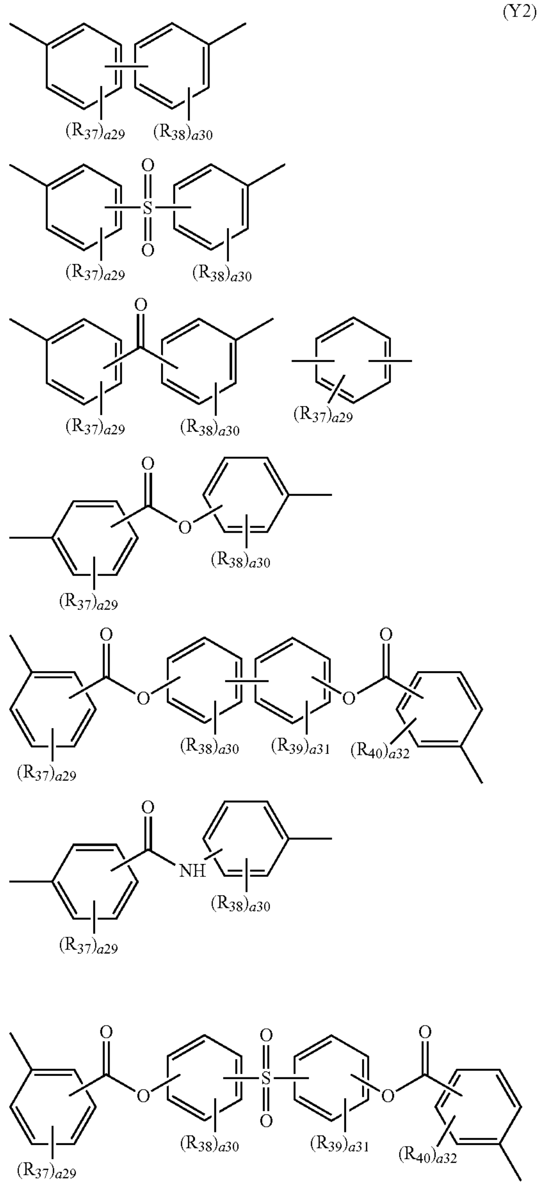

-continued

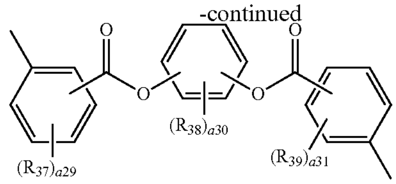

{wherein, a29 to a32 respectively and independently represent an integer of 0 to 4, $R_{37}$ to $R_{40}$ respectively and independently represent a hydrogen atom, fluorine atom or monovalent organic group having 1 to 10 carbon atoms, and in the case a plurality of $R_{37}$ to $R_{40}$ are present, may mutually be the same or different}.

3. The photosensitive resin composition according to claim 1, wherein, in general formula (1) of (A1), 50 mol % or more of X is a group represented by general formula (4), (5) or (6), and 50 mol % or more of Y is a group represented by general formula (7).

4. The photosensitive resin composition according to claim 1, wherein, in general formula (1) of (A2), 50 mol % or more of X is a group represented by general formula (8), and 50 mol % or more of Y is a group represented by general formula (9) or (10).

5. The photosensitive resin composition according to claim 1, wherein, in general formula (1) of (A3), 50 mol % or more of X is a group represented by general formula (4), (5) or (6), and 50 mol % or more of Y is a group represented by general formula (9) or (10).

6. The photosensitive resin composition according to claim 1, wherein, in general formula (1) of (A4), 50 mol % or more of X is a group represented by general formula (8), and 50 mol % or more of Y in general formula (1) is a group represented by formula (7).

7. The photosensitive resin composition according to claim 1, wherein the content of (A4) is 10% by weight to 90% by weight of the sum of the weights of (A1) to (A4).

8. The photosensitive resin composition according to claim 1, wherein the sum of the weights of (A1) to (A4) is 50% or more of the total weight of component (A).

9. The photosensitive resin composition according to claim 1, wherein 50 mol % or more of X in general formula (1) of (A1) is a group represented by general formula (4), (5) or (6), and 50 mol % or more of Y in general formula (1) of (A1) is a group represented by the following formula (11):

(11)

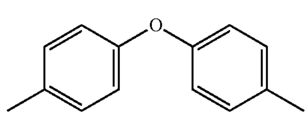

10. The photosensitive resin composition according to claim 1, wherein 50 mol % or more of X in general formula (1) of (A2) is a group represented by the following formula (12):

(12)

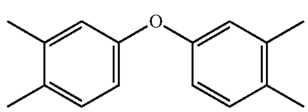

and 50 mol % or more of Y in general formula (1) of (A2) is a group represented by formula (9) or (10).

11. The photosensitive resin composition according to claim 1, wherein 50 mol % or more of X in general formula (1) of (A4) is a group represented by the following formula (12):

(12)

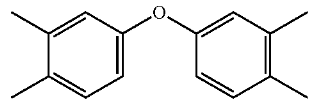

and 50 mol % or more of Y in general formula (1) of (A4) is a group represented by the following formula (11):

(11)

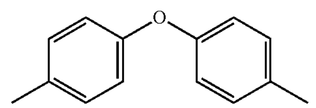

12. The photosensitive resin composition according to claim 11, wherein 80 mol % or more of X in general formula (1) of (A4) is a group represented by formula (12), and 80 mol % or more of Y in general formula (1) is a group represented by formula (11).

13. The photosensitive resin composition according to claim 1, wherein the solvent (C) includes at least two solvents selected from the group consisting of γ-butyrolactone, dimethylsulfoxide, and 1,3-dimethyl-2-imidazolidinone.

14. The photosensitive resin composition according to claim 13, wherein the solvent (C1) is y-butyrolactone and the solvent (C2) is dimethylsulfoxide.

15. The photosensitive resin composition according to claim 1, wherein the weight of the solvent (C2) is 5% to 50% of the sum of the weights of the solvent (C1) and the solvent (C2).

16. The photosensitive resin composition according to claim 1, wherein the photosensitizer (B) is a photo-radical initiator.

17. The photosensitive resin composition according to claim 1, wherein the photosensitizer (B) contains a component represented by the following general formula (13):

(13)

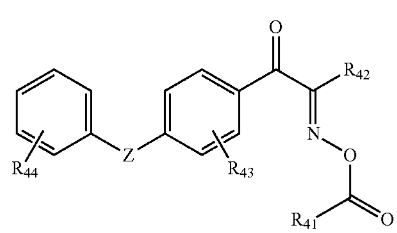

{wherein, Z represents a sulfur atom or oxygen atom, $R_{41}$ represents a methyl group, phenyl group or divalent organic group, and $R_{42}$ to $R_{44}$ respectively and independently represent a hydrogen atom or monovalent organic group}.

18. The photosensitive resin composition according to claim 17, wherein the component represented by general formula (13) is at least one member selected from the group consisting of compounds represented by the following general formulas (14) to (17):

(14)

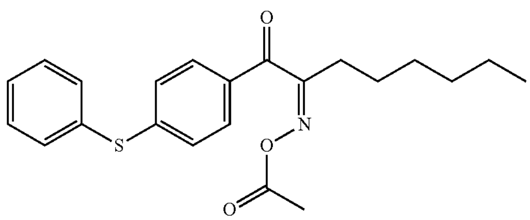

(15)

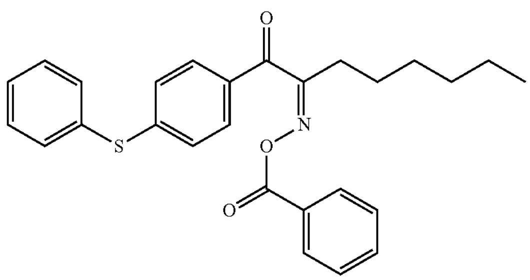

-continued (16)

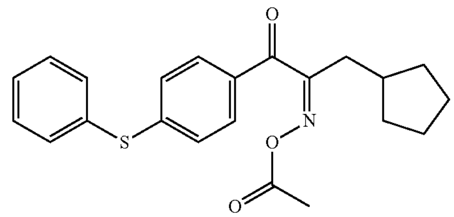

(17)

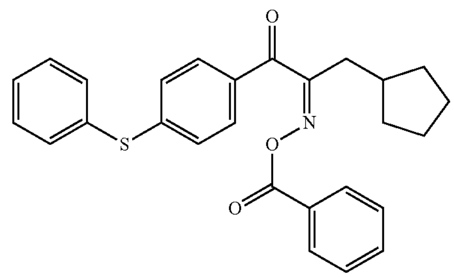

.

19. A method for producing a cured relief pattern, comprising:

(1) forming a photosensitive resin layer on a substrate by coating the photosensitive resin composition according to claim 1 on the substrate;

(2) exposing the photosensitive resin layer to light;

(3) forming a relief pattern by developing the photosensitive resin layer after exposing to light; and (4) forming a cured relief pattern by heat-treating the relief pattern.

* * * * *

UNITED STATES PATENT AND TRADEMARK OFFICE

CERTIFICATE OF CORRECTION

PATENT NO. : 10,831,101 B2
APPLICATION NO. : 15/742975
DATED : November 10, 2020
INVENTOR(S) : Tomohiro Yorisue et al.

It is certified that error appears in the above-identified patent and that said Letters Patent is hereby corrected as shown below:

In the Claims

Column 262, Line 45 Claim 1, change "of $R_{10}$" to -- of $R_{14}$ --
Column 265, Line 43 Claim 2, change "least group" to -- least one group --

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*